(12) United States Patent
Bose

(10) Patent No.: US 8,332,793 B2
(45) Date of Patent: Dec. 11, 2012

(54) METHODS AND SYSTEMS FOR PLACEMENT AND ROUTING

(75) Inventor: Subhasis Bose, Austin, TX (US)

(73) Assignee: Otrsotech, LLC, Wilmington, DE (US)

( * ) Notice: Subject to any disclaimer, the term of this patent is extended or adjusted under 35 U.S.C. 154(b) by 363 days.

(21) Appl. No.: 12/301,456

(22) PCT Filed: May 18, 2007

(86) PCT No.: PCT/US2007/069214
§ 371 (c)(1),
(2), (4) Date: Nov. 18, 2008

(87) PCT Pub. No.: WO2008/005622
PCT Pub. Date: Jan. 10, 2008

(65) Prior Publication Data
US 2009/0254874 A1      Oct. 8, 2009

Related U.S. Application Data

(60) Provisional application No. 60/747,651, filed on May 18, 2006, provisional application No. 60/803,032, filed on May 24, 2006, provisional application No. 60/804,448, filed on Jun. 12, 2006, provisional application No. 60/804,574, filed on Jun. 13, 2006, provisional application No. 60/804,643, filed on Jun. 13, 2006, provisional application No. 60/804,690, filed on Jun. 14, 2006, provisional application No. 60/804,826, filed on Jun. 15, 2006.

(51) Int. Cl.
*G06F 17/50* (2006.01)
(52) U.S. Cl. ........ 716/114; 716/108; 716/113; 716/119; 716/122; 716/134
(58) Field of Classification Search .................. 716/108, 716/113–114, 119, 122, 134
See application file for complete search history.

(56) References Cited

U.S. PATENT DOCUMENTS 3,832,686 A    8/1974   Bilgutay
(Continued)

FOREIGN PATENT DOCUMENTS

EP    1907957    1/2007
(Continued)

OTHER PUBLICATIONS

Rajagopal et al., (Timing Driven Force Directed Placement with Physical Net Constraints, ISPD, Apr. 6-9, 2003, ACM, pp. 60-66).*
(Continued)

*Primary Examiner* — Nghia Doan
(74) *Attorney, Agent, or Firm* — Schwabe, Williamson & Wyatt, P.C.

(57) ABSTRACT

Techniques for placement of integrated circuit elements include global placement, detailed placement, timing closure, and routing. The integrated circuit is described by a netlist specifying interconnections of morphable devices. The detailed placement uses, for example, Simultaneous Dynamical Integration, wherein the morphable-devices correspond to nodes influenced by forces, including timing forces. The timing forces are derived, for example, from a timing graph; path delay; slack; and drive resistance of the elements. The timing closure uses timing-driven buffering and timing-driven resizing to reduce maximum delay and/or transition time, and/or to fix hold time. Nets having high capacitance and/or fanout, and timing critical nets are preferentially processed. Timing-driven buffering applies buffering solutions to segments of route trees, combines solutions of adjoining segments, and prunes sets of solutions. Timing-driven resizing morphably replaces selected elements with upsized versions thereof.

23 Claims, 54 Drawing Sheets

U.S. PATENT DOCUMENTS

| | | | |
|---|---|---|---|
| 5,166,604 A | 11/1992 | Ahanin et al. | |
| 5,252,917 A | 10/1993 | Kadowaki | |
| 5,337,285 A | 8/1994 | Ware et al. | |
| 5,537,068 A | 7/1996 | Konno | |
| 5,568,636 A | 10/1996 | Koford | |
| 5,625,575 A | 4/1997 | Goyal | |
| 5,754,444 A | 5/1998 | Koford | |
| 5,818,726 A | 10/1998 | Lee | |
| 5,838,583 A | 11/1998 | Varadarajan et al. | |
| 5,867,446 A | 2/1999 | Konishi et al. | |
| 5,875,117 A | 2/1999 | Jones et al. | |
| 5,883,534 A | 3/1999 | Kondoh et al. | |
| 5,889,828 A | 3/1999 | Miyashita et al. | |
| 5,901,101 A | 5/1999 | Suzuki et al. | |
| 6,085,032 A | 7/2000 | Scepanovic | |
| 6,088,519 A | 7/2000 | Koford | |
| 6,125,217 A | 9/2000 | Paniccia et al. | |
| 6,166,990 A | 12/2000 | Ooishi et al. | |
| 6,175,526 B1 | 1/2001 | Morgan | |
| 6,216,252 B1 | 4/2001 | Dangelo et al. | |
| 6,223,313 B1 | 4/2001 | How et al. | |
| 6,260,175 B1 | 7/2001 | Basel | |
| 6,282,693 B1 | 8/2001 | Naylor et al. | |
| 6,301,693 B1 | 10/2001 | Naylor et al. | |
| 6,305,001 B1 | 10/2001 | Graef | |
| 6,324,118 B1 | 11/2001 | Ooishi | |
| 6,360,356 B1 | 3/2002 | Eng | |
| 6,393,592 B1 | 5/2002 | Peeters et al. | |
| 6,557,153 B1 | 4/2003 | Dahl et al. | |
| 6,591,407 B1 | 7/2003 | Kaufman et al. | |
| 6,611,932 B2 | 8/2003 | How et al. | |
| 6,662,348 B1 | 12/2003 | Naylor et al. | |
| 6,665,851 B1 | 12/2003 | Donelly et al. | |
| 6,671,859 B1 | 12/2003 | Naylor et al. | |
| 6,698,006 B1* | 2/2004 | Srinivasan et al. | 716/114 |
| 6,701,507 B1 | 3/2004 | Srinivasan | |
| 6,725,438 B2 | 4/2004 | van Ginneken | |
| 6,757,878 B2 | 6/2004 | Srinivasan et al. | |
| 6,766,500 B1 | 7/2004 | Donelly et al. | |
| 6,782,520 B1 | 8/2004 | Igusa et al. | |
| 6,822,481 B1* | 11/2004 | Srikantam et al. | 326/93 |
| 6,832,180 B1* | 12/2004 | Sutera et al. | 703/13 |
| 6,901,567 B2 | 5/2005 | Irie | |
| 6,910,199 B2 | 6/2005 | Sachs | |
| 6,915,496 B2* | 7/2005 | Alpert et al. | 716/114 |
| 6,957,407 B2 | 10/2005 | Suto | |
| 7,065,729 B1 | 6/2006 | Chapman | |
| 7,078,928 B2 | 7/2006 | Sahara et al. | |
| 7,103,863 B2 | 9/2006 | Riepe et al. | |
| 7,178,118 B2 | 2/2007 | Ramachandran et al. | |
| 7,313,739 B2 | 12/2007 | Menon et al. | |
| 2002/0138816 A1 | 9/2002 | Sarrafzadeh et al. | |
| 2002/0157066 A1 | 10/2002 | Marshall et al. | |
| 2002/0198695 A1 | 12/2002 | Sherman et al. | |
| 2003/0046050 A1 | 3/2003 | Padilla et al. | |
| 2003/0051217 A1 | 3/2003 | Cheng | |
| 2003/0177459 A1 | 9/2003 | Chen | |
| 2003/0187626 A1 | 10/2003 | Catto | |
| 2004/0015803 A1 | 1/2004 | Huang et al. | |
| 2004/0041610 A1 | 3/2004 | Kundu | |
| 2004/0078770 A1 | 4/2004 | Miller et al. | |
| 2004/0123262 A1 | 6/2004 | Shirota et al. | |
| 2004/0158772 A1 | 8/2004 | Pan et al. | |
| 2004/0181380 A1 | 9/2004 | Yoshida et al. | |
| 2004/0194051 A1 | 9/2004 | Croft | |
| 2004/0225971 A1 | 11/2004 | Donelly et al. | |
| 2004/0225982 A1 | 11/2004 | Donelly et al. | |
| 2004/0230931 A1 | 11/2004 | Barbee et al. | |
| 2005/0055615 A1 | 3/2005 | Agashe et al. | |
| 2005/0086040 A1 | 4/2005 | Davis | |
| 2005/0125758 A1 | 6/2005 | Lembach et al. | |
| 2005/0138578 A1 | 6/2005 | Alpert et al. | |
| 2005/0278667 A1 | 12/2005 | Boucher et al. | |
| 2006/0085709 A1 | 4/2006 | Kim et al. | |
| 2006/0139056 A1 | 6/2006 | Madurawe | |
| 2007/0150846 A1 | 6/2007 | Furnish et al. | |
| 2007/0204252 A1 | 8/2007 | Furnish et al. | |
| 2008/0028352 A1 | 1/2008 | Birch et al. | |

FOREIGN PATENT DOCUMENTS

| | | |
|---|---|---|
| JP | 63-300528 | 12/1988 |
| JP | 04-072583 | 6/1992 |
| JP | 05-341016 | 12/1993 |
| JP | 11-317429 | 11/1999 |
| JP | 2000-209074 | 7/2000 |
| JP | 2001-059856 | 6/2001 |
| JP | 2003-503791 A | 1/2003 |
| JP | 2003-043114 | 2/2003 |
| KR | 1020010087374 | 7/2003 |
| KR | 1020050051856 A | 6/2005 |
| KR | 1020040032109 | 11/2005 |
| KR | 1020100033623 | 6/2009 |
| WO | PCT/JP2004/010089 | 7/2004 |
| WO | WO2004061725 | 7/2004 |
| WO | W02007002799 | 1/2007 |
| WO | WO2007146849 A1 | 12/2007 |
| WO | WO2007146966 | 12/2007 |
| WO | WO2007147084 | 12/2007 |
| WO | WO2007147150 | 12/2007 |
| WO | WO2007149717 | 12/2007 |
| WO | WO2008005622 | 1/2008 |

OTHER PUBLICATIONS

Alupoaei et al., Net-based Force-Directed Macrocell Placement for wirelength optimization, 2002, IEEE.*
U.S. Appl. No. 11/953,048, filed Dec. 8, 2007, Dozier et al.
U.S. Appl. No. 11/967,186, filed Dec. 29, 2007, Lebrun.
U.S. Appl. No. 11/967,187, filed Dec. 29, 2007, Furnish.
U.S. Appl. No. 11/967,182, filed Dec. 29, 2007, Furnish.
U.S. Appl. No. 11/967,180, filed Dec. 29, 2007, LeBrun.
U.S. Appl. No. 11/967,183, filed Dec. 29, 2007, LeBrun.
U.S. Appl. No. 11/967,184, filed Dec. 29, 2007, Bose.
U.S. Appl. No. 11/967,185, filed Dec. 29, 2007, Furnish.
U.S. Appl. No. 11/967,179, filed Dec. 29, 2007, Furnish.
U.S. Appl. No. 12/301,456, filed Nov. 18, 2008, Bose.
U.S. Appl. No. 11/427,333, filed Jun. 28, 2006, Furnish.
U.S. Appl. No. 60/696,661, filed Jul. 5, 2005, Furnish.
U.S. Appl. No. 60/694,949, filed Jun. 29, 2005, Furnish.
U.S. Appl. No. 60/804,690, filed Jun. 14, 2006, Furnish.
U.S. Appl. No. 60/697,902, filed Jul. 9, 2005, Furnish.
U.S. Appl. No. 60/747,651, filed Jul. 9, 2005, Furnish.
Non-final Office Action dated Aug. 20, 2008 for U.S. Appl. No. 11/684,522.
Final OA dated Apr. 28, 2009 for U.S. Appl. No. 11/684,522.
Non-final OA dated Nov. 18, 2008 for U.S. Appl. No. 11/744,758.
Final Office Action dated Jun. 11, 2009 for U.S. Appl. No. 11/744,758.
Alupoaei, Net-Based Force-Directed Macrocell Placement for Wirelength Optimization, IEEE Transactions on Very Large Scale Integration (VLSI) Systems, vol. 10, No. 6, Dec. 2002.
U.S. Appl. No. 60/803,032, filed May 24, 2006, Bose.
U.S. Appl. No. 60/804,173, filed Jun. 8, 2006, Furnish.
U.S. Appl. No. 60/804,448, filed Jun. 12, 2006, Furnish.
U.S. Appl. No. 60/804,574, filed Jun. 13, 2006, Furnish.
U.S. Appl. No. 60/804,643, filed Jun. 13, 2006, Furnish.
U.S. Appl. No. 60/804,826, filed Jun. 15, 2006, Furnish.
U.S. Appl. No. 60/805,086, filed Jun. 18, 2006, Bose.
U.S. Appl. No. 60/869,250, filed Dec. 8, 2006.
Final OA dated Jun. 11, 2009 for U.S. Appl. No. 11/744,758.
Response filed Jan. 21, 2009 to non-final OA dated Aug. 20, 2008 for U.S. Appl. No. 11/684,522.
Response filed Feb. 18, 2009 in response to non-final OA dated Nov. 18, 2008 for U.S. Appl. No. 11/744,758.
Final Rejection for JP Application No. 2009-514561, mailed on Feb. 24, 2012.
Notice of Allowance mailed Sep. 17, 2009 from U.S. Appl. No. 11/684,522.
International Search Report from PCT/US06/25294 mailed Dec. 1, 2006.
Notice of Allowance mailed Nov. 16, 2009 from U.S. Appl. No. 11/744,758.

Notice of Allowance mailed Dec. 6, 2010 from U.S. Appl. No. 11/967,184.
Non-Final Office Action mailed May 12, 2010 from U.S. Appl. No. 11/967,184.
Final Office Action mailed Sep. 7, 2010 from U.S. Appl. No. 11/967,184.
Non-Final Office Action mailed May 17, 2010 from U.S. Appl. No. 11/967,185.
Final Office Action mailed Sep. 7, 2010 from U.S. Appl. No. 11/967,185.
Notice of Allowance mailed Dec. 3, 2010 from U.S. Appl. No. 11/967,185.
Notice of Allowance mailed Jun. 7, 2010 from U.S. Appl. No. 11/967,179.
Non-Final Office Action mailed Apr. 1, 2010 from U.S. Appl. No. 11/953,048.
Notice of Allowance mailed Jul. 22, 2010 from U.S. Appl. No. 11/953,048.
International Search Report from PCT/US07/070821 mailed Nov. 7, 2007.
Notice of Allowance mailed Aug. 1, 2008 from U.S. Appl. No. 11/456,219.
Non-Final Office Action mailed Apr. 18, 2011 from U.S. Appl. No. 12/325,629.
Final Office Action mailed Oct. 12, 2011 from U.S. Appl. No. 12/325,629.
Non-Final Office Action mailed Jan. 18, 2001 from U.S. Appl. No. 12/303,938.
European Search Report issued Apr. 19, 2011 from EP Application No. EP07798355.9.
Notice of Allowance mailed Oct. 4, 2011 from U.S. Appl. No. 12/303,938.
Eisenmann, Hans, "Generic Global Placement and Floorplanning," 1998, Institute of EDA Technical University, All Pages.
Malonnek, C., "A New Placement Algorithm for an Interconnect Centric Design Flow," IMS University of Hannover, 2002, All Pages.
Liniger, W.,"A Stopping Criterion for the Newton-Raphson Method in Implicit Multistep Integration Algorithms for NonLinear Systems of Ordinary Differential Equations," ACM, 1971, All Pages.
Quinn, Neil Jr., "The Placement Problem as Viewed From the Physics of Classical Mechanics," General Dynamic Corporation; 1986, All Pages.
Sherwani, "Algorithms for VLSI Physical Design Automation," Third Edition, Springer, Nov. 30, 1998, pp. 219-246.
Smith, "Application-Specific Integrated Circuits," Pearson Education, Inc., 1997, pp. 873-893.
Micheli, "Synthesis and Optimization of Digital Circuits," McGraw-Hill, 1994, pp. 185-216.
Hockney et al., "Computer Simulation Using Particles," Adam Hilger, 1989, pp. 1-43, 94-165.
Hockney et al., "Computer Simulation Using Particles," Adam Hilger, 1989, pp. 166-265.
Hockney et al., "Computer Simulation Using Particles," Adam Hilger, 1989, pp. 266-352.
Birdsall et al., "Plasma Physics Via Computer Simulation," McGraw-Hill Book Company, 1985, pp. 1-79.
Wikitionary Website; Definition of "legalize"; Webpage last modified Nov. 8, 2008; Website address: http://en.wikitionary.org/wiki/legalize.
Ren et al., "Sensitivity Guided Net Weighting for Placement Driven Synthesis," 2004, ACM, Technical Paper, 8 pages.
M. Sachdev, "Testing defects in scan chains," IEEE Design & Test of Computers, vol. 12, Issue 4, pp. 45-51, 1995, See p. 48 Transparent Scan (including Figure 6-8).
Notice of Rejection for JP Application No. 2009-514561, mailed on Sep. 30, 2011.

* cited by examiner

Partitions, P1 = {La, Lb}
P2 = {Ca, Cb}

Partitions, P1 = {La, Ca}
P2 = {Lb, Cb}

METHODS AND SYSTEMS FOR PLACEMENT AND ROUTING

CROSS REFERENCE TO RELATED APPLICATIONS

The present application is a U.S. national phase entry under 35 U.S.C. 371 of International Patent Application No. PCT/US2007/069214, filed May 18, 2007, which designates the United States of America, and which claims priority to U.S. Provisional Application No. 60/747,651, filed May 18, 2006, U.S. Provisional Application No. 60/803,032, filed May 24, 2006, U.S. Provisional Application No. 60/804,448, filed Jun. 12, 2006, U.S. Provisional Application No. 60/804,574, filed Jun. 13, 2006, U.S. Provisional Application No. 60/804,643, filed Jun. 13, 2006, U.S. Provisional Application No. 60/804,690, filed Jun. 14, 2006, U.S. Provisional Application No. 60/804,826, filed Jun. 15, 2006, and International Patent Application No. PCT/US2006/025294, filed Jun. 28, 2006, the entire content and disclosures of which are hereby incorporated by reference in their entireties for all purposes except for those sections, if any, that are inconsistent with this specification.

BACKGROUND

1. Field

Advancements in integrated circuit design, including placement and routing of elements in a Computer Aided Design (CAD) context, are needed to provide improvements in performance, efficiency, and utility of use.

2. Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

SYNOPSIS

The invention may be implemented in numerous ways, including as a process, an article of manufacture, an apparatus, a system, a composition of matter, and a computer readable medium such as a computer readable storage medium or a computer network wherein program instructions are sent over optical or electronic communication links. In this specification, these implementations, or any other form that the invention may take, may be referred to as techniques. The Detailed Description provides an exposition of one or more embodiments of the invention that enable improvements in performance, efficiency, and utility of use in the field identified above. The Detailed Description includes an Introduction to facilitate the more rapid understanding of the remainder of the Detailed Description. The Introduction includes Example Embodiments of one or more of systems, methods, articles of manufacture, and computer readable media in accordance with the concepts described herein. As is discussed in more detail in the Conclusions, the invention encompasses all possible modifications and variations within the scope of the issued claims.

DETAILED DESCRIPTION

Figure 1:
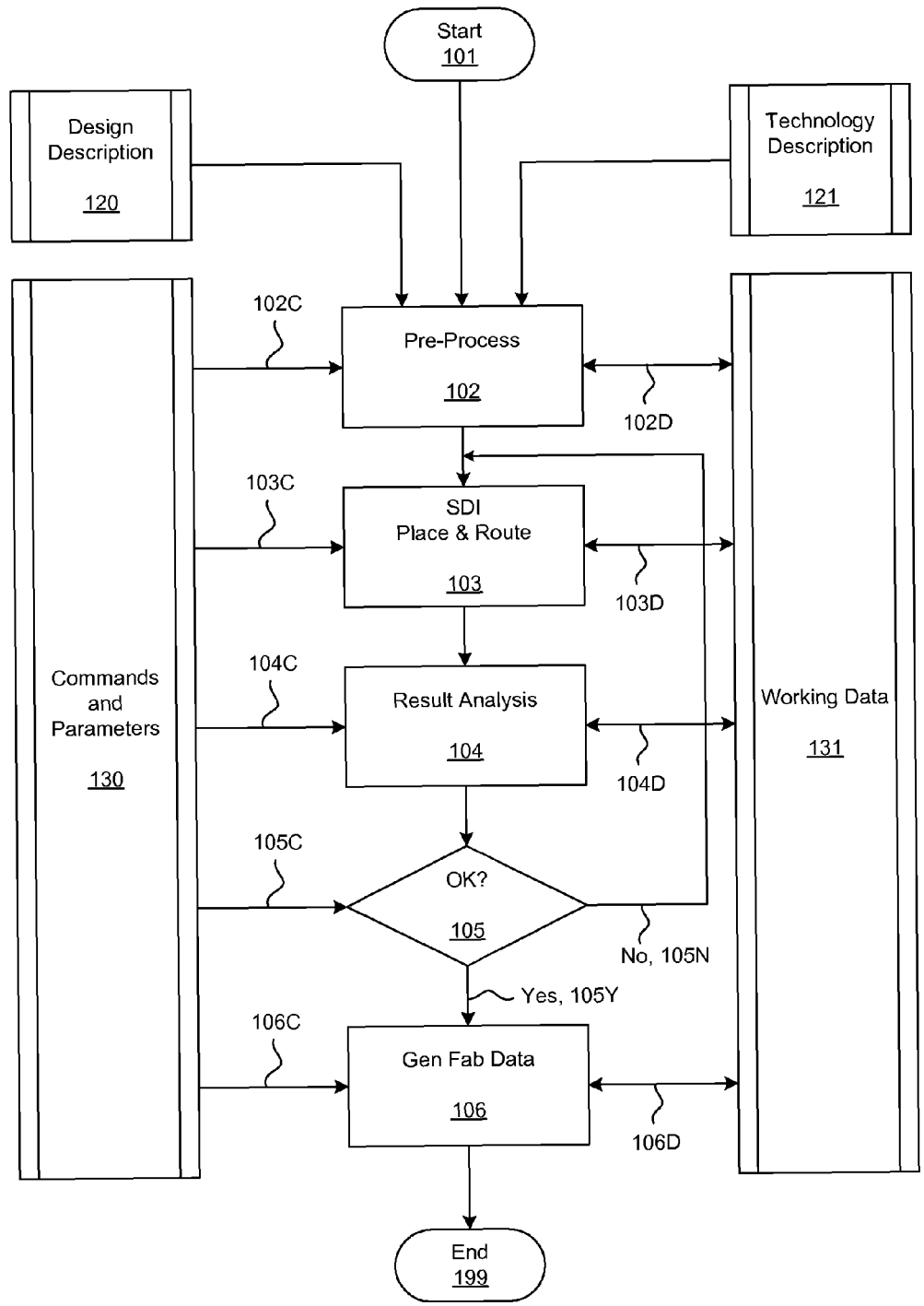
FIG. 1 is a flow diagram illustrating selected details of an embodiment of placing, routing, analyzing, and generating fabrication data for any portion of an integrated circuit according to a Simultaneous Dynamical Integration (SDI)-based flow.

A detailed description of one or more embodiments of the invention is provided below along with accompanying figures illustrating selected details of the invention. The invention is described in connection with the embodiments. It is well established that it is neither necessary, practical, or possible to exhaustively describe every embodiment of the invention. Thus the embodiments herein are understood to be merely exemplary, the invention is expressly not limited to or by any or all of the embodiments herein, and the invention encompasses numerous alternatives, modifications and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Introduction

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

As described herein, "dynamic time-evolving SDI" refers to SDI techniques for the modeling and simulation of elements for integrated circuit placement and routing. Dynamic time-evolving SDI includes applying principles of Newtonian mechanics to an "analogy-system" based on a netlist that is a specification of the integrated circuit as part of an EDA flow (such as during physical design development of the integrated circuit). In some usage scenarios the analogy-system (often referred to simply as "system") includes a single point particle corresponding to each device in the netlist. The system further includes a set of one or more forces acting on each of the particles, in certain embodiments computed as a weighted sum. Various numerical integration techniques are used to apply Newton's second law of motion to the system, forming a time-evolving representation of the system in state-space. In other words a simulation determines paths of the particles in a plane (or three dimensions). Then resultant locations of the point particles are mapped back into resultant placements of the corresponding devices, thus providing SDI-directed placements.

Using dynamic time-evolving SDI, elements of the system are pushed simultaneously forward in time through a smooth integration in which the model for the system dynamics is an abstraction utilizing continuous variables and simultaneous exploration. Departures from idealizations of continuous variables and simultaneity are artifacts of techniques for solving the system of coupled simultaneous governing equations, such as that occur with numerical integration on a digital computer. In such digital computer implementations, the departures are limited to specifiable tolerances determined by the quality of result goals and economic considerations (such as available solution time, supply of computing power available, and other similar constraints).

The system forces include attractive and spreading components, used to model effects of interconnect, resource usage (such as device area), and to drive various optimizations (such as timing closure). Some of the system forces are directly expressed as functions of the positions of other devices (such as attractive forces between connected devices), some of the forces are indirect functions of the positions of other devices and are computed by way of various fields (such as one or more density fields), and some of the forces that act on some of the devices are independent of the positions of the other devices in the system. Computing selected forces as fields in certain embodiments affords more computational efficiency.

SDI-directed placement is useful in various integrated circuit design flows and related implementation architectures, including full custom, semi-custom, standard cell, structured array, and gate array design flows and related implementation architectures. Several variations in the context of structured array design flows enable efficient processing of numerous constraints imposed by the paritally predetermined nature of the arrays. A library of composite cells or "morphable-devices" is provided to a synthesis tool (such as Synopsys Design Compiler or any other similar tool). The morphable-devices are used as target logic elements by the synthesis tool to process a netlist (either behavioral or gate-level) provided by a user. A synthesis result is provided as a gate-level netlist (such as a Verilog gate-level netlist) expressed as interconnections of morphable-devices. The synthesis tool assumes the morphable-devices represent the final implementation, subject to device sizing to resolve circuit timing issues.

The morphable-devices are, however, subject to additional modifications in the structured array design flow context (see "Structured Arrays", elsewhere herein), as each morphable-device may be implemented in a plurality of manners using varying resources of the structured array. During phases of resource reconciliation (where attempts are made to satisfy required resources with locally available resources), one or more of the morphable-devices may be transformed to a logically equivalent implementation. For example, an AND function may be implemented by an AND gate, by a NAND gate and an Inverter, or by any other equivalent formulation. Functionally equivalent alternatives are grouped according to implementation function, and individual realizations within a given function are referred to as "forms". Thus any morphable-device may be implemented as any instance of any form having an equivalent function. Subsequent operations account for variation between logically equivalent forms (such as differences in area, timing behavior, routing resources used or provided, and any other characteristic distinguishing one form from another). Operations relating to interchanging implementations of morphable-devices to satisfy structured array resource limitations and underlying topology, as well as meeting spatial organization constraints, are termed "morphing".

The SDI-directed placement, in various contexts including structured array design flows, includes several phases: global placement, legalization, and detailed placement. Global placement in certain embodiments provides a first-cut location for each morphable-device in a netlist. The first-cut location is subject to additional refinement by subsequent processing (including legalization and detailed placement). Global placement is considered complete when a configuration is attained that is determined to be sufficiently close to legality to proceed to legalization, i.e. the configuration is likely to be reducible to a satisfactory implementation. Legalization starts with the global placement configuration and produces a final configuration in which demand for resources in every region is determined to be no greater than corresponding supply in each region. Detailed placement starts with the legalized placement configuration and assigns every element implementing a morphable-device to specific resources in an implementation (such as a set of specific resource-slots in a structured array architecture). Some simple functions may have degenerate forms requiring only a single resource instance, but more complex forms are composite, requiring more than one physical resource instance plus internal interconnect to correctly implement the function.

Various morphing and similar transformation operations may be used in any combination of phases including global placement, legalization, and detailed placement, according to various embodiments. Morphing techniques used in one phase may be distinct or may be substantially similar to morphing techniques used in another phase, varying according to implementation. In some embodiments, different processing phases proceed with morphing operations operating according to respective morphing classes, i.e. a set of morphing classes for global placement, a set of morphing classes for legalization, and set of morphing classes for detailed placement. The morphing classes according to phases may be distinct or may be substantially similar to one another, according to embodiment.

SDI-directed placement operations, when applied in a structured array design flow context, may include specialized forces relating to various "morphing classes" representing categories of structured array resources or related functionality. For example, resources for combinational circuitry may be grouped in a combinational morphing class, while resources for sequential circuitry may be grouped in a sequential morphing class. In some situations morphable-devices are restricted to implementation by resources belonging to a limited set of morphing-classes. Continuing with the example, combinational logic morphable-devices may be restricted to implementation by resources of the combinational morphing class, while sequential logic morphable-devices may be restricted to implementation by sequential morphing class elements. One or more specialized forces relating to each of the morphing classes may be used during global placement to effect spreading of morphable-devices according to corresponding morphing classes. Continuing with the example, a combinational spreading force may be selectively applied to combinational logic morphable-devices, while a sequential spreading force may be selectively applied to sequential logic morphable-devices. In certain embodiments, it is useful to subject all devices in the netlist (whether morphable or not) to a single spreading force that acts to drive the circuit toward a density that is sustainable on the implementation architecture, and augment the spreading force with the specialized resource-class-specific spreading forces to further tune the placement.

Structured Arrays

In some usage scenarios structured arrays are implementation vehicles for the manufacture of integrated circuits, as described elsewhere herein. Structured arrays in certain embodiments include fundamental building blocks (known as "tiles") instantiated one or more times across an integrated circuit substrate to form a Structured Array Fabric (SAF). In some embodiments structured arrays are homogeneous (i.e. all of the tiles are identical), while in some embodiments the arrays are heterogeneous (i.e. some of the tiles are distinct with respect to each other). Heterogeneity may occur as a result of tile type, arrangement, or other differences. Irregardless of tile number and arrangement, however, the SAF tiles are fixed (i.e. prefabricated) and independent of any specific design implemented thereupon.

SAF tiles, according to various embodiments, may include any combination of fully or partially formed active elements (such as transistors, logic gates, sequential elements, and so forth), as well as fully or partially formed passive elements (such as metallization serving as wires and vias providing interconnection between layers of metal). In some SAF embodiments "lower" layers of interconnect are included in SAF tiles (as the lower layers are formed relatively early in fabrication), while "upper" layers of interconnect are specific to a design (as the upper layers are formed relatively later in fabrication). Such SAF embodiments permit the lower prefabricated (and thus non-customizable) layers to be shared between different design implementations, while the higher/customizable layers provide for design-specific specialization or personalization.

SAF structures may be used to construct an entire chip, or may constitute only a portion of the floorplan of an encompassing circuit, allowing for design variation. The size of the SAF tiles is generally irrelevant to design flows, and a tile may be as small and simple as a single inverter or as large and complex as a Randomly Accessible read-write Memory (RAM) block or other large-scale Intellectual Property (IP) element.

EDA flows targeting designs based on structured array technology (such as the SDI-directed flow described elsewhere herein) account for the predetermined nature of the array, from gate-level netlist synthesis through subsequent implementation processing including layout of cells and interconnect. Such EDA flows enable realizing advantages of manufacture of integrated circuits including SAF tiles. The advantages include reduced manufacturing cost, as fewer mask layers (for example those corresponding to upper layers of interconnect) are customized for each design, as well as reduced characterization cost (for example by re-use of known structures such as the SAF tiles).

Illustrative Combinations

This introduction concludes with a collection of exemplary illustrative combinations, including some explicitly enumerated as "ECs", that tersely summarize illustrative systems and methods in accordance with the concepts taught herein. Each of the illustrative combinations or ECs highlights various combinations of features using an informal pseudo-claim format. These compressed descriptions are not meant to be mutually exclusive, exhaustive, or restrictive, and the invention is not limited to these highlighted combinations. As is discussed in more detail in the Conclusion section, the invention encompasses all possible modifications and variations within the scope of the issued claims.

General Exemplary Illustrative Combinations

An embodiment for generating a circuit layout, the embodiment including (a) loading a circuit netlist, the netlist including a plurality of cells to be placed, the cells having specified functionality and interconnection; (b) representing the cells of the netlist according to corresponding physical state variables for a respective plurality of nodes, the node physical state variables including position and velocity components configured to represent each available spatial dimension in an implementation architecture, the node physical state variables further including a mass component; (c) representing the netlist according to corresponding physical state variables for each net of the netlist, the net physical state variables including a contractive strength force component as a function of cells spanned by each respective net; (d) integrating the physical state variables forward in time from an initial state according to a system of coupled simultaneous ordinary differential equations corresponding to Newtonian mechanics, the integrating being continuous and simultaneous with respect to values of the physical state variables over time, the integration further being according to a plurality of forcing functions; initializing the initial state; and (e) modulating a first one of the forcing functions in a time-varying manner; and wherein a second one of the forcing functions corresponds to the contractive strength force component.

Any of the foregoing embodiments wherein a third one of the forcing functions corresponds to viscous damping according to node velocity. Any of the foregoing embodiments wherein a fourth one of the forcing functions corresponds to a timing-driven force based on any combination of electrical characteristics and timing characteristics of a physical implementation of the circuit netlist based on the spatial locations of the nodes. Any of the foregoing embodiments wherein the fourth one of the forcing functions corresponds to pin-to-pin timing slack between cells. The foregoing embodiment wherein the pin-to-pin timing slack is calculated as a function of spatial locations of cells, the spatial location of each cell corresponding to a spatial location of the respective node. The foregoing embodiment where the pin-to-pin timing slack is calculated repeatedly over time as represented by the integration of the physical state variables forward in time. Any of the foregoing embodiments wherein a fifth one of the forcing functions corresponds to repulsion associated with spatial concentration of nodes. Any of the foregoing embodiments wherein a sixth one of the forcing functions corresponds to attraction associated with floorplan specifications. Any of the foregoing embodiments wherein a seventh one of the forcing functions corresponds to repulsion associated with any combination of floorplan specifications and predetermined cell placements. Any of the foregoing embodiments wherein an eighth one of the forcing functions corresponds to any combination of a routability metric, a manufacturability metric, a yield metric, and a signal integrity metric.

An embodiment of a method of representing a circuit netlist, the cells of which are modeled in terms of forms (defined herein) implementing defined functions, the forms being grouped into sets of functionally equivalent, interchangeable, substitutable forms which implement the same function, the forms further being embodiments of the netlist substructure (or "templates") required to implement said function in any of various techniques available in the implementation architecture, the forms further specifically comprising a list of implementation cells, and sets of connection specifications detailing the interconnections required between the ports of the function and the ports on said implementation cells comprising the form.

A timing force embodiment, based upon any of the foregoing embodiments, but further wherein at least some of the forces include timing driven force that are derived from instantaneous timing characteristics of the dynamical physical system. Any of the foregoing embodiments wherein some of the timing driven forces are modeled as a function of pin slack, worst negative slack (WNS) and/or total negative slack (TNS) of the circuit. Any of the foregoing embodiments wherein some of the timing driven forces are computed using a path-based approach from critical path and near-critical paths of the circuit.

A timing kernel embodiment, based upon any of the foregoing embodiments, but further wherein timing driven forces are computed from a timing kernel that accurately models the timing characteristics of instantaneous physical placement. The timing kernel embodiment wherein timing forces and timing kernel can be adjusted every N iteration where N is specified by the user. The timing kernel embodiment wherein timing forces can be adjusted every N iteration where N can be automatically computed by the system (auto TD-force update mode) depending on the state of dynamical system.

A timing force auto-update embodiment, based upon any of the foregoing embodiments, but further wherein timing forces are auto-updated in accordance with a predetermined criteria. A variation on the timing force auto-update embodiment wherein the frequency of auto-updates is a function of the progression of the integration. The foregoing embodiment wherein the frequency of auto-updates is increased after a predetermined interval. A variation on the timing force auto-update embodiment wherein the auto-update is based at least in part on cumulative node displacement reaching a predetermined value. A variation on the timing force auto-update embodiment, wherein the auto-update is performed whenever the displacement within any net reaches a predetermined maximum displacement value respective to that net. A variation on the timing force auto-update embodiment, wherein at predetermined intervals the displacement of the nodes since the last check is evaluated, and an incremental timing update (as opposed to a more comprehensive timing update) is performed if the displacement of the nodes is less than a predetermined metric.

The timing force embodiment, wherein iterative slack allocation and net delay budgets are computed on the instantaneous placement every N iterations to adapt the timing budgets based on evolving placements. The timing force embodiment, further wherein an adaptive net delay budget is based on the evolving physical state.

The timing kernel embodiment, wherein timing graph nodes' spatial coordinates is determined periodically from state variables of dynamical physical system. The timing kernel embodiment, wherein net-timing models of the graph are periodically updated to derive the accurate time changing parasitic. The timing kernel embodiment, wherein the timing kernel computes and propagates transition times through the timing graph. The timing kernel embodiment, wherein the timing kernel propagates timing exceptions such as false paths and multicycle paths through the timing graph. The timing kernel embodiment, wherein non-linear delay characteristics of the nodes are computed based on input transition and output loads.

A Minimum Rectilinear Steiner Trees (MRST) embodiment, based upon the timing kernel embodiment, wherein wire parasitics are accurately computed by building MRSTs coupling all the pins of the nets. A distributed parasitics MRST embodiment, based upon the MRST embodiment, wherein wire parasitics are computed by generating distributed RC parasitics tree from MRST. The distributed parasitics MRST embodiment, wherein wire delays are computed using Elmore-Penfield-Rubenstein (ERP) delays model of distributed RC parasitics tree circuits. The distributed parasitics MRST embodiment, wherein wire delays are computed using an Asymptotic Waveform Evaluation (AWE) technique of distributed RC parasitics tree circuits. Any of the foregoing MRST-based embodiments, wherein the MRSTs are approximate.

The timing kernel embodiment, wherein wire parasitics of short nets can be estimated by using net-bounding box (NBB) of constituent pins. The timing kernel embodiment, wherein some wires that exceed max capacitive limits of the drivers are buffered using a buffered tree. The foregoing claim, wherein fast and extremely scalable buffering is performed by using a recursive bi-partitioning based buffering technique.

Timing Driven Buffering Exemplary Illustrative Combinations

EC1) A method comprising:
sorting nets according to timing criticality;
eliminating pre-existing buffer trees;
resizing drivers of a first portion of the nets according to form resizing;
inserting buffers driving a second portion of the nets according to timing driven buffering; and
wherein the nets are of a circuit description.

EC2) The method of EC1 wherein the first and the second portions overlap.

EC3) The method of EC1 wherein the first and the second portions are disjoint.

EC4) The method of EC1 wherein the resizing includes upsizing some elements driving some of the nets.

EC5) The method of EC1 wherein the inserting includes generating trees of buffers to drive some of the nets.

EC6) A method comprising:
computing macro displacement coefficients of a plurality of macros;

scoring a plurality of possible morphable forms for a driver of a net;
determining at least one valid placement for each of the morphable forms;
sorting at least a portion of the morphable forms according to the scoring and the determining;
selecting one of the sorted morphable forms; and
wherein interconnections between the macros are specified by a circuit description, and the net corresponds to one of the interconnections.

EC7) The method of EC6 wherein the determining includes displacing a form.

EC8) The method of EC6 wherein a respective one of the macro displacement coefficients of a respective one of the macros is a sum of macro displacement coefficients of each of a respective group of intermediate elements implementing the respective macro.

EC9) The method of EC8 wherein the intermediate elements are morphable forms.

EC10) The method of EC8 wherein the respective macro displacement coefficient of each intermediate element is a product of respective densities of a respective group of physical elements implementing the respective intermediate element.

EC11) The method of EC10 wherein the respective densities are determined via a resource usage grid having elements comprising available resources and used resources according to a plurality of resource types.

EC12) The method of EC11 wherein the resource types comprise Boolean logic gate types and sequential logic types.

EC13) A method comprising:
sorting nets of an electronic circuit according to timing criticality;
resizing drivers of a first portion of the nets in accordance with the sorting; and
inserting buffers driving a second portion of the nets.

EC14) The method of EC13 wherein the electronic circuit is compatible with implementation on a structured array fabric.

EC15) The method of EC13 wherein the resizing comprises resizing a relatively higher timing critical one of the nets before resizing a relatively lower timing critical one of the nets.

EC16) The method of EC13 further comprising after the sorting and before the resizing, eliminating pre-existing buffer trees.

EC17) The method of EC13 wherein the resizing comprises form resizing.

EC18) The method of EC17 wherein
the form resizing comprises replacing a first logic gate of a first drive strength and operable according to a logical function with a second logic gate of a second drive strength and operable according to the logical function; and
the second drive strength is greater than the first drive strength.

EC19) The method of EC18 wherein the second logic gate is comprised of a single physical circuit element.

EC20) The method of EC18 wherein the second logic gate is comprised of a plurality of physical circuit elements.

EC21) The method of EC20 further comprising allocating the plurality of physical circuit elements to a third logic gate before the replacing.

EC22) The method of EC21 further comprising de-allocating the plurality of physical circuit elements from the third logic gate after the allocating and before the replacing.

EC23) The method of EC13 wherein the inserting is according to timing driven buffering comprising at least one of net prioritization, global Steiner tree routing, evaluating multiple route trees, computing buffering options, pruning the buffering options, and determining and selecting a solution.

EC24) The method of EC13 wherein the inserting comprises global Steiner tree routing to estimate heavily congested regions.

EC25) The method of EC13 wherein the inserting comprises determining at least two route trees for at least one driver, each of the trees coupling the at least one driver to all loads driven by the at least one driver.

EC26) The method of EC25 wherein a first one of the route trees is in accordance with a shortest path weight technique and a second one of the route trees is in accordance with a net spanning factor technique.

EC27) The method of EC13 wherein the inserting comprises Steiner tree routing of relatively more critical ones of the nets.

EC28) The method of EC27 wherein the inserting further comprises routing of relatively less critical ones of the nets subsequent to the routing of the relatively more critical nets.

EC29) The method of EC28 wherein the routing of the relatively less critical nets is in accordance with a shortest path weight technique.

EC30) The method of EC29 wherein the shortest path weight technique is according to a relatively high shortest path weight.

EC31) The method of EC13 wherein the inserting comprises Steiner tree routing according to a global cell granularity.

EC32) The method of EC13 wherein the inserting comprises Steiner tree routing of individual net segments.

EC33) The method of EC32 wherein at least two routing solutions are maintained for at least one of the individual net segments.

EC34) The method of EC13 wherein the inserting comprises processing load terminals before processing a driver of the load terminals.

EC35) The method of EC13 wherein the inserting comprises computing buffering options.

EC36) The method of EC35 wherein the computing comprises determining at least one of a buffer cost parameter, a required time parameter, and a lumped capacitive load parameter.

EC37) The method of EC36 wherein the inserting further comprises pruning the buffering options according to at least one of the determined parameters.

EC38) The method of EC37 wherein the pruning comprises sorting the buffering options according to the required time parameter.

EC39) The method of EC38 wherein the sorted options are partitioned into a plurality of sort-order contiguous sections.

EC40) The method of EC39 wherein respective portions of at least two of the sort-order contiguous sections are retained after the pruning.

EC41) A method comprising:
sorting nets of an electronic circuit according to timing criticality;
allocating physical circuit elements to implement a first portion of the electronic circuit;
then de-allocating the physical circuit elements;
then re-allocating the physical circuit elements to implement a second portion of the electronic circuit; and
wherein the portions are determined in accordance with the sorting.

EC42) The method of EC41 wherein an integrated circuit comprises the electronic circuit.

EC43) A computer readable medium having a set of instructions stored therein which when executed by a processing element causes the processing element to perform procedures comprising:
implementing the method of any of EC1 to EC42.

EC44) The computer readable medium of EC102 wherein the processing element is a single processor.

EC45) The computer readable medium of EC102 wherein the processing element is a plurality of processors.

EC46) A system comprising:
a processor;
a memory; and
wherein the processor and the memory are adapted to implement the method of any of EC1 to EC42.

EC47) The system of EC105 wherein the processor is a single processing element.

EC48) The system of EC105 wherein the processor is a plurality of processing elements.

Timing Driven Force Directed Placement Exemplary Illustrative Combinations

EC49) A method comprising:
in a system of nodes compatible with simultaneous dynamical integration, the nodes interacting via a set of forces in accordance with Newtonian dynamics, computing at least one of the forces based on a timing analysis relating to an element of an electronic circuit; and
wherein the nodes are derived from a representation of the electronic circuit.

EC50) The method of EC49 wherein the timing analysis determines a number of critical paths the element contributes to.

EC51) The method of EC50 wherein the at least one force is proportional to the number.

EC52) The method of EC49 wherein the timing analysis determines a drive resistance of the element.

EC53) The method of EC52 wherein the at least one force is proportional to the drive resistance.

EC54) The method of EC49 wherein the timing analysis determines sensitivity of the element to incremental interconnect length.

EC55) The method of EC49 wherein the timing analysis determines a maximum path length of a load pin of the element.

EC56) The method of EC49 wherein the timing analysis determines a stage delay of the element.

EC57) The method of any of EC49 to EC56 wherein the electronic circuit is an integrated circuit.

EC58) The method of EC57 wherein the representation is a netlist.

EC59) The method of EC58 wherein the netlist specifies functional elements.

EC60) The method of EC59 wherein the netlist further specifies interconnections between the functional elements.

EC61) The method of EC58, wherein the netlist is in accordance with at least one of a standard cell design flow, a structured array design flow, a gate array design flow, and a field-programmable gate array design flow.

EC62) A method comprising:
determining a placement of elements of an integrated circuit die via simultaneous dynamical integration of an analogous system of nodes and forces; and
wherein at least one of the forces is based on how many critical paths at least one of the elements is a member of.

EC63) A method comprising:
determining a placement of elements of an integrated circuit die via simultaneous dynamical integration of an analogous system of nodes and forces; and
wherein at least one of the forces is based at least in part on drive resistance of at least one of the elements.

EC64) A method comprising:
determining a placement of elements of an integrated circuit die via simultaneous dynamical integration of an analogous system of nodes and forces; and
wherein at least one of the forces is based at least in part on sensitivity of at least one of the elements to incremental interconnect length.

EC65) A method comprising:
determining a placement of elements of an integrated circuit die via simultaneous dynamical integration of an analogous system of nodes and forces; and
wherein at least one of the forces is based at least in part on a maximum path length of a load pin of at least one of the elements.

EC66) A method comprising:
determining a placement of elements of an integrated circuit die via simultaneous dynamical integration of an analogous system of nodes and forces; and
wherein at least one of the forces is based at least in part on a stage delay of at least one of the elements.

EC67) A method comprising:
determining a placement of elements of an integrated circuit die via simultaneous dynamical integration of an analogous system of nodes and forces; and
wherein at least one of the forces is derived from a timing analysis based on the elements.

EC68) The method of any of EC62 through EC67 wherein the placement is a global placement.

EC69) The method of any of EC62 through EC67 wherein the placement is a detailed placement.

EC70) The method of EC67 wherein the at least one force is proportional to a timing property associated with at least one of the elements as determined by the timing analysis.

EC71) The method of EC70 wherein the timing property comprises at least one of
a number of critical paths the at least one element is on,
a drive resistance of the at least one element,
sensitivity of the at least one element to incremental interconnect length,
a maximum path length of a load pin of the at least one element, and
a stage delay of the at least one element.

EC72) The method of EC67 wherein the at least one force is inversely proportional to a timing property associated with at least one of the elements as determined by the timing analysis.

EC73) The method of EC67 wherein the at least one force is determined based in part on how many critical paths one of the elements contributes to as determined by the timing analysis.

EC74) The method of EC67 wherein the at least one force is determined based in part on drive resistance of at least one of the elements as determined by the timing analysis.

EC75) The method of EC74 wherein the at least one force is proportional to the drive resistance.

EC76) The method of EC67 wherein the at least one force is determined based in part on sensitivity of at least one of the elements to incremental interconnect length as determined by the timing analysis.

EC77) The method of EC67 wherein the at least one force is determined based in part on a maximum path length of a load pin of at least one of the elements as determined by the timing analysis.

EC78) The method of EC67 wherein the at least one force is determined based in part on a stage delay of at least one of the elements as determined by the timing analysis.

EC79) A method comprising:
  determining a placement of elements of an integrated circuit die via simultaneous dynamical integration of an analogous system of nodes and forces; and
  wherein at least a portion of the forces are timing driven forces based in part on a timing analysis of the elements.

EC80) The method of EC79 wherein at least a portion of the timing driven forces are attractive.

EC81) The method of EC79 wherein the timing driven forces are associated only with critical paths.

EC82) The method of EC79 wherein at least some of the timing driven forces are associated with critical paths.

EC83) The method of EC82 wherein the critical paths are all timing paths failing to meet timing criteria.

EC84) The method of EC82 wherein the critical paths comprise a portion of timing paths failing to meet timing criteria.

EC85) The method of EC82 wherein the critical paths comprise all timing paths failing to meet timing criteria.

EC86) The method of EC79 wherein at least some of the timing driven forces are associated with non-critical paths.

EC87) The method of EC86 wherein the non-critical paths are all timing paths meeting timing criteria.

EC88) The method of EC86 wherein the non-critical paths comprise a portion of timing paths meeting timing criteria.

EC89) The method of EC79 wherein the timing driven forces are associated with critical and non-critical paths.

EC90) The method of EC79 wherein at least one of the timing driven forces corresponds to a load pin of one of the elements that is on a critical timing path.

EC91) The method of EC79 wherein at least one of the timing driven forces corresponds to a load pin of one of the elements that is on a non-critical timing path.

EC92) The method of EC91 wherein the load pin forms a portion of a bounding box of an interconnection on a critical timing path.

EC93) The method of any of EC62 to EC92 wherein the elements comprise Boolean elements.

EC94) The method of any of EC62 to EC92 wherein at least one of the elements comprises a plurality of Boolean elements.

EC95) The method of any of EC93 and EC94 wherein the Boolean elements comprise logic gates.

EC96) The method of any of EC62 to EC92 wherein the elements comprise sequential elements.

EC97) The method of EC96 wherein the sequential elements comprise at least one of a latch and a flip-flop.

EC98) The method of any of EC62 to EC97 wherein the elements comprise function-elements, the placement of the elements comprises placement of the function-elements, and the placement of the function-elements comprises substituting a physical element for at least one of the function-elements.

EC99) The method of any of EC62 to EC97 wherein the elements comprise function-elements, the placement of the elements comprises placement of the function-elements, and the placement of the function-elements comprises placement of a physical element corresponding to at least one of the function-elements.

EC100) The method of any of EC62 to EC97 wherein the elements comprise function-elements, the placement of the elements comprises placement of the function-elements, and the placement of the function-elements comprises substituting a plurality of physical elements for at least one of the function-elements.

EC101) The method of any of EC62 to EC97 wherein the elements comprise function-elements, the placement of the elements comprises placement of the function-elements, and the placement of the function-elements comprises placement of a plurality of physical elements corresponding to at least one of the function-elements.

EC102) A computer readable medium having a set of instructions stored therein which when executed by a processing element causes the processing element to perform procedures comprising:
  implementing the method of any of EC49 to EC101.

EC103) The computer readable medium of EC102 wherein the processing element is a single processor.

EC104) The computer readable medium of EC102 wherein the processing element is a plurality of processors.

EC105) A system comprising:
  a processor;
  a memory; and
  wherein the processor and the memory are adapted to implement the method of any of EC49 to EC101.

EC106) The system of EC105 wherein the processor is a single processing element.

EC107) The system of EC105 wherein the processor is a plurality of processing elements.

High-Level Integrated Circuit Physical Design Flow

FIG. 1 is a flow diagram illustrating selected details of an embodiment of placing, routing, analyzing, and generating fabrication data for any portion of an integrated circuit according to an SDI-based flow. A representation of all or any portion of the integrated circuit is provided ("Design Description" 120), in certain embodiments including a gate-level netlist, placement constraints, timing requirements, and other associated design specific data. The gate-level netlist may be provided in any proprietary or standard format, or a hardware description language (such as Verilog).

A representation of fabrication flow is also provided ("Technology Description" 121), in certain embodiments including information relating to fabrication material starting state and manufacturing flow. The fabrication material information may include data describing wafers and any associated predetermined processing on the wafers (for example fabrication of lower layers of devices). The predetermined processing may be associated with transistors, combinatorial logic gates, sequential logic devices, storage arrays, regular structures, power distribution, clock distribution, routing elements, and other similar portions of active and passive circuitry. The manufacturing flow information may include information relating to physical and electrical design rules and parameters for extraction of parasitic information for analyzing results during physical design flow processing.

Flow begins ("Start" 101) and continues ("Pre-Process" 102), where the design and technology descriptions are parsed and various design-specific data structures are created for subsequent use. The design description in certain embodiments includes a gate-level netlist describing interconnections of devices (morphable-devices, according to some embodiments), as well as constraints specific to implementation of the design (such as timing and placement requirements). The technology description includes information such as library definitions, fabrication technology attributes, and descriptions of manufacturing starting material (for example data describing SAF tile arrangement and composition of active and passive elements).

Physical locations of some or all of the devices are then determined ("SDI Place & Route" 103), i.e. the design is placed, and wiring according to the netlist is determined (i.e. the design is routed). Place and route processing in certain embodiments includes multiple iterations of one or more internal processes (see "Place and Route Flow", elsewhere herein). The placed and routed design is then analyzed ("Result Analysis" 104), in certain embodiments with one or more analysis tools performing various functions such as parasitic extraction, timing verification, physical and electrical rule checking, and Layout-Versus-Schematic (LVS) formal verification.

Results of the analysis are examined by any combination of automatic (such as software) and manual (such as human inspection) techniques ("OK?" 105). If the results are acceptable, then flow continues ("Yes" 105Y) to produce information to manufacture the design according to the results ("Generate Fabrication Data" 106). The fabrication data varies by embodiment and design flow context, and may include any combination of mask describing data, FPGA switching-block programming data, and FPGA fuse/anti-fuse mapping and programming data. Processing is then complete ("End" 199).

If the results are not acceptable, then flow loops back ("No" 105N) to repeat some portion of the place and route operations. In some usage scenarios (not illustrated) one or more modifications to any combination of the design and the technology may be made before repeating some of the place and route operations. For example, synthesis may be repeated (with any combination of changes to functionality as specified by behavioral or gate-level inputs and synthesis commands), a different technology may be chosen (such as a technology having more metal layers), or a different starting material may be selected (such as choosing a "larger" structured array having more SAF tiles).

Processing functions ("Pre-Process" 102, "SDI Place & Route" 103, "Result Analysis" 104, "OK?" 105, and "Generate Fabrication Data" 106) are responsive to various instructions and input data ("Commands and Parameters" 130), according to various embodiments. The effects of the commands and parameters on the processing are represented conceptually in the figure (arrows 102C, 103C, 104C, 105C, and 106C, respectively). In various embodiments information is communicated between the processing functions (and other processing elements not illustrated) in various forms and representations, as shown conceptually ("Working Data" 131 and associated arrows 102D, 103D, 104D, and 106D, respectively). The working data may reside in any combination of processor cache, system memory, and non-volatile storage (such as disks), according to implementation and processing phase.

The illustrated placement, route, and analysis processing is applied, in various embodiments, to integrated circuits implemented in various design flows or contexts, including application specific, structured array (homogenous and heterogeneous varieties), mask-definable gate array, mask-programmable gate array, Field-Programmable Gate Array (FPGA), and full custom. The processing may be applied to an entire integrated circuit, or one or more portions or subsections of an integrated circuit, according to various usage scenarios. For example, an otherwise full custom integrated circuit may include one or more regions of standard cells, and each of the standard cell regions may be processed according to all or portions of the illustration. For another example, an Application Specific Integrated Circuit (ASIC) may include some regions of standard cells and other regions of SAF tiles. Any combination of the standard cell and SAF tile regions may be processed according to all or portions of the illustrated flow. These and all similar variations are contemplated.

Place and Route Flow

Figure 2:
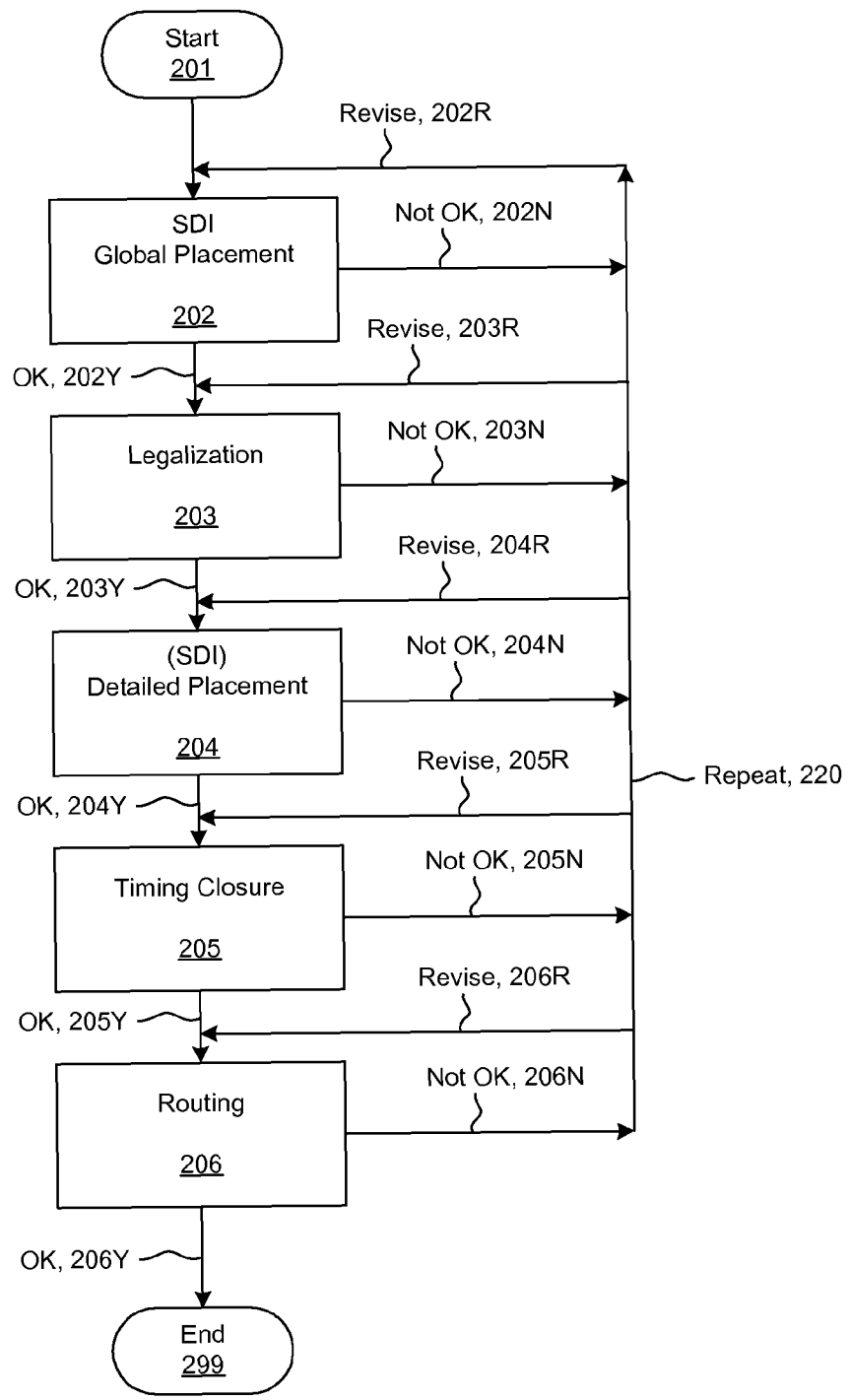
FIG. 2 is a flow diagram illustrating selected details of an embodiment of placing and routing any portion of an integrated circuit according to an SDI-based flow.

FIG. 2 is a flow diagram illustrating selected details of an embodiment of placing and routing any portion of an integrated circuit, according to an SDI-based flow, such as operations referred to elsewhere herein ("SDI Place & Route" 103, of FIG. 1, for example). Overall the flow includes determining approximate (i.e. subject to subsequent refinement) locations for devices, reconciling resources, determining nearly final locations and implementations for the devices, minimizing critical delay paths, and wiring the devices according to a netlist. In certain embodiments each of the elements of the flow includes internal functions to determine acceptability of results, iterate as necessary to improve the results, and to direct feedback to earlier processing functions of the flow as needed.

Processing begins ("Start" 201), in certain embodiments by receiving one or more data structures and files describing a netlist having devices and associated connectivity, along with manufacturing technology information. The structures and files may result from parsing design and technology information ("Pre-Process" 102, of FIG. 1, for example). Approximate locations for the devices of the netlist are then determined ("SDI Global Placement" 202) according to the netlist, the technology, and commands/parameters (such as those from "Commands and Parameters" 130, of FIG. 1). If global placement results are acceptable (i.e. suitable as a starting point for further processing), then flow proceeds ("OK" 202Y). If the global placement results are not acceptable, then flow loops back ("Not OK" 202N, "Repeat" 220, and "Revise" 202R) to repeat all or portions of the global placement. Revised global placement processing (via "Revise" 202R) in certain embodiments includes modifying any combination of the netlist, global placement commands and parameters, and manufacturing technology (such as specifying a larger die, or a denser device fabrication process) based in part upon previous processing.

Subsequent to acceptable global placement, resources are reconciled according to the global placement and manufacturing information ("Legalization" 203), resulting in elimination of areas of oversubscribed resources. In certain embodiments modifications are made to the global placement results (effecting "movement" of placed elements) thus producing a legalized placement. If legalization results are acceptable, then flow proceeds ("OK" 203Y). If the legalized placement is not acceptable (or not computed), then flow loops back for additional processing ("Not OK" 203N). In certain embodiments the additional processing is based on previous processing, and may include repeating any portion of global placement ("Revise" 202R via "Repeat" 220) and continuing onward, or repeating any portion of legalization ("Revise" 203R via "Repeat" 220), according to various usage scenarios and embodiments.

After acceptable legalization, then nearly final (or "exact") locations and implementations for the devices are determined ("(SDI) Detailed Placement" 204). Relatively small-scale adjustments are made to legalization results, via any combination of placed element movement and placed element implementation, according to embodiment. In certain structured array embodiments, the placed element implementation includes morphing of selected devices to functionally equivalent alternatives. If detailed placement results are acceptable, then flow proceeds ("OK" 204Y). If the detailed placement is not acceptable (or not computed), then flow loops back for additional processing ("Not OK" 204N). In certain embodiments the additional processing is based in part upon previous processing, and may include repeating any portion of previous place and route functions and then continuing onward (such as via any of "Revise" 204R, "Revise" 203R, and "Revise" 202R by way of "Repeat" 220).

Subsequent to detailed placement, delay paths are minimized ("Timing Closure" 205), in certain embodiments to meet user specified timing, in various ways according to embodiment and/or user option or configuration. In certain embodiments the detailed placement is analyzed and buffers (or buffer trees) are inserted in high fanout and timing-critical nets. In some embodiments drivers are resized and optimized to meet maximum capacitance and/or required time constraints with respect to timing critical receivers. In some embodiments clock networks are synthesized, while in other embodiments the clock networks are predefined. In either case the appropriate clock network elements are inserted into the netlist for clock distribution and to meet clock skew constraints. Further according to embodiment and/or user option or configuration, other timing closure driven optimizations are performed (see "Timing Closure", elsewhere herein). If the timing closure results are acceptable, then flow proceeds ("OK" 205Y). If the timing closure is not acceptable, then flow loops back for additional processing ("Not OK" 205N). The additional processing may include repeating any portion of previous place and route functions, based in part upon previous processing and then continuing onward (such as via any of "Revise" 205R, "Revise" 204R, "Revise" 203R, and "Revise" 202R by way of "Repeat" 220). Note that in some embodiments flow loops back as a natural consequence of timing closure processing, rather than merely as a result of not-acceptable timing closure results. For example, certain timing closure techniques call for repetition of previous processing (such as one or more of "SDI Global Placement" 202, "Legalization" 203, and "(SDI) Detailed Placement" 204), using various combinations of modified behaviors and parameters, along with optional changes to the netlist and constraints, according to various embodiments.

After timing closure is complete (or considered "close enough"), the resultant devices are wired together according to the resultant netlist ("Routing" 206), and corresponding interconnect is generated. If the routing results are acceptable, then flow proceeds ("OK" 206Y). Place and route processing is then complete ("End" 299), and results are available for further use, such as any combination of analysis and mask generation ("Generate Fabrication Data" 106 of FIG. 1, for example). If the routing results are not acceptable, then flow loops back for additional processing ("Not OK" 206N). In certain embodiments the additional processing is based in part upon previous processing, and may include repeating any portion of previous place and route functions and then continuing onward (such as via any of "Revise" 206R, "Revise" 205R, "Revise" 204R, "Revise" 203R, and "Revise" 202R by way of "Repeat" 220).

Various combinations of place and route processing functions (such as "SDI Global Placement" 202, "Legalization" 203, "(SDI) Detailed Placement" 204, "Timing Closure" 205, and "Routing" 206) may include reading and writing shared information (such as references to "Working Data" 131, of FIG. 1). Examples of working data include netlists, constraints, progress indicators, and other similar shared processing items. Various combinations of the aforementioned place and route processing functions also may include receiving one or more inputs specifying requested behaviors or processing (such as information from "Commands and Parameters" 130, of FIG. 1). Examples of commands and parameters include scripts specifying iteration closure conditions, control parameters, goal descriptions, and other similar information to guide processing. The commands and parameters may be provided via any combination of scripts, command line inputs, and graphical user interfaces, according to various embodiments.

In some embodiments processing of one or more elements of FIG. 2 is optional, or performed only for selected iterations though the illustrated flow. For example, timing closure operations may be operative in a first processing mode where legalization and detailed placement are skipped, and processing relating to timing closure is partially performed as part of global placement. Alternatively the first processing mode may be viewed as global placement operations being performed to a limited extent, then analyzed and further directed by timing closure operations (without legalization or direct placement), and then additional global placement operations being performed. Eventually a second mode of processing may be entered where legalization and detailed placement are performed, optionally followed by additional timing closure operating as in the first mode or operating in a manner specifically tailored to the second mode (see "Timing Closure", elsewhere herein).

Simultaneous Dynamical Integration (SDI) Directed Global Placement

Conceptually SDI may be understood as modeling each individual device of the netlist as a node, or point particle, having an associated mass, position (or location), and velocity. The nodes representing the devices of the netlist are coupled by and interact with each other via attractive and spreading forces. The forces may include attractive forces representing electrical connections between the devices (as specified by the netlist), and spreading forces modeling resource requirements versus availability (such as a density of logic gates needed versus a density of logic gates on hand). The nodes and effects of the coupling forces are simulated as evolving over time as governed by a system of coupled ordinary differential equations using continuous variables, according to classical Newtonian mechanics (i.e. force equals mass multiplied by acceleration, or F=ma). Thus locations of nodes (corresponding to device placements) evolve over time from initial positions to subsequent positions (corresponding eventually to the global placement result for the devices).

More specifically, the independent variables in the dynamical system simulation include configuration-space variables (position and velocity) of the nodes. In certain embodiments the position and velocity representations are multi-dimensional quantities (two or three dimensions, for example), according to usage scenario and embodiment. Force terms in the coupled equations of motion are related to any combination of the topology of the connections of the devices, timing analysis of evolving device locations (placement), obstructions, and region constraints (fixed and floating), according to embodiment. Force terms may also be related to any combination of partial node density, partial resource usage density, viscous damping, energetic pumping, interconnect congestion effect modeling, power or clock distribution, and signal integrity representation, according to embodiment. Force terms may include any function of the independent variables, provided commands and parameters, and other similar mathematical devices useful in managing numerical behavior of continuous time integration of the system of nodes and forces.

In certain embodiments the obstructions are represented as exclusion zones, and arise as a result of architectural considerations, location-fixed (or predetermined) blocks (such as large RAM arrays or IP elements), and other similar placement limiting conditions. In certain embodiments the region constraints are represented as fixed, relative, or floating location requirements on selected devices of the netlist. Corresponding position requirements (such as an initial position with no subsequent change during system simulation time) are imposed for the corresponding nodes in the dynamical simulation. Various combinations of region constraints (relating to integrated circuit floorplan specifications, for example) may be developed by any combination of automatic techniques (by software, for example) and manual techniques (by users), according to usage scenarios and embodiments.

Conceptually the system of coupled simultaneous differential equations is operational in continuous variables. While it is envisioned that certain embodiments will perform at least some of the integration according to true analog integration techniques, in which the state variables are actually continuous, in digital computer embodiments, the integration is performed using digital integration techniques. Digital computers are limited to representing all quanta with finite-precision variables and that continuous time integration may be implemented on digital computers using "pseudo-continuous" numerical approximation techniques, a.k.a. "numerical methods." Even when implemented using finite-precision approximations, the "continuous variables" abstraction is a useful way to conceive and describe some of the techniques described herein and to distinguish compared to other approaches using conceptually discrete variables. Thus the term continuous as used throughout this disclosure should be interpreted in accordance with the foregoing.

In digital computer embodiments, continuous state variables (including those variables representing simulation time, mass, location, and velocity) are approximated as any combination of single, double, or extended floating-point numbers. The continuous time integration of the simultaneous coupled dynamical governing equations may be performed in digital computer embodiments by any suitable digital integration technique, such as Runge-Kutta, predictor-corrector, leap-frog, and any similar technique adaptable to continuous multi-variable state space integration. In some embodiments the integration technique is chosen for suitability based at least in part on adaptability to parallel processing (see "Computer System Executing SDI-Directed EDA Routines", elsewhere herein).

The forces acting in the system provide coupling between the nodes and act to accelerate the nodes over time, resulting in movement of the nodes throughout the state-space over time. A set of attractive forces (known as "net attractive forces") is modeled to represent connectivity between the devices of the netlist, or more specifically between pins (i.e. terminals of circuit elements) of devices. In some embodiments the net attractive forces are modeled as individual springs between a pin of one device and a pin of another device, with every interconnection between any two pins being modeled as a corresponding spring. Force associated with each spring is computed according to Hooke's law (force is proportional to distance between the pins). The net attractive force acting on each device is a vector sum of all net attractive forces acting on all of the pins of the respective device.

In some embodiments the constant of proportionality used to calculate spring force is identical for all springs. In some embodiments the constant of proportionality is dependent on the fanout of a net (i.e. the number of pins connected together). In some embodiments relatively high fanout nets are considered to be one or more drivers providing a signal to one or more loads. Springs between the loads of the relatively high fanout nets are eliminated (while springs from drivers to loads are retained). In some embodiments springs between drivers and loads have a different constant of proportionality than other springs. Modeling of net attractive forces is not restricted to ideal springs, and may instead be based on a general linear or non-linear force model, according to various embodiments.

A set of spreading forces (known as "spatial spreading forces") is modeled based on one or more macroscopic density fields. In certain embodiments the density fields are computed based on analysis of metrics associated with respective devices corresponding to the nodes (and their locations) in the dynamical system. The metrics may include any combination of standard cell area (in, for example, standard cell flow processing), fabric resource consumption (in, for example, SAF flow processing), equivalent gate count, and other similar functions of node properties. In some embodiments the spatial spreading forces (see "Field-Based Force Components", elsewhere herein) are with respect to a density field based on resource utilization of corresponding nodes in a local region. In some embodiments resource utilization may be evaluated using an area averaging or summation of nearby devices or an equivalent-gate count rating (cost function) of spatially close devices.

In some embodiments a plurality of density fields are computed with respect to a plurality of metrics. In some embodiments any combination of first, second, and third density fields are computed with respect to first, second, and third categories of logic devices (such as combinational logic devices, sequential logic devices, and total logic devices). In some embodiments each of a plurality of partial density fields is computed according to a set of respective non-interchangeable morphing classes (such as combinational and sequential morphing classes) associated with an underlying SAF. In some embodiments (such as selected standard cell based design flows) the density fields are computed based wholly or partially on device area. In some embodiments (such as selected structured array based design flows) the density fields are computed based wholly or partially on resource utilization as measured by counts of the number of each type of resource needed to implement the function associated with each device in the netlist.

Other attractive and spreading forces may also be included, according to usage scenario and embodiment. Floorplan constraints, or various region constraints, may be expressed as attractive or spreading forces, or as potential wells (with a tendency to retain nodes in a region) or potential barriers (with a tendency to disperse nodes from a region), according to usage scenario and embodiment. For example, boundaries of a die, or locations of input/output (IO) rings may be expressed as fixed constraints that are mapped to attractive forces acting on nodes having interconnect to the IO ring. For another example, a selected region of the die may be excluded from use (such as for yield improvement or noise reduction) by fixed or relative (i.e. floating) constraints that are mapped to spreading forces acting on nearby or all nodes (see "Exclusion Zones", elsewhere herein). In other embodiments or modes of operation, such floorplan constraints may be implemented through coordinate clipping inside the integrator, thereby preventing the motion of devices into disallowed regions.

User specified circuit timing constraints may warrant that certain pins in the netlist be moved closer together to improve the performance of the design. A corresponding set of attractive forces between drivers and select loads is fed into the system as attractive forces with configurable binding strength.

Viscous Damping

Forces other than attractive and spreading forces between nodes or other elements may also be accounted for. As an example, a viscous damping force may be included as a way to (a) compensate for the effect of numerical errors (potentially incurred by the time integration and spatial differencing techniques used) contributing toward numerical heating, and (b) change the ratio between kinetic and potential energy of the node distribution. The damping serves to decelerate the ballistic motion of a node. One embodiment of such a force on a given node is a term proportional to the negative of the node velocity, with the proportionality constant being equal to $\mu$, the global coefficient of viscosity. The value of $\mu$ may be supplied by direct manual input (by a user) or via automatic control, (under software control) according to embodiment, to provide partial control of the node distribution as a whole.

While $\mu$ is a global constant, it may have a local effect, and thus in some embodiments other parameters are selected for manipulation to provide control of the node distribution as a whole. For example, in some implementations a ratio of KE/TE, where KE is the kinetic energy of the node distribution and TE is the total energy of the system, is a convenient control parameter.

In some embodiments, the global viscosity coefficient is split into two terms, a gradually drifting term and a dynamically calculated term. The gradually drifting term enables the system to gradually adapt to time varying forces or parameter changes, while the dynamical term prevents runaway acceleration on a per-timestep basis.

Each timestep the total effective $\mu$ is adjusted in response to normalized kinetic energy (KE/TE) changes from a selected target value. In certain embodiments the adjustment to $\mu$ is given by:

```
If KE/TE > target then:
    dm = cdm1 * ( (KE/TE / target) − 1 ) + cdm2 * ( (KE/TE / target) −
    10 )^2
    μ_eff = μ * ( 1 + dm )
    μ *= (1 + <small adjustment>)
If KE/TE < target then:
    dm = cdm1 * ( (target / KE/TE) − 1 ) + cdm2 * ( (target / KE/TE) −
    10 )^2
    μ_eff = μ / ( 1 + dm )
    μ /= (1 + <small adjustment>)
where:
    double mu_max = 1.e+8;
    double cdm1 = 1.;
    double cdm2 = 0.01; and
```

Note that "double" refers to double-precision variables used in some embodiments.

The <small adjustment> may vary with the relative difference between the target and actual values of KE/TE, and tends to be small compared to 1. The term "mu_max" limits $\mu$ to prevent numerical problems with a timestepper used for numerical integration. The quadratic term contributes little until KE/TE differs from the target by a factor of 10, and quenches runaway conditions.

By splitting the calculation of $\mu$ into a purely dynamical term and a slowly varying term, the system remains generally stable while retaining an ability to react quickly to energy spikes. Further, by using a constant $\mu$ during the course of the time integration, performance may be enhanced, as operation counts are substantially reduced and adaptive integrator timesteps (if relevant) may be allowed to increase.

In some embodiments a viscous damping proportionality constant is identical for all nodes in the system, while in other embodiments one or more distinct proportionality constants may be employed. For example, in certain embodiments the viscous damping proportionality constant is modeled as a scalar field of position and the value of the constant at the position of each circuit device is computed. Moreover, in certain embodiments the scalar field is analytically specified, and selectively includes a dependence upon the independent time variable. In other embodiments the scalar field is a derived quantity computed from other numerical characteristics that may be evaluated for the time-evolving simulation. Additionally, the viscous force is not limited to being proportional to the velocity of a node. In certain embodiments the viscous force instead follows a functional form based on other selected state of the system.

The aforementioned forces are merely representative examples. Forcing terms may be associated with interactions between one or more nodes, and between one or more fixed (or immovable) elements. Forcing terms may also be associated with fields that may be dependent in some way upon one or more nodes, or with fields that are independent of nodes. These and all similar types of forcing terms are contemplated in various embodiments.

Thus forces on the nodes of the system include direct interactions with topological neighbors (according to the netlist), collective interactions involving numerical constructs associated with temporal bulk properties of the node distribution, and with architectural features of the implementation. The result of the combination forces impinging on the system nodes is a complex dynamical interaction where individual nodes meander through the placement domain under the influence of the forces and wherein the forces vary continuously with the motion of all nodes in the netlist. The motion exhibits both chaotic and coherent behaviors. The motion of a given node may appear chaotic in the sense that the node trajectory may meander back and forth as a result of connections to other nodes. Yet the system may also exhibit coherent (or collective) motion in the sense that tightly connected nodes will tend to move in bulk and remain in proximity to topological neighbors even as the tightly connected nodes collectively move far from respective starting points.

The integration of the governing equations of motion proceeds using standard techniques of numerical integration. (See for example, a reference describing numerical integration). As an example, the next several paragraphs assume the use of a Runge-Kutta integrator.

The computation of the forcing terms is referred to as "computing the derivatives". Differentiation is denoted with respect to time by ' (prime), so that $dx/dt=x'$, $d^2x/dt^2=x''$, and so forth. The following variables are introduced to set up the governing equations for solution by numerical integration:

$$v_{x,i}=(x_i)'$$

$$v_{y,i}=(y_i)'$$

The subset of the system of equations relating to the ith node (for a two-dimensional layout application) is:

$$(x_i)'=v_{x,i}$$

$$(y_i)'=v_{y,i}$$

$$(v_{x,i})'=F_{x,i}$$

$$(v_{y,i})'=F_{y,i}$$

Thus the system of simultaneous second order differential equations is transformed to a (larger) system of simultaneous first order differential equations, where the right hand side of each equation is the derivative of the respective left hand side. Conceptually computation of a derivative per se is not required (unless some element of the forcing terms is itself expressed as a derivative of something else), but rather the right hand sides of the equations are the derivatives.

There is time-varying complexity in the behavior (character of motion) of the moveable nodes in the netlist when the forcing terms are time varying. In some embodiments a time varying timestep is used to preserve numerical accuracy and to continue processing until convergence criteria (error limits) are met during each timestep in the integration.

The integrator accepts as input a specification of a desired timestep, and then processes the timestep in two ways: once directly, and once as two half-steps. If the results are not close enough as determined by a specifiable error-norm, then the target timestep is reduced until it is possible to perform the one-step plus the two-half-steps approaches with results within an error norm. Besides new coordinate values for the independent variables, the integrator also returns the length of the timestep just taken and the advised length for the next timestep. Thus during periods of laminar motion when numerical convergence is readily achieved, the timestep trends longer on successive calls to the integrator. But in periods of turbulent or chaotic motion, where convergence requires more effort, the timesteps become as small as needed to ensure the accuracy of the integration.

Figure 3A:
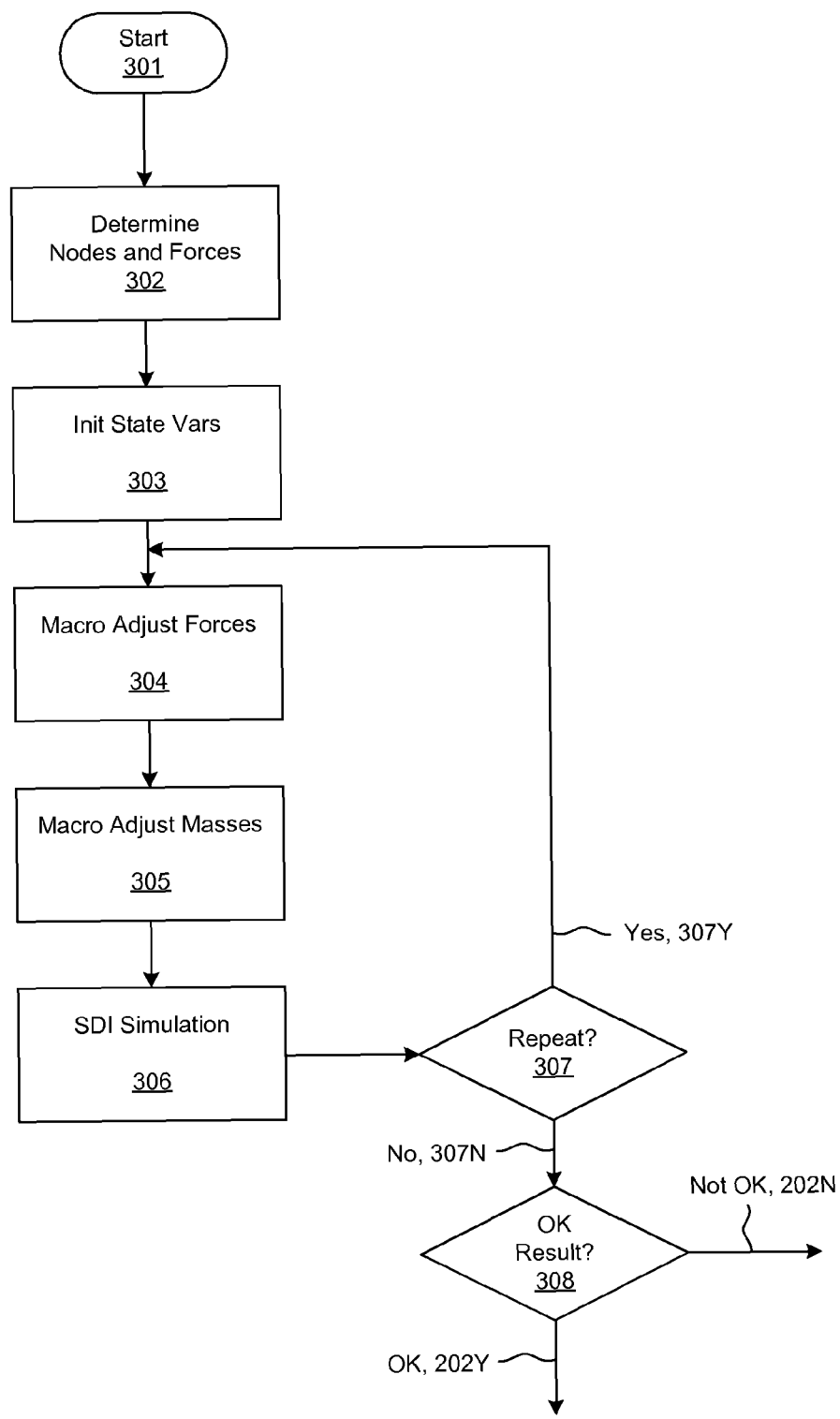
FIG. 3A is a flow diagram illustrating selected details of an embodiment of global placement according to SDI-based modeling and simulation.

FIG. 3A is a flow diagram illustrating selected details of an embodiment of global placement according to SDI modeling and simulation, such as operations referred to elsewhere herein ("SDI Global Placement" 202, of FIG. 2, for example). Overall the flow includes various functions to enable and perform a series of dynamical simulations based on Newtonian mechanics on a system representing the netlist and associated design constraints and targets. The simulations use SDI techniques to orchestrate the interactions between particles (representing netlist devices). The SDI techniques make use of fields that are calculated as functions of the particle positions. The functions include determining a set of nodes corresponding to the devices in the netlist, initialization of state variables (including mass, location, and velocity associated with each node), adjusting forces, and evolving the resultant system of simultaneous dynamical governing equations forward in time via integration. The flow is repeated beginning at the adjustment processing until a suitable result is available, or it is determined that a suitable result will not become available without further processing outside of the illustrated flow.

Processing begins ("Start" 301) with receipt of pre-processed information, in certain embodiments as data structures representing the netlist and the associated devices and connectivity ("Pre-Process" 102, of FIG. 1, for example). Further data structures for representing a system of nodes and forces are created and initialized ("Determine Nodes and Forces" 302), with each node in the system corresponding one-to-one with each device of the netlist, and with each node having a corresponding set of forces acting on it. State variables for the dynamical simulation are initialized ("Initialize State Variables" 303), including determining starting values for mass, location, and velocity state variables for each node. The initial node locations correspond to initial placements of the corresponding netlist devices (see "Initial Placement", elsewhere herein). Initial force values are also determined.

Large-scale goal-driven modifications to the forces in the system are then made ("Macro Adjust Forces" 304). In some embodiments one or more attractive forces are over- or under-weighted for periods of time, and one or more spreading forces may also be reduced or increased in relative proportion to the attractive forces. For example, a "condensing" phase may inflate attractive forces and deflate spreading forces, and an "extending" phase may deflate attractive forces and inflate spreading forces. Operations associated with the macroscopic force adjustment track simulation time and change the forces according to condensing and extending phases. During the phases of system evolution, the coordinates of individual nodes continue to evolve separately based on the governing equations for each individual node. Consequently, the behavior of any individual node may vary from the bulk behavior of the collective system.

Other large-scale force adjustments may also be made, according to embodiment, including entirely removing one or more forces for a period of simulation time, and introducing a new force. The removal (or introduction) of a force may be at a predetermined point in simulation time, at a point in simulation time determined by computation of a test condition, any similar mechanism, and/or at the discretion of a human operator of the system, according to various embodiments. In certain embodiments the removal (or introduction) of a force is gradual, and the rate of change of the removal (or introduction) may vary over simulation time or be constant, according to implementation. In some embodiments the macroscopic force adjustments are in response to various force-control instructions and input data (such as represented conceptually by "Commands and Parameters" 130, of FIG. 1).

Large-scale goal-driven modifications to the effects of masses in the system are then made ("Macro Adjust Masses" 305). In certain embodiments the effects of masses are modified during phases where node densities are being adjusted to more evenly distribute resource consumption, or to more evenly match resources needed with resources available. For example, in usage scenarios including global placement of devices according to SAF tiles, macroscopic mass adjustments may be made to "encourage" cells in over-subscribed regions to "move" to less subscribed regions (see "Depletion Weighting", located elsewhere herein). As in the case of macroscopic force adjustments, macroscopic mass adjustments may be varied according to simulation time phase, and may be gradually introduced (or removed) over the course of system evolution throughout simulation time. In some embodiments the macroscopic mass effect adjustments are in response to various mass-control instructions and input data (such as represented conceptually by "Commands and Parameters" 130, of FIG. 1). Note that adjusting the effects of mass, in certain embodiments, is with respect to densities and forces brought about by the masses, while the momentum of each of the nodes having adjusted mass effects remains unchanged.

A dynamical simulation of the nodes (as point particles) according to the mass, location, velocity, force, and other state variables is performed ("SDI Simulation" 306) for some amount of system simulation time. The time may be a predetermined interval, dependent on specific completion criteria (as provided to the SDI simulation), and any similar interval specification scheme, according to various embodiments. At the end of the simulation time the system arrives at a new state. In certain embodiments the new state includes new locations for one or more of the nodes, and the new locations of the nodes are interpreted as corresponding to new locations for the devices being placed.

According to various embodiments, any combination of the system variables (including simulation time and node mass, location, and velocity) and corresponding interpretations of the system variables in the context of the netlist (including device location and density) are examined to determine if portions of the flow should be repeated ("Repeat?" 307) or if flow is complete ("OK Result?" 308). If repeating the flow would likely improve results, and no other end condition has been met, then flow loops back ("Yes" 307Y) to macro adjustment of selected forces and masses. In some embodiments configurable settings are adjusted prior to or in conjunction with force and mass macro adjustments (such as settings associated with "Commands and Parameters" 130, of FIG. 1). If the global placement is close enough ("No" 307N), then flow is complete ("OK" 202Y) and processing continues to legalization (see FIG. 2). If there would likely be no benefit in iterating the global placement ("No" 307N), and the results are not acceptable, then flow is also complete ("Not OK" 202N), but subsequent processing then includes one or more revisions (see FIG. 2).

Tests to determine if the flow is to be repeated may be made for a predetermined end condition, a predetermined rate of change, other similar criteria, and any combination thereof according to assorted implementations. In some embodiments the flow is not repeated even if improvement is likely possible (for example if an interval of simulation time has expired).

Determinations ("Repeat?" 307 and "OK Result?" 308) are according to any combination of automatic (software program) and manual (human user) techniques, according to various embodiments. For example, an automatic technique may include software determining if the most recent iteration is a significant improvement over a previous iteration. If so, then repeating the flow is beneficial. As another example, a manual technique may include a user observing the time-evolving locations of devices and noticing that further improvements are possible and that repeating the flow would be beneficial. Another manual technique may include a user determining that the placement as changing over time is "stuck", perhaps due to some incorrectly specified constraints, and that additional iterations of the global placement flow are not likely to be beneficial unless modifications are made to the constraints.

Any portion (or all) of global placement may be performed according to various techniques, in addition to the aforementioned SDI directed technique. The additional techniques include simulated annealing, objective minimization techniques such as conjugate-gradient, chaotic processing, and other similar mechanisms to provide approximate or "close enough" device coordinates, according to various embodiments.

Initial Placement

Figure 3B:
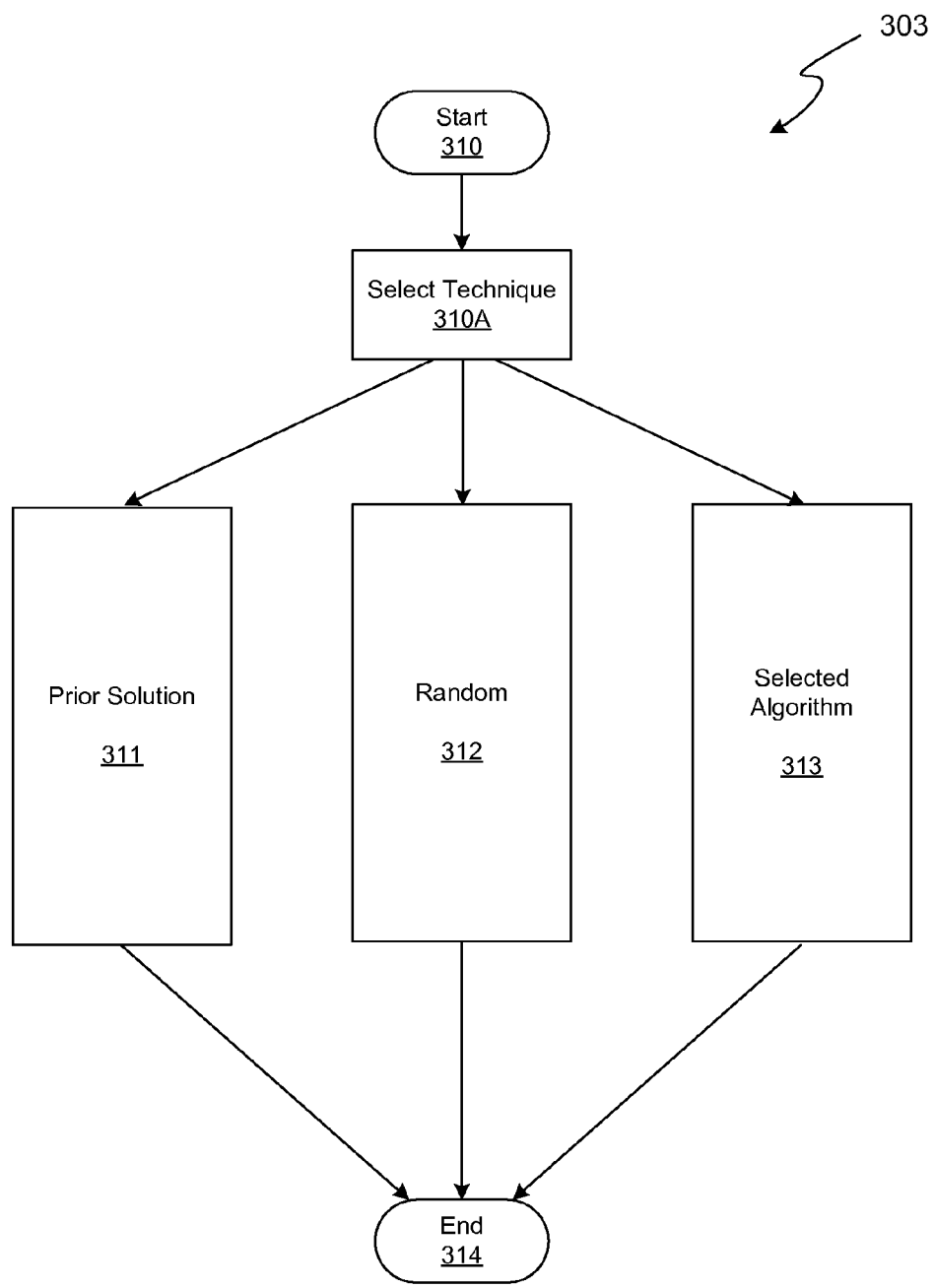
FIG. 3B is a flow diagram illustrating selected details of an embodiment of initial placement operations for global placement.

FIG. 3B is a flow diagram illustrating selected details of an embodiment of initial placement operations for global placement, such as selected operations performed while initializing state variables (as in "Initialize State Variables" 303 of FIG. 3A). Processing begins ("Start" 310) and then one of a plurality of starting location definition techniques is chosen ("Select Technique" 310A), based, in some embodiments, on instructions provided by a user (such as information from "Commands and Parameters" 130, of FIG. 1). A first technique determines an initial placement based on a placement performed in the past ("Prior Solution" 311). A second technique formulates an initial placement based on randomization ("Random" 312). A third technique develops an initial placement according to any of a number of other mechanisms ("Selected Algorithm" 313), chosen by any combination of software and user input. The chosen technique is then performed and processing is complete ("End" 314).

Mass Determination

In some embodiments, determination of mass (as in "Determine Nodes and Forces" 302, for example) is dependent on the design flow or implementation context (such as application specific, structured array, mask-definable gate array, mask-programmable gate array, FPGA, and full custom). For example, in a standard cell context, the mass of a node may be computed as a function (such as a linear function) of area occupied by the corresponding device in the netlist. For another example, in a structured array context, the mass of a node may be computed with respect to consumption of resources provided by the structured array, or with respect to local availability or scarcity of the resources, according to the corresponding device as implemented by the resources. For another example, in an FPGA context, the mass of a node may be computed according to consumption of Look Up Table (LUT) resources, or similar switching and/or routing resources.

In some embodiments the spatial spreading forces (see "Field-Based Force Components", located elsewhere herein) are with respect to a density field based on resource utilization (such as an area averaging or summation of nearby devices or an equivalent-gate count cost function of spatially close devices) of corresponding nodes in a local region. In some embodiments first and second density fields are computed with respect to first and second categories of logic devices (such as combinational logic devices and sequential logic devices).

Field-Based Force Components

In some embodiments various elements of the spatial spreading forces are with respect to one or more resource usage based density fields, or other types of density fields. The density fields are managed independently, and may include any combination of all nodes, combinational nodes, and sequential nodes. Computation of density fields and resultant spreading forces conceptually includes calculating local densities according to a discrete grid, computing density fields, allocating field strengths according to the discrete grid to system nodes, and calculating resultant spatial spreading forces acting on the system nodes. In some embodiments the discrete grid is a uniform (or non-variable) grid, and in some embodiments the grid is a non-uniform (or variable) grid, the grid being implemented according to architectural considerations. Local density calculation includes summing resource usage computed in continuous spatial variables (i.e. node location and mass) according to the discrete grid and digitally filtering the resultant gridded scalar field. The local density calculation includes special accounting for edges of the grid. The digital filter result is suitable for processing by a field solver. Density field computation performed by the field solver includes determining density fields (given density values on the grid) and digitally filtering the result. Allocating field strengths includes interpolating field strengths to nodes (in continuous location space) while accounting for edges of the grid. Repulsive (or spreading) forces are then computed according to the allocated field strengths.

In some embodiments the grid is a unit grid, and the region enclosed by adjacent grid lines is termed a "cell". The grid may be two-dimensional (i.e. x and y) or the grid may be three-dimensional (i.e. x, y, and z), according to implementation technology and other design-flow related parameters. In some embodiments resource usage density is proportional to the respective mass of each node, and the mass is in turn directly proportional to a "gate rating" that is a measure of relative cost of implementing a logic function corresponding to the node. In some embodiments the gate rating of the node is measured in "gate-equivalents" commonly associated with design-flow device selection criteria.

Figure 3C:
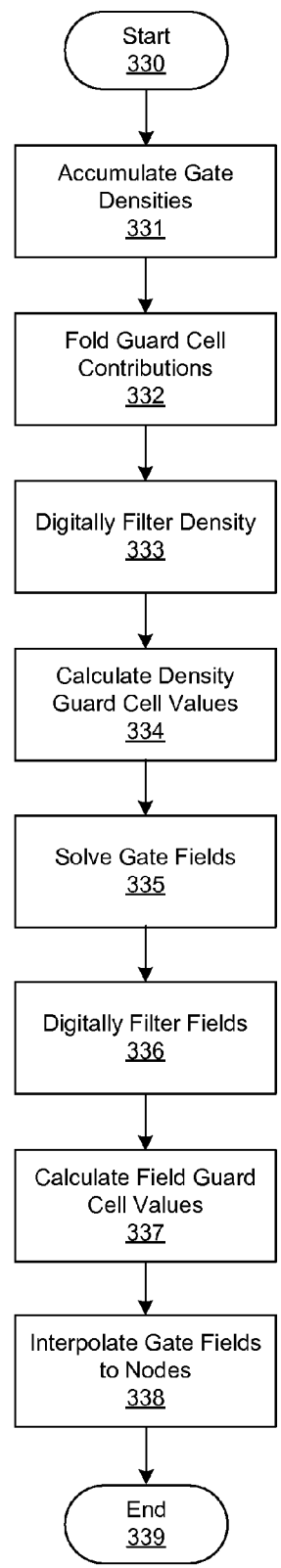
FIG. 3C is a flow diagram illustrating selected details of an embodiment of density field based force component computation.

FIG. 3C is a flow diagram illustrating selected details of an embodiment of density field based force component computation, in a specific context of resource usage densities expressed in certain embodiments as mass that is proportional to gate rating. The operations of the flow are performed for each of a possible plurality of density fields, each field having separate accounting. Flow begins ("Start" 330), and proceeds to determine local resource usage density by accumulating system node masses with respect to a scalar field organized as a regular grid (in the illustrated embodiment) according to the SDI simulation spatial field ("Accumulate Gate Densities" 331). The grid is finite in size, completely covering space in the system simulation corresponding to the area available for the devices of the netlist (either an entire die or a portion thereof). The grid is extended, via one or more guard grid locations (or grid cells) one or more units around each border of the area (the boundaries of the area) to more accurately and efficiently model edge effects. The guard grid elements are then included in the gate density calculation ("Fold Guard Cell Contributions" 332). The single-unit guard-cell buffer is used in some embodiments employing two and three-point allocation/interpolation schemes, and a multi-unit guard-cell buffer is used in some embodiments having higher order allocation schemes.

The resultant density values are then further optionally processed ("Digitally Filter Density" 333), according to embodiment, to smooth variations caused by grid element representation inaccuracies. Density values for guard grid elements are then determined ("Calculate Density Guard Cell Values" 334) to enable straightforward and efficient field solver implementations. Density field computations ("Solve Gate Fields" 335) are then performed by the field solver, determining the field value at each point as equal to minus the gradient at the point (i.e. field=−Grad(n)). Any field solution technique applicable to calculating a derivative with respect to a discrete grid may be used, such as a second order finite difference formula, or any other suitable technique, according to embodiment. In some embodiments the second order finite difference formula is given as the derivative at grid point "i", and is equal to one-half the quantity equal to the difference of the values at adjacent grid points along one of the orthogonal dimensions (i.e. field(i)=(density(i+1)−density(i−1))/2). Derivatives are calculated for each orthogonal dimension of the system node space (two or three dimensions, according to embodiment). The result is a gridded vector field for each gridded density (such as all, combinational, and sequential).

In some embodiments vector field values are stored in a data structure as a tuple. Each member of the tuple corresponds to a value associated with an orthogonal dimension of the vector field, and there is a tuple associated with each grid point. In some embodiments vector field values are stored separately as scalar fields, according to each vector field orthogonal component. Each respective scalar field represents all grid points. In some embodiments vector field values are stored according to other arrangements that are mathematically equivalent to tuples or scalar fields. In addition, vector fields may be stored in various combinations of tuple, scalar field, and other forms, according to embodiment. The representation employed for the vector fields may also change during processing to enable more efficient computations. Further, during processing, any portion of vector field representations may be stored in any combination of processor cache memory (or memories), processor main memory (or memories), and disk (or other similar non-volatile long-term) storage, according to usage scenario and implementation.

The gridded vector fields are then processed according to a digital filter ("Digitally Filter Fields" 336). In some embodiments the filtering of the gridded vector fields is according to operations identical, except for edge processing, to the smoothing performed on density values (as in "Digitally Filter Density" 333). The difference between the filter operations is that for density filtering even parity is used when processing the boundaries, while for field filtering even parity is used for field components parallel to the boundary and odd parity is used for field components perpendicular to the boundary. The difference in parity accounts for the differentiation operation performed between density and field domains, such that parity is reversed from even (for density) to odd (for field) when differentiation is directed into a boundary. For a (scalar) density, even parity means values associated with guard grid points are added to interior grid points. For a (vector) field, even parity means the guard grid points are equal to respective closest inner grid points for, and odd parity means that the guard grid points are equal to the negative of respective closest inner grid points ("Calculate Field Guard Cell Values" 337). Thus the average field directed into (or out of) a boundary vanishes at the boundary. Assigning guard point field values enables subsequent efficient computation of field values in the continuous location representation of nodes from the discrete field values ("Interpolate Gate Fields to Nodes" 338). Corresponding forces may then be calculated according to node field values and node masses. Processing is then complete ("End" 339).

Figure 3D:
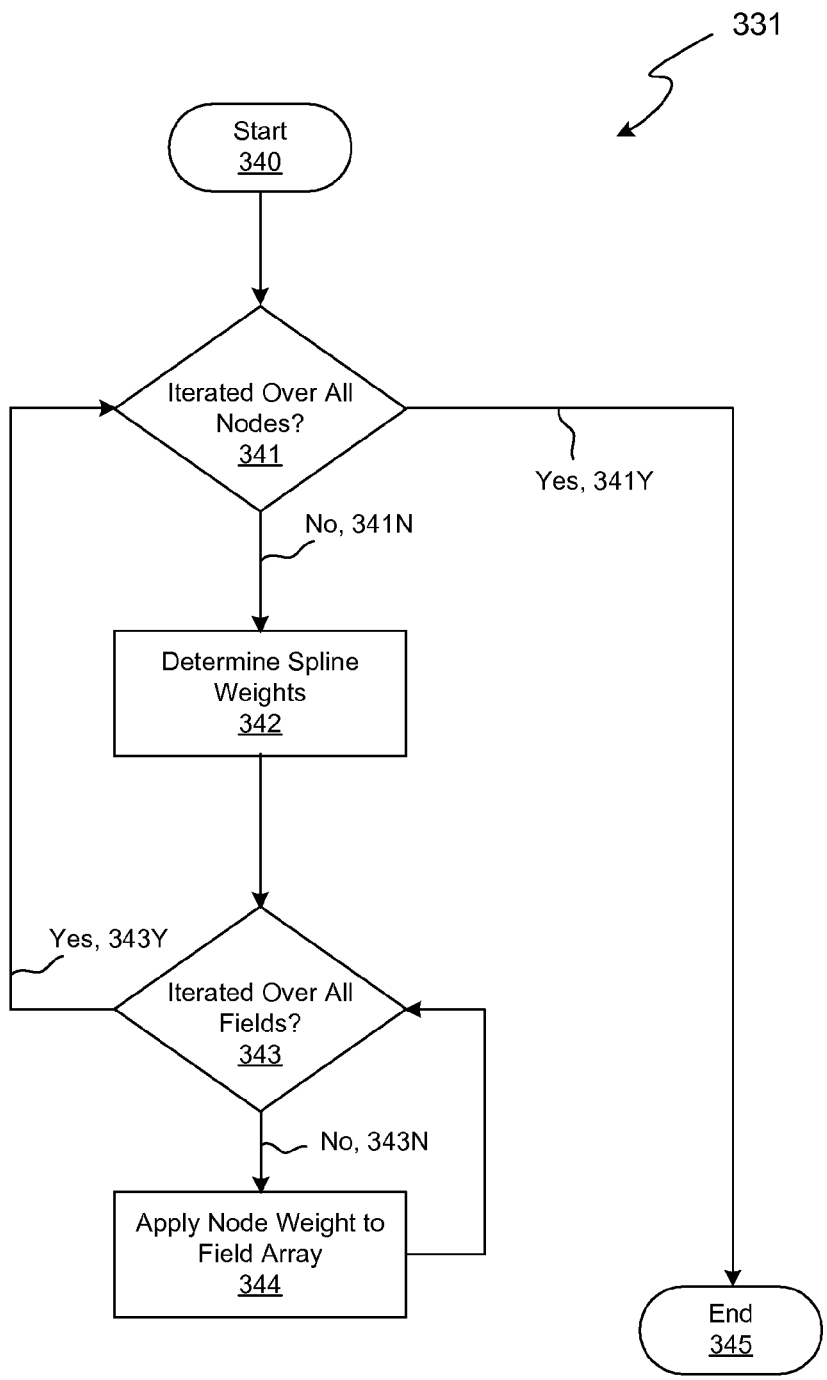
FIG. 3D is a flow diagram illustrating selected details of an embodiment of gate density accumulation.

FIG. 3D is a flow diagram illustrating selected details of an embodiment of gate density accumulation, such as operations referred to elsewhere herein ("Accumulate Gate Densities" 331, of FIG. 3C, for example). Conceptually mass associated with each node (represented in continuous location space) is allocated to a local neighborhood portion of the discrete grid points. Guard grid points are added around the boundary of the grid to efficiently process edge conditions. In some embodiments a two-point linear spline, also known as a Cloud-In-Cell (CIC) or area weighting technique, is used to allocate the mass of each node to four neighboring grid points. In some embodiments a three-point spline technique is used to allocate node mass to nine neighboring grid points.

More specifically, flow begins ("Start" 340) by initializing accumulation variables (such as to zero), and then a check is made to determine if processing is complete for all nodes in the simulated system ("Iterated Over All Nodes?" 341). If so, ("Yes" 341Y), then gate field interpolation processing is complete ("End" 345). If not, then a first (and subsequently a next) node is selected for processing, and flow continues ("No" 341N). Spline coefficients are then determined for the node ("Determine Spline Weights" 342), based on distances from the respective node to each field grid point (see the discussion of FIG. 3E, elsewhere herein).

After all of the spline weights for all of the grid points have been calculated, a check is made to determine if all fields the respective node contributes to have been processed ("Iterated Over all Fields" 343). If so ("Yes" 343Y), then processing loops back to check if all nodes have been processed. If not, then a first (and subsequently a next) field is selected for processing, and flow continues ("No" 343N). The effect of the node is then accumulated to the respective field array at each of the grid points currently subject to interpolation ("Apply Node Weight to Field Array" 344). Processing then loops back to determine if all fields have been processed.

Figure 3E:
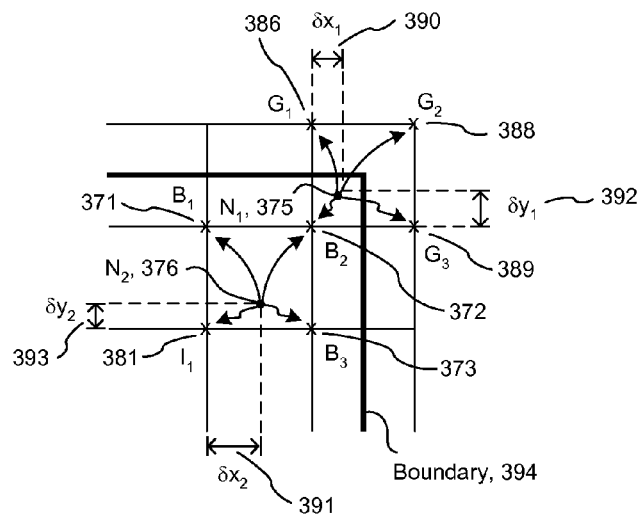
FIG. 3E is a conceptual diagram illustrating an embodiment of two-point interpolation of node mass to grid points.

FIG. 3E is a conceptual diagram illustrating an embodiment of two-point interpolation of node mass to grid points, as performed during mass accumulation (such as "Determine Spline Weights" 342, of FIG. 3D). Boundary 394 is shown to represent edges of the system simulation space (and corresponding edges of an integrated circuit region or die). Several points of the discrete grid are illustrated: interior point $I_1$ 381, boundary points $B_1$ 371, $B_2$ 372, and $B_3$ 373, and guard points $G_1$ 386, $G_2$ 388, and $G_3$ 389. Mass from node $N_1$ 375 is shown accumulating to four grid points ($G_1$, $G_2$, $G_3$, and $B_2$), according to distance along orthogonal dimensions of the system simulation location space ($\delta x_1$ 390 and $\delta y_1$ 392). Conceptually grid points $B_2$ and $G_1$ together receive $(1-\delta x_1)$ of the mass of $N_1$, while grid points $G_2$ and $G_3$ together receive $\delta x_1$ of the mass of $N_1$. More specifically each dimension is processed in a geometric fashion, so the total mass contribution from $N_1$ to $B_2$, for example, is $(1-\delta x_1)*(1-\delta y_1)$, and so forth. As illustrated in the figure, $\delta x_1$ is the projected distance along the x-axis from $B_2$ to $N_1$, and similarly for $\delta y_1$ with respect to the y-axis, $B_2$, and $N_1$.

The figure also illustrates mass allocation of node $N_2$ 376 to four neighboring grid points ($B_1$, $B_2$, $B_3$, and $I_1$), none of which are guard points. The mass contribution from $N_2$ to point $B_2$ is additive with the mass contribution from $N_1$ to $B_2$. Also, there may be any number of other nodes (not illustrated) within the same grid cell as either of nodes $N_2$ and $N_1$, and masses from the respective nodes are accumulated in the same manner as illustrated for $N_2$ and $N_1$.

Figure 3F:
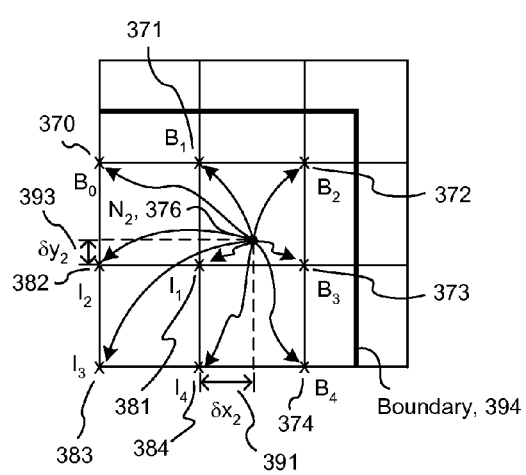
FIG. 3F is a conceptual diagram illustrating an embodiment of three-point interpolation of node mass to grid points.

FIG. 3F is a conceptual diagram illustrating an embodiment of three-point interpolation of node mass to grid points, as performed during mass accumulation (such as "Determine Spline Weights" 342, of FIG. 3D). The figure is representative of operations similar to FIG. 3E, except the node being processed according to mass accumulation affects masses accumulating for nine nearest-neighbor grid points ($B_0$ 370, $B_1$ 371, $B_2$ 372, $B_3$ 373, $B_4$ 374, $I_4$ 384, $I_3$ 383, $I_2$ 382, and $I_1$ 381). The formula representing accumulation to a point (such as $I_1$) is implementation dependent.

Figure 3G:
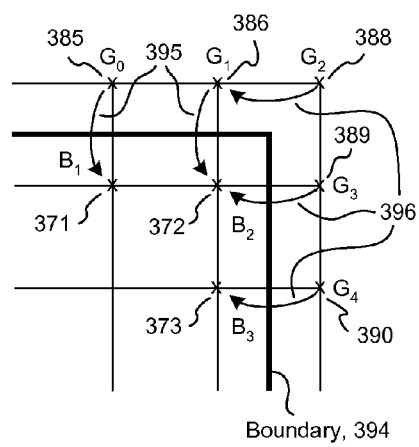
FIG. 3G is a conceptual diagram illustrating an embodiment of applying boundary grid point masses to interior grid points.

FIG. 3G is a conceptual diagram illustrating an embodiment of applying guard grid point masses to interior grid points, such as operations referred to elsewhere herein ("Fold Guard Cell Contributions" 332 of FIG. 3C, for example). The elements and representations are similar to FIG. 3E. In a first stage of processing, contributions of "right-hand column" guard elements ($G_2$ 388, $G_3$ 389, and $G_4$ 390) are summed, or "folded" into corresponding guard and interior elements of the adjacent column ($G_1$ 386, $B_2$ 372, and $B_3$ 373, respectively), as suggested conceptually by curved arrows 396. In a second stage of processing, contributions of "top row" guard elements ($G_1$ 386 and $G_0$ 385) are summed to (or folded into) corresponding interior elements of the adjacent row ($B_1$ 371 and $B_2$ 372, respectively), as suggested conceptually by curved arrows 395. The summation processing corresponds to even parity. Similar processing is performed for the other two edges of the region.

Figure 3H:
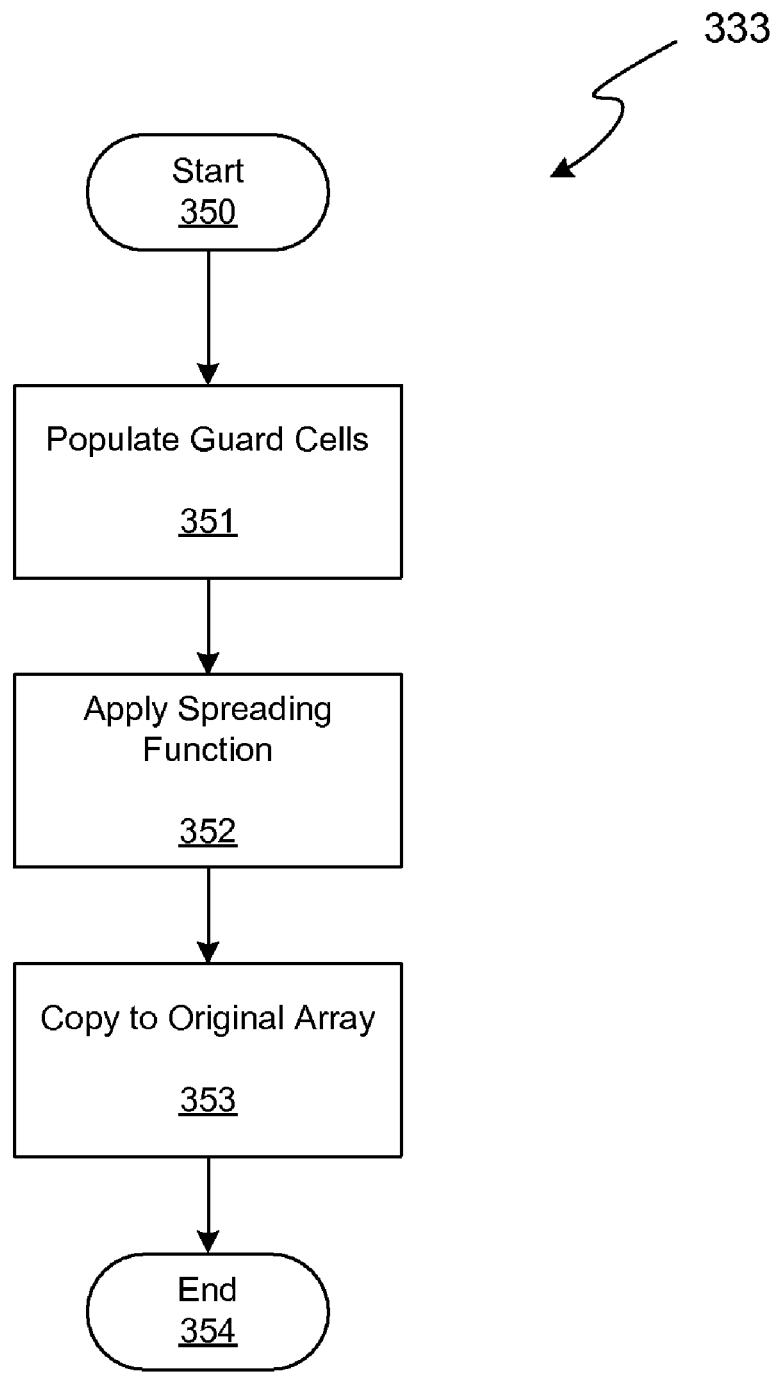
FIG. 3H is a flow diagram illustrating selected details of an embodiment of digital density filtering.

FIG. 3H is a flow diagram illustrating selected details of an embodiment of digital density filtering, such as operations referred to elsewhere herein ("Digitally Filter Density" 333, of FIG. 3C, for example). Conceptually each density grid is filtered, alone or in combination with other density grids, according to embodiment. Filtering each density grid may include filtering all of the elements of the respective grid, although in certain embodiments filtered elements may be selected. Applying the digital density filtering process includes determining edge conditions for each grid element, "smoothing" temporary copies of elements of the grid, and replacing the original grid elements with the smoothed elements.

More specifically, flow begins ("Start" 350) and a working copy of grid elements is created. Then additional elements are added "outside" the spatial boundaries of the temporary grid ("Populate Guard Cells" 351). The added guard elements enable more useful smoothing results in some usage scenarios. Then a local averaging is performed on elements of the temporary grid, including the guard elements ("Apply Spreading Function" 352). In some implementations the spreading function reduces numerical artifacts associated with short-wavelength density fluctuations. In some usage scenarios the numerical artifacts arise due to inaccuracies in representation of a grid or grid elements.

Any combination of smoothing functions may be used, according to various embodiments, including relatively conservative and relatively more aggressive techniques. In some embodiments a binomial weighting function implementing a 1-2-1 spreading (with a subsequent division by four to preserve total mass) over spatially neighboring grid element values is used. In some embodiments the binomial weighting is performed in any number of orthogonal dimensions, up to and including the maximum number of spatial dimensions represented in the SDI simulation. After completing the spreading processing, the temporary elements are used to replace the original array elements ("Copy to Original Array" 353) and flow is complete ("End" 354).

In some embodiments all of the filtering operations for all of the elements of all of density grids are completed before any of the associated temporary results replace the original elements, as the original elements are required as inputs to respective filtering computations for each grid. Alternatively, temporary copies of all of the original elements may be made, and the copying may occur as filtering result are made available. Other similar arrangements of original and temporary element management with respect to filtering computations are envisioned.

As mentioned elsewhere herein, processing according to the illustrated flow is entirely optional, according to embodiment. In addition, in some embodiments multiple iterations of the flow may be performed, in some usage scenarios using varying filter functions. Consequently zero or more iterations of the illustrated flow are performed (the iterations are not explicitly shown), according to application requirements and implementation.

Figure 3I:
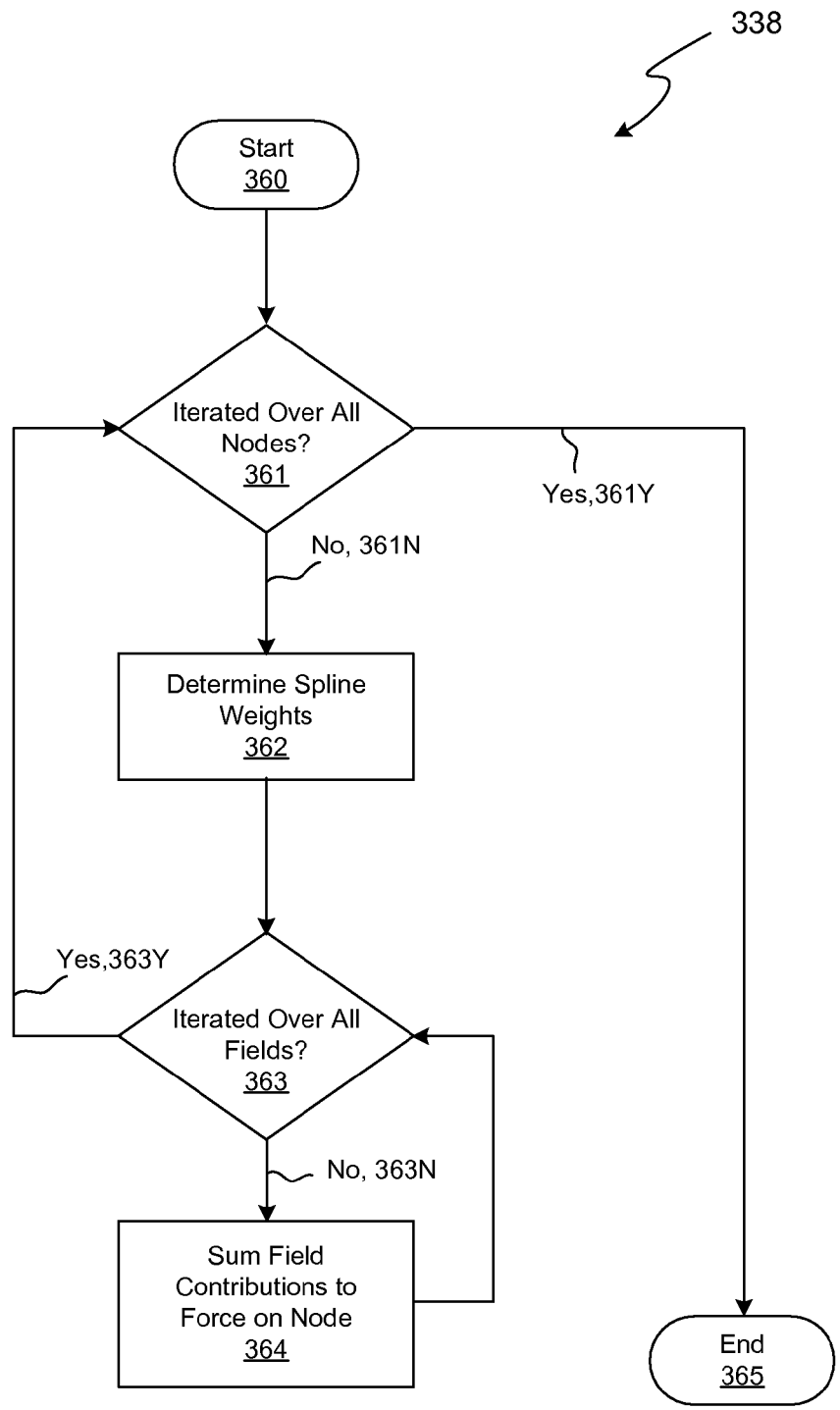
FIG. 3I is a flow diagram illustrating selected details of an embodiment of interpolating gate fields to nodes.

FIG. 3I is a flow diagram illustrating selected details of an embodiment of interpolating gate fields to nodes, such as operations referred to elsewhere herein ("Interpolate Gate Fields to Nodes" 338, of FIG. 3C, for example). Conceptually field components calculated according to the (discrete) grid are mapped onto the continuous spatial coordinates of node locations. In some embodiments the mapping is according to the node mass accumulation (such as summations performed in "Accumulate Gate Densities" 331). In other words, if an N-point spline technique is used to accumulate densities, then an N-point spline technique is also used to interpolate fields to nodes, and the value of N is the same for both techniques. Using matched spline weights during accumulation and interpolation prevents "self-forces" that would otherwise arise and spontaneously propel a node inconsistently with forces acting on the node.

More specifically, flow begins ("Start" 360) by initializing node force values (such as to zero), and then a check is made as to whether processing is complete for all nodes in the simulated system ("Iterated Over All Nodes?" 361). If so, ("Yes" 361Y), then gate field interpolation processing is complete ("End" 365). If not, then a first (and subsequently a next) node is selected for processing, and flow continues ("No" 361N). Spline coefficients are then determined for the node ("Determine Spline Weights" 362), based in part on user input in some embodiments (such as those from "Commands and Parameters" 130, of FIG. 1). In some embodiments the user input is chosen to drive balancing corresponding device distribution throughout an integrated circuit die.

After all the spline weights for the respective node have been determined, a check is made to determine if all fields affecting the respective node have been processed ("Iterated Over all Fields" 363). If so ("Yes" 363Y), then processing loops back to check if all nodes have been processed. If not, then a first (and subsequently a next) field is selected for processing, and flow continues ("No" 363N). The force contributed according to the respective field is accumulated with forces associated with other fields ("Sum Field Contributions to Force on Node" 364). The accumulation is according to each orthogonal spatial dimension associated with force modeling (i.e. x and y for two-dimensional systems and x, y, and z for three-dimensional systems). Flow then loops back to determine if all fields have been processed.

Depletion Weighting

The effect a node has on local density and resultant forces may be "artificially" increased (or decreased) to expedite nodes moving to more satisfactory placements more quickly. Local density modification may be considered to be a result of manipulating a weighting associated with the mass of one or more nodes, and is referred to as depletion weighting. In other words, depletion weighting is a technique that may be used to drive the system to the point of legality in an SAF flow via dynamical means. By providing a dynamical solution to the problem, a higher quality result may be obtained in some usage scenarios. In certain embodiments depletion weighting operates by attaching a modifier to the density contributed by a node and the expansion field force acting upon it.

In some embodiments an expansion field without depletion weighting is used. In some embodiments an expansion field with depletion weighting is used. In some usage scenarios the depleting weighting improves any combination of actual node resource footprint, block footprint, and block capacity. In some usage scenarios the depleting weighting results in nodes being driven apart only as far as necessary to achieve legality.

In certain embodiments the depletion weight is calculated from a weighted sum of the differences between the available resources and the node resource footprint onto a quantization block, i.e. the amount of resource depletion caused by presence of the node in its current state. The depletion weight acts as a simple linear weight modification to both the density contributed by the node (in accumulation processing phases) and force acting on the node (in interpolation processing phases), and dependencies computed as:

$$dpwt = (1+m)^{pdpwt}$$

where pdpwt is the power-law configuration parameter (that in certain embodiments defaults to 0, i.e. no modification), and the modifier "m" is as defined below. There is in addition a linear term and configuration parameter cdpwt (that in certain embodiments defaults to 1, i.e. no modification) that in some usage scenarios enables improved results compared to the power-law form alone.

The weights are computed differently if the quantization block is depleted in any one of the resources required for the node. For example, a node may be oversubscribed in only a single resource, but undersubscribed for others, leading to no net result unless resources are considered individually. Thus, if any resource appears depleted with respect to requirements for a node, then only the depleted resources are considered. In some usage scenarios the node is thus "coerced" out of a quantization block by depletion weighting related expansion forces.

The following equations are used when there is depletion for at least one resource. Nomenclature:
f_a node footprint for atom (a)
b_f_a block fooprint for atom (a)
b_c_a block capacity for atom (a)

For overfull (i.e. depleted) quantization blocks, the modifier m is given by:

$$m = cdpwt * sum\_a \{ f\_a * (b\_f\_a - b\_c\_a)/b\_c\_a \}$$

where only terms with (b_f_a−b_c_a)>0 are considered, sum_a indicates a sum over all values of iteration variable "a", and the term atom refers to a slot in an underlying SAF. The modifier ensures that (a) resources that are more limited are given higher weight, and (b) nodes possessing multiple depleted resources have higher weight.

For the case of no depletion, the modifier m is given by:

$$m = sum\_a \{ f\_a * (b\_f\_a - b\_c\_a)/b\_c\_a/b\_c\_a \} / sum\_a \{ f\_a/b\_c\_a \}$$

where (compared to the depleted block case) additional terms serve to map the amount of depletion onto the range [−1,0] (resulting in a weight in the range [0,1]). Thus m=−1 is the minimum when the block is completely empty and m>0 when the block is full. In some embodiments depletion zones may be treated differently from one another.

In some embodiments a simpler normalization multiplier is used, i.e. 1/sum_a{f_a}, having the effect of treating all depletion zones equally.

In some embodiments where depletion zones are treated differently from one another, depletion weighting tends to reduce density contributed by nodes that "fit" and to increase density for nodes that "don't fit". Also, nodes that fit tend to be affected by weaker expansion forces and nodes that don't fit tend to be affected by stronger expansion forces. Thus the net effect of the depletion weighting is that nodes that easily fit contribute a smaller density and are affected by a lesser force from the expansion fields, but nodes that don't fit contribute a larger density and are affected by a stronger force. The variation in forces tends to contribute to forward progress in several ways. The density differential between nodes that are fitting and those that are not creates a situation where the system naturally (thermodynamically) evolves to a lower energy state, where everything fits. Also, the force differential provides a direct dynamical mechanism to cause non-fitting nodes to leave an overfull block (as a result of the density surplus and the attendant local expansion field) before other nodes get a chance to leave the block.

In some embodiments a depletion weight technique calculates the node depletion weight at each of the nearest neighbor grid points used in the accumulation and interpolation, so that nodes near a block boundary are subject to forces due to the inclusion of the node in the neighboring block as well the bock the node is included in. In certain usage scenarios this prevents nodes from oscillating (or "sloshing") between blocks when there is likely no benefit to be gained from the oscillation.

The induced per-block expansion field tends to drive non-fitting nodes towards the boundary where they may tend to cluster temporarily if the neighboring block does not have the capacity to accept them. The cluster may be, however, a transient effect. Nodes that are bunched near the edge of a block either slide along the edge until reaching an accepting block on either side, or hover at the edge until conditions in the nearest neighboring block become favorable for transit.

Exclusion Zones

In some embodiments various regions, or exclusion zones, may be defined that are not allowed to include any morphable-devices, any placed elements, or any elements of certain types, according to various usage scenarios. During later stages of global placement iterations, exclusion zones may be processed to provide gradually growing regions of higher density fields that result in repulsing forces that tend to expel nodes from the exclusion zones. In certain embodiments the exclusion zones "grow" as simulation time moves forward, starting out as point particles (like nodes), as miniature representations of the desired exclusion zone (the miniature having an overall shape and aspect ratio equal or nearly equal to the desired exclusion zone), or as two-dimensional lines, according to various usage scenarios. Subsequently the starting representation evolves into an ever-growing object until the object matches the desired exclusion zone in size and location. Similarly exclusion zones specified as strips across the entire area being placed and routed begin as an exclusion line and grow over simulation time into an exclusion area equal in dimension and location to the required exclusion zone.

Exclusion zones (also referred to as "xzones") are a way to model architectural entities that explicitly prohibit inclusion of all non-qualifying node (or corresponding device) types, while preserving the SDI-based numerical model. In certain embodiments all adjacent xzones are collapsed into a single xzone, to simplify treatment.

In some embodiments simulation proceeds according to the laws of motion defined elsewhere herein, ignoring xzones, allowing the netlist a relatively large amount of time for detangling. Once the nodes are suitably spread, a transition is made to "exclusion mode" where the xzone constraints are obeyed.

A first technique to manage the transition is to explicitly move nodes out of the way, starting from the center of the exclusion zone and continuing outward. In some embodiments the outward processing is gradual to reduce disruption caused by spatial shifting of the nodes. The center of the xzone and moving xzone boundaries are defined to push nodes in a desired direction, i.e. in the direction of accessible final placement states. For exclusion zones that are in the form of a stripe along the entire chip area, nodes are moved to one or both sides as appropriate. For exclusion zones that are in the form of isolated rectangles, the nodes are moved in a ray from the center point to the affected node, to spread out the distribution in an isotropic manner.

A second technique is to apply an artificial density enhancement to the area inside the exclusion zone as it slowly expands. In this technique, twice the average density on the xzone boundary is imposed in the interior of the xzone during transition. This provides a dynamical shove against the nodes in advance of the approaching barrier.

After the xzone transition is complete, simulation continues as during the xzone transition, but with added constraints including:

Nodes are snapped to xzone boundaries at the end of each timestep. A node may "tunnel" to the other side of an xzone if energetically favorable (see "Tunneling Congestion Relief" located elsewhere herein for additional information); and The density fields obey specified parity boundary conditions at the edge of each xzone, to ensure physically relevant behavior at the boundary. In some implementations even parity is used, and in some implementations periodic parity is used.

Simultaneous Dynamical Integration (SDI) Simulation

SDI simulation (also known as Particle In Cell (PIC) simulation) provides approximations to solutions of Newton's second law (i.e. force equals mass multiplied by acceleration, or F=ma), as expressed by a system of coupled ordinary differential equations. For each node, the sum of the forces (also known as forcing terms) acting on the respective node is equal to the mass of the respective node multiplied by the second derivative with respect to time of the state-space representation of the node. In some embodiments nodes are restricted to planar (i.e. two-dimensional) movements, and there are four equations per node (x-position, y-position, x-velocity component, and y-velocity component). In some embodiments nodes are not so restricted (i.e. allowed three-dimensional movements), and there are six equations per node (x, y, and z-positions, and corresponding velocity components).

Figure 4:
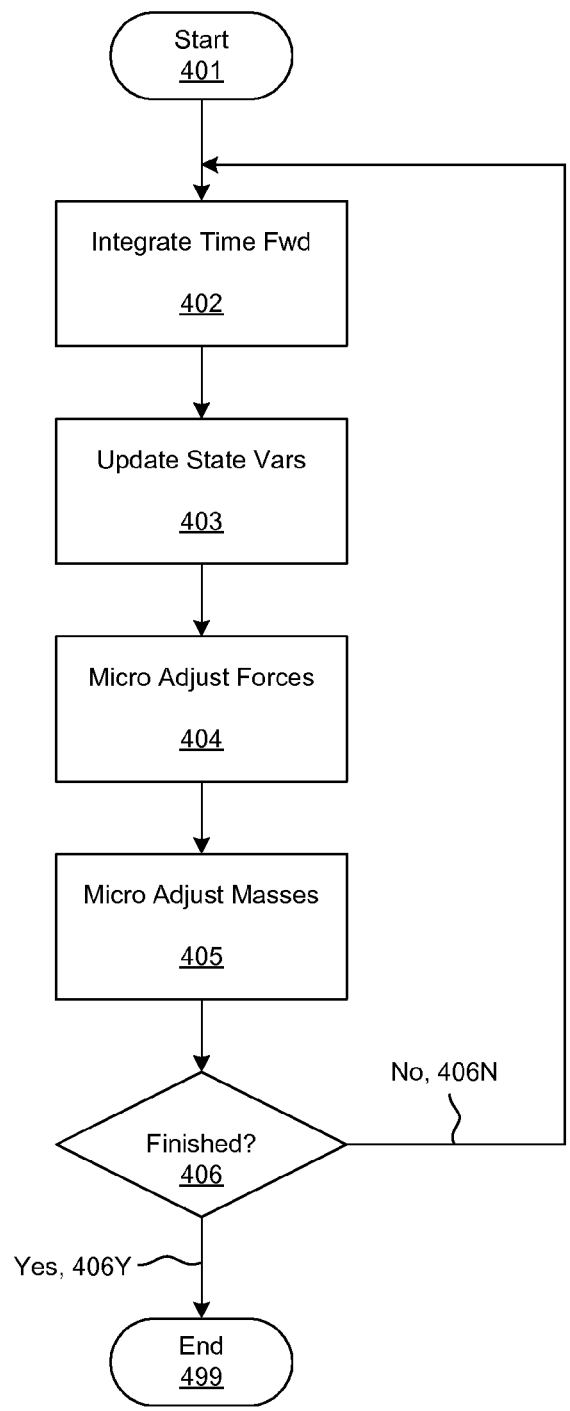
FIG. 4 is a flow diagram illustrating selected details of an embodiment of SDI-based modeling and simulation.

FIG. 4 is a flow diagram illustrating selected details of an embodiment of SDI modeling and simulation, such as operations referred to elsewhere herein ("SDI Simulation" 306, of FIG. 3A, for example). Overall the illustrated processing serves to advance a dynamical system simulation forward in time, updating state-space variables according to Newtonian mechanics. Processing begins ("Start" 401) and the system of coupled ordinary differential equations is approximately solved by numerical integration for a short delta simulation time interval ("Integrate Time Forward" 402).

Changes to all of the state variables for all of the nodes are then simultaneously processed ("Update State Variables" 403), based on the numerical integration. In some embodiments relatively small-scale changes are then made to one or more of the forces and masses of the system ("Micro Adjust Forces" 404 and "Micro Adjust Masses" 405), according to a specified or a computed rate of change, in certain usage scenarios to provide more nearly continuous changes to state-space variables than would otherwise be possible. The changes to the force(s) are in addition to changes naturally arising due to the advancement of simulation time. For example, in some embodiments large-scale force (and mass) changes (such as "Macro Adjust Forces" 304 and "Macro Adjust Masses" 305, of FIG. 3A) are partially effected by incremental changes.

The new system state is examined ("Finished" 406) to determine if the SDI simulation is complete via a test of an end condition. An example termination condition is completion of simulation of a specified time interval. If the SDI simulation is finished ("Yes" 406Y), then processing is complete ("End" 499). If the end condition is not satisfied, then flow loops back for further simulation forward in time ("No" 406N). In some embodiments configurable settings are adjusted prior to or in conjunction with continuing SDI simulation (such as settings associated with "Commands and Parameters" 130, of FIG. 1).

Numerical integration techniques compatible with the time-integration include Runge-Kutta, predictor-corrector, leap-frog, and other similar integration techniques. Various embodiments use any combination of integration techniques.

In some embodiments the time-integration is according to a fixed timestep, while in other embodiments the integration is according to an adaptive timestep. The adaptive timestep results in reduced integration costs during system simulation time periods of slowly changing state variables and improved numerical accuracy during system simulation time periods of rapidly changing state variables, or otherwise "stiff" governing equations. In some embodiments the integrator (such as used in "Integrate Time Forward" 402) receives an input Delta-t (an amount to advance system simulation time). In some embodiments the integrator provides an actual Delta-t (an amount system simulation time actually advanced during the integration) and a suggested Delta-t for use in succeeding integration timesteps. In some of the adaptive timestep embodiments one or more of the actual and suggested Delta-t values are used to control the adaptive timestep.

While the discussion of SDI is specific to global placement, the technique is applicable to other functions of the aforementioned place and route flow, including any combination of global placement, legalization, detailed placement, and routing.

Legalization

Conceptually legalization determines if the global placement is likely to be usable for a successful detailed place and route, and if not, legalization attempts to improve placement before proceeding to detailed placement. The determination of suitability for detailed placement includes assessing one or more metrics correlated with local solvability of placement (and routing) problems not addressed by global placement. In some embodiments one of the metrics includes sectioning all of the devices according to a grid (such as a regular grid) of analysis windows, and determining locally if within each analysis window resources exceed (or fall below) requirements. If all of the analysis windows are simultaneously solvable (i.e. available resources meet or exceed requirements), then detailed placement and routing is likely to succeed without additional refinements to the global placement. Improvements, or corrective actions, may take various forms including any combination of "moving" devices from one region to another, transforming devices from one implementation form to another, and partitioning-related strategies.

Figure 5A:
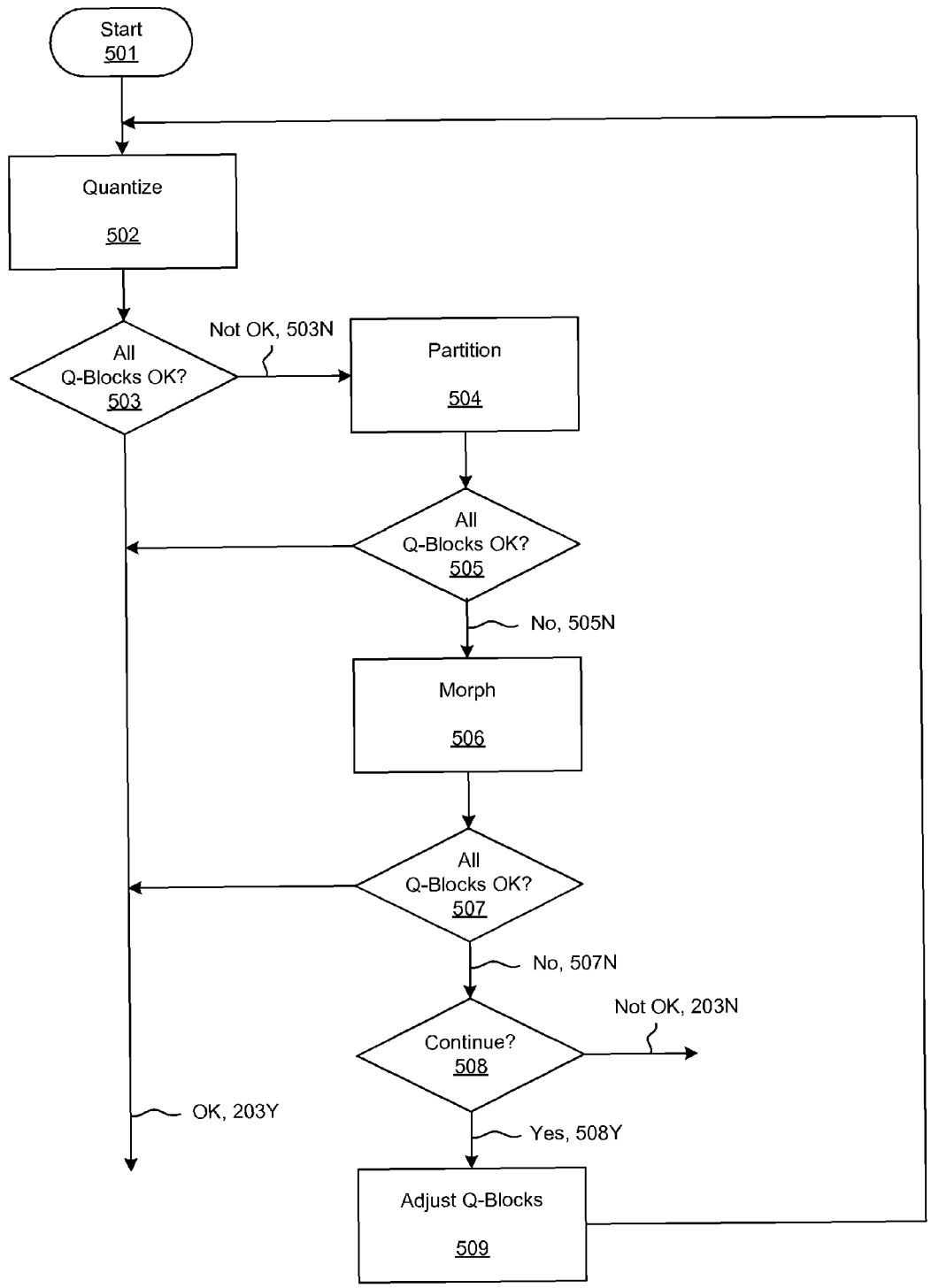
FIG. 5A is a flow diagram illustrating selected details of a first embodiment of resource reconciliation, as a first example of legalization.

FIG. 5A is a flow diagram illustrating selected details of a first embodiment of resource reconciliation, as a first example of legalization (such as "Legalization" 203, of FIG. 2). Overall the flow includes determining a size of an analysis window and allocating all devices in groups to their respective containing windows, and sub-dividing and transforming logic functions to reduce resource over-subscription. The flow also includes checks to determine if the devices allocated to each window may be implemented with the resources available in the window (i.e. no analysis window is over-subscribed), and if continued iterations are likely to provide improved results.

Processing begins ("Start" 501) with global placement information (such as produced by "SDI Global Placement" 202, of FIG. 2, for example). The global placement result may not be legal (i.e. in a standard cell flow devices may be overlapping, or in a structured array flow more resources may be used than are locally available), but is good enough to continue processing via refinement techniques implemented in legalization. An analysis window is determined ("Quantize" 502), corresponding to a quantization block size, and conceptually replicated in a regular contiguous (but not overlapping) fashion such that all of the devices in the netlist are allocated to one (and only one) window (some windows may be devoid of devices). In some embodiments relating to a structured array design flow, the analysis window is a rectangular shape having a size that is an integer multiple of a corresponding SAF tile. In some embodiments the analysis window is aligned with respect to SAF tiles.

A first determination as to whether all of the analysis windows (also referred to as quantization blocks or simply "Q-Blocks") are simultaneously legal, i.e. none are over-subscribed, is made ("All Q-Blocks OK?" 503). If all of the Q-Blocks are legal, then legalization processing is complete ("OK" 203Y) and processing continues to detailed placement (see FIG. 2). Otherwise ("No" 503N) the devices are sub-divided ("Partition" 504) via partitioning strategies including any combination of fixed blocks, recursive bisection, and other similar techniques, according to embodiment.

A second legalization check is performed ("All Q-Blocks OK?" 505) that is substantially similar to the first check. As in the first checking case, if all of the Q-Blocks are legal, then processing is complete ("OK" 203Y) and the legalized result is ready for detailed placement. Otherwise ("No" 505N) the devices are transformed (individually or in groups) to logically equivalent formulations having reduced resource over-subscription ("Morph" 506). The transformation, or morphing, operations are directed to manipulate the netlist such that logic functions requiring resources not available in a Q-Block are implemented as logic functions using resources that are available. As an example, an OR function required in a Q-Block exhausted of OR gates may instead be implemented as a NOR gate followed by an inverting gate, if a NOR gate and an inverting gate are available in the Q-Block. Morphing may be used in usage scenarios including structured array regions.

A third legalization check is performed ("All Q-Blocks OK?" 507) that is also substantially similar to the first check. As in the first checking case, if all of the Q-Blocks are legal, then processing is complete ("OK" 203Y) and the legalized result is ready for detailed placement. Otherwise ("No" 507N) a determination is made as to whether further legalization iterations are likely to result in improvement ("Continue?" 508). If continuing is potentially beneficial ("Yes" 508Y), then one or more adjustments are made to the analysis windows ("Adjust Q-Blocks" 509), and flow loops back to repeat processing starting with quantization. In some embodiments the adjustments include increasing the Q-Block size in one or more dimensions according to a granularity that is an integer multiple of a corresponding dimension of an underlying SAF tile. For example, the Q-Block size may start out as "1 by 1" (i.e. equal in size to the SAF tile), then be increased by one in the first dimension to "2 by 1" (i.e. twice the SAF tile size in the first dimension), and then be increased by one in the second dimension to "2 by 2" (i.e. twice the SAF tile size in the second dimension). Alternatively, the Q-Block size may be successively lowered, or may be increased in one dimension while being decreased in another, according to various embodiments. More than one Q-Block size choice may result in legal or otherwise useful results, according to various characteristics of the results (such as minimum and maximum local resource utilization, and other similar metrics).

If it is determined that continuing legalization processing is not useful (i.e. not likely to further a solution), then processing is also complete ("Not OK" 203N) and subsequent processing includes one or more revisions (see FIG. 2). In some embodiments checking if a Q-Block size equals or exceeds a predetermined value (either before or after one or more adjustments) is part of the continuation determination, as legalization achieved with relatively smaller Q-Block sizes, in some usage scenarios, is more likely to result in successful detailed placement.

Figure 5B:
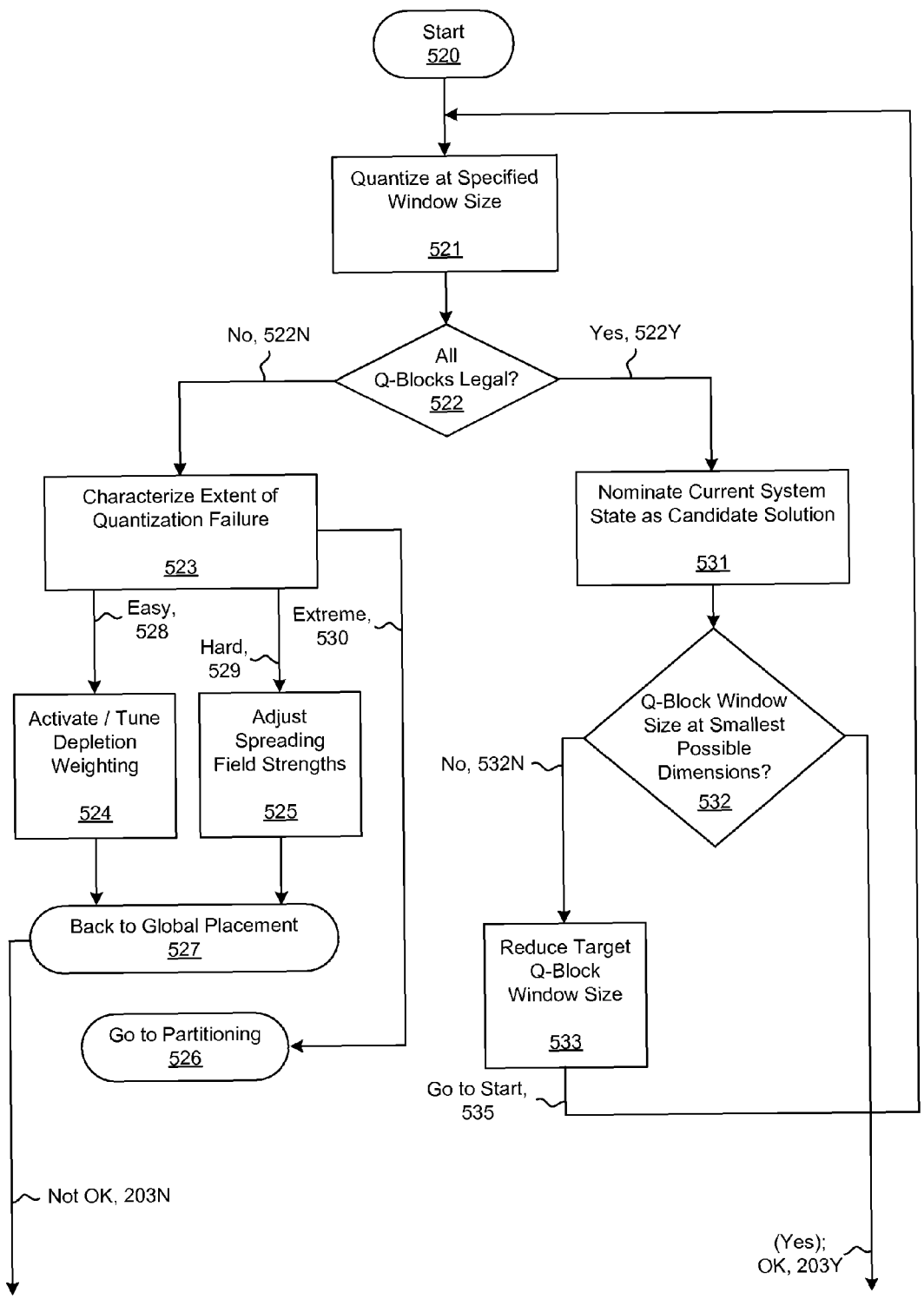
FIG. 5B is a flow diagram illustrating selected details of a second embodiment of resource reconciliation, as a second example of legalization.

FIG. 5B is a flow diagram illustrating selected details of a second embodiment of resource reconciliation, as a second example of legalization (such as "Legalization" 203, of FIG. 2). Flow begins ("Start" 520) and proceeds to determine a window for quantizing ("Quantize at Specified Window Size" 521), binning elements into Q-blocks and optionally morphing selected elements to find a legal result. All Q-Blocks are then tested to determine if or to what extent resource conflicts exist ("All Q-Blocks Legal?" 522). If all Q-Blocks are simultaneously free of resource conflicts ("Yes" 522Y), then processing proceeds to mark the current state as a possible solution ("Nominate Current System State as Candidate Solution" 531). A test is then made to determine if the current Q-Block is a minimum size Q-Bock ("Q-Block Window Size at Smallest Possible Dimensions?" 532). If so ("OK" 203Y), then processing is complete and the result is ready for detailed placement. If the current Q-Block is not the minimum size ("No" 532N), then processing proceeds with a smaller window ("Reduce Target Q-Block Window Size" 533). Flow then loops back ("Go to Start" 535) to attempt processing with the reduced window size.

If at least one Q-Block has a resource conflict ("No" 522N), then a determination is made as to the severity of the remaining conflicts ("Characterize Extent of Quantization Failure" 523). In some embodiments the determinations include "Easy", "Hard", and "Extreme" cases. Relatively simple conflicts ("Easy" 528) are processed by depletion weighting ("Activate/Tune Depletion Weighting" 524), and relatively more difficult cases ("Hard" 529) are processed by modifications to repulsive (or spreading) force sources ("Adjust Spreading Field Strengths" 525). Processing for the Easy and Hard cases then flows back to repeat all or portions of global placement (as revisions in the context of FIG. 2) according to depletion weighting activation/tuning or adjusted spreading strengths ("Back to Global Placement" 527 and then "Not OK" 203N). Substantially more difficult cases ("Extreme" 530) are processed by partitioning ("Go to Partitioning" 526).

The determination of conflict severity or difficulty may include examination of objective factors (such as a ratio of resources demanded compared to supplied in the Q-Blocks or other computable figures of merit), and may also include examination of subjective factors (such as how much processing time has already been expended during legalization, and other similar progress indicators), according to various embodiments. In certain usage scenarios, upon entry to legalization, there may be a subjective perception that the system is far from legal due, for example, to over-concentration of nodes of one or more resource classes (such as Nand2, Nor2, Mux2, Inverter, and so forth) in certain regions. In some usage scenarios the strength of the spreading forces acting on the over-concentrated resource class is increased, and earlier processing (such as global placement processing with revisions via "Not OK" 203N of FIG. 2) is repeated. In other usage scenarios, if the resource imbalance is mild, then an attempt may be made to gently nudge the system with depletion weighting activated as revised global placement processing (such as via "Not OK" 203N of FIG. 2).

However, if extended time-evolution with increasingly powerful depletion weighting does not resolve the conflicts, then in certain embodiments the quantization failure may ultimately be deemed "Extreme" even though only a comparative paucity of Q-Blocks show only slightly over-subscribed resources. As the depletion weighting influencing factors become increasingly strong, the governing dynamical equations become stiff, and the overall assessment of legalization difficulty may be escalated to extreme, even though over-subscription is small. According to various embodiments assessment of legalization difficulty includes any combination of examining the system state, the netlist topology, the timing constraints and the architecture definition.

In some embodiments of the flow for standard cell implementation technologies, legalization may be pursued via modifications or adjustments to the spreading force strength. For example, the masses of nodes may be directly correlated to the areas of the standard cells, and the capacity of each Q-Block directly correlated to the respective Q-Block area. Thus spreading forces may be used to drive density so that area consumed by nodes within a Q-Block is no greater than the area of the Q-Block. When achieved, legalization is complete and flow proceeds to detail placement. In some embodiments legalization may be pursued via partitioning, optionally in combination with spreading force strength adjustments.

Partitioning

Figure 5C:
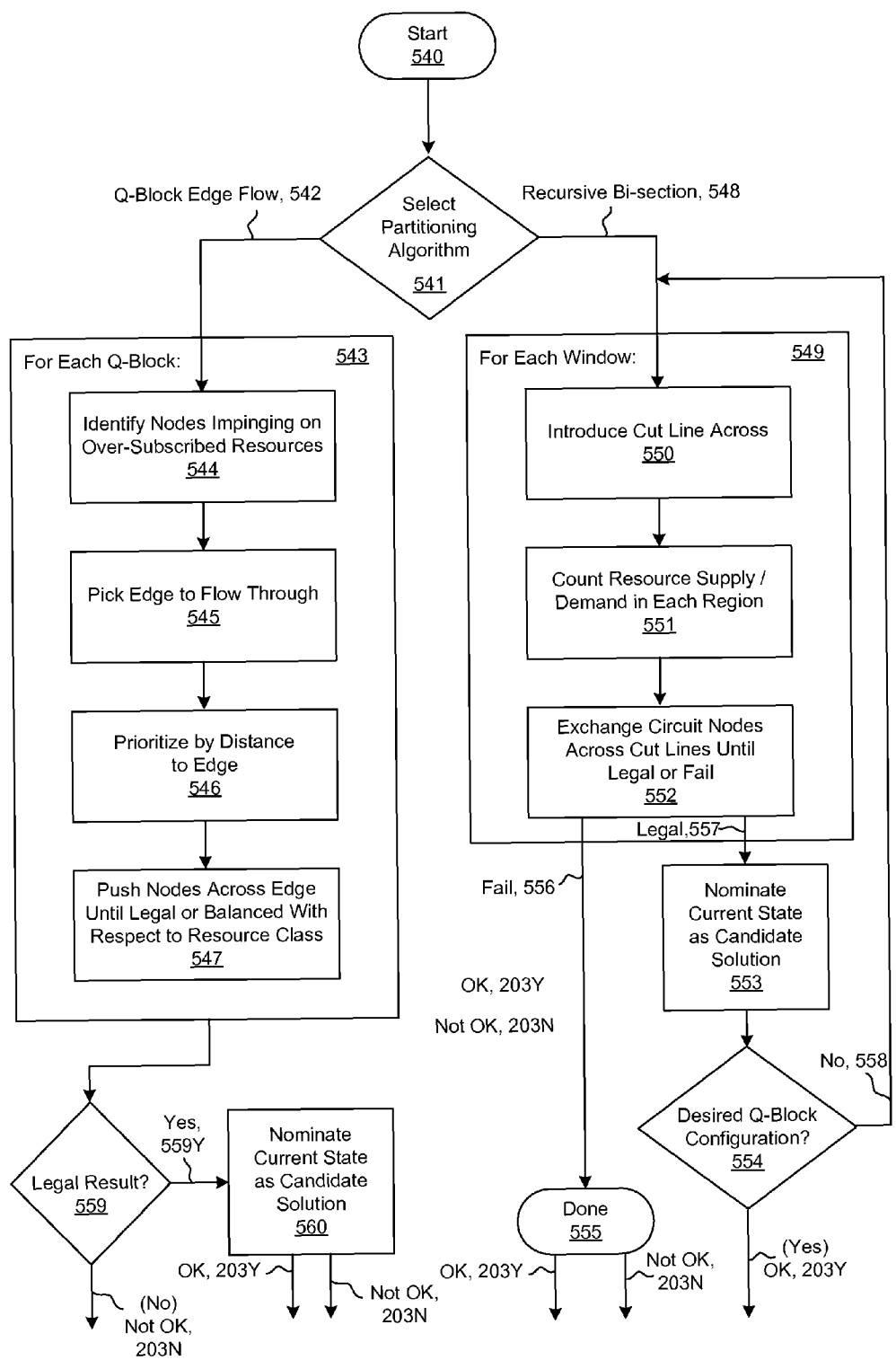
FIG. 5C is a flow diagram illustrating selected details of an embodiment of partitioning.

FIG. 5C is a flow diagram illustrating selected details of an embodiment of partitioning (such as processing performed as a result of "Go to Partitioning" 526, of FIG. 5B). Flow begins ("Start" 540) and then a technique for partitioning is chosen ("Select Partitioning Algorithm" 541) via any combination of manual (user directed) or automatic (software determined) mechanisms, according to various embodiments. If a Q-Block technique is chosen ("Q-Block Edge Flow" 542), then processing is performed for each Q-Block ("For Each Q-Block" 543). If a Bi-Section technique is chosen ("Recursive Bi-Section" 548), then processing is performed for each of a set of progressively smaller windows ("For Each Window" 549), starting, in some embodiments, with a window size equal to the entire place and route region, and proceeding to progressively smaller and smaller windows.

Processing for each Q-Block according to the Q-Block edge flow technique includes determining nodes causing resource conflicts ("Identify Nodes Impinging on Over-Subscribed Resources" 544), followed by choosing an exit edge ("Pick Edge to Flow Through" 545) for the nodes that are impinging. Then the nodes are ranked, for example, by separation from the chosen exit ("Prioritize by Distance to Edge" 546) and then moved across the exit edge ("Push Nodes Across Edge Until Legal or Balanced With Respect to Resource Class" 547), thus entering a different Q-Block. After all Q-Blocks have been processed, a determination is made as to whether a legal result has been obtained ("Legal Result?" 559). If a legal result has not been obtained, then one or more revisions are indicated and earlier processing is repeated ((No) "Not OK" 203N). If a legal result has been obtained ("Yes" 559Y), then the current configuration is nominated as a candidate solution, as in other legalization techniques ("Nominate Current State as Candidate Solution" 560). Processing may then proceed to detailed placement ("OK" 203Y), or may return for further legalization processing with a goal of achieving a legal result at a smaller Q-Block size (Not OK, 203N), conceptually as a revision to legalization processing as described with respect to FIG. 2.

Processing for each window according to the recursive Bi-Section technique includes formulating two sections to break the window into ("Introduce Cut Line Across" 550) and then determining resource requirements and availability in each of the sections ("Count Resource Supply/Demand in Each Region" 551). Nodes are then moved between the sections ("Exchange Circuit Nodes Across Cut Lines Until Legal or Fail" 552) until successful ("Legal" 557) or no further improvements are possible ("Fail" 556). If the result is legal, then the current state is marked as a possible result ("Nominate Current State as Candidate Solution" 553) and then a determination is made as to whether a smaller Q-Block should be attempted ("Desired Q-Block Configuration?" 554). If a target Q-Block size has not been reached, then flow returns back ("No" 558) to continue bisecting windows. If the target Q-Block size has been reached, then processing is complete and flow may proceed to detailed placement ("OK" 203Y).

In some embodiments the recursion operations are according to a tail recursion formulation, and testing for the desired Q-Block configuration may include a tail recursion end check (for example, if the next region is smaller than a predetermined end condition size) as an iteration termination condition for recursive window processing. In some embodiments for use in an SAF flow context the predetermined end size is equal to an SAF tile size.

If no further improvements are possible (via "Fail" 556), then flow continues ("Done" 555) where a determination is made as to whether an acceptable candidate solution has been found ("OK" 203Y) and detailed placement may follow, or whether revisions and repetition of earlier processing are indicated ("Not OK" 203N).

Nodes may be selected for speculative migration across the cut line according to any combination of various criteria, including proximity to an edge, a footprint onto over-subscribed resources, and any other related reason, according to embodiment. In some embodiments speculative expulsion of a node from one side of the cut line to the other side may include morphing operations on any combination of nodes on the one side, the other side, and both sides. The morphing operations are directed to discover suitable implementation forms for all nodes such that nodes in each containing region may be fully implemented using only resources in the respective containing region.

Detailed Placement

Conceptually detailed placement serves to fine-tune placement as produced by legalization, determining final placement of all the devices of the netlist. In certain embodiments operations are relatively limited in scope, focusing on optimizations and refinements generally limited to a region corresponding to a Q-Block.

Particular detail placement techniques are described in detail in the SAF embodiments illustrated herein. Nevertheless, any of a variety of detail placement procedures and techniques may instead be employed, as the specific mechanism for performing detail placement (assignment of devices to specific, non-conflicting locations) is not a limiting aspect of the SAF techniques described herein.

In some SAF embodiments illustrated herein legalization produces Q-Blocks where supply is known to meet demand. Since the SAF already has the resources laid out in some structured manner, there is thus certainty of the existence of a fitting assignment of resource instances in the netlist to resource slots in the SAF. Consequently, there is no risk of failure to find a detailed placement solution, and moreover the Q-Blocks can be detail placed independently, including in certain embodiments, in parallel, concurrent operation.

Some embodiments use continuous variables during global placement to specify placement position. Conceptually, the position coordinates determined by global placement in these embodiments may be considered as "optimal" locations for each node, when interpreted as being representative of the collective configuration of all circuit elements. Detail placement attempts to find actual resource slots in the SAF for each resource instance in the netlist such that all resource instances are simultaneously slotted as close as possible to the coordinate calculated during SDI-directed global placement. Stated differently, a collective assignment of all resource instances to resource slots is sought for each resource class in the SAF, such that the overall variance from the coordinates assigned by global placement (and possibly modified during legalization) is minimized or reduced. Some embodiments slot each node independently in the closest available unoccupied slot (instead of prioritizing individual nodes).

Figure 6:
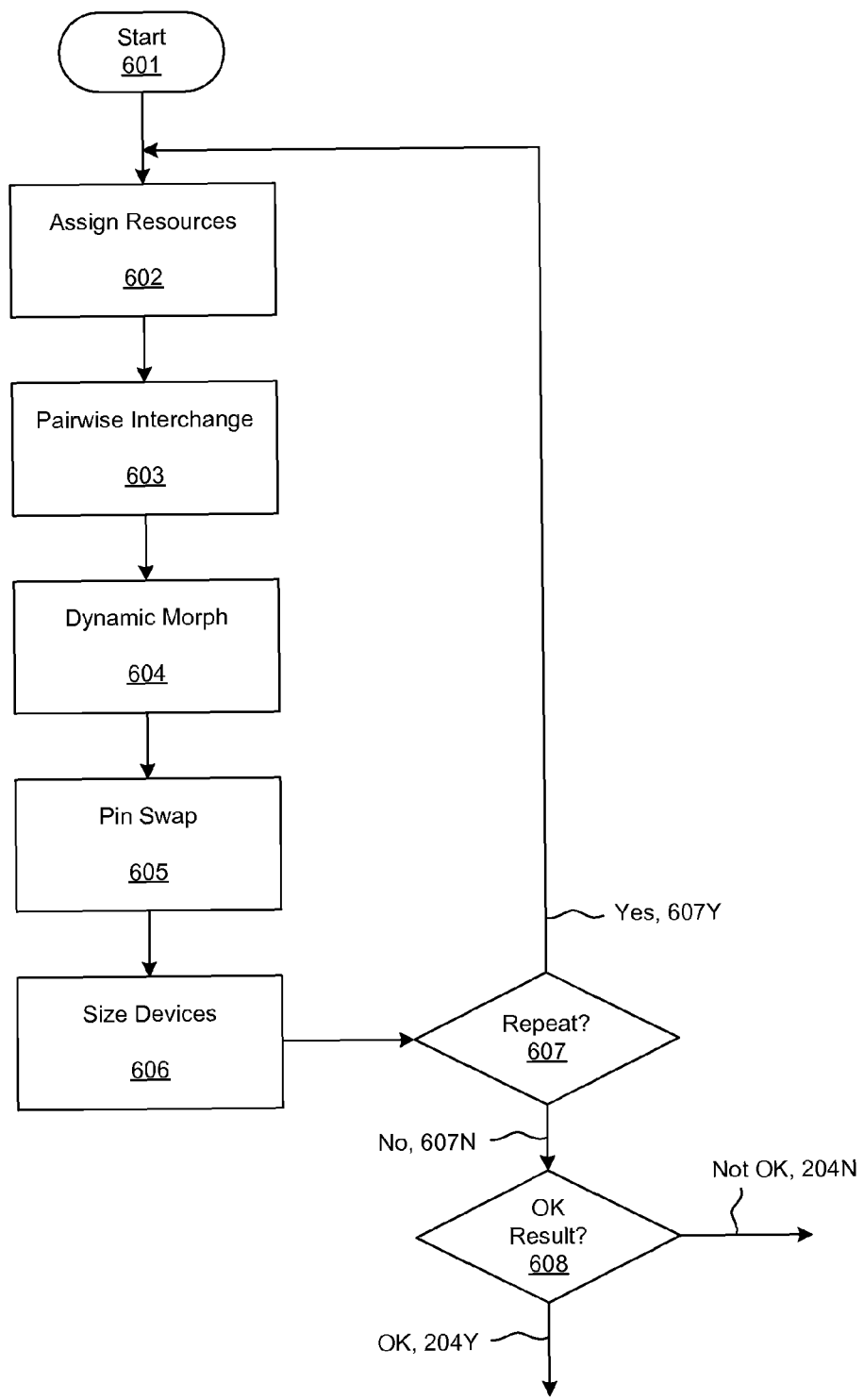
FIG. 6 is a flow diagram illustrating selected details of an embodiment of detailed placement (also referred to as detail placement elsewhere herein).

FIG. 6 is a flow diagram illustrating selected details of an embodiment of detailed placement useful in a variety of applications (such as processing performed in relation to "Detailed Placement" 204 of FIG. 2). The illustrated flow may be used in design techniques relating to SAFs. Overall the flow includes determining a prioritized order to satisfy resource requirements and performing limited-scope optimizations, according to various embodiments. The flow may iterate internally to provide successively more refined solutions, and terminates when an acceptable result is found, or when it is determined that further iterations are not likely to produce improved results.

Flow begins ("Start" 601) upon receipt of placement information as produced by legalization (such as "Legalization" 203 of FIG. 2, for example). As represented by "Assign Resources" 602, resources are prioritized by class. In an illustrative embodiment the prioritization is in accordance with a function of demand for resources of a respective class and supply of SAF resource slots, the slots being consumed by the resource instances of the respective resource class. The prioritization is carried out such that as the percentage of consumed slot supply increases, the priority of the respective resource class is increased, and as the supply of resource slots increases (irrespective of demand), the priority of the respective resource class is decreased. The function is used to evaluate the priority of each resource class, and assignment of resource instances to resource slots is performed one resource class at a time, in the determined priority order of resource classes. In some of embodiments the prioritization is done on a Q-Block basis. That is, the function is evaluated with respect to the demand, supply, and consumption local to each Q-Block.

Iterating through resource classes in priority order, within each resource class the resource instances impinging upon the respective resource class are identified, and an initial assignment of resource instances to resource slots is generated, with each resource instance drawing the closest still-unoccupied resource slot currently available. Closeness is measured in terms of distance from a slot center to the coordinate assigned by global placement (and possibly modified by legalization), for the node containing the resource instance.

Processing continues with a first form of limited-scope refinement ("Pairwise Interchange" 603), where selected pairs of allocated resources are interchanged in an attempt to discover an improved solution. In certain embodiments, within the set of resource instances previously assigned slots, speculative interchanges are considered between every instance and every other slot (whether occupied or not). In other words, a resource instance may be swapped with the instance occupying another slot, or may simply be moved to an empty slot. Each speculative interchange is scored according to a function of the slot position and the preferred position of the occupying resource (as assigned by global placement and possibly modified by legalization). An example function is the sum of the squares of the distances between the slot centers and the preferred positions. Speculative interchanges are accepted with strictly greedy semantics, on the demonstration of a reduced sum of squared distances from instance to slot. The interchange process will eventually stall when the collective variance of resource instances from desired positions can no longer be strictly reduced.

In some embodiments pairwise interchanges may be evaluated according to a predicate:

$$D(p\_i, s\_j)^2 + D(p\_i', s\_j)^2 <? D(p\_i, s\_j)^2 + D(p\_i', s\_j')^2$$

where
  $p\_i$ is the ideal position of node I;
  $s\_j$ is the actual location of slot j; and
  $D(p\_i, s\_j)$ is the distance between $p\_i$ and $s\_j$.
The sum of $D(p\_i, s\_j')^2$ over all assignments (i→j) is minimized, according to the predicate.

When the collective variance may no longer be reduced, any resource instances of other resource classes that are associated with composite forms (i.e. forms realizable from resources of more than one slot, such as an And2 realized from a Nand2 slot and an Inverter slot) participating in the pairwise interchange are placed in an available slot (corresponding to an ancillary resource) that is closest to the resource instance of the respective composite form. The (ancillary) resource instance slot assignments are then marked as locked, and the ancillary instances are thereafter excluded from the set of assignable and revisable resource instances to be placed when a corresponding resource class is subsequently processed. When all resource classes in the SAF have been processed as described above, a complete and valid initial detail placement for one Q-Block has been rendered, and subsequent optimization processes are enabled.

In certain embodiments, the above processes ("Assign Resources" 602 and "Pairwise Interchange" 603) are used in combination with "Dynamic Morphing" 604. In some dynamic morphing embodiments note is made of resource instances that are placed farthest from a respective desired location and improved placement of the forms is attempted by morphing to a functionally equivalent available destination form having a more suitable placement configuration of resources instances. In certain dynamic morphing embodiments, such speculation over implementation form for netlist nodes is combined with iteration over slot assignment and pairwise interchange. In the latter dynamic morphing embodiments various visited states are scored according to collective variance from preferred locations (as described above) and the best state that can be found is taken as a result. In certain embodiments states visited are limited by a computational cost criteria.

Flow then continues to a third form of limited scope refinement ("Pin Swap" 605), where pin swapping directed to improve routability is performed. Here, speculation is performed over various functionally equivalent mappings of netlist nets to instance pins. As an example, the inputs of a NAND gate may be interchanged without changing the function implemented in the gate. This and other similar equivalent mappings for other gates and circuitry are selectively evaluated. By considering such netlist transformations, attempts are made to reduce the difficulty of achieving a fully routed circuit layout.

In some embodiments an optional first-cut attempt at improving timing paths is then performed ("Size Devices" 606). As an example, driver sizing is selectively performed by revising the netlist to employ forms composed of resources with higher drive strengths. Optimization is not limited to such up-sizing. Selective down-sizing of drivers on non-critical paths is also performed, to free up high drive strength resources (such as in an SAF) for use by paths that are more critical.

A determination is then made ("Repeat?" 607) as to whether additional iterations of all or part of the detailed placement flow is likely to improve results. If so ("Yes" 607Y), then processing loops back to resource assignment and continues forward again from there. If further iterations are found to be unlikely to offer improvement ("No" 607N), then a determination is made as to whether the results are acceptable ("OK Result?" 608). If so ("OK" 204Y), then processing is complete and ready for routing. If the results are not acceptable ("Not OK" 204N), then processing is also complete and subsequent processing includes one or more revisions (see FIG. 2). The repeat and acceptable determinations are made by any combination of automatic (such as software) and manual (such as human inspection) techniques, according to various embodiments.

FIG. 6 is an illustrative example of detailed placement, as the order and/or presence of operations 602 through 606 will vary according to embodiment. That is, many combinations of "Assign Resources" 602, "Pairwise Interchange" 603, "Dynamic Morphing" 604, "Pin Swap" 605, and "Size Devices" 606, will have utility as embodiments of detailed placement, including combinations reordering and/or omitting one or more of these operations. As specific examples, some embodiments perform "Assign Resources" 602 and "Pairwise Interchange" 603 but omit "Dynamic Morphing" 604 and "Pin Swap" 605, while other embodiments selectively perform "Dynamic Morphing" 604 and then subsequently perform "Assign Resources" 602 and "Pairwise Interchange" 603.

Another embodiment of detail placement re-employs SDI-directed placement methodology (targeted at a resource-level netlist) optionally constrained to a reduced sub-circuit present in a specific Q-Block. In the SDI-directed detail placement embodiment, the specific forcing terms in the system of simultaneous governing equations are modified from that described in global placement, and force models more appropriate to detail placement are substituted. For example, in detail placement, once the Q-blocks are formed and legalized, there is no further need to perform inter-Q-Block interchange of nodes. Consequently the bulk density fields that were used in global placement to control unsustainable over-concentrations of specific resource types are unnecessary by construction in the detail placement context. Thus the bulk density fields are replaced by forcing terms that represent a spring drawing the resource-level instances of each form toward the position assigned by global placement. Simultaneously, overlap repulsions arising from pair-wise occupancy exclusions between resource instances of each resource class act to drive the resource instances toward feasible slots while preserving the topological disentanglement that was a key result of the global placement previously obtained by SDI-directed techniques.

The illustrated SAF embodiments emphasize a conceptual separation between global placement, legalization and detail placement, as facilitated by the described form-level netlist abstraction and the technique of morphing and facilitating data structures and SAF enabling properties. The approaches to detail placement used in the illustrative SAF embodiments herein are not meant to be limiting and other detail placement approaches may be substituted.

In some standard cell implementation technologies, there is no concept of resource classes. In some usage scenarios "slots" correspond to tiled regions of a defined size. Any standard cell may be positioned at any location on a so-called standard cell grid, with the understanding that each standard cell consumes some number of contiguous abutting slots, and that neighboring standard cell instances are non-overlapping.

In some implementations assessment of Q-Block legality by comparing demand for standard cell slots to the capacity of the Q-Block (determined by counting the number of contained standard cell slots), is an uncertain predictor of detail placement success. As an example, consider a Q-Block that is 10 standard cell rows high by 100 standard cell columns wide. The assigned standard cells in the Q-Block would be organized into no more than 10 rows, each row limited to 100 units (standard cell columns) in length. A detail placer may be unable to construct row-sets of instances. Continuing the example, consider 11 standard cell instances of a single cell type, the single cell requiring 51 standard cell columns. Then the Q-Block would be infeasible, even though the slot supply comfortably exceeded demand.

As a result, standard cell embodiments may use a quantization (a Q-Block sizing) that is enough larger than the largest frequently occurring standard cell (in certain usage scenarios standard cells having sequential logic, a.k.a. "sequentials") to improve the likelihood that over-concentrations of unwieldy standard cells will succeed during the slot assignment phase of detail placement. In some embodiments of a detail placer for standard cell design flows the detail placer may include a mechanism for feeding back from detail placement to legalization.

In one representative standard cell embodiment, the feedback includes operating an iterative partitioner included in the detail placer. Solution of each Q-Block is attempted. If any fail, then the capacity of the failing Q-Blocks is artificially depressed. The partitioner then runs to attempt to redistribute the netlist nodes to distort the net topologies to the least possible extent, while still achieving resource legality in each Q-Block, including the effect of the artificially depressed capacity of certain Q-Blocks for the purpose of inducing the system to move some cells to different neighboring Q-Blocks in the hopes of finding a soluble configuration. Some embodiments targeting standard cell flows are based upon a conceptual framework where the global-placement position coordinates assigned to each netlist node are deemed ideal when considered as a collective determination, not as an individual determination. Consequently, the standard cell embodiment partitioner preferably seeks to move across the failing Q-Block edges whatever is already closest to the edge, and that can therefore be displaced slightly with the least distortion in the overall netlist net topology.

In another representative standard cell embodiment, the cells in a Q-Block are grouped into rows, determined through considering relative juxtaposition of the cells in the coordinate that varies perpendicularly to the standard cell rows (such as the y coordinate). Thus cells at higher y position coordinate will be promoted to the row above in preference to cells with lower y position coordinate. Once the rows are formed and the contents optimized until each row fits in the width of the containing Q-Block, layout within the rows proceeds in a similar fashion. Specifically, cells are laid out horizontally within each row, and the global placement assigned x position coordinates are used to determine relative packing order along the standard cell row within each Q-Block.

In another representative standard cell embodiment, the detail placement is solved via a re-employment of the SDI-directed techniques described previously for global placement. The spreading fields of global placement are replaced with forcing terms modeling a spring drawing each netlist cell instance toward the respective node position coordinate determined by global placement. Moreover, pairwise overlap repulsion interactions between neighboring nodes are included and tend to tile the nodes toward net disentanglement.

In variations of embodiments of detail placement for standard cells, further optimizations may be performed through orientation speculation and pin swapping, e.g. to reduce routing congestion. The optimizations are based upon the observation that each net that crosses a given line contributes to demand for tracks crossing the line. If the demand for the tracks crossing the line exceeds the supply of perpendicular-running tracks, then routing is more difficult. However, the condition of over-demand for routing tracks may be highly localized. If nets crossing the line from opposite directions to reach pins on either side can be swapped, then the track demand is reduced by two. Techniques include pin swapping by exploitation of pin permutability semantics on an underlying standard cell (such as swapping inputs on a NAND gate) and by rotation and flipping a standard cell according to standard rules of the implementation architecture.

Timing Closure and Timing-Driven Placement

Conceptually timing closure and timing-driven placement operate to reduce critical timing delays to facilitate higher-speed operation of an implementation of a netlist. A high fidelity timing kernel, in conjunction with precise modeling of interconnect parasitics, specifies timing-driven attractive forces, or modifies effects of one or more net attractive forces used during SDI-directed global placement. Timing-driven forces are derived from a snapshot of state variables of the time-evolving dynamical system simulation. As the dynamical system changes (due to influences of various forces, for example), electrical characteristics of a placement of the associated netlist also change, and effects of the new state variables (such as longer or shorter interconnects) are fed back into a timing kernel to reevaluate timing characteristics of a placement corresponding to the state variables. In some embodiments timing-driven forces are calculated and applied to nets selectively, in certain embodiments as a function of any combination of one or more slack coefficients, worst negative slack values, and total negative slack values. In some embodiments timing forces may also be derived using a path-based approach, where the paths include various critical and near-critical paths according to a placement of the netlist as indicated by the state variables.

Various quanta of SDI simulation time may advance between timing-driven force re-calculation, from as frequently as a single SDI iteration to as infrequently as an unbounded number of SDI iterations. For example, timing-driven forces may be adjusted on every iteration of the integration timestep or every N iterations, where N may be provided by a user, or determined by software, according to embodiment. In some embodiments, the frequency of timing update may be automatically computed by the timing kernel (in an "auto timing-directed-force update mode") depending on the state of the dynamical system. For example, when the system is "hot" (i.e. has a relatively high ratio of kinetic energy to total energy), timing force updating is performed more frequently than when the system is "cold" (i.e. has a relatively low ratio of kinetic energy to total energy). In some embodiments the update frequency is determined in part by tracking system parameters including any combination of a cumulative node displacement since last update, a maximum displacement per net, and other similar metrics to trigger an auto-update of timing forces. An incremental timing update is performed on a timing graph when relatively small displacements of nodes are detected with respect to the prior update. Iterative slack allocation and net delay budgets are computed on the instantaneous placement every N iterations to adapt the timing budgets based on the time-evolving placements.

Certain high fanout (or portions of high fanout) nets are identified as non-critical with respect to timing and have little or no timing-driven forces associated with them. False timing paths and non-critical multi-cycle timing paths are also identified as non-critical and receive little or no timing-driven force enhancements. In some usage scenarios control nets such as reset and one or more clocks may be recognized as timing non-critical.

Timing critical nets (or portions of nets) are identified and receive relatively stronger timing-driven forces, in certain embodiments based on normalized timing slack determined for the net. Thus a distinct timing-driven force component may be associated with every pin on every net (or any sub-grouping thereof). In embodiments where the connectivity-based net attractive force is equal for each pin on a net, the timing-driven force tends to enable prioritizing resultant physical location according to greater timing criticality. At a macroscopic level, timing-driven forces tend to keep timing critical and near timing critical devices in relatively close physical proximity, thus reducing associated parasitics and improving timing performance. The timing-driven forces also tend to guide placements toward solutions where relatively higher drive strength devices are associated with relatively greater parasitic loads (corresponding to longer wire lengths) and relatively lower drive strength devices are associated with relatively lower parasitics (corresponding to shorter wire lengths).

In some embodiments parasitics (for example parasitics of relatively short interconnects) are estimated using a simple bounding box model (i.e. net parasitics are estimated as the product of a semi perimeter of a bounding box of the pins on the net multiplied by a constant wire capacitance per unit length). In some embodiments transformations including buffering, clock tree synthesis, driver resizing, timing-based restructuring, and incremental timing post fixes are ignored during parasitic estimation, while in other embodiments the transformations are accounted for by various estimation techniques.

In some embodiments parasitics (for example parasitics of relative long or relatively high fanout interconnects) are estimated after inserting buffer trees and building heuristically constructed near-Minimal Rectilinear Steiner Trees (MRST) of the high fanout nets to accurately and efficiently estimate circuit timing. In some embodiments devices are modeled as having an effective resistance that ignores input ramp time and non-linear timing response effects of the device based on output capacitive load. In some embodiments a high fidelity timing kernel propagates input ramp rise and fall times (treating them separately), and simultaneously propagates circuit ramp time from various timing start points to various timing end points. Timing exceptions (such as false and multi-cycle paths) are propagated through the timing graph to account for effects of the exceptions.

In some embodiments, during placement, a lumped capacitive interconnect delay model that ignores effects of distributed Resistance-Capacitance (RC) trees is used to estimate selected parasitic effects. In some embodiments actual net routing information (or approximations thereof) forms a basis for generation of one or more distributed RC trees for estimating selected parasitic effects.

In some embodiments timing closure is implemented in a Timing Kernel (TK) that dynamically updates a timing graph based on current placement state (that is in turn derived from the locations of the nodes in the SDI simulation). Net and device delays are computed and propagated to slack results on each pin, normalized slack coefficient(s) are determined, and then updated timing-driven forces are generated for use by subsequent SDI simulation.

The timing graph is a graph data structure representing the netlist and includes pre-computations and pre-propagations of user-defined constraints including any combination of clock period, false path and multi-cycle path identifications, arrival times at primary inputs, and required times at primary outputs. In certain embodiments the timing graph is organized as a Directed Acyclic Graph (DAG) data structure. In certain embodiments the pre-computations and pre-propagations are generated only when a new netlist is provided or modifications are made to the current netlist. The timing graph includes timing node elements and timing edge elements. A timing node element represents pins of a macro (such as a morphable-device), and a timing edge element represents connectivity of timing node elements (such as a flattened or non-hierarchical net of the netlist).

Timing delay through a timing node element (also known as a stage delay) is a function of several parameters, including a cell delay ($D_c$) and a wire delay ($D_w$). The cell delay is a function of input transition time and cell output loading. In some embodiments cell delay values are determined via a cell delay table lookup. The cell delay table may be representative of non-linear timing behavior and is specified in a timing library (such as a portion of "Technology Description" 121 of FIG. 1). Cell output transition times are also a function of input transition times and output loads, and are computed by the TK and propagated from inputs to outputs.

A Steiner buffered tree constructor creates an interconnect tree based on coordinates of pins of morphable-devices. RC parasitics are then computed from the interconnect tree, and corresponding cell delays are computed according to pi-models of the RC parasitics. Wire delays are computed using Elmore-Penfield-Rubenstein delay models according to estimated net and pin parasitics.

Figure 7A:
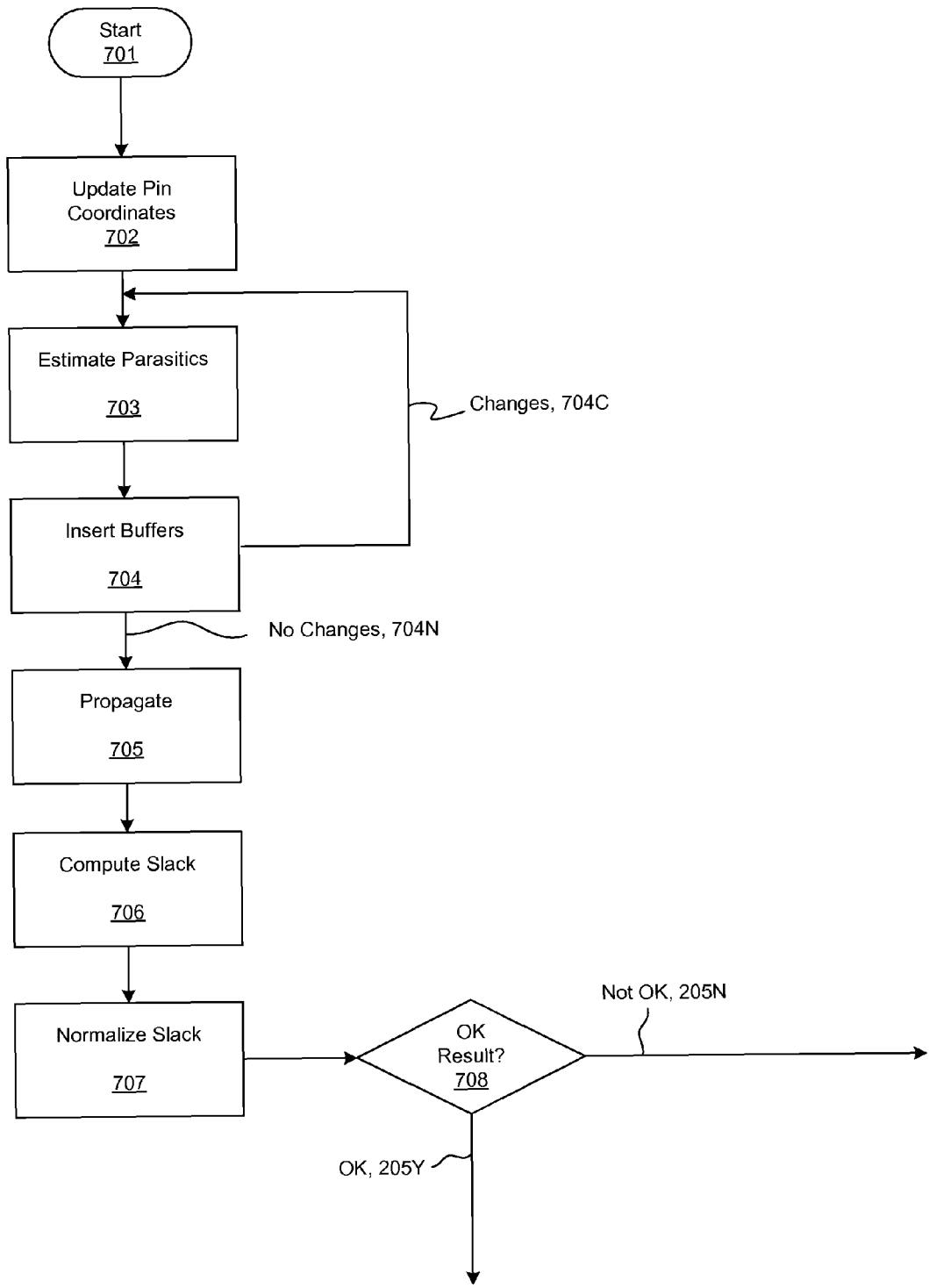
FIG. 7A is a flow diagram illustrating selected aspects of an embodiment of delay path reduction and minimization, as an example of timing closure.

FIG. 7A is a flow diagram illustrating selected aspects of an embodiment of delay path reduction and minimization, as an example of timing closure (such as "Timing Closure" 205, of FIG. 2). As described with respect to FIG. 2, in some embodiments timing closure is essentially operative within global placement, rather than, or in addition to, operative external to global placement. In other words, in some embodiments timing closure operations are performed intimately with operations of global placement (such as those illustrated in FIG. 3A). Flows having closely associated global placement and timing improvement are known as having timing-driven global placement. For example, timing-driving forces may be adjusted (such as in "Macro Adjust Forces" 304) on every iteration (via "Repeat?" 307), or the timing-driven forces may be adjusted every N iterations, where N is computed or is provided by a user (such as via "Commands and Parameters" 130, of FIG. 1). The following discussion is according to timing closure operation within global placement, however the technique is applicable in other contexts.

Processing begins ("Start" 701) with new morphable-device locations as derived from SDI simulated time advancement and resultant node location evolution. Timing node element locations and associated pin spatial positions are updated accordingly in a timing graph ("Update Pin Coordinates" 702). Approximate interconnect distributed resistance and capacitance values are determined ("Estimate Parasitics" 703) via any combination of an NBB technique (such as for short interconnects) and a Steiner-route technique (such as for long interconnects).

Driver trees are then added for long and high fanout nets, and nets exceeding a specified maximum capacitance threshold ("Insert Buffers" 704). In some embodiments the driver tress are constructed according to recursive bipartition-based buffering, until a maximum drive capacity has been met. If one or more new devices are added, thus changing the netlist, then processing loops back to repeat parasitic estimation ("Changes", 704C). If no new devices are added (for example since current buffering is sufficient or maximum drive capacity has been met), then more nearly accurate parasitic approximations are determined, in certain embodiments via Steiner-route techniques, and processing continues ("No Changes" 704N).

Delays are then disseminated through the timing graph, including computing new timing edge element specific transition times ("Propagate" 705). Arrival times and required times are also propagated through the timing graph in topological order. Arrival times are propagated via a Depth-First Search (DFS) order while required times are propagated in reverse DFS order. Spare delay time is then derived for each timing node element of the timing graph ("Compute Slack" 706). The resultant slack times are then normalized and used to determine revised timing weight coefficients and associated timing-driven forces for one or more pins ("Normalize Slack" 707). In some embodiments timing-driven forces are reevaluated only for pins participating in timing critical nets.

A determination is then made as to whether the timing closure is acceptable ("OK Result?" 708). If so, then flow is complete ("OK" 205Y), and processing continues to routing (see FIG. 2). If not, then flow is also complete ("No OK" 205N), but subsequent processing then includes one or more revisions (see FIG. 2).

Figure 7B:
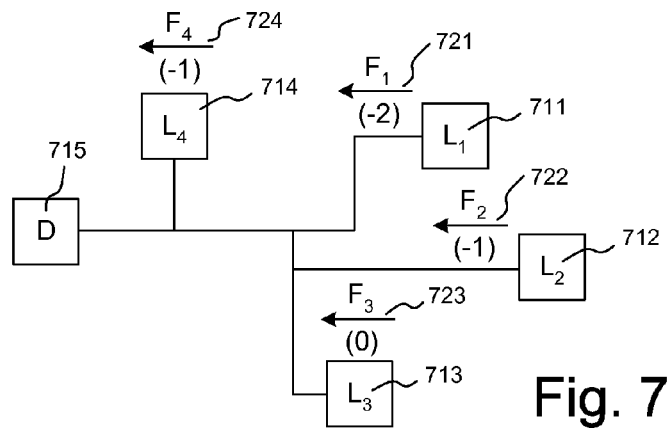
FIG. 7B illustrates a conceptual view of selected elements of an embodiment of timing-driven forces.

FIG. 7B illustrates a conceptual view of selected elements of an embodiment of timing-driven forces, such as used during timing-driven global placement. Driver D 715 is coupled to pins of three loads $L_1$ 711, $L_2$ 712, and $L_3$ 713, and $L_4$ 714. Each node is shown with an associated timing slack in parentheses (−2, −1, 0, and −1, respectively). Corresponding timing-driven forces are shown as $F_1$ 721, $F_2$ 722, $F_3$ 723, and $F_4$ 724 respectively. Since the timing slack for $L_1$ 711 is the most negative (−2), the corresponding timing-driven force $F_1$ 721 is the largest of the three illustrated. Similarly, since the timing slack for $L_3$ 713 is the least negative (0), the corresponding timing-driven force $F_3$ 723 is the smallest of the three illustrated. During SDI-directed placement, the action of timing forces $F_1$ 721, $F_2$ 722, $F_3$ 723, and $F_4$ 724 would be such that the dynamical system nodes corresponding to D 715 and $L_1$ 711 would experience a stronger mutual attraction than that between D 715 and $L_2$ 712, $L_3$ 713, or $L_4$ 714 other things being equal. However, in a realistic circuit, many other factors would be simultaneously considered, and moreover, more than one independent critical path could flow through any of the participating nodes. Consequently, the actual motion of the nodes may not turn out to be the same as might be indicated by such a consideration-in-isolation, as the full complexity of the dynamical system may still overcome timing forces acting on any given node.

Steiner Route Tree Construction

In some embodiments Steiner-route tree construction is according to a heuristic-based modified Prim-Dijkstra algorithm, including elements of Prim's Minimum Spanning Tree (MST) algorithm and Dijkstra's Shortest Path Tree (SPT) algorithm, using a coefficient alpha that is between 0 and 1. As MST yields minimum wire length (or a spanning tree) and SPT yields a minimum radius tree, the coefficient alpha enables efficient trade-offs between MST and SPT.

Resistance/Capacitance (RC) Parasitic Estimation

In certain embodiments, interconnect delay, or wire delay, is determined by modeling a net as a distributed RC network, with load devices presenting a capacitive load on the net. Various approximation schemes may be used, according to embodiment, to estimate the eventual routing for the net before the routing is performed (during placement, for example). The estimated routing is used in turn to derive associated approximate RC network parameters, and the RC approximations are then used to estimate timing delays, as described elsewhere herein.

The RC network is divided into segments, and a wire segment delay is computed for each segment. In some embodiments the wire segment delay is computed according to an Elmore delay model (wire segment delay equals wire segment resistance multiplied by the sum of the wire segment capacitance and all of the associated input capacitances). In some embodiments the wire segment delay is computed according to a higher order moment delay calculation.

In some embodiments routing associated with large (or high fanout) nets is approximated by Steiner tree graph analysis. Delays from a driver to each respective load are then determined as the sum of resistance in series between the driver and the load multiplied by the sum of the capacitance between the driver and the load, where "between" refers to the tree graph segments coupling the driver to the load.

In some embodiments parasitics for short nets are estimated using net contributing factor heuristics. For example, wire capacitance from a driver to a load is equal to a load contribution factor multiplied by a "NetMSRT" multiplied by a capacitance per unit length. NetMSRT is equal to a Net Semi-Perimeter (NSP) multiplied by an "NSP-FanOut-Scaling" factor. The NSP-FanOut-Scaling factor is equal to one-half the quantity equal to the square root of the number of net loads plus one. The load contribution factor describes a relative contribution of a load with respect to all of the loads on the net, and may be expressed as the distance to the load divided by the entire length of the net. Wire resistance is derived similarly to wire capacitance, except resistance per unit length is used instead of capacitance per unit length.

Figures 7C, 7D:
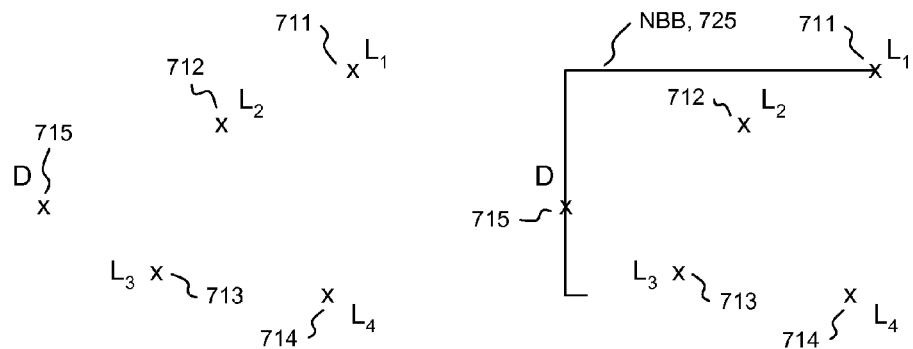
FIG. 7C illustrates a spatial organization of the driver and the coupled loads of FIG. 7B.
FIG. 7D illustrates an embodiment of Net Boundary Box (NBB) estimation of routing to cover the driver and the loads of FIG. 7C.

FIG. 7C illustrates a spatial organization (or topology) of driver D 715 and coupled loads $L_1$ 711, $L_2$ 712, and $L_3$ 713 and $L_4$ 714 of FIG. 7B.

FIG. 7D illustrates an embodiment of NBB estimation of routing to cover the driver and the loads of FIG. 7C. As shown, NBB 725 covers all of the loads and the driver, and is defined by the spatial locations of D 715, $L_1$ 711, and $L_4$ 714.

Figures 7E, 7F:
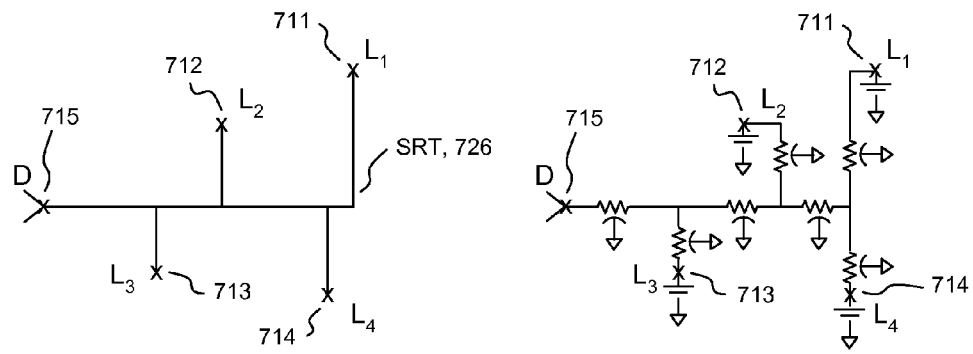
FIG. 7E illustrates an embodiment of a rectilinear Steiner Route Tree (SRT) estimation to cover the driver and loads of FIG. 7C.
FIG. 7F illustrates an embodiment of estimated RC parasitics associated with the RST of FIG. 7E.

FIG. 7E illustrates an embodiment of a rectilinear SRT estimation to cover the driver and loads of FIG. 7C.

FIG. 7F illustrates an embodiment of estimated RC parasitics associated with the RST of FIG. 7E.

Timing Weights Computation

In certain embodiments a timing weight is computed for all pins having a negative timing slack. All other pins are considered non-critical. Non-critical nets are marked as inactive nets and no timing forces are applied to them. Non-critical pins are assigned timing weights of zero (and thus affect no timing-driven forces). The timing weight of a pin may be modeled as a function of various timing parameters including pin slack, worst negative slack, total negative slack, interconnect length, and other similar parameters, according to implementation. In some embodiments the timing weight for a pin is equal to the square of the quantity equal to the slack of the pin divided by the worst negative slack of the entire netlist, and in various embodiments the timing weight is computed according to any number of linear and high-order calculations. The timing-driven forces are computed according to Hooke's law with a coefficient equal to the respective timing weights (i.e. timing force equal to negative timing weight multiplied by distance between driver node and load node).

Selected Timing Closure User Commands

Timing closure and timing-driven placement are automated to varying degrees according to embodiment. In certain embodiments the automation is controlled or directed by a plurality of control parameters provided in data files or scripts (such as via "Commands and Parameters" 130, of FIG. 1). In some embodiments a relatively small number of control parameters may be provided by a Graphical User Interface (GUI). Timing constraints are used to perform timing closure and timing-driven placement, and the GUI may also provide for user input of timing constraints files, such as Synopsys Design Constraint (SDC) compatible information, via a "source SDC" command or menu item.

In some embodiments and usage scenarios design automation software (including timing closure and timing-driven placement) may be operated in a batch mode. In the batch mode any combination of selected switches may be specified in a file (such as a "schedule file", that may be included in "Commands and Parameters" 130, of FIG. 1). A first control switch instructs SDI-driven (sometimes also referred to as force-driven) placement operations (such as operations performed by a placement engine) to apply timing-driven forces at each timestep. By default, the forces are turned off in some embodiments. Timing-driven forces are recomputed at predefined intervals, or at a selected frequency with respect to timesteps, as specified by another control switch.

A second control switch instructs SDI-driven placement to perform timing analysis at predefined time intervals of the SDI simulation, and to report a specified number of critical paths or selected critical paths. In certain usage scenarios the report includes some or all of the most critical paths. If the first control switch is on, then the second control switch is automatically turned on also. However, in some usage scenarios, users may keep the first control switch off with the second control on to perform a timing analysis based on a current system configuration. Selected critical paths may then be reported at predefined intervals during SDI-driven placement. The interval may be user specified, and the reported paths may include a selection of the most critical paths, with the report including worst-negative-slack information.

A third control switch controls how frequently a timing update is performed and timing-driven force computation is performed in the SDI simulation (i.e. when the first control switch is on). In some embodiments a default value for a parameter associated with the third control switch is 50; i.e. every 50 timesteps timing-driven forces are determined anew. In certain usage scenarios a larger value is specified for lager designs. For example if a design is more than one million gates, then an iteration frequency of 100 may be specified. In some usage scenarios the frequency may be adjusted dynamically (either manually by a user or automatically by software). For example, at stages of placement where changes are relatively small (such as later stages of placement), the interval may be increased.

In some embodiments GUI "radio buttons" may be provided to enable a user to enable (or disable) any combination of the control switches. In some embodiments a command window (either separate from or associated with the GUI) may be used to specify the third control switch and the associated parameter.

SDI-Directed Electronic Design Automation (EDA) Flow

Figure 8A:
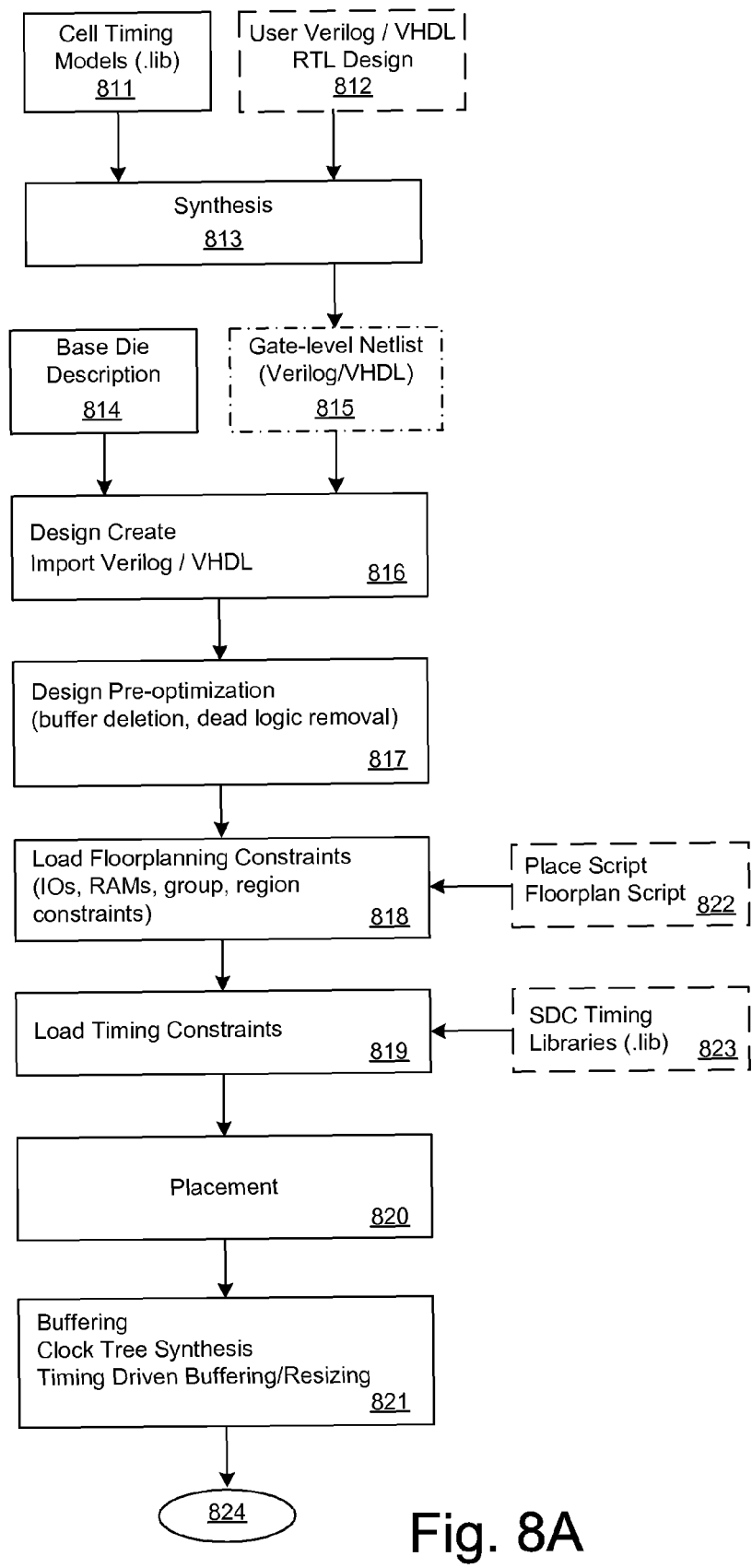
FIGS. 8A and 8B collectively are a flow diagram illustrating selected details of an embodiment of an integrated circuit Electronic Design Automation (EDA) flow using one or more techniques including SDI-directed global placement, legalization, legalization-driven detailed placement, timing optimization, and routing.
Figure 8B:
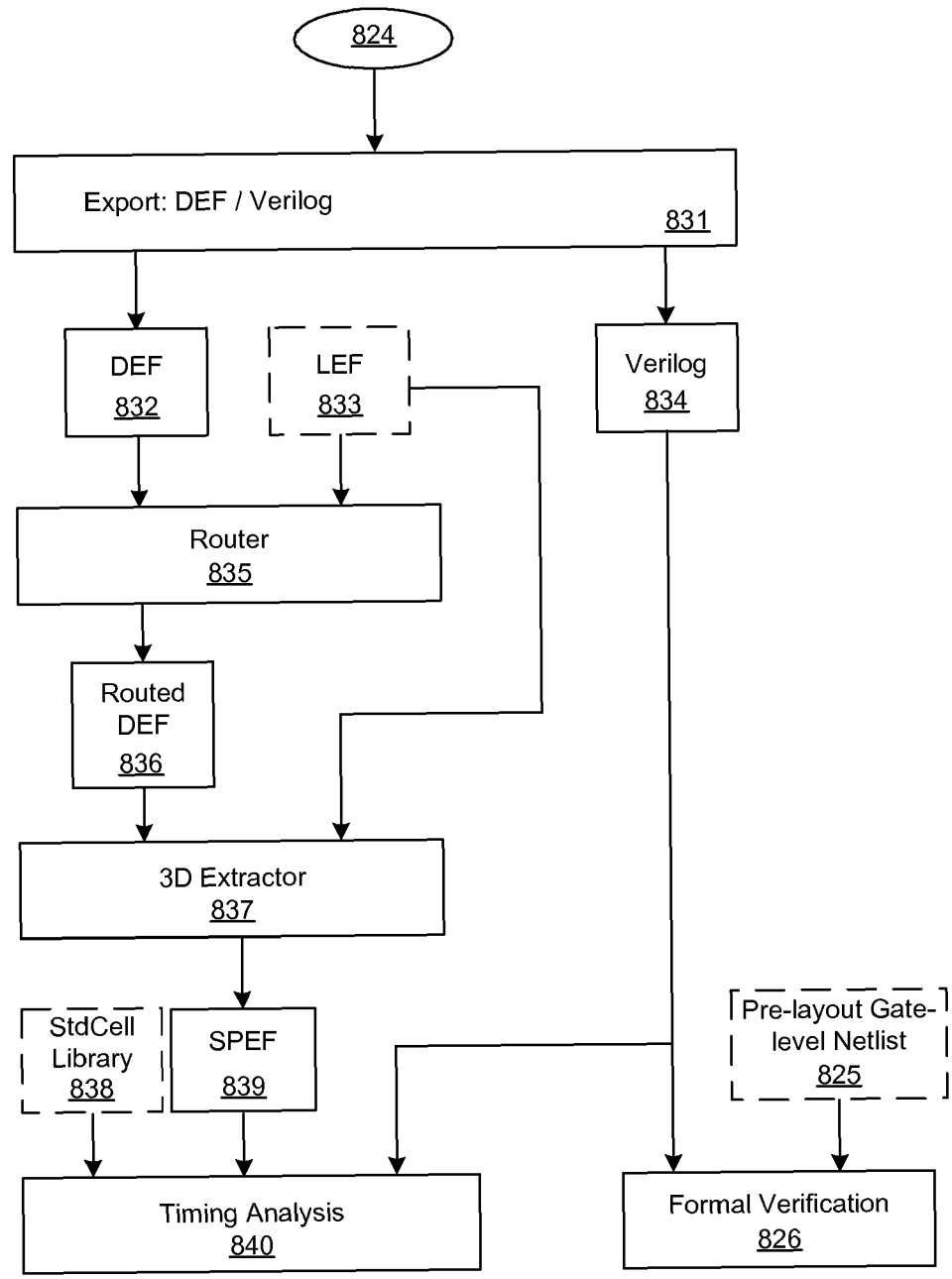

FIGS. 8A and 8B collectively are a flow diagram illustrating selected details of an embodiment of an integrated circuit Electronic Design Automation (EDA) flow using one or more techniques including SDI-directed global placement, legalization, legalization-driven detailed placement, timing optimization, and routing. In the illustrations dashed-boxes represent information provided in certain embodiments by users of the flow. In some embodiments element 815 is provided by users of the flow while in other embodiments it is generated by element 813, and thus 815 is shown having a unique dashed-box patterning.

As a starting point, a design to be implemented is provided as a Hardware Description Language (HDL) or Register Transfer Language (RTL) specification ("User Verilog/VHDL RTL Design" 812). Libraries are provided describing functional and timing characteristics associated with all library cells that may be implemented on a base wafer, such as a predetermined or prefabricated structured array wafer ("Cell Timing Models (.lib)" 811). The libraries may be accessed by various tools shown later in the flow.

The design is then converted to a specific implementation description according to the library and the design specification ("Synthesis" 813). Semiconductor vendor process information such as the number and type of metal layers and via layers, process design rules, and process parameters are provided ("Base Die Description" 814). The die description also includes all die floorplan information associated with implementation as a structured array, i.e. descriptions of SAF tiles. The die description is processed ("Design Create Import Verilog/VHDL" 816) in conjunction with a gate-level netlist produced by synthesis ("Gate-level Netlist (Verilog/VHDL)" 815) resulting in a parsed netlist.

Selected improvements are performed, such as buffer deletion, dead logic removal, inverter pair elimination, and constant propagation ("Design Pre-optimization (buffer deletion, dead logic removal)" 817). Then directives to guide the physical design are processed ("Load Floorplanning Constraints (IOs, RAMs, group, region constraints)" 818). In certain usage scenarios the floorplan constraints are used to "lock" selected elements into desired regions of the die. For example IO pads may be assigned to the perimeter, and RAMs may be allocated to specific zones. Core logic may be guided to selected areas or grouped together as desired. In some embodiments the floorplan constraints are provided via one or more scripts ("Place Script; Floorplan Script" 822).

Timing performance criteria are then processed ("Load Timing Constraints" 819), in some embodiments according to timing libraries ("SDC Timing Libraries (.lib)" 823). Information in the timing libraries may be according to an SDC format, and includes input arrival times, output required times, false path identification, and multi-cycle path notations. In certain embodiments subsequently locations are determined for all of the elements in the netlist ("Placement" 820), guided by previously provided constraints. Timing performance improvements are then made to effect timing closure ("Buffering Clock Tree Synthesis Timing Driven Buffering/Resizing" 821). Clock tree synthesis strives to meet desired clock skew constraints, and buffer resizing serves to meet user specified timing constraints.

Processing then flows (via 824) to output post layout design data ("Export: DEF/Verilog" 831). In certain usage scenarios a format compatible with Design Exchange Format (DEF) is used to facilitate interchange with various EDA tools. The output DEF ("DEF" 832) specifies the structure of the design and all placement information. The output Verilog ("Verilog" 834) specifies the post-layout gate-level netlist. The DEF output is provided along with information describing routing technology ("LEF" 833) to compute interconnect details ("Router" 835). The resultant geometry is output as DEF ("Routed DEF" 836) that is processed ("3D Extractor" 837) along with the routing technology information to determine connectivity and parasitic information ("SPEF" 839). The parasitic information is according to a Standard Parasitic Exchange Format (SPEF).

A timing performance check is then made ("Timing Analysis" 840) using the parasitic information, the post-layout gate-level netlist, and device characterization information ("Std-Cell Library" 838). A correctness check is also made ("Formal Verification" 826) by comparing a pre-layout gate-level netlist ("Pre-layout Gate-level Netlist" 825) with the intended-to-correspond post-layout gate-level netlist. In some usage scenarios the pre-layout gate-level netlist is identical to the netlist output from synthesis.

The illustrated EDA flow is an example only, as some of the illustrated operations may be omitted or performed in slightly different orderings according to various embodiments.

Manufacture of Devices Designed Via SDI-Directed Techniques

Conceptually a structured array architecture is defined to satisfy a plurality of user-specific designs. The architecture is optionally based on a pre-characterized standard cell library. A plurality of user-specific designs are targeted for the defined architecture, and physical layout is generated at least in part based on a SDI-directed place and route flow. An inventory of wafers (or die) built according to the structured array architecture is used as a starting point to manufacture instances of the user-specific designs. Thus a single structured array architecture (and corresponding predetermined wafer inventory) serves to implement more than one user-specific design via a SDI-directed placement and routing.

Figure 9:
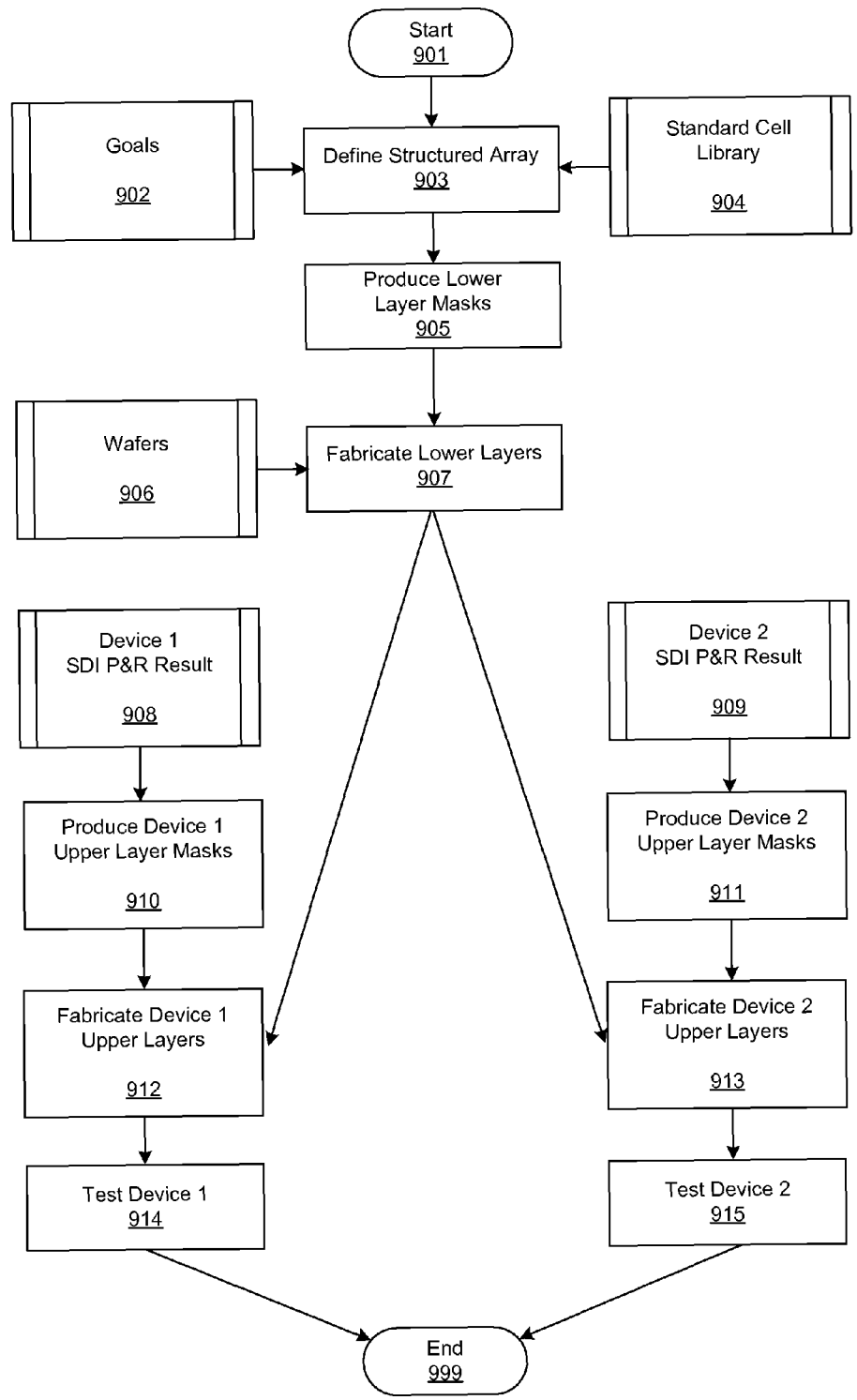
FIG. 9 illustrates selected details of an embodiment of manufacturing integrated circuits, the circuits being designed in part based on SDI-directed design techniques.

FIG. 9 illustrates an embodiment of selected details of manufacturing integrated circuits, the circuits being designed in part based on SDI-directed design techniques. The manufacturing flow begins ("Start" 901) by receiving objectives for a design or a group of designs ("Goals" 902) along with optional information ("Standard Cell Library" 904) regarding relatively fixed-function elements previously manufactured and characterized according to a selected integrated circuit production facility or "fab". The received items are processed to determine one or more SAF tiles to be arrayed to form a structured array integrated circuit ("Define Structured Array" 903). The standard cell library information may be used to develop SAF tiles with lower cost than developing SAF tiles from "scratch". Fabrication images are produced from the structured array design ("Produce Lower Layer Masks" 905).

The lower layer masks are combined with starting materials ("Wafers" 906) to produce an inventory of pre-fabricated structured array die ("Fabricate Lower Layers" 907). A first and a second device are designed according to a SDI-driven place and route flow, and the resultant design databases are provided to the flow ("Device 1 SDI P&R Result" 908 and "Device 2 SDI P&R Result" 909). Each of the databases is then used to produce corresponding sets of upper layer fabrication images ("Produce Device 1 Upper Layer Masks" 910 and "Produce Device 2 Upper Layer Masks" 911, respectively). The upper layer masks are used to manufacture ("Fabricate Device 1 Upper Layers" 912 and "Fabricate Device 2 Upper Layers" 913, respectively) one or more integrated circuits according to each of the respective designs, using portions of the previously developed inventory ("Fabricate Lower Layers" 907). The manufactured devices are then tested ("Test Device 1" 914 and "Test Device 2" 915, respectively) and the flow is complete ("End" 999).

Computer System Executing SDI-Directed EDA Routines

Figure 10:
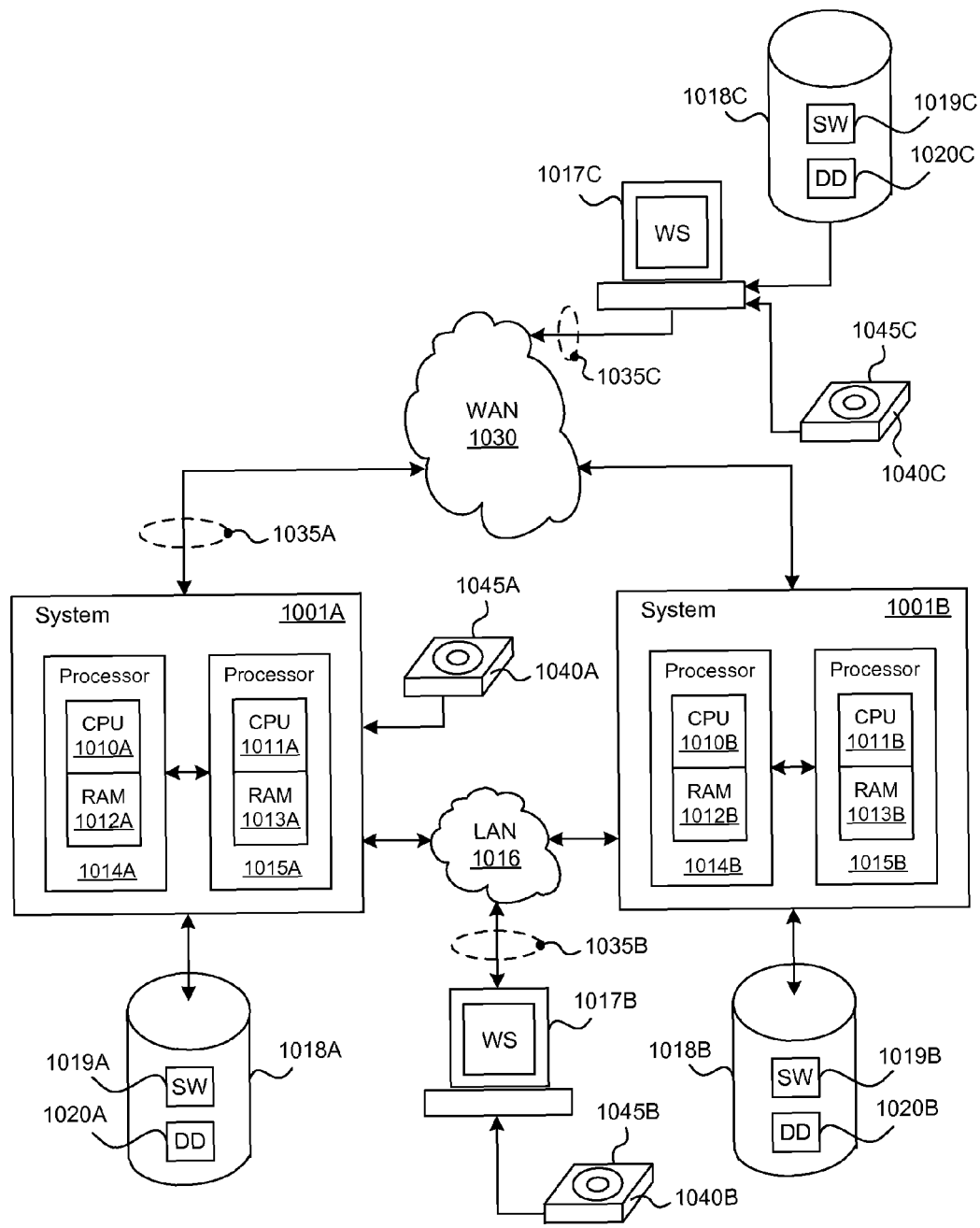
FIG. 10 illustrates selected details of an embodiment of a computer system to execute EDA routines to perform SDI-directed place and route operations.

FIG. 10 illustrates an embodiment of selected details of a computer system to execute EDA routines to perform SDI-directed place and route operations. There are multiple subsystems illustrated including computing and storage complexes (System 1001A and System 1001B) and workstations (local WS 1017B and remote WS 1017C). Similar elements have identifiers using the same numerical base, and a letter suffix is used to distinguish different instances. For brevity, unless there is a notable difference between the instances, only the first instance of similar elements is described.

A data processing machine (System 1001A) includes a pair of computational elements (Processors 1014A and 1015A). Each processor includes a Central Processing Unit (CPUs 1010A and 1011A, respectively) as well as working memory (RAMs 1012A and 1013A, respectively). The machine is coupled to a storage array, such as disk 1018A, that includes images of EDA software (SW 1019A) and design database information (DD 1020A). An interconnection resource (Local Area Network LAN 1016) enables local communication between System 1001A, System 101B, and workstation/PC (WS 1017B) enables local users to access the facilities to direct and observe computations. Systems 1001A and System 1001B are also coupled to Wide Area Network WAN 1030, such as a corporate intranet, the Internet, or both. Remote WS 1017C communicates with any combination of System 1001A and System 1001B via WAN 1030. In certain embodiments, WS 1017C has a disk 1018C, that includes images of EDA software (SW 1019C) and design database information (DD 1020C). In some embodiments at least part of the EDA software images may be compressed or encrypted while stored on disk.

SW 1019A may include one or more machine-readable executable files corresponding to any combination of processing operations illustrated in FIG. 1, as well as any processing operations performed on behalf or under control of elements in FIG. 1. For example, global placement (such as SDI-directed global placement), legalization, detailed placement, timing closure, and routing operations may be encoded as portions of SW 1019A for execution by System 1001A. Similarly, design data (such as data corresponding to any combination of portions of "Commands and Parameters" 130 and "Working Data" 131) may be stored in portions of DD 1020A. In operation the CPUs (in conjunction with associated RAMs) execute portions of SW 1019A to perform assorted EDA functions.

In some embodiments SW 1019A may include routines that are chosen (or optimized) in part to facilitate parallel execution of EDA routines (such as SDI-directed global placement, legalization, detailed placement, and routing) on CPUs 1010A and 1011A. In some embodiments the parallel execution may be carried out on System 1001A simultaneously (or overlapping) with System 1001B (via LAN 1016) such that CPUs 1010A, 1011A, 1010B, and 1011B are operating together to provide a SDI-directed EDA solution for a single user-specific design. The parallel processing is not limited to two machines, nor to machines with multiple internal processors. Rather, the parallel computation may be performed on a collection of processors, however organized or subdivided amongst independent machines. For example, the software may run on a massively parallel supercomputer, or on a network of multiprocessor computers, or on a network of single processor computers.

In certain embodiments, each of System 1001A, WS 1017B, or WS 1017C may have an associated removable media drive, represented respectively by drives 1040A, 1040B, and 1040C. The removable media drives are used to load at least parts of the EDA software images, such as those discussed above, from removable media, represented respectively by disks 1045A, 1045B, and 1045C. The removable media and the associated drives can take many forms, including but not limited to optical, magnetic, and flash media, including such media as floppy disks, CD-ROMs, DVD-ROMs, and flash disks.

In certain embodiments, WS 1017C transfers at least parts of EDA software images SW 1019C from either or both of System 1001A and System 1001B via WAN 1030. With or without a local EDA software image, according to various embodiments, WS 1017C may interact with either or both of System 1001A and System 1001B for the purpose of locally or remotely executing or controlling any of the global placement (such as SDI-directed global placement), legalization, detailed placement, timing closure, and routing operations, as otherwise taught throughout this disclosure. In various embodiments, WS 1017C selectively has control interactions and/or data transfers (including data related to the design database information) with respect to either or both of System 1001A and System 1001B. In various embodiments, the transfers are selectively compressed or encrypted. At least parts of the EDA software images, the control interactions, or the data transfers, are thus observable as propagated signals at points that include signal observation point 1035C and point 1035A.

In various embodiments, the propagated signals selectively include interactions related to enabling and/or licensing of WS 1017C (or a particular user of WS 1017C) to locally and/or remotely execute and/or control any of the EDA operations taught herein. In certain embodiments, an FTP service is made available to WS 1017C for downloading of at least parts of EDA software image 1019C via WAN 1030. In related embodiments, the downloaded software is adapted to be a demonstration embodiment, with either limited functionality or that functions only for a predetermined interval. In other related embodiments, a software key is used by WS 1017C (obtained via WAN 1030 or other means of distribution) to enable or restore functionality of at least parts of the EDA software, whether the EDA software was loaded from removable media 1045C or propagated via WAN 1030. In related embodiments, the management and distribution of the software key is a component of the licensing process. The licensing is not limited to workstations. In an analogous embodiment, at least part of System 1001A and System 1001B are licensed using selective aspects of the above described techniques.

In certain embodiments, executing EDA software, as otherwise taught herein, selectively reports license related events via WAN 1030 to license management processes running on at least one designated server. In related embodiments, the reported license related events are evaluated in accordance with predetermined criteria and alerts, reports, control events, and/or billings are selectively and/or automatically created and/or updated.

SDI-Based Detailed Placement Embodiments

Figure 11:
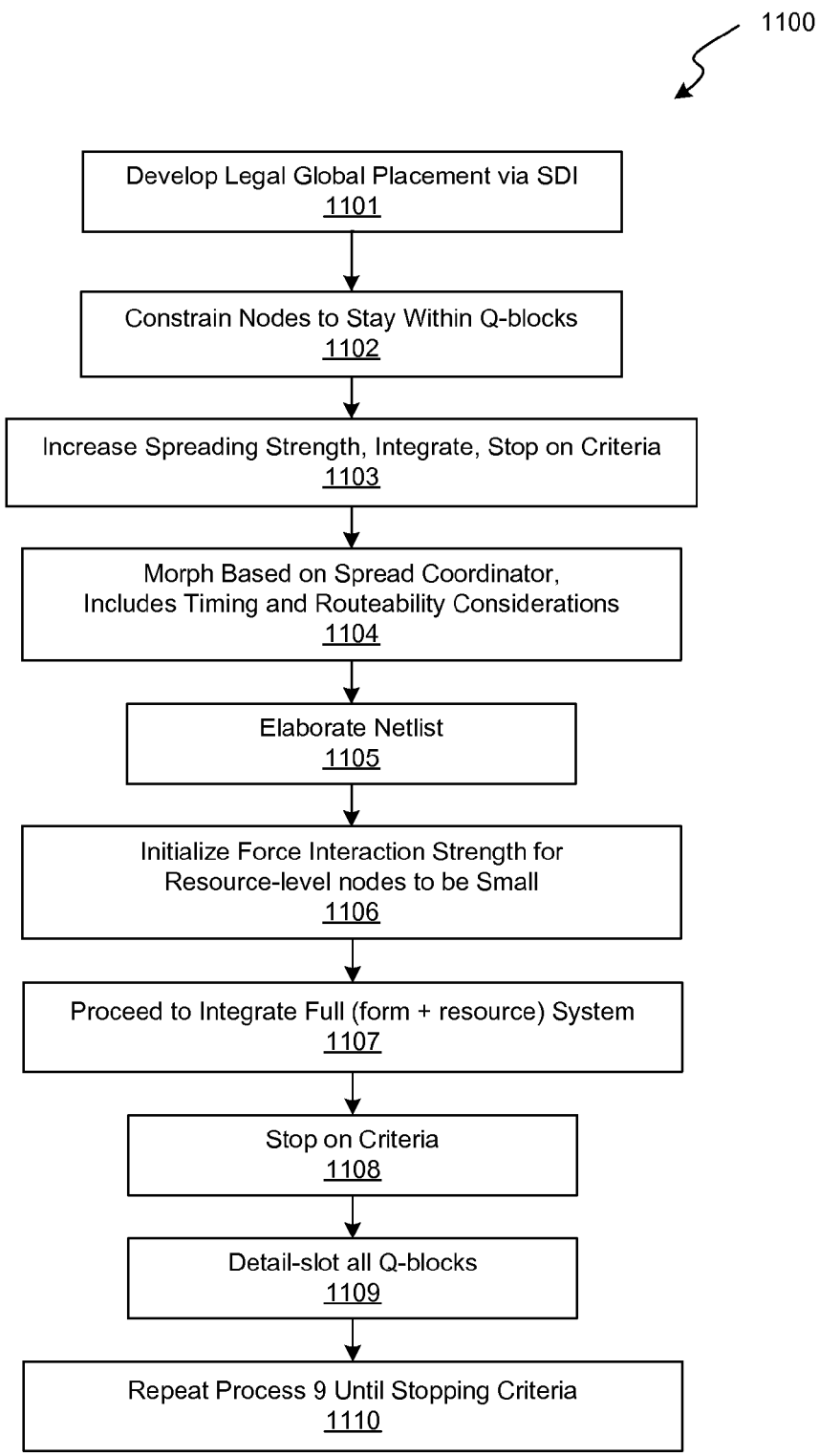
FIG. 11 illustrates an embodiment of an SDI-based detailed placement flow.

FIG. 11 illustrates an embodiment of an SDI-based detailed placement flow useful in a variety of applications. The SDI-based detailed placement flow may replace and/or augment operations performed after global placement and before routing (such as any combination of processing relating to "Legalization" 203 and "(SDI) Detailed Placement" 204 of FIG. 2).

In 1101 a legal global placement is developed (such as via "SDI Global Placement" 202 of FIG. 2). In 1102 nodes are (optionally) prevented from moving between Q-blocks, thus increasing the likelihood that a fitting (i.e. legal) global placement is retained during continued system evolution. In some usage scenarios where circuit density is at or near a threshold of what can be supported in a structured ASIC architecture, the processing of 1102 is invoked. In some usage scenarios where the processing of 1102 is omitted, subsequent legalization processing is used.

In 1103 spreading force strengths are increased, and in some usage scenarios the spreading forces are substantially increased. According to various embodiments the spreading forces are increased by any combination of reducing digital filtering of fields sourcing the spreading forces, and increasing spatial resolution of a grid the spreading fields are calculated with respect to. In some usage scenarios the (substantial) increase in spreading forces does not result in (substantial) bulk motion since nodes (such as form-level nodes) are prevented from moving between Q-blocks. In some usage scenarios the (substantial) increase in spreading forces does add energy to the system, and various techniques for changing the ratio between kinetic and potential energy of the system may be employed (as described elsewhere herein).

In some usage scenarios processing in 1103 serves to overcome tight packing of form-level nodes that causes local density of the form level nodes (on relatively short spatial length scales) to exceed slot density (i.e. supply) of the underlying SAF. In some usage scenarios the exceeding of supply increases effort required by a slot assigner to discriminate between alternate slot assignments. By spreading out the form-level nodes and reducing large density fluctuations on short spatial length scales, the form-level nodes within the Q-block are driven farther apart, and thus closer to coordinates of ultimate slot assignments. In some usage scenarios the reduction of density fluctuations serves to reduce dislocation during detail slot assignment, thus improving quality of the detail placement overall.

In 1104 morphing is optionally repeated, with new target locations for form-centers. In some usage scenarios nodes demanding a resource may be unevenly distributed in a region, and thus some of the resource-level nodes are moved a comparatively long distance to reach a slot. The movement results in "cut inflation", where nets are forced to be routed over relatively longer distances and thus consume more routing resources than were anticipated by the form-level placement. The cut inflation results in decreased routability. The cut inflation may be overcome by the optional morphing, to improve the balance between spatial distribution of resource slots and nodes. Nodes are then moved shorter distances during slot assignment, reducing cut inflation and routability degradation.

Figure 12A:
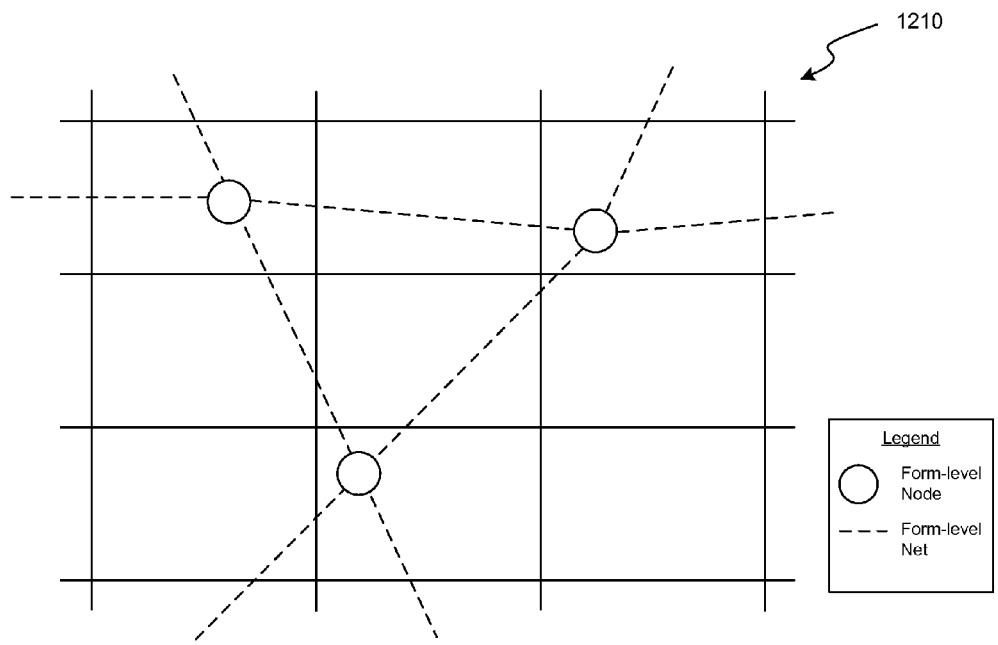
FIGS. 12A and 12B illustrate concepts relating to an embodiment of netlist elaboration.
Figure 12B:
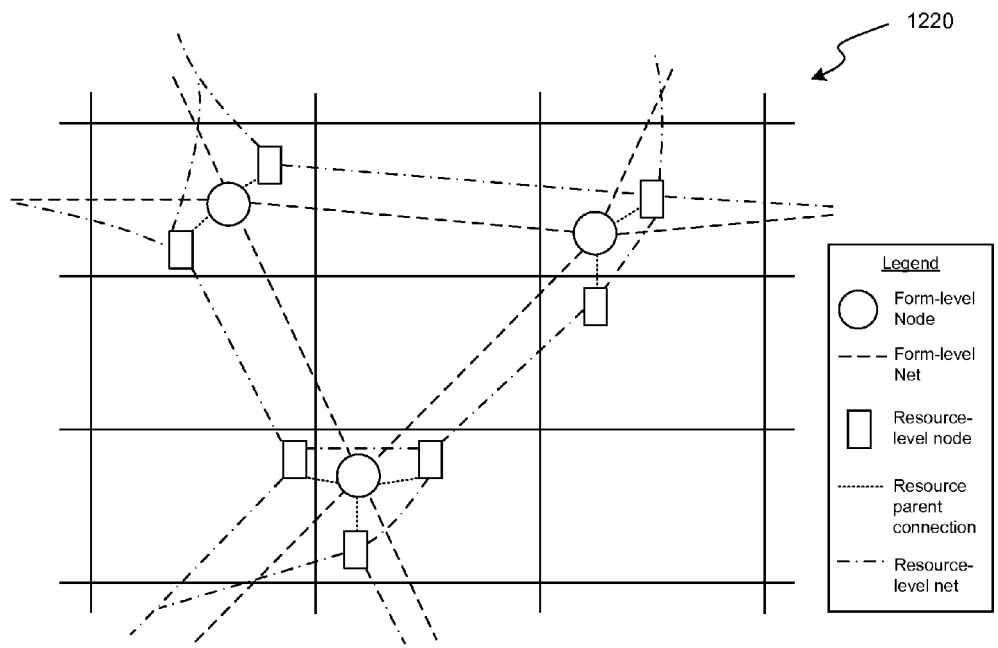

In 1105 the netlist is elaborated with resource-level nodes and nets spanning pins on the resource-level nodes (see the discussion relating to FIG. 12A and FIG. 12B). Forces are included to tie resources to respective parent forms. In some embodiments information relating to the resource-level nodes (and associated spanning nets) is retained in extended data structures to facilitate SDI-based processing of the resource-level nodes.

In 1106 forces and interaction coefficients are initialized to relatively low values for the new resource-level elements of the combined (i.e. elaborated) netlist. Integration is then resumed in 1107. The resumed integration is according to the forces and interaction coefficients for the new elements in addition to the forces and the interaction coefficients "inherited" from the global SDI-based processing. In some usage scenarios using the new and inherited forces and coefficients together results in disentanglement of the resource-level nodes now present in the netlist. Enabling the resource-level nodes to move independently of each other provides a context for resources to move left (or right) or up (or down) with respect to sibling resources of the same parent form. The movement of the resource-level forms enables more efficient slot assignments otherwise indistinguishable when only the center of the parent form is examined.

In 1108 integration (i.e. time evolution of the system) is stopped according to selected criteria. In some embodiments dampening effects are increased to drive the system toward a new state reflecting separation of resource-level nodes and to prevent or reduce thrashing. In some embodiments the dampening effects are auto-regulated.

The selected criteria may include any combination of a number of integrator steps, an amount of "system time", system kinetic energy (i.e. temperature) falling to a threshold value, system kinetic energy falling by a threshold percentage with respect to an initial value, and system kinetic energy falling by a threshold percentage in a single time step. The number, the amount, the threshold value, and the threshold percentages may be predetermined or programmatically varied according to various implementations and usage scenarios.

In 1109 all Q-blocks are processed. In some embodiments the processing for each Q-block is according to functions described elsewhere herein with respect to FIG. 13. In 1110 processing relating to 1109 is repeated until stopping criteria are met. In some embodiments the criteria include full placement of all resource classes. In some embodiments processing then continues according to functions described elsewhere herein with respect to FIG. 14.

FIGS. 12A and 12B illustrate concepts relating to an embodiment of netlist elaboration. FIG. 12A illustrates a portion of a system with three form-level nodes located on computational grid 1210 and coupled by a plurality of form-level nets. FIG. 12B illustrates the system of FIG. 12A with resource-level nodes (corresponding to resource-level forms) for each of the form-level nodes "added" to the system. Also illustrated are connections between resource-level nodes and corresponding parent nodes, as well as resource-level nets. The parent connections and resource-level nets are representative of corresponding forces and interaction coefficients that are added to the system as a result of elaboration and in preparation for SDI-based detailed placement time evolution. The resource-level nodes and nets may be retained in extended data structures for the SDI-based processing.

Figure 13:
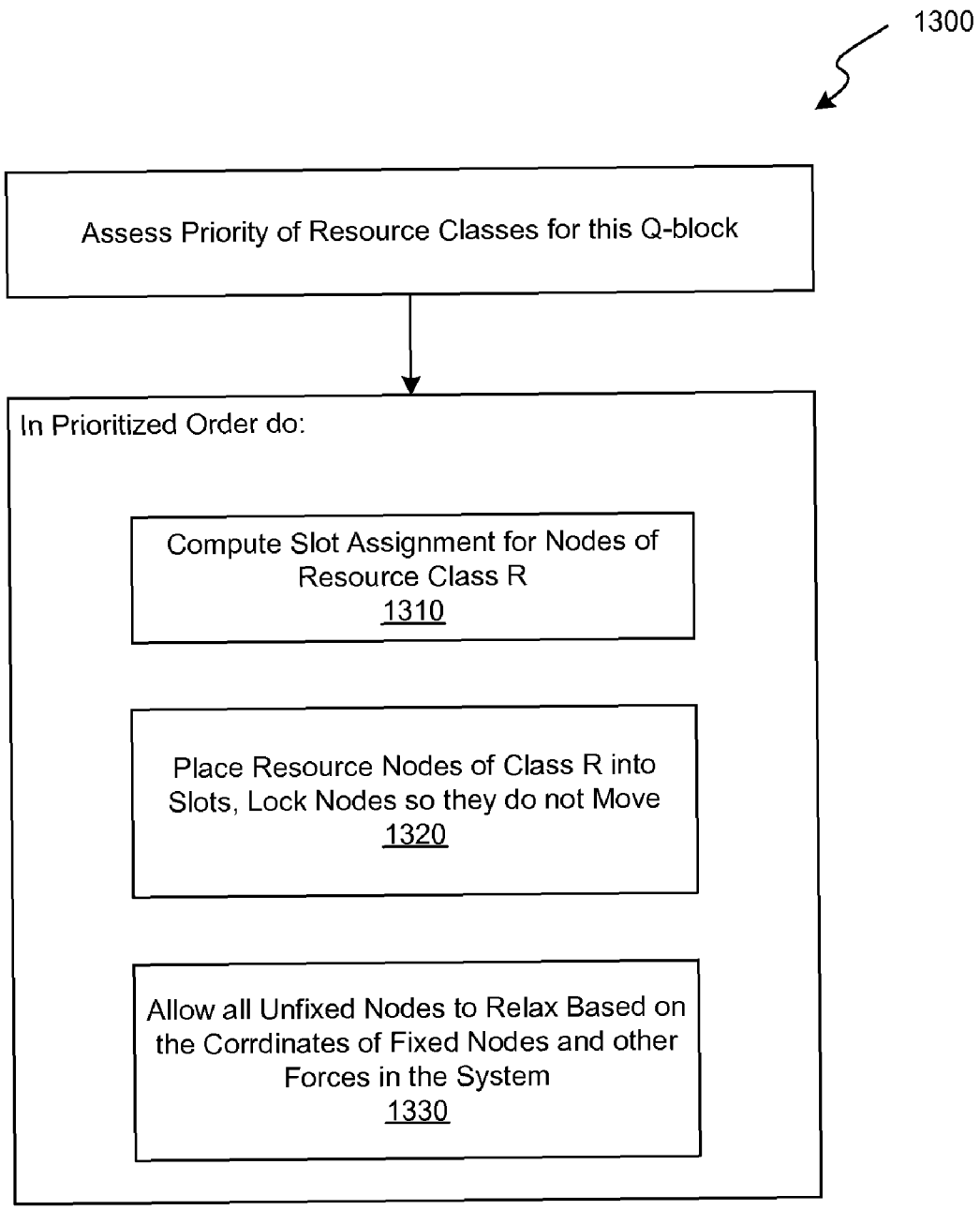
FIG. 13 illustrates an embodiment of detailed placement of a Q-block.

FIG. 13 illustrates an embodiment of detailed placement of a Q-block. In 1301 priority of each resource class in a Q-block is assessed, based on a combination of factors relating to resource supply and consumption. Less supply makes for higher priority, and more consumption makes for higher priority. Note that prioritization results naturally vary from one Q-block to another, as nodes (demand) and available slots (supply) vary from one Q-block to another. Processing according to 1310, 1320, and 1330 is then performed for each resource class in order according to the resource class prioritization.

In 1310 slot $d^2$ optimized slot assignment for nodes of the respective resource class is performed via one or more techniques identical to or similar to processing associated with elements illustrated or discussed with respect to FIG. 6 (such as "Pairwise Interchange" 603). In some embodiments the slot assignment is performed using an implementation dependent technique.

In 1320 resource-level macros of the respective resource class are assigned to computed (or destination) slots. The assignments are then "fixed" (i.e. prevented from moving or being reassigned). According to various embodiments the fixing may be via any combination of a variety of techniques. The techniques include:

Instantaneous enactment, i.e. a node is moved directly to the destination slot and locked;

Gradual enactment; i.e. a node is propelled toward the destination slot using a slow but overwhelming force, stronger than all other forces acting on the node, so that the node reaches the destination slot in an adiabatic motion over some reasonable number of timesteps and is locked there; and Direct parametric motion; i.e. a line is drawn from the current position of the node to the destination slot, and the node is moved directly along the line toward the destination slot over a series of timesteps and is locked there.

In 1330 remaining unfixed elements are optionally enabled to relax according to new coordinates corresponding to the destination slot assignments most recently made in 1320. In some embodiments (such as various embodiments using instantaneous enactment) processing in 1330 is performed. In some embodiments (such as various embodiments using gradual enactment or direct parametric motion) processing in 1330 is skipped.

Figure 14:
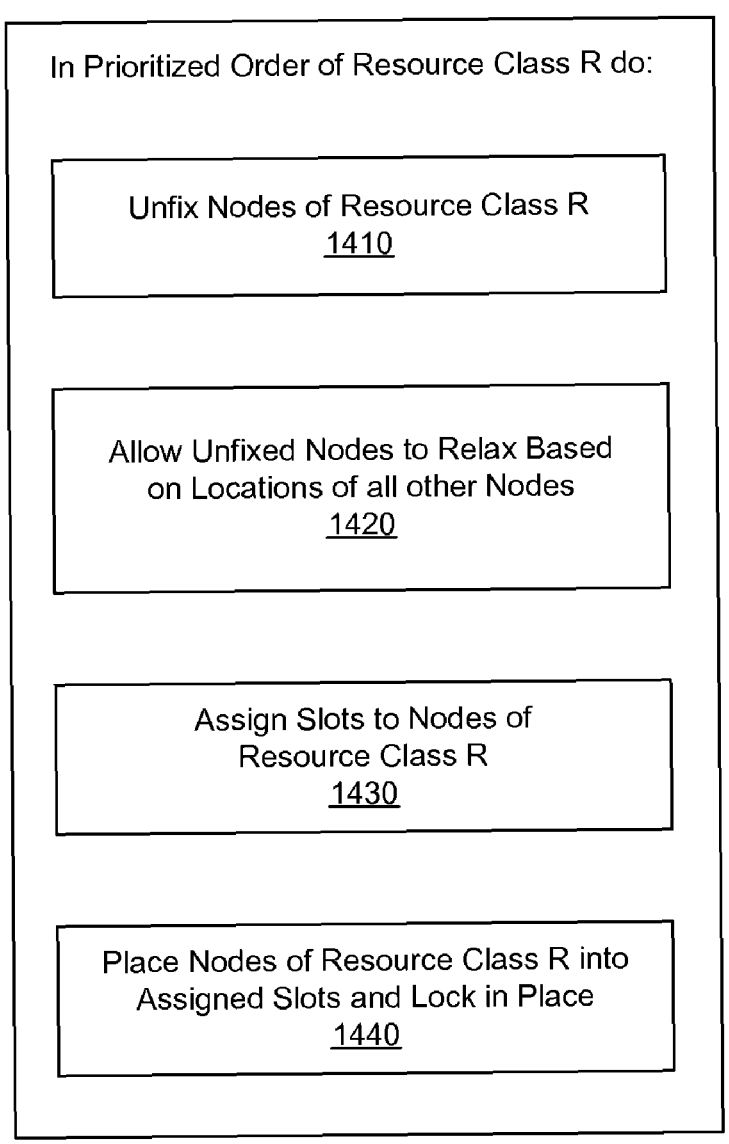
FIG. 14 illustrates an embodiment of an additional pass of detailed placement of a Q-block.

FIG. 14 illustrates an embodiment of an additional pass of detailed placement of a Q-block. Processing according to 1410, 1420, 1430, and 1440 is performed for each resource class in order according to the resource class prioritization determined in 1301 of FIG. 13. Each resource class is unfixed in turn to enable additional relaxation. In some usage scenarios a plurality of iterations of processing of all resource classes according to FIG. 14 is performed. Unfixing each resource class enables higher priority resource classes (i.e. classes processed ahead of other classes) to relax with respect to lower priority resource classes (i.e. classes processed behind other classes).

Additional Morphing Embodiments

In at least some structured ASICs the supply of fundamental hardware resources is predetermined and fixed. Careful apportionment of netlist nodes into function-realization-entities (forms) can help to improve the quality of the physical solution of the EDA flow. However, size and performance constraints cause the form selections of different nodes in the netlist to be coupled, resulting in an extremely complex and thus potentially expensive computational optimization problem. A procedural approach to generating a solution includes a technique making use of Integer Linear Programming (ILP). Illustrative embodiments for circuit placement are described.

Figure 15A:
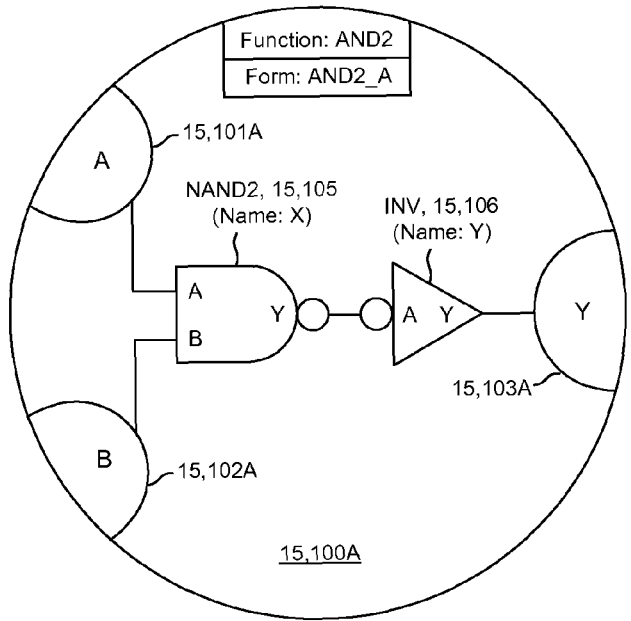
FIG. 15A illustrates a form of the form-level net of FIG. 12A. In this view the resource-level nodes are shown internal to the form.
Figure 15B:
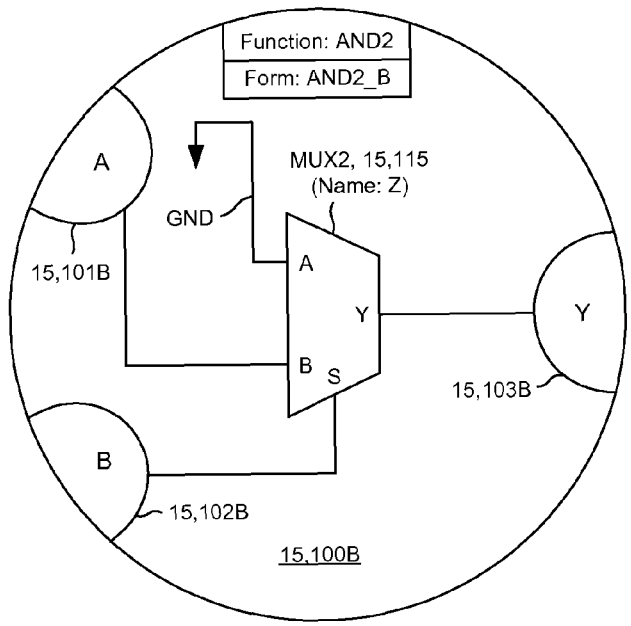
FIG. 15B illustrates another form that uses different resources to implement the same function as the form of FIG. 15A. In at least one embodiment, the form of FIG. 15B is substituted for the form of FIG. 15A through a morphing process.

A schema for representation of a circuit netlist when nodes of an initial (e.g. synthesis- or schematic-derived) gate level netlist are interchangeable with functionally equivalent alternatives implemented using different hardware resources is used. Herein, each functionally equivalent realization is called a "form", and the initial gate level netlist is called the form-level netlist. Exchanging a form instance in the form-level netlist with a functionally equivalent alternate form is herein called "morphing". FIG. 12A illustrates a form-level net of form-level nodes overlaid on a computational grid. FIG. 12B illustrates one type of view of an elaboration of the form-level net of FIG. 12A to include resource-level nodes in a resource-level net. FIG. 15A illustrates a form of the form-level net of FIG. 12A. In this view the resource-level nodes are shown internal to the form. FIG. 15B illustrates another form that uses different resources to implement the same function as the form of FIG. 15A. In at least one embodiment, the form of FIG. 15B is substituted for the form of FIG. 15A through a morphing process.

In a structured ASIC, the supply of hardware resources is predetermined and fixed. The optimal selection of implementation form for each node in the form-level netlist is a complex problem involving many coupled considerations. For example, certain hardware resources in a structured ASIC might be faster than others, but if all form-level nodes were morphed into forms that utilize the faster resource, then the total silicon area required to implement a circuit could be greater than otherwise necessary, thus increasing cost of manufacture. A denser placement may be obtained if the form-level instances in the netlist are morphed amongst available forms so aggregate demand for each resource type across all form instances in the netlist follows the same proportional relationship as the supply thereof in the structured ASIC architecture being used to implement the circuit. However, since in such an apportionment, many form instances will be implemented using forms that require slower hardware resources, the circuit may perform slower overall. Careful apportionment of the forms among the nodes of the netlist to optimize overall performance of the circuit is important. Each change of a given form instance from one implementation form to another results in a change to timing characteristics of all logic paths through the affected node, hence providing another coupling pathway in the form determination process. Similarly, if resource exhaustion forces a node to be implemented using a form such that the nearest available implementation resources are far from the ideal location of the node, then routability degradation may occur.

There are many uses of morphing in structured ASIC EDA. The following list of examples is provided for illustration only, and should not be taken as limiting.

Figure 16A:
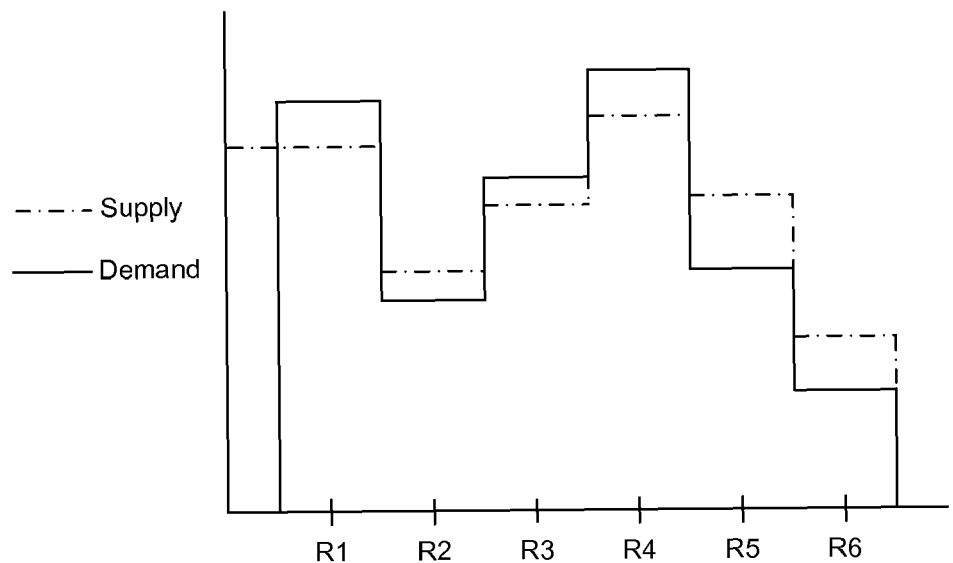
FIG. 16A illustrates the supply and demand for resources R1 through R6 corresponding to target functions of an integrated circuit design having a first selection of forms for the target functions. For at least some of the resources, the demand exceeds the available supply.
Figure 16B:
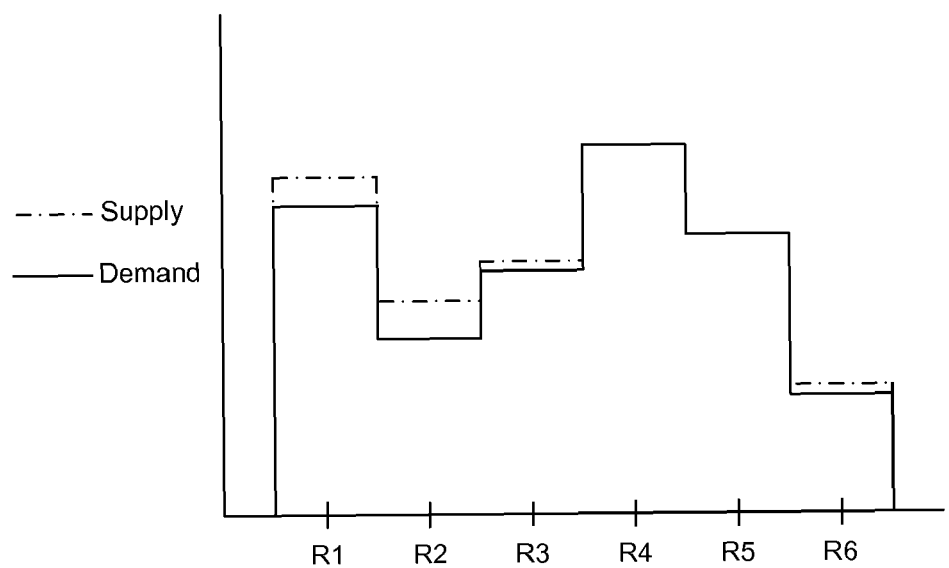
FIG. 16B illustrates the supply and demand for resources R1 through R6 for the same target functions, but using a second selection of forms for the target functions obtained by morphing certain forms to use different resources. For each of the resources shown, the demand is less than or equal to the supply.

As one illustrative example, consider the case of a netlist that is to be placed in a structured ASIC logic array instance. Knowledge of whether the netlist can be packed to fit into the available resource supply of the specified structured ASIC is desired. A simple tabulation of the resources demanded by the forms in the initial gate level netlist can be performed and compared to the supply of resources in the structured ASIC logic array instance. FIG. 16A illustrates the supply and demand for resources R1 through R6 corresponding to target functions of an integrated circuit design having a first selection of forms for the target functions. For at least some of the resources, the demand exceeds the available supply. However, even if the demand for any resource exceeds supply in the structured ASIC logic array instance, then a fit may still be possible. It may be possible to morph some or all of the nodes in the form-level netlist by exchanging selected form instances with functionally equivalent alternate forms, to relieve the over demand for certain resources while increasing the demand for other underutilized resources. FIG. 16B illustrates the supply and demand for resources R1 through R6 for the same target functions as for FIG. 16A, but using a second selection of forms for the target functions obtained by morphing certain forms to use different resources. For each of the resources shown, the demand is less than or equal to the supply. In this way, a morphing operation can yield a determination of the feasibility of fitting a netlist into a structured ASIC logic array instance.

As another illustrative example, consider the case of a netlist that is to be placed into the smallest possible accepting logic array instance of the structured ASIC. In this situation the size of the structured ASIC is not predetermined, but is to be an output of the netlist packing optimization problem. Possible approaches t include: A) A succession of structured ASIC logic array instances of different sizes are individually evaluated using the fit-checking procedure described in the preceding example. The smallest structured ASIC logic array instance that is large enough to hold the netlist is the result. B) Morph the form-level netlist until the stoichiometric ratios of the resources demanded by the forms matches as nearly as possible with the stoichiometric provisioning proportions in the structured ASIC. Then the ratio between the corresponding elements in the resource demand versus provisioning yields the required logic array size.

In yet another illustrative example, consider the case of the placement of a netlist within a specified structured ASIC logic array instance. In this case, in addition to determining if a netlist can fit, a complete final placement is sought, such that all resources consumed by forms of a form-level netlist are uniquely assigned to resource "slots" in the structured ASIC logic array instance. One approach is to divide available area into abutting blocks, and then attempt to find a morphing solution that fits a respective portion of the netlist over each block into the respective resource complement of the respective block. As with the netlist fit-checking operation described above, there may be an initial imbalance between the resources demanded by the forms and the structured ASIC logic array supply in a given region that can be relieved through morphing. Only a subset of the nodes in the netlist participate in the morphing operation, and only a portion of the resources of the structured ASIC logic array instance are available for utilization. The block morphing operation is performed on the subset of the netlist that is contained within each of the blocks. The blocks need not be of uniform shape or size. Of course, embodiments such domain decomposition and netlist subsection morphing are not the only approaches to placement generation. As long as the whole netlist is morphed to fit within the resources of the whole structured ASIC logic array instance, there will be some way that the resources of the form instances in the netlist could be assigned to resource slots.

As an additional illustrative example, consider the case of placement of a netlist into a dynamically sized structured ASIC logic array instance, where the final size of the logic array is determined simultaneously with generation of a legal placement. Such a facility might work by "spreading" the netlist until nodal density fell to a point where block-based morphing (as described above) was successful for all domains containing circuit elements. The size of the final fitting configuration determines the size of the structured ASIC logic array to be used for the netlist. This example is distinct from the minimum logic array size determination example above, in that the former represents a theoretical maximum packing density determination, where all the netlist form-level nodes participate in the morph, whereas in this case there are many independent morphing problems where a reduced subset of the netlist nodes participate in the morphing operation. The size of the logic array instance that can be obtained in this way will in general be lower bounded by the former "theoretical maximum density" logic array size described in the earlier example. In general, the fewer the number of form-level instances that participate in a morphing operation, the less space-efficient the solution will be.

As an additional illustrative example, consider the case of a placement flow that aims to generate a placement of a netlist using iterative refinement of morphing regions. In this scenario, processing starts with a structured ASIC logic array instance size known to be big enough to hold a morphed version of the netlist (at least as big as the minimum theoretical size produced by the logic array size minimization example in the previous section). A morphing window is defined, initially to be the size of the full structured ASIC logic array instance. The netlist is globally placed within the window using any available global placement or partitioning technique and morphing operations are attempted in subdomains (or subwindows) of the (previous) morphing window. The subwindows may be constructed by bisection of the enclosing window, or by any other suitable subdivision technique. When the global placement has evolved to the point that each subwindow is morphing soluble, the netlist nodes are constrained to stay within the subwindows, and the subwindows themselves are taken to define a reduced spatial domain for further global placement or partitioning refinement. In this way, the process proceeds by recursive subdivision of morphing windows, until some limiting cutoff criteria is reached. For example, the process might terminate when the morphing windows reach a size of 10 nanometers^2, or any other similar stopping criteria. Note in particular, that spatial resolution of the recursively refined morphing window grid is not required to be spatially uniform. Indeed, nonuniform spatial resolution refinement grids may be of special utility in situations with complex floorplans.

Morphing Techniques

Now consider a detailed description of some specific techniques for implementing morphing according to various embodiments.

Morphing Techniques: Interchange Morpher

An illustrative interchange morphing (problem) solver uses three specification components:

1) A library. The library is a statement of available forms, the function each form implements, and quantity of each resource that is utilized by each form.

2) Netlist nodes, each node of some particular initial form type. The netlist nodes may be a subset of the netlist.

3) Capacity of resources provided by the structured ASIC. The capacity may be a subset of total resources available for placement. In some usage scenarios the capacity is specified as an array of integers, indexed by an identifier of the resources in the structured ASIC logic array architecture.

Interchange morphing proceeds in stages, as follows:

1) Assess initial demand for resources by accumulating demand for each resource type by the form of each participating node. In pseudo-code:

```
for_each node n do:
    f = n.form
    for_each resource r do:
        footprint(r) = footprint(r) + library.resource_demand( f, r )
```

If footprint(r)<=capacity(r) for each r, then the nodes fit on entry and no additional morphing is required in order to achieve a fit. In some usage scenarios additional morphing may be desirable, since there are many factors of interest besides just placement feasibility.

2) Take forms without alternates. Depending on the specific construction details of the structured ASIC library, there may be forms with no alternates, i.e., functions with only one way to be implemented in the structured ASIC architecture (that is specified in the library). Forms without alternates will not be morphing since there are no interchange possibilities, so the forms without alternates are taken as is. One way to do this is to remove the forms from the morphing participation set, and remove resources consumed by the removed forms from the resource capacity vector. Alternatively other bookkeeping strategies may be used.

3) Register balancing. In some structured ASIC architecture configurations, the forms implementing sequential (register) functions are restricted, having much reduced morphability (fewer alternate implementation forms) compared to combinational forms. For example, there may be only one or two sequential resources (flip flops) in the structured ASIC architecture, from which the sequential forms can be built. Often there is only a single sequential form per sequential resource type, for the sequential functions. In contrast, it is not uncommon for combination functions to have a dozen alternate implementation forms, with corresponding resource demand touching each non-inverter resource type. Because of the reduced implementation flexibility, it may be desirable to resolve sequential balancing next.

This can be done, for example, by the following procedure. Score sequential nodes according to respective footprints onto oversubscribed resources. Sort the nodes by the scores, so the higher scoring nodes are considered first for morphing into alternate forms. For each sequential node with a footprint onto an oversubscribed resource, score each respective alternate form according to an objective function, and select the best scoring form. If the selected form is different from the current form, then a morph is performed. After each morph, check to see if the sequential resources have been brought into alignment with the resource supply. If so, then exit the register balancing processing, and otherwise continue to the next node.

Aspects of certain objective functions will now be detailed. Other objective functions may also be used, thus these embodiments are merely illustrative and not limiting. For scoring sequential forms, founding some usage scenarios it may be useful to accumulate 1 (one) for each combinational resource utilized, plus 10 times the number of any oversubscribed resources used by the form. Lower scores are thus preferable. For combinational forms, in some usage scenarios it may be useful to accumulate for each resource 'a' utilized by the form, the quantity:

```
double sa=(100.*cfpa*tfpa)/capacity_a*
    (tfpa>capacity[a]?(100.*tfpa/capacity_a):1.);
``` where cfpa is the form footprint onto resource a, tfpa is the total footprint onto resource a if the form were to be chosen, capacity[a] is available supply for resource 'a' in the current morphing context, and capacity_a is the same as capacity[a], unless capacity[a] equals zero, in which case capacity_a is 0.01 (to avoid division by zero). The formula has the property of heavily costing demand for oversubscribed resources, and of accentuating the cost of using forms with a footprint onto resources that are provided in smaller proportions by the structured ASIC architecture. In some embodiments alternate mathematical formulas provide similar behavior.

4) Morph combinational nodes. Similar to register balancing, remaining as yet unmorphed non-sequential (e.g. combinational) nodes that have a footprint onto an over subscribed resource are identified. The alternate forms are scored according to the objective function, and the best (lowest cost) morph selected.

In some usage scenarios the combinational node morphing results in a collection of nodes that have been morphed to fit within a resource supply of a specified problem context. In some usage scenarios the combination node morphing results are insufficient, and the following additional procedures may be optionally invoked.

5) A morph away from an oversubscribed resource may be blocked because alternate forms all have a footprint onto some resource that will become oversubscribed if the morph is taken. Thus ways to "make room" for forms that will be coming out of oversubscribed resources and impinging upon different resources than a starting configuration are searched for. One technique is to "extract" inverter forms. Since the inverter function can be implemented with essentially any combinational resource, there is really no danger of an inverter being unable to be reinserted, if there is room. The technique comprises extracting inverters, scoring forms with a footprint onto oversubscribed resources using the objective function, and then taking the best scoring alternate form. Finally, the inverters (the forms implementing the inverter function) are added back in, morphing as necessary to attempt to achieve a fit.

In some usage scenarios 5) is run after the procedures 1 through 4, although this is not required.

6) Building on 5), morphing may be inhibited whenever a destination resource is fully occupied. Thus in addition to extracting the inverters, any forms that impinge on almost-full resources are also extracted. The extracting opens up additional space so that when iterating through the forms impinging on over-subscribed resources, there is more room in resources that previously appeared full. Then the full set of removed nodes are reinserted, morphing as needed.

In some usage scenarios 6) is run after 5), but this is not required.

Morphing Techniques Integer Linear Programming Based Morphing

Some morphing embodiments use integer linear programming. A linear program is constructed comprising a system of equations and constraints specified over a set of state variables representing the number of forms of each form-type. The formulation includes:

1) Function instance conservation constraint equations
2) Resource capacity constraints
3) An objective function The independent system variables are taken to be the number of each form to be utilized. The system variables are constrained to be non-negative integers. The count of instances of a given form type cannot be either fractional (a given netlist node is implemented exactly and entirely using one specific form in any valid morph state) or negative.

Once the constraint equations and the objective function are specified, the ILP solver returns with the number of each form to be utilized, which optimizes the objective function and satisfies the constraints. Of course, it is possible that no solution exists, if for example, the number of form instances assigned to a region is so great that the forms cannot be packed in, or if there is inadequate morphability in any of the functions. If there is no solution, then the ILP solver returns a status indicating that no solution could be found.

The function instance conservation constraint equations state that the result will have the same number of instances of each function type as were in the original configuration of the subset of the netlist participating in the morph. Stated another way, the intent of morphing is to select alternate forms implementing the same circuit function, so the action of the morpher on a set of nodes should preserve the number of instances implementing each function. Within a function, the distribution of nodes implemented in different forms can change, but the total number of nodes in all the forms implementing the function is the same in the output as in the input. Morphing per se does not change the Boolean algebraic structure of the form-level netlist. (Other optimization technologies unrelated to morphing do that, and use of morphing does not preclude use of the other technologies).

For example, suppose that the number of form instances implementing the NAND2 function is 5, apportioned on input as 3 form instances using form NAND2_1 and 2 using form NAND2_2, and that the number of form instances implementing a MUX4 function is 7, apportioned as 3 form instances using MUX4_1, 2 using MUX4_2 and 2 using MUX4_3. Further assume that the state variables x_0, x_1, x_2, x_3, x_4 represent the number of form instances of the forms NAND2_1, NAND2_2, MUX4_1, MUX4_2 and MUX4_3 respectively. Then the following two constraint equations would be among the set of function instance conservation equations:

$$1^*x\_0 + 1^*x\_1 + 0^*x\_2 + 0^*x\_3 + 0^*x\_4 + 0^*x\_5 + \ldots = 5$$

$$0^*x\_0 + 0^*x\_1 + 1^*x\_2 + 1^*x\_3 + 1^*x\_4 + 0^*x\_5 + \ldots = 7$$

The resource capacity constraints are inequalities that state that the resources utilized by a given form allocation may not exceed resources that are available. There is one respective constraint inequality for each resource in the structured ASIC architecture. In the respective inequality constraint for each resource, the coefficient of each state variable is the number of that resource consumed by the corresponding form. The right hand side is the capacity of that resource in the current region context.

For example, consider a morphing problem for a structured ASIC architecture containing NAND2, NOR2 and INV resources (among others). There are INV_INV, INV_ND2 and INV_NR2 implementing an inverter function each using one of the INV, NAND2 and NOR2 resources respectively. There is a form XNOR2_1 implementing an XNOR2 function using three NAND2 resources and one NOR2 resource. There is a form XNOR2_2 implementing an XNOR2 function using two NAND2 and two NOR2 resources. In the current region there are 400 INV, 100 NAND2, and 150 NOR2 resources. Then the resource capacity constraints would include terms like these:

$$1^*x\_0 + 1^*x\_1 + 1^*x\_2 + 0^*x\_3 + 0^*x\_4 + \ldots <= 400$$

$$0^*x\_0 + 0^*x\_1 + 0^*x\_2 + 3^*x\_3 + 2^*x\_4 + \ldots <= 100$$

$$0^*x\_0 + 0^*x\_1 + 0^*x\_2 + 1^*x\_3 + 2^*x\_4 + \ldots <= 150$$

where x_0 represents the number of INV_INV forms, x_1 the number of INV_ND2 forms, x_2 the number of INV_NR2 forms, x_3 the number of XNOR2_1 forms and x_4 the number of XNOR2_2 forms.

Some structured ASIC architectures have resources that can be reconfigured to switch between different primitive Boolean functions. For example, in some structured ASIC architectures, a mask reconfiguration might allow an abstract resource to be switched between implementing either a NAND2 function or a NOR2 function. Morphing support for such architectures can be accommodated in variations of the integer linear programming formulation by including combination constraint inequalities to constrain the sum of forms implemented using the reconfigurable resources to be no larger than the total possible. For example, posit a structured ASIC architecture such that within a given region there are 100 NAND2 resources, 100 NOR2 resources, and 100 NAND2/NOR2 combination resources. Label the NAND2 resource 0, the NOR2 resource 1, and the NAND2/NOR2 combination resource 2. Further, represent the footprint of form i onto resource j as R_ij and the supply of resource i as S_i. Then constraint inequalities would include terms like:

$$R\_00^*x\_0 + R\_10^*x\_1 + R\_20^*x\_2 + \ldots <= S\_0 + S\_2$$

$$R\_01^*x\_0 + R\_11^*x\_1 + R\_21^*x\_2 + \ldots <= S\_1 + S\_2$$

$$(R\_00 + R\_01)^*x\_0 + (R\_10 + R\_11)^*x\_1 + (R\_20 + R\_21)^*x\_2 + \ldots <= S\_0 + S\_1 + S\_2$$

The above formulation enables exploration of solutions where the combination resources are allocated flexibly between either resource behavior, but simultaneously excludes solutions that oversubscribe the simple plus combinational resource supply.

Morphing Techniques: Objective Function

In some usage scenarios an ILP solver package allows a user to specify an objective function of the system variables to optimize, as there may be many solution vectors that satisfy the various constraint equations. Without the ILP solver, the best choice of the many available solutions may not be apparent. An objective function is a function specified as a linear combination of the system state variables. The ILP solver then returns the best solution found, as measured by the objective function. That is, of the range of solutions satisfying the constraint equations, the chosen solution will be the one that maximizes the objective function.

$$F = \text{sum}\_i\, O\_i\, x\_i$$

where i ranges over the number of variables in the system, x_i is the $i^{th}$ system variable, and O_i is the coefficient to be applied to the $i^{th}$ system variable. More specifically, $0 <= i < N\_{forms}$, where N_forms is the number of forms in the library and x_i is the number of the corresponding form in the solution.

One particularly useful objective function to use is a so-called "form efficiency". The form efficiency measures efficiency of implementation of each form in terms of respective Boolean computational work that the respective form performs divided by a similar measure of Boolean computational work that could be performed using resources consumed implementing the respective form. In some usage scenarios the efficiency of a form varies between 0 and 1, although the normalization is immaterial to the optimization problem.

Other embodiments use optimization objectives other than form efficiency.

Morphing Techniques Software Implementation

An illustrative usage scenario of form morphing follows.

The structured ASIC logic array is divided into regions, and a global placer apportions circuit nodes to the various regions. A morphing controller function then cycles through the regions, identifies respective resource capacities and respective netlist nodes contained within each region, and calls the morpher, passing in the resource capacities, nodes (with the current form assignments), possibly a choice of objective function, and possibly also an indication of the priority of the nodes, and possibly also a function for evaluating the suitability of any given form for any given node.

The morpher evaluates the number of nodes implementing each function present in the set of participating nodes as respective function instance counts according to a library. The function instance counts, along with the resource capacities, are used to formulate the system of equations and inequality constraints, as described above. The coefficients of the objective function are supplied, and the ILP solver is invoked.

If a solution is found, then the resulting quota of forms (i.e., a particular distribution of form types determined by the ILP solver) is apportioned to the participating nodes in some manner. One illustrative example technique is to pass through the nodes, and test to see if the full quota of the respective current form has been reached yet. If not, take the form, and move to the next node. If so, morph this node to the next not-yet-exceeded form type within its function group.

An additional illustrative, but not limiting, example technique for apportioning forms is as follows. Order input nodes according to a priority indicator supplied by a caller. Assign each node to a "preferred" form type (for example, whatever form type the node was assigned by the tool (e.g. a timing-driven synthesis tool) that produced the original form-level structural netlist, if available. If unavailable, then assign to one of the other forms in the function group (e.g. a lower or higher drive strength logically equivalent form).

An additional illustrative, but not limiting, example technique for apportioning forms is as follows. When a preferred form quota for a node is exhausted, then instead of assigning the node, push the node back onto a queue for subsequent consideration. After all nodes have been visited once, and either assigned or queued, the queue of blocked nodes is reprocessed. Each node of the queue is assigned any of the available alternate forms in a corresponding function group.

An additional illustrative, but not limiting, example technique for apportioning forms is as follows. Use the supplied evaluator function to evaluate the form-ranking on a per node basis, thus enabling factors outside the scope of the ILP formulation to affect determination of the apportionment of the quota of forms developed by the ILP based morpher. In other words, the morpher is responsible for determining a fitting set of form quotas, but other systems or techniques are responsible for apportioning available forms based on more detailed per-node considerations. For example, timing critical path nodes may receive special treatment.

Path-Based Timing Force Embodiments
Timing Driven Force Computation

Timing driven SDI-based placement uses timing forces to systematically influence and optimize timing performance of a placement of elements such as in a design for an integrated circuit. In some embodiments timing characteristics of a circuit are modeled in a timing graph from a time-evolving placement and timing forces are applied by a placement engine as a feedback mechanism. A timing graph may be a Directed Acyclic Graph (DAG) that has nodes that represent pins of a circuit netlist (e.g. provided by a user of the engine and an associated design flow) and edges that represents timing arcs within a library cell and interconnections of the netlist. The timing forces are applied in conjunction with net connectivity forces and spreading forces to improve placement quality as measured by circuit timing performance and routability.

One approach for modeling timing force for use in a timing driven SDI-based placement flow is known as a Path-Based Timing Force (PBTF) model. PBTF heuristics apply proportionate timing forces on each node (or element) of various critical paths, so that when spreading forces are applied according to each critical path, the elements are pushed away or held together based on respective contribution to overall circuit performance.

In various embodiments of a PBTF system, any combination of factors may be used in determining timing force on an element. The factors include:

Critical Paths influence Factor (CPF);
Drive Resistance Factor (DRF); and
Stage Delay Factor (SDF).

Critical Paths influence Factor (CPF)

CPF models contributions of a node to all or any portion of critical paths of a circuit. In various embodiments of a PBTF model usage scenario a timing driven placement seeks to improve any combination of the Worst Negative Slack (WNS) and the Total Negative Slack (TNS) of the circuit. Contributions of a node to the critical paths of the circuit are accounted for to improve the TNS of the circuit.

Figure 17A:
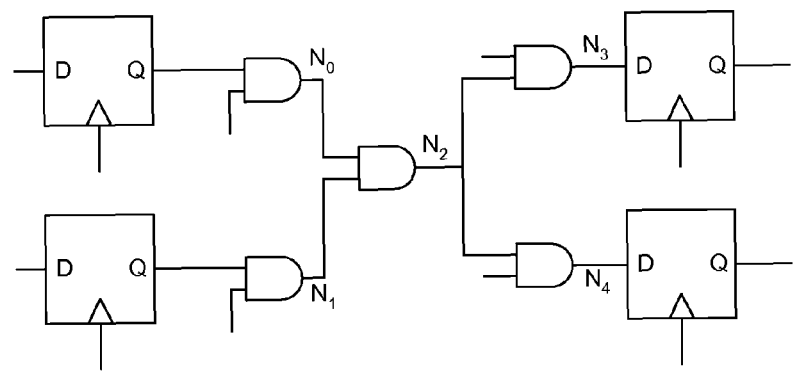
FIG. 17A illustrates an example circuit with a plurality of critical paths.

FIG. 17A illustrates an example circuit with a plurality of critical paths. The critical paths include:
Path 1, $P_1=\{N_0, N_2, N_3\}$;
Path 2, $P_2=\{N_0, N_2, N_4\}$;
Path 3, $P_3=\{N_1, N_2, N_3\}$; and
Path 4, $P_4=\{N_1, N_2, N_4\}$.

Node $N_2$ is common to all the paths, while all the other nodes are present in two of the four paths. Thus in some embodiments a CPF computation for node $N_2$ will be higher than CPF computations for the other nodes. In some usage scenarios all critical paths of the circuit are explicitly enumerated. In some usage scenarios not all critical paths of the circuit are explicitly enumerated, since there are an exponential number of timing paths, and CPF modeling builds a heuristic based CPF model for each node of a timing graph.

A CPF score is computed by topologically traversing nodes of the timing graph in forward Depth-First-Search (DFS) order and reverse DFS order. Two scores are computed for each node: transitive FanIn CPF (FICPF) and transitive FanOut CPF (FOCPF). The respective CPF score of each node is the product of FICPF and FOCPF.

FICPF is computed during the forward DFS traversal as a sum of FICPFs of all immediate predecessor nodes of a node if the respective predecessor node is a critical node:

node_FICPF=Sum(critical fanin_FICPF).

Similarly, during reverse DFS traversal, an FOCPF of each timing graph node is computed as a sum of FOCPFs of all immediate successor nodes if the respective successor node is a critical node:

node_FOCPF=Sum(critical fanout_FOCPF).

Then each node CPF score is computed by multiplying the respective FICPF and the respective FOCPF:

node CPF score=node_FICPF*node_FOCPF.

CPF is then normalized by dividing the CPF score by the maximum CPF of the timing graph:

normalized_node_CPF=(node CPF score)/Max(node CPF score). (Eq. 1)

Figure 17B:
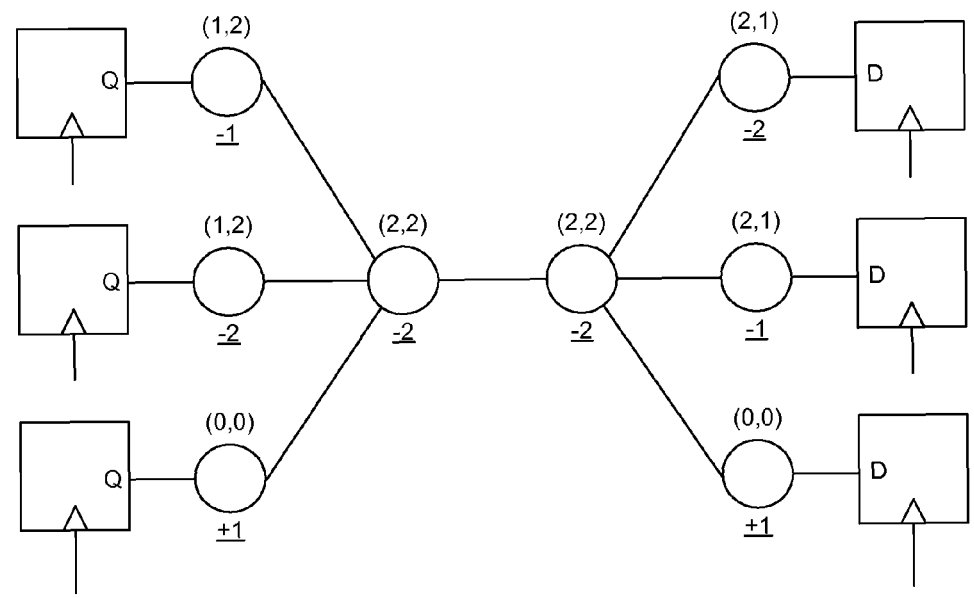
FIG. 17B illustrates example computations relating to an embodiment of CPF scoring.

FIG. 17B illustrates example computations relating to an embodiment of CPF scoring. Tuples in the figure represent (FICPF, FOCPF) pairs, and underlined numbers represent slack on each node.

Drive Resistance Factor (DRF)

DRF models contributions of each node on a critical path based on drive resistances of node drivers. In some usage scenarios drive resistance of a node driver is a significant delay contributor to overall path timing. In one modeling equation that considers first-order effects, stage delay of a gate is computed as follows.

gate delay=$Ti+Rd*Cl$; (Eq. 2)

where
Ti: intrinsic delay of the gate;
Rd: drive resistance of the gate; and
Cl=interconnect capacitance+pin capacitances (i.e. total capacitive load on the output of a gate).

In some embodiments pin capacitances are fixed (or unchanged) during timing driven placement, and thus the timing driven force model is directed to influence interconnect capacitance. According to Eq. 2, improving the product of drive resistance and total output load tends to improve stage delay of a critical path node. The product may be improved by arranging for drivers with relatively higher driver resistance (Rd) to drive relatively lower capacitive loads, resulting in drivers having relatively low driver resistance (such as some drivers on critical paths) driving higher capacitive loads (such as relatively long wires). In some usage scenarios an incremental delay cost associated with driving a "stretched" wire with a strong driver is less than with a weak driver.

Figure 18:
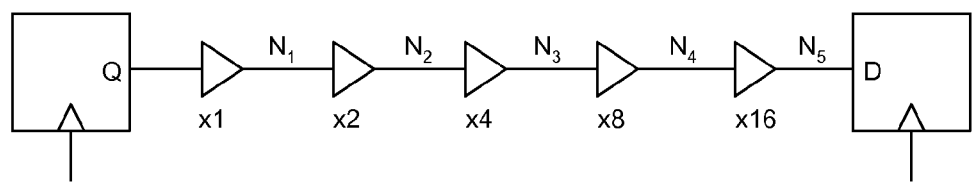
FIG. 18 illustrates an embodiment of a cascade of buffers of increasing drive strength.

FIG. 18 illustrates an embodiment of a cascade of buffers of increasing drive strength (i.e. decreasing drive resistance). Five levels of buffer are illustrated with relative drive strengths of x1, x2, x4, x8, and x16 (i.e. each stage provides a factor of two more drive than the preceding stage). Nodes driven by the buffers are illustrated respectively as $N_1$, $N_2$, $N_3$, $N_4$, and $N_5$.

Overall delay of the path illustrated in FIG. 18 is minimized if all the logic levels have equal delay. Ignoring intrinsic gate delays, the delay for each element of the path is balanced by equalizing respective products of Rd*Cl.

Since

Rd(x1)>Rd(x2)>Rd(x4)>Rd(x8)>Rd(x16)

the PBTF system attempts to maintain the following relative capacitive loading ordering:

Cl(x1)<Cl(x2)<Cl(x4)<Cl(x8)<Cl(x16).

Since Cl is directly proportional to wire length, and higher timing force tends to result in shorter wire lengths, timing forces are made proportionate to drive resistance.

Relative DRF is normalized by dividing a respective DRF weight of each node by the DRF weight of the node having the least drive resistance:

node DRF=(node_DRF_weight)/Min(node_DRF_weights of all nodes) (Eq. 3)

where
node_DRF_weight=Drive resistance of the driver gate for the node under consideration.

Stage Delay Factor (SDF)

Stage Delay Factor (SDF) models stage delay contributions of each driver on a critical net (or net on a critical path) and accounts for the maximum path length of each load pin on the critical net. The SDF combines stage delay and maximum path length factors to assign an SDF force component to each load pin. An SDF force is proportional to the maximum path length associated with the load pin.

The SDF is computed as follows:

SDF Factor=$d$ coeff*exp($lpwpd$/min_cycle−1) (Eq. 4)

where
lpwpd=load pin: worst path delay;
min_cycle=clock period delay of the clock controlling the net; and
d coeff=driver stage delay coefficient.

The d coeff is computed as follows:

$d$ coeff=($dgsd/dpwpd$)*path_levels where
dgsd=stage delay of the driver gate;
dpwpd=driver pin: worst path delay; and
path_levels=number of logic levels in the path.

Load pin: worst path delay is computed as follows:

$lpwpd$=AT(load_pin)+clock_cycle−RT(load_pin)

Driver pin: worst path delay is computed as follows:

$dpwpd$=AT(driver_pin)+clock_cycle−RT(driver_pin)

where
AT: Arrival time; and
RT: Required time.

Figure 19:
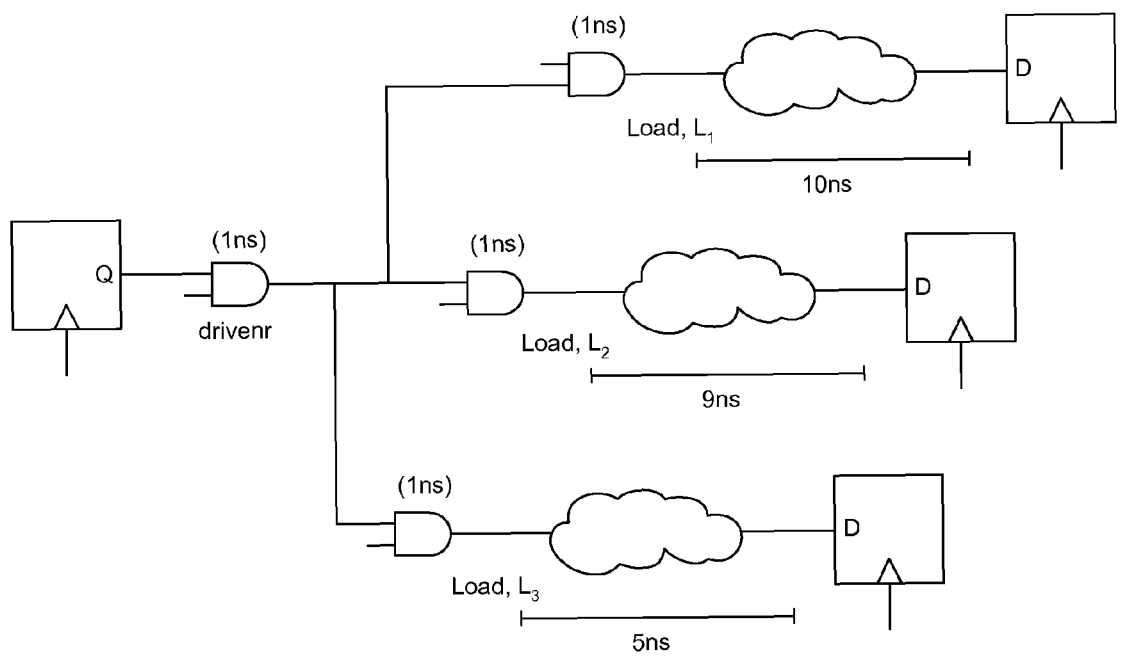
FIG. 19 illustrates example computations relating to an embodiment of SDF calculation.

FIG. 19 illustrates example computations relating to an embodiment of SDF calculation. In the figure:
lpwpd($L_1$)=12;
lpwpd($L_2$)=11;
lpwpd($L_3$)=7;
dpwpd=12;
clock_cycle=10;
dgsd=1;
SDF(L1)=d coeff*exp(12/10−1);
SDF(L2)=dcoff*exp(11/10−1); and
SDF(L3)=0.

A stage delay of a driver gate is the sum of the driver gate delay and the interconnect wire delay that is driven by the driver. The driver gate stage delay discriminates the load based on criticality by factoring in the worst path delay of the load pin.

If a load pin is part of a slower critical path, then a higher force coefficient is associated with the load pin than a load pin that is part of a relatively faster critical path. The exponential term provides discrimination between two critical paths of unequal lengths. For example, if a first critical path is missing by a target by 2 ns while a second critical path is missing the target by 1ns, then a higher multiplying factor is associated with the first path (compared to the second path) due to the exponential term. Thus critical paths with worse violations are weighted more.

Bounding Box Based Pin Force

In some embodiments timing forces are not applied in association with non-critical loads that fanout from a critical driver, thus enabling some relaxation of some (non-critical) loads so that more critical load pins of a net may be pulled closer to the driver. In some embodiments timing forces are applied for non-critical pins, if the pins form any portion of a bounding box of a critical net. A bounding box is defined as a rectangle around all the pins of a net. If a non-critical pin is on the edge of the bounding box, then an attractive force is applied to the load pin, thus in some cases reducing total interconnect capacitance (or at least preventing an increase in capacitance).

Path Based Timing Force

A first variant of a path-based-timing-force is:

$$PBTF_1 = CPF*RDF + SDF$$

where
CPF: Normalized_node_CPF (as in Eq. 1);
RDF: Normalized_node_DRF (as in Eq. 3); and
SDF: Normalized_node_sdf (as in Eq. 4).

A second variant of a path-based-timing-force is:

$$PBTF_2 = CPF*RDF + RSF$$

where
CPF: Normalized_node_CPF (as in Eq. 1);
RDF: Normalized_node_DRF (as in Eq. 3);
RSF: Normalized_node_RSF; and
Normalized_node_RSF=node_slack/Minimum slack of timing graph.

Relative-Slack-Based Timing Force Embodiments

The SDI technique of optimizing chip placement relies on a variety of forces affecting nodes in a dynamical fashion, integrated forward in time. These forces are chosen to simultaneously improve metrics that constitute a desirable placement, including routability and timing performance, while achieving a physically realizable (legal) configuration. An approach to timing-driven placement is described in what are referred to herein as "relative slack" embodiments. Relative slack embodiments provide improved results (in both absolute performance as well as numerical behavior) in some usage scenarios.

In a first illustrative, but not limiting, class of relative slack embodiments forces affecting pins on a critical path (as well as pins on shared nets) are increased or decreased in an incremental fashion, rather than being directly calculated by a timing kernel. In the first class of embodiments, pin-to-pin forces (so-called timing-based or timing-driven forces) affecting nets (e.g. timing-critical nets) are governed by a force law equation having a linear increase with distance (Hooke's law) and a driver-to-load connectivity model. Other classes of relative slack embodiments may employ any arbitrary functional variation with distance, as well as alternate connectivity models. A set of weights governing the timing-based force attraction are periodically updated, and adjusted in to result in successively better relative node configurations with regard to overall circuit performance.

Relative slack embodiments assume existence of a timing kernel that is called during an SDI run to provide relative slack data used in updating the timing driven forces. Specific details of the timing kernel implementation are irrelevant since only r data from a timing graph and propagated pin slacks analysis are needed. The frequency of update can be controlled in a variety of ways: e.g. at regular timestep intervals, in response to a triggering event (dynamical or otherwise), or in response to external (user, script, or graphical) input. Each update provides a "snapshot" of the critical path analysis for every net and pin in the system at that moment of time.

The relative slack as calculated for each pin, as well as the position of connected pins (to handle boundary box effects as noted below), results in an adjustment in the "timing weight" associated with each pin. The timing weight is then used as a multiplier in the force law equation governing pin-to-pin attraction. Pins that need to be moved closer together to satisfy timing constraints tend to have weights increased (modulo possible normalization, noted below), in some usage scenarios in a manner varying with the amount of slack available. That is, the less slack (or more negative slack), the greater the positive adjustment to the attraction. Pins that have excess slack tend to have weights decreased. The reduction in weight on pins that have become "over-tightened" creates additional room for relaxation towards an optimal timing state.

At least some relative slack embodiments seek to improve timing of nets that do not meet target slack through "bounding box" (or bbox) contraction. Because increases to total net length result in increased capacitance, the associated timing can be negatively impacted by long distance nets—even if the associated load pin is not on the critical path. The long distance net effect may be especially pronounced on large designs. The bounding box contraction considers a range of distances from the net bounding box, to help ensure that the bounding box is continuously contracted (otherwise pins on the bounding box may merely trade places).

The incremental approach to change in timing forces provides a quiet and consistent approach to timing closure during the course of an SDI run. In some cases where the timing constraints have been unrealistically set, it may be necessary to introduce a maximum to the total timing forces exerted by the system (for example, adding an upper limit to the ratio of timing net energy to total net energy, through a normalization term). A wide variety of other tunable controls are possible, including but not limited to:

baseline relative tightening factor (typically small compared to unity);
target min pin slack (typically zero);
positive pin slack where relaxation may occur;
minimum change in pin slack to consider it in an "improving state";
distance between driver and load pins when no further tightening occurs;
distance from net bounding box where tightening starts to occur;
min bounding box size when no further "bbox" tightening occurs; and
relative strength of bounding box vs. critical path tightening terms.

Illustrative Detailed Relative Slack Procedure

An illustrative, but not limiting, relative slack procedural flow is as follows.

First, in at least some embodiments, a pre-processing phase is performed (in other embodiments this might occur as a post-processing phase), where timing weight adjustment criteria or timing weights themselves are adjusted to control properties of distribution of the timing weights as a whole. The pre-processing permits balancing resulting timing-driven forces with other effects in the system, such as connectivity forces (affecting routability) and expansion fields (affecting routability as well as utilization).

Figure 20A:
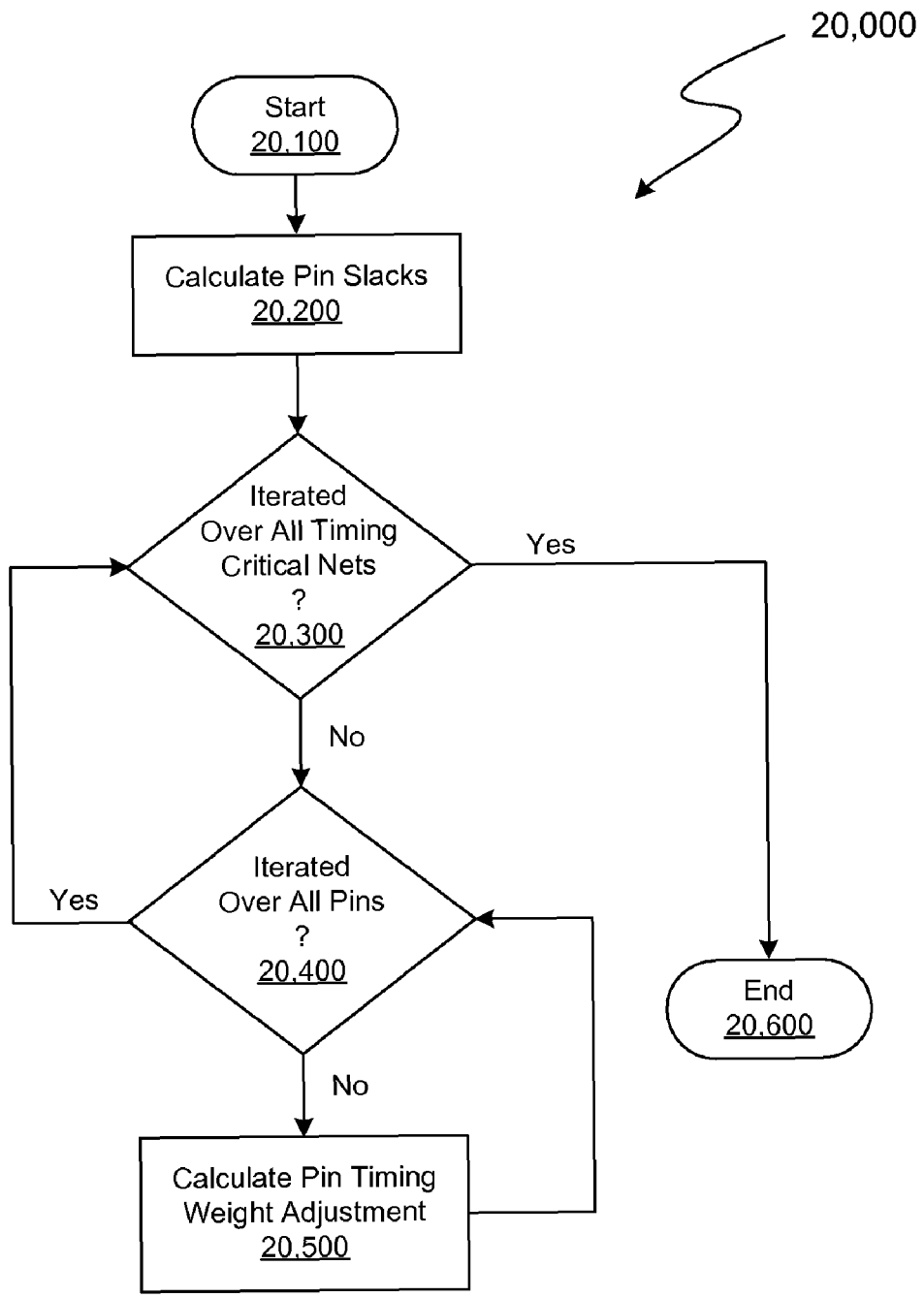
FIG. 20A illustrates an overall procedural control flow in an illustrative relative slack embodiment.

Second, update a timing graph using a Timing Kernel (TK). Using the updated timing graph, for every pin on every timing critical net, the slack associated with the respective pin is calculated (See 20,200 of FIG. 20A).

Figure 20B:
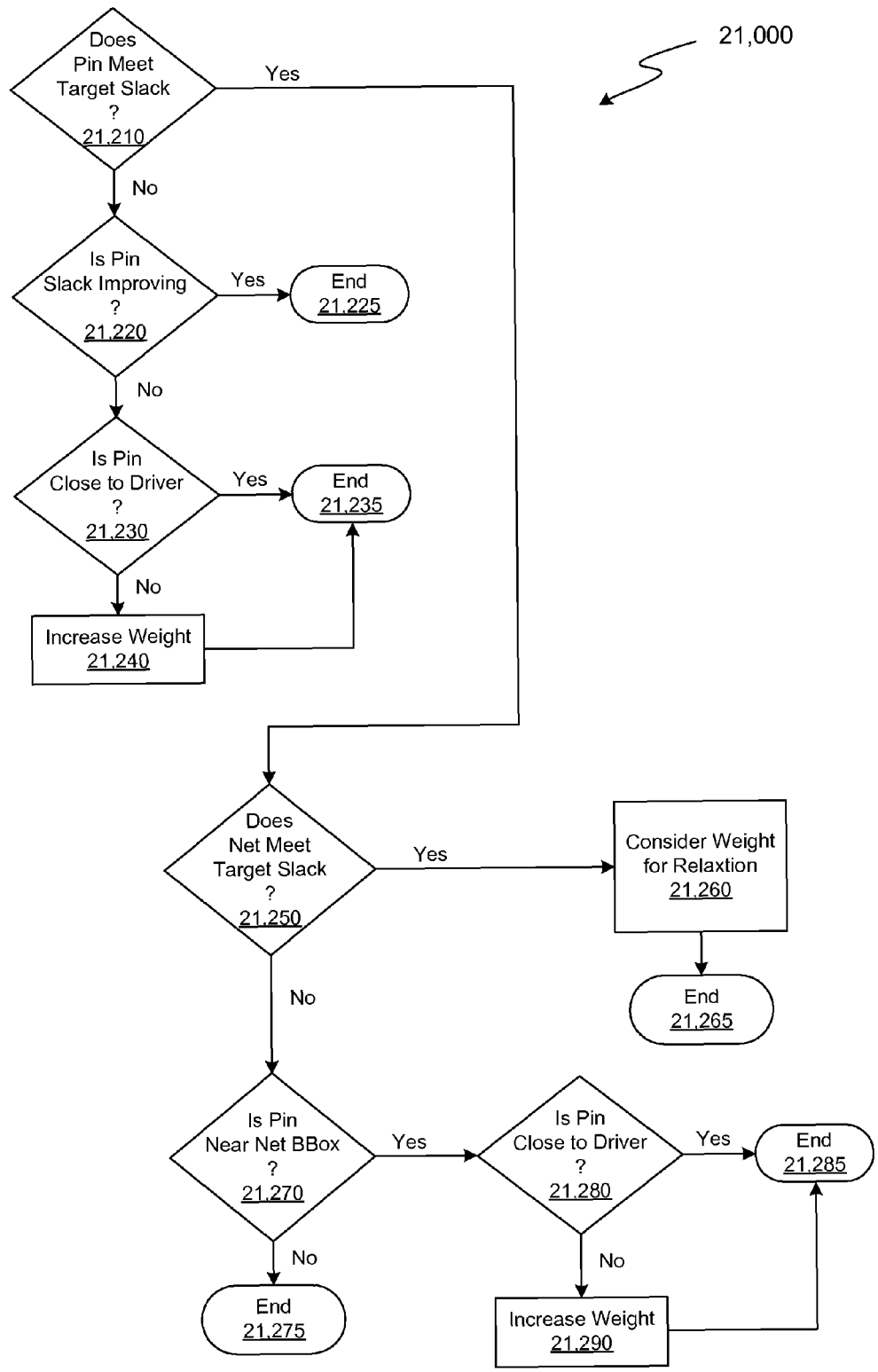
FIG. 20B illustrates the adjustment of timing driven weight in the relative slack embodiment of FIG. 20A.
Figure 21A:
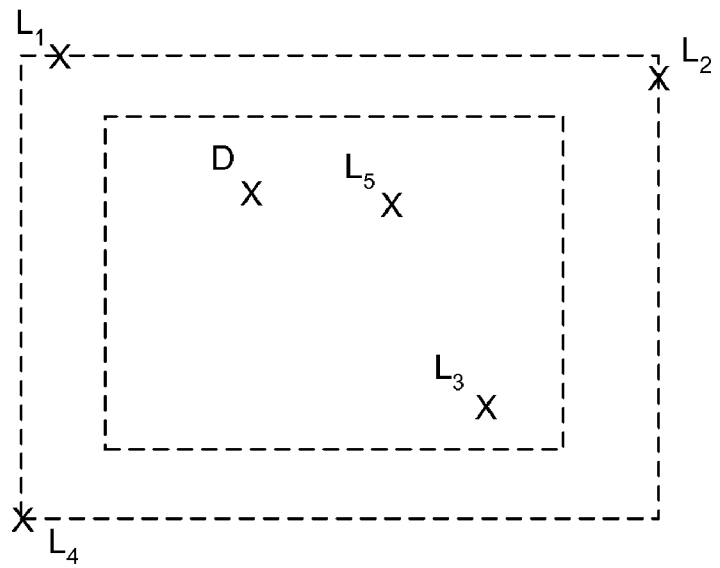
FIG. 21A illustrates a driver in the interior of a net bounding box region.
Figure 21B:
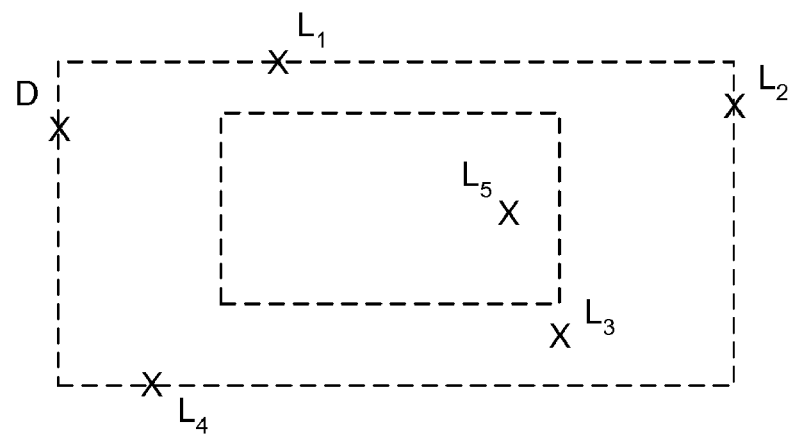
FIG. 21B illustrates a driver to one side of a net bounding box region.

Third, iterate over all timing critical nets 20,300, and all load pins on the nets 20,400. Fourth, for each load pin on a respective timing critical net, calculate a respective pin timing weight adjustment (20,500 of FIG. 20A and the entirety of FIG. 20B):

1. Calculate worst slack on the respective net and find bounding box pins. The pins are taken from some region around the bounding box of the net (the size of which is determined by performance tuning, scaling by system size).
2. Determine if the respective driver pin needs to be factored into the bbox calculation. That is, when the driver pin determines the bounding box position, increasing the attraction to nearby pins that are farther from the bbox may be counterproductive. The attraction to pins on the far side of the bbox is likely more influential in decreasing the overall capacitance. FIG. 21A illustrates a driver D in the interior of a net bounding box region determined by loads $L_1$, $L_2$, and $L_4$. FIG. 21B illustrates a driver D to one side of a net bounding box region determined by the driver and loads $L_1$, $L_2$, and $L_4$.
   2a. To focus on connections of loads to the driver, the effect of a driver on a bbox is indirectly applied to the loads themselves, through a multiplication factor on any tightening term.
3. For each pin, modify a respective timing weight as needed (see FIG. 20B).
4. For pins that meet target slack (Yes-path from 21,210 to 21,250):
   4a. If the slack for the associated is net is negative (No-path from 21,250 to 21,270), then to continue to make positive progress bounding box effects are considered. By taking into account a range of distances from the bbox, rather than a hard boundary, sloshing (oscillations) as pins move onto or off of the bbox is reduced.
   If (see decision 21,270) a net is near or on the bounding box of a critical net, then determine how much to tighten up the connection.
      If (see decision 21,280) a load pin is within a specified (small) distance from the driver, do nothing (End 21,285), as further tightening of the connection is counterproductive (e.g. result in increased oscillatory motion between the load and driver).
      Otherwise, strategies for tightening (increase weight 21,290) include:
   if the bbox size is sufficiently small, then do nothing;
   if a pin is on bbox, then tighten at full strength;
   if a pin is farther than a specified distance from the bbox, then do nothing; and
   otherwise (in between), then tighten from 0-1x full strength, depending linearly on distance.
   4b. If the pin was not tightened (Yes-path from 21,250 to 21,260), then the pin may be considered as a candidate for relaxation (21,260). By allowing connections to either strengthen or weaken, the ability of the system to evolve and relax to an optimal configuration is improved.
      4b1. The amount of relaxation allowed for the pin connection is dependent on the worst slack for the net. If the pin has positive slack, but the worst case slack on the net is negative, then the amount of relaxation allowed is reduced. Recall that the pin was not tightened, so little is added to the total capacitance on the net.
      4b2. Further, the relaxation is subject to a reasonable upper bound. Otherwise the weights may drop from substantial to nonexistent in a single pass.
      4b3. In both of these cases, by moderating the relaxation allowed during one update cycle, we help prevent sudden movement away from what was potentially a fairly optimal solution. This is manifested as increased sloshing in the overall timing performance.
5. For pins having negative slack (No-path from 21,210 to 21,220):
   5a. If (see decision 21,220) slack of a constrained pin is improving according to a specified criterion, then let the pin continue to evolve without change (Yes-path to End 21,225).
   5b. If (see decision 21,230) the driver and load are within a critical distance, then no tightening is performed (Yes-path to End 21,235). Otherwise tighten the connection (increase weight 21,240), in a manner varying with the ratio of the slack on the pin and the worst negative slack, thus pins most affecting the critical path are likely affected the most.

Timing Driven Buffering Embodiments

Timing Driven Buffering Overview

Timing driven buffering and resizing for integrated circuit designs, e.g. structured array architectures, provides increased performance, reduced cost, or both. Nets having high capacitance and/or fanout and timing critical nets are preferentially processed to reduce maximum delay and/or transition time, enabling allocation of limited structured array resources to more important nets. Timing driven buffering is performed to generate trees of buffers. Timing driven sizing is performed to upsize selected elements. During the buffering Steiner tree routes are segmented and various buffering options are evaluated for each segment according to buffer cost, required time, and lumped capacitance. The options are sorted and partitioned according to the sort. Computational efficiency is improved by eliminating all but a topmost portion of each partition. Options are further evaluated according to performance including timing and routing costs. Displacement coefficients of macros are computed during the sizing to evaluate desirability of reallocating resources implementing less critical macros to more critical macros. A plurality of low-level implementations of each macro are evaluated and compared. Logic replication and tunneling may be performed according to timing improvements and routing costs. Hold time fixes may be implemented by delaying clocks and/or replacing a fast FlipFlop (FF) with a slower element.

In some embodiments of design flows relating to array architecture based integrated circuits (e.g. structured arrays or other similar Application Specific Integrated Circuit (ASIC) implementations), timing driven buffering is used to "reconstruct" or "re-synthesize" nets having high capacitive loads or having high fanouts. In some usage scenarios modifying the nets reduces a maximum capacitive load driven by any buffer or driver, or group of elements. In some usage scenarios the modifying reduces a maximum fanout associated with any net or group of nets. In some embodiments a high capacitive load may be driven by a dedicated buffer, or a dedicated tree of buffers. In various embodiments any combination of maximum transition time, maximum rise/fall time, and maximum delay are minimized when performing timing driven buffering.

In some embodiments the timing driving buffering is according to fixed resources available in various structured array architectures. In some embodiments the timing driven buffering is iterative (e.g. to achieve timing closure). In some embodiments the timing driven buffering accounts for any combination of local and global congestion. In some embodiments the timing driven buffering includes morphing non-buffer resources and allocating the morphed resources as buffers.

In some embodiments of array architecture design flows, timing driven gate resizing is used to improve performance of various combinations of highly capacitive and high fanout nets. Logic gates are upsized (i.e. replaced with a gate having an equivalent logic function but greater drive strength) as necessary to reduce maximum delay and/or transition times. In some embodiments the upsizing is via so-called "form replacement" or replacing a form level macro with an alternate form level macro (such as substituting a gate with a higher drive strength for a gate with a lower drive strength).

In some embodiments timing driven gate resizing is constrained according to fixed resources available in various structured array architectures. In some embodiments a plurality of resources are simultaneously "swapped" (i.e. deallocated from a first use and reallocated to a second use) to improve critical path timing. In some embodiments the timing driven gate resizing includes morphing non-buffer resources and allocating the morphed resources as "upsized" gates or buffers.

In various embodiments of timing driven buffering and resizing for structured array architectures, timing driven hold time fixes are implemented by any combination of morphing, delaying clock signals, and buffering. In some embodiments any combination of logic replication and tunneling are used to improve circuit performance of designs implemented according to a structure array fabric.

Figure 22A:
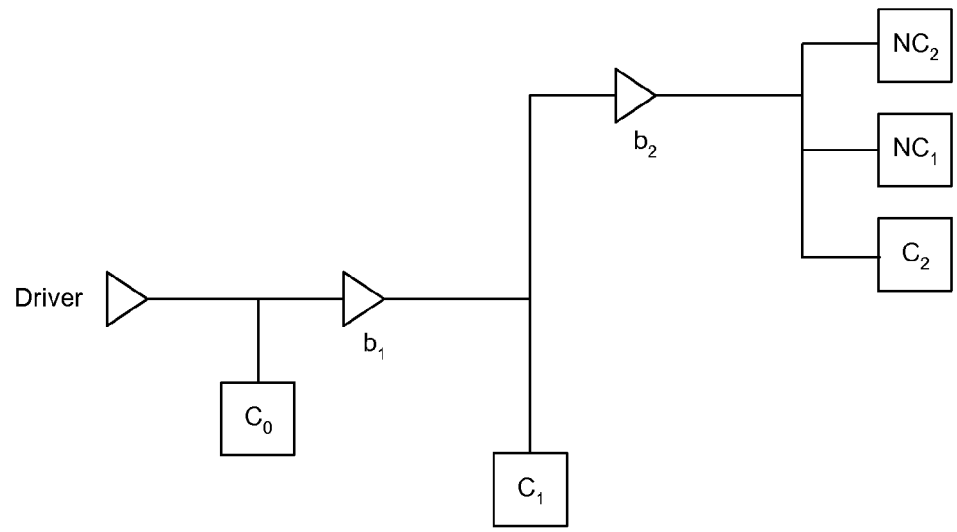
FIGS. 22A and 22B illustrate an example circuit excerpt before and after processing according to an embodiment of timing driven buffering and resizing for an array architecture.
Figure 22B:
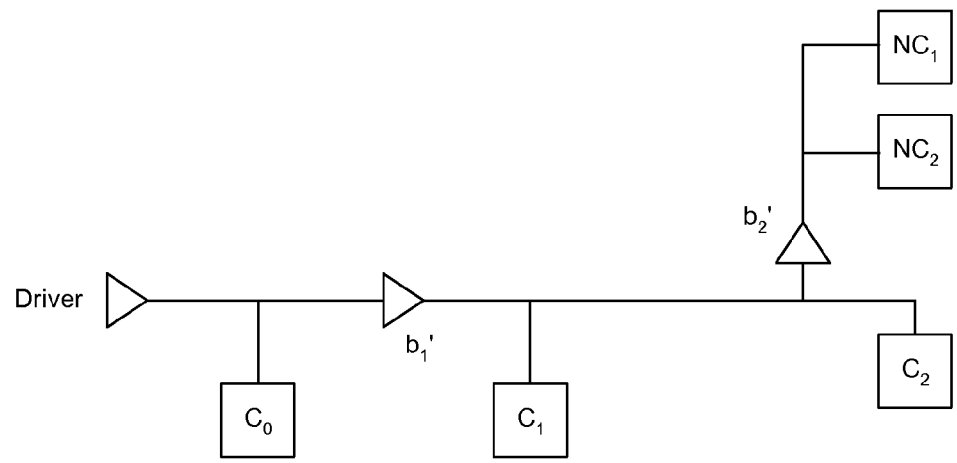

FIGS. 22A and 22B illustrate, respectively, an example circuit excerpt before and after processing according to an embodiment of timing driven buffering and resizing for an array architecture. FIG. 22A illustrates critical load $C_2$ driven by buffer $b_2$ that is driven by buffer $b_1$ that is in turn coupled to Driver. Thus there are two buffers between the driver and the critical load. Non-critical loads $NC_1$ and $NC_2$ are also driven by buffer $b_2$. Loads on a critical path from Driver to $C_2$ include c0 driven by Driver and $C_1$ driven by buffer $b_1$. FIG. 22B illustrates a result of timing driven buffering and resizing, as applied to the topology of FIG. 22A, where critical load $C_2$ is driven from new/modified buffer b1' that is directly coupled to Driver. Thus there is only one buffer between the driver and the critical load, providing enhanced arrival time for the critical load compared to the topology of FIG. 22A.

Structured ASIC Timing Closure

Figure 23:
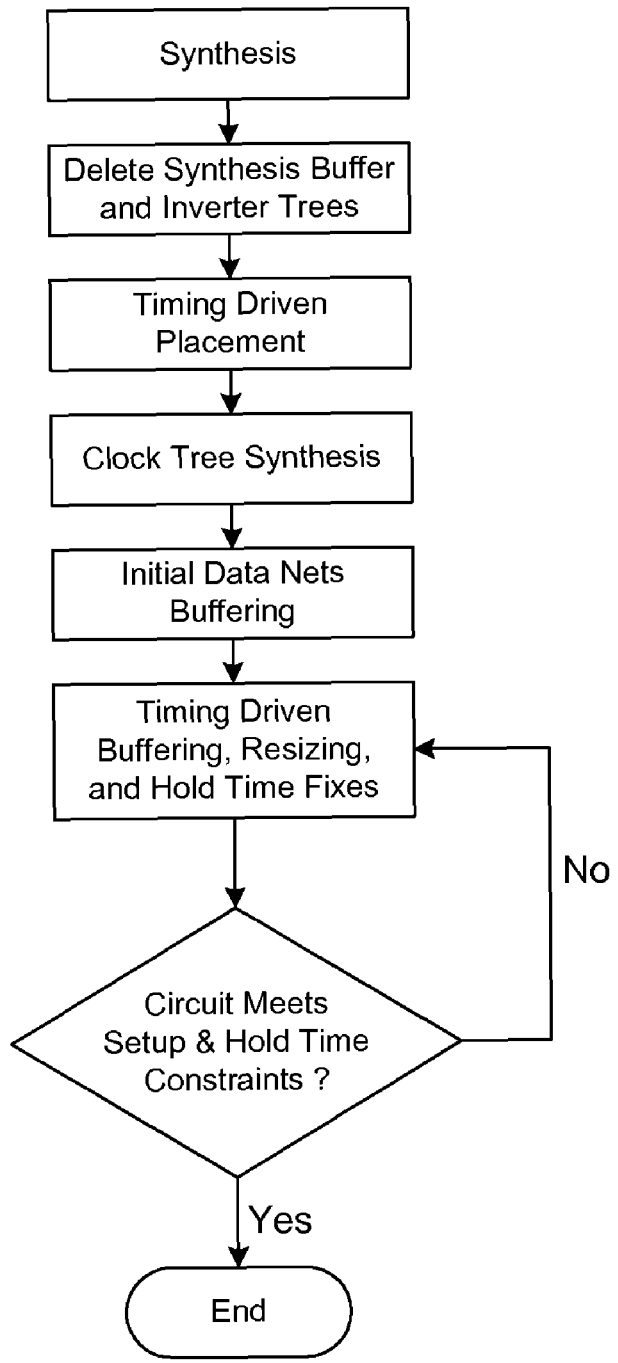
FIG. 23 illustrates a flow diagram of an integrated circuit design flow including an embodiment of processing in accordance with an embodiment of timing driven buffering and resizing for an array architecture.

FIG. 23 illustrates a flow diagram of an integrated circuit design flow including an embodiment of processing in accordance with an embodiment of timing driven buffering and resizing for an array architecture, e.g. a structured ASIC.

Timing Driven Buffering

Figure 24A:
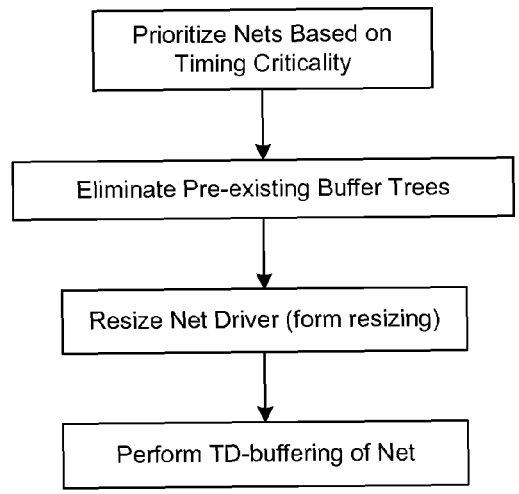
FIG. 24A illustrates a top-level view of an embodiment of timing driven buffering and resizing for an array architecture.

FIG. 24A illustrates a top-level view of an embodiment of timing driven buffering and resizing for an array architecture. In some usage scenarios timing driven buffering and resizing serves to reduce delays of critical path elements and decrease transition times associated with drivers (or nets or both). Routing-aware buffering is used to reduce maximum congestion in otherwise heavily congested regions.

In some embodiments an initial buffering phase is performed ignoring timing-driven constraints, while in other embodiments the initial buffering accounts for timing-driven constraints. According to various implementations timing-driven buffering and resizing includes any combination of net prioritization, global Steiner tree routing, evaluating multiple route trees, computing buffering options, pruning, and determining and selecting a solution.

In some embodiments a buffering subsystem processes nets individually, prioritizing the nets according to timing criticality, enabling preferential treatment for more critical nets. The preferential treatment is according to any combination of buffering resources, wiring resources, and routing congestion (measured according to a metric). In structured array usage scenarios, buffer resources are finite and several nets may be simultaneously competing for the same resources. Ordering nets and processing the most critical nets (or the nets having the highest negative slack) first provides the more critical nets with access to the buffer resources first. In addition, as more nets are processed, the most critical of the remaining nets have access to wire routing regions most beneficial to routing the remaining nets through. Less critical nets are relegated to more meandering routes to meet region congestion constraints.

In some embodiments the buffering subsystem initially constructs global Steiner tree routes for all nets to estimate heavily congested regions. Routing and/or congestion hotspots that should be avoided while buffering (at least for non-critical nets) are identified.

In some embodiments the buffering subsystem initially builds multiple route trees for each driver that couple the respective driver to all loads of the driver. The route trees are heuristic based, and the heuristics include prioritizing critical loads differently than non-critical loads and operating with an awareness of the previously identified hotspots. The route tree building includes any combination of shortest path weight and net spanning factor techniques, enabling results having different topologies.

In one embodiment of one of the route tree heuristics, loads are first grouped into multiple partitions based on load (or pin) criticality. More critical loads are prioritized for Steiner tree route construction first. Then less critical loads are processed, enabling the more critical loads to have a more direct route from driver to load. In addition, the more critical loads are presented with higher shortest path weight, thus reducing branching of the route tree from the more critical loads to the less critical loads.

In some implementations a Steiner tree based route is decomposed into several segments, such as according to a global cell granularity used when constructing the Steiner tree based route. A dynamic programming technique is used to compute a buffer solution for each of the route trees. The dynamic technique includes maintaining several solutions for each segment to be considered for use to implement a sub-tree of the respective route tree. The respective route tree is processed bottom-up, i.e. all of the load terminals of the tree are visited before the driver. Buffering options at a segment are computed by combining solutions of all predecessor sub-trees with a current solution.

Figure 25A:
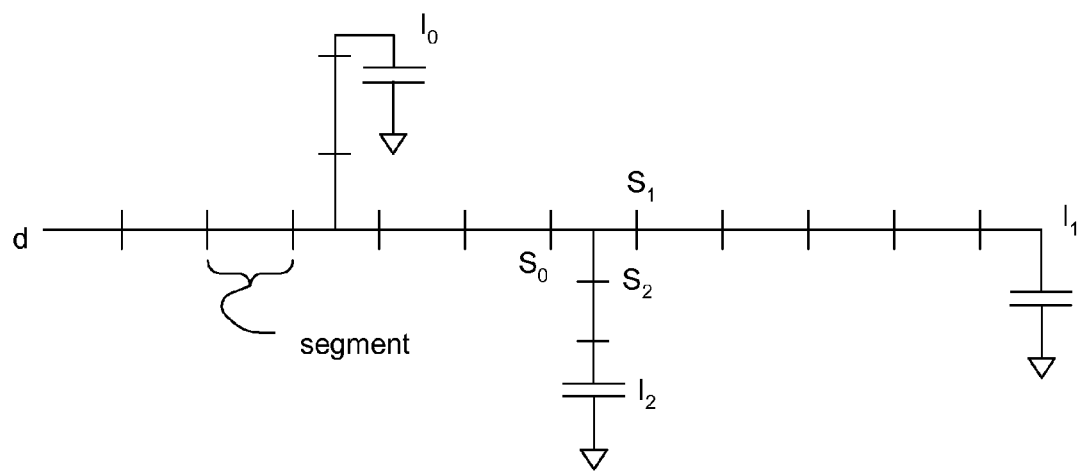
FIGS. 25A and 25B illustrate an example route tree as processed by an embodiment of segmenting a portion of the route for timing driven buffering and resizing.

FIG. 25A illustrates a portion of a route tree having several branches decomposed into segments according to processing by an embodiment of timing driven buffering. Child options are a function of downstream options. For example:

Options at $S_0$=Product(Options at $S_1$, Options at $S_2$).

Figure 25B:
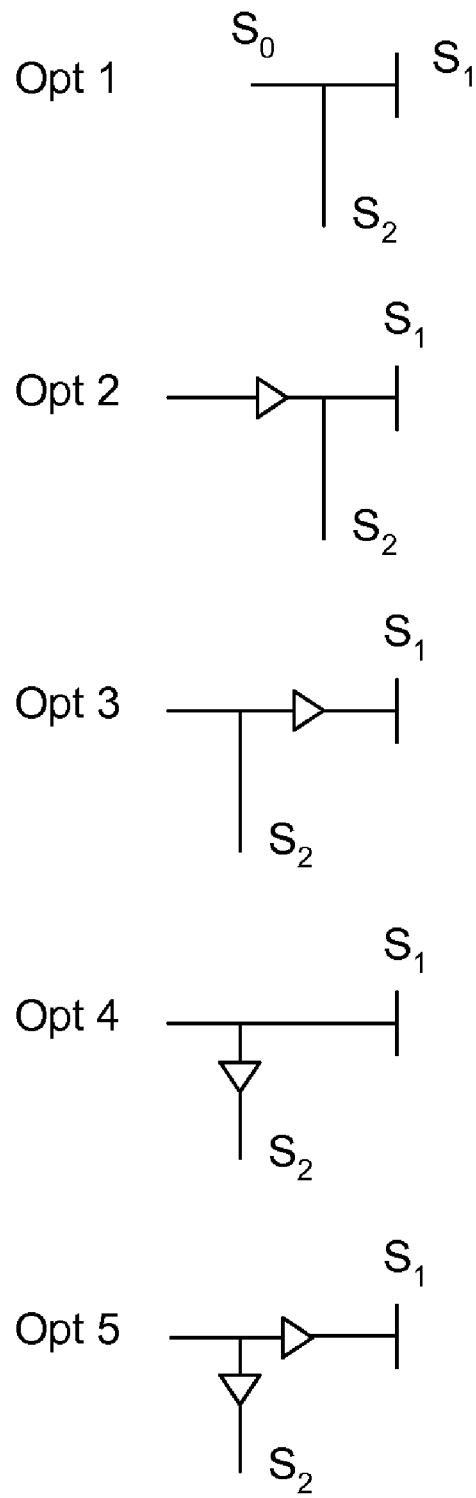

FIG. 25B illustrates several segment options for segment $S_0$ of FIG. 25A. The options include no buffering (Opt1), a buffer before the branch to segment $S_2$ (Opt2), a buffer on segment $S_1$ (after the branch as Opt3), a buffer on segment $S_2$ (after the branch as Opt4), and two buffers after the branch, one on each of segments $S_1$ and $S_2$ (Opt5).

If a segment currently being processed is a branch point, then the current segment has multiple sub-trees below it, and each of the sub-trees contains an array of options. The options are merged by performing a cross product of option sets. After computing the cross product, each feasible solution for the sub-tree is combined with a buffering solution for the current segment.

Multiple segment options are computed for each segment. The number of options produced is proportional to the number of buffer types (or buffer electrical characteristics) available according to technology associated with an integrated circuit design (such as a standard cell library). In some implementations various options are computed for each segment, including a non-buffered option, a high-drive strength buffer option, and a low-drive strength buffer option.

For each option, several parameters are determined, including Buffer Cost (BC), Required Time (RT), and lumped Capacitive Load (CL). The parameters are subsequently used to determine option cost and feasibility. BC measures cost according to the buffering solution for the entire sub-tree "underneath" the segment being evaluated. RT measures expected required time for a signal at the input of the segment. CL measures cumulative capacitive load of the segment and all associated child segments.

Pruning techniques are used to limit computation, maintaining selected options for each route segment. The selected options chosen are those most likely to result in a "good" solution according to the root of the route tree. A first pruning technique includes deleting any infeasible solutions, such as a buffering option that has accumulated capacitance exceeding the maximum drive capability according to available buffers. A second pruning technique removes redundant options. An option having higher BC and smaller RT, or an option having higher BC, smaller RT and higher CL, compared to an existing option, is considered redundant. A third pruning technique includes trimming the number of options according to an upper bound. In some embodiments the upper bound is variable, while in other embodiments the upper bound is predetermined (at a value such as 10, 20, 50, or 100). In some implementations the options are sorted in order of RT (highest RT first). In some embodiments a contiguous portion of the top of the sorted options is retained, the portion being equal in number to the upper bound (i.e. the "best" options are kept). In some embodiments the sorted options are partitioned into four quarters, and a number of options are preserved from each quarter. In some embodiments the number is chosen to be one-fourth of the upper bound. In some usage scenarios the preserving according to partitions enables discovery of solutions that appear locally inferior, but when combined with parent segments appear superior.

In some embodiments determining and selecting a buffering solution includes evaluating options according to performance (such as arrival time) and (estimated) routing congestion. A disproportionately higher weighting is applied to timing cost when evaluating a critical net. A buffering solution having lower hotspot (i.e. congestion) cost is preferentially chosen for non-critical nets.

Timing Driven Sizing

Figure 24B:
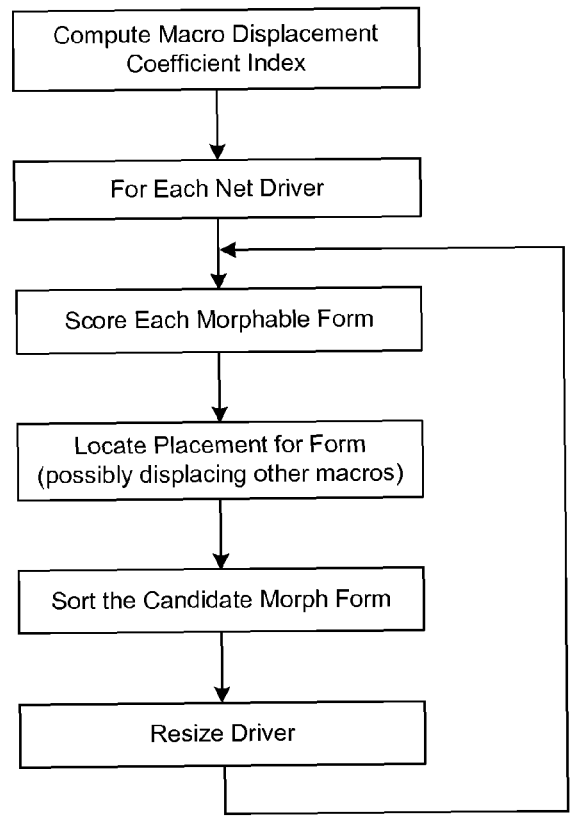
FIG. 24B illustrates a detail view of selected details of an embodiment of timing driven resizing for an array architecture.

FIG. 24B illustrates a detail view of selected details of an embodiment of timing driven resizing for an array architecture. Timing-driven form sizing (or resizing) selects alternate forms to improve any combination of drive capability and stage delay, for example by replacing a lower drive strength gate with a relatively higher drive strength gate. In some usage scenarios macro or form sizing is preferred over buffering when cost of upsizing a driver is less than buffering a net. In some structured ASIC usage scenarios buffer sites are predetermined according to block tiles, and thus the fixed locations of buffer sites may result in relatively high intrinsic buffer cost or associated congestion cost. In some situations there may be no available sites (or slots) near a macro targeted for resizing.

In some embodiments a form-sizing subsystem attempts to discover nearby sites by (re)implementing the macro using a different set of primitives. According to various embodiments the primitives correspond to standard cells, structured array tile elements, or other similar low-level resources. In some implementations the form-sizing subsystem is enabled to "displace" (or "move") selected forms (such as forms on non-critical paths) that are initially near the macro that is to be resized. In structured array integrated circuit designs, strictly speaking the forms are not moved, but instead fixed-location sites are deallocated in one area and reallocated in another area.

A Displacement Coefficient (DC) of a macro is computed as follows:

DC of macro=Sum(DC of each morphable form within the macro); and

DC of a morphable form=Product(primitive densities of all the primitives within the morphable form).

The DC is a conceptual measurement of "placeability" or ease of placement of an element when the element is currently unplaced. A macro is more placeable if it may be implemented with more morphable alternatives. A morphable alternative is more placeable if the primitives of the morphable alternative are placeable (or relatively more placeable), such as when there are available (or unused) sites for the primitives.

The primitive densities relating to the DCs of morphable forms are computed as follows. A site density grid is constructed that is a two-dimensional matrix of grid resource usage. For each element of the density grid, a number of available resources and used resources are computed for each resource type. Relatively sharp density gradients are smoothed by accumulating density from eight neighboring grid elements to a respective grid element. Thus the computed density at each grid element is an average density at the element in conjunction with eight nearest neighboring elements. The site density grid values are then used to determine the DCs of the morphable forms.

The DC of a morphable form is computed by looking up the density of each of the primitives of the morphable form, within the site density grid and according to respective primitive types. The morphable form DC computation continues by multiplying the look up results (i.e. primitive densities) together. If a particular resource or resource type is depleted (or nearly depleted) within the grid, then the morphable form DC is zero (or nearly zero). Thus the resource depletion results in the placeability of the morphable form being low.

Resizing a macro includes selecting a form from a plurality of implementation choices. Each of the choices is speculatively selected and evaluated with respect to the macro being resized. A timing score is computed that is equal to arrival time at an output of the macro assuming the macro is implemented with the speculatively selected form. If the timing score is poorer than previously saved possible implementation choices, then the current choice is rejected. If the timing score is better, and the drive strength of the speculatively selected form is sufficient to drive the capacitive load at the output, then the speculatively selected form is saved as a possible implementation choice.

In some embodiments placing a macro after determining an implementation according to one or more morphable forms proceeds as follows. New coordinates of the (now form level) macro are computed based on all of the connections of the form level macro. The coordinates of drivers of nets connected to all of the input pins of the form level macro as well as associated net fanouts are used to compute the new coordinates.

In some embodiments a form placing sub-system performs an attempted placement of each of the possible implementation choices determined during the resizing of the macro. The underlying morphable forms are already prioritized based on the respective timing scores (based on an idealized placement), and the attempted placements are, in various embodiments, performed in priority order (i.e. morphable forms resulting in better arrival times are tried first). Unplaceable morphable forms are not considered further. After a respective placement is found for each placeable one of the morphable forms, the placed morphable form is scored based on timing in the respective placement. After attempting to place and after scoring all of the morphable forms, the one of the morphable forms with the best score, if any, is selected. In some embodiments, if there is no placeable one of the morphable forms, the window size is increased and attempted placement of the morphable forms is repeated. Attempted placement of one of the morphable forms succeeds if individual attempted placements of each of the respective primitives of the morphable form all succeed. Attempted placement of a particular one of the respective primitives of a particular one of the morphable form proceeds as follows.

A site locator (or slot locator) searches all possible sites around a given coordinate within a certain window size and returns a list of all sites within the window assignable to the particular primitive. In some embodiments, the list is sorted in Manhattan distance from the given coordinate. The list is then examined. In some embodiments, a first acceptable site is selected. In other embodiments, all sites in the list are processed and scored, such as by scoring on DC, and the best-scoring acceptable site is selected. In some embodiments, an acceptable site is one that has a respective DC above a threshold. In various embodiments, unoccupied sites have a respective DC above the threshold, such as a DC of 1. The respective DC of an occupied site is obtained by looking up the DC of the parent form level macro of the occupied site. If an occupied site is selected, then the parent macro is tentatively scheduled to move from the site (i.e. a primitive in the site will be placed elsewhere) and the particular primitive is tentatively assigned to the site. The tentative move of the parent macro and the tentative assignment of the particular primitive to the site are actualized if the particular morphable form is selected as the one of the morphable forms with the best score. Any parent macros that are scheduled to move are queued to be visited later based on criticality of the parent macros.

Timing Driven Logic Replication and Tunneling

In some embodiments a driver node is logically replicated for nets having high capacitive loading or high fanout. The replication is performed selectively according to evaluations of timing improvements and routing costs. In some embodiments tunneling is performed to move the driver closer to a cluster of loads. In some embodiments the tunneling is performed after evaluating the timing improvements and routing costs.

Figure 26:
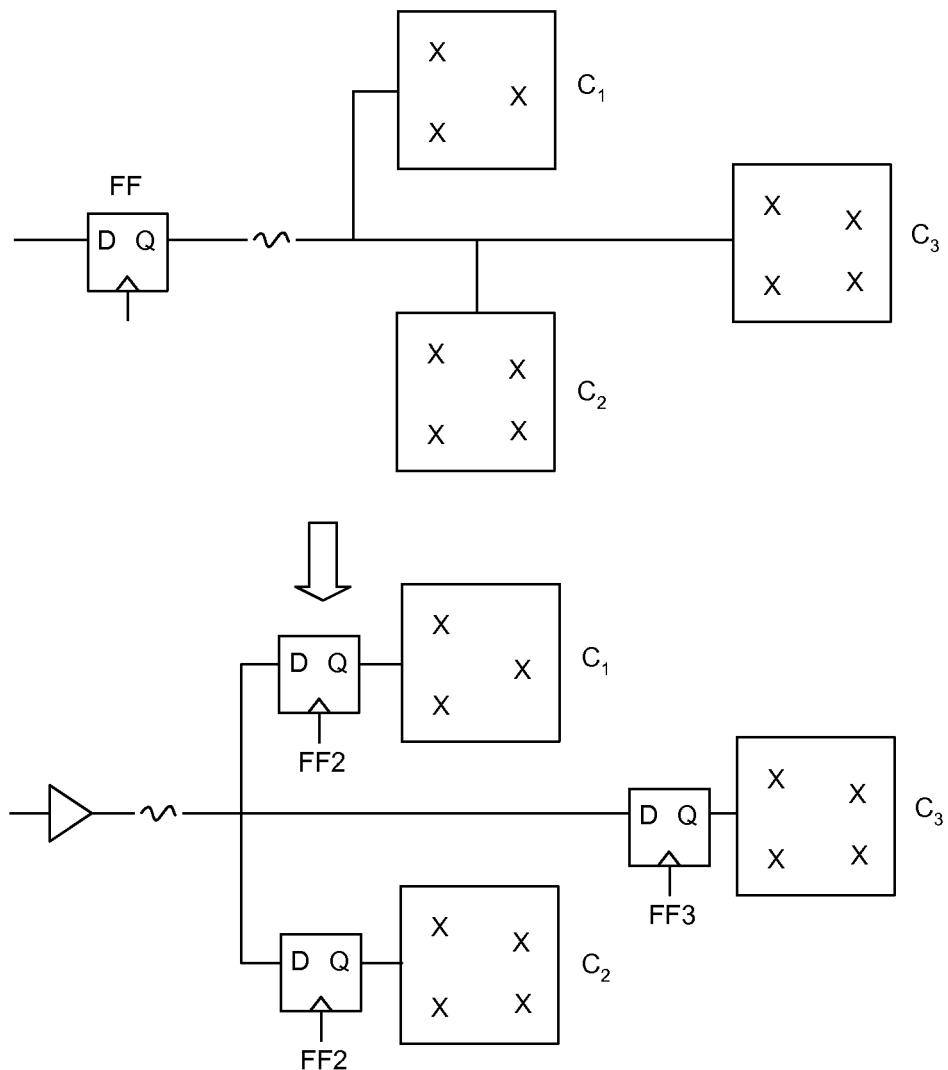
FIG. 26 illustrates example results of an embodiment of logic replication and tunneling for an array architecture.

FIG. 26 illustrates example results of an embodiment of logic replication and tunneling for an array architecture. The example illustrates a single FF driving three clusters of load ($C_1$, $C_2$ and $C_3$). After replication and tunneling (shown in the lower portion of the figure), the FF is replicated as $FF_1$, $FF_2$, and $FF_3$. Each of the replicated FFs is then placed near the respective cluster driven by the FF.

Timing Driven Hold Time Fixes

In some embodiments timing driven hold time fixes proceed as follows. Excess setup time (or slack setup time) is determined for each launch FF that is a root of a hold time violation. If there is excess setup time, then in some embodiments the clock signal feeding the launch FF is delayed. In some implementations the delay is via addition of a dummy load. In other embodiments a hold time violation is addressed by morphing the launch FF to a slower FF. In some implementations the morphing is via swapping the (original) launch FF with an unused (or available) slower FF.

Density Enhancement Embodiments

Node density in various SDI embodiments is influenced by a variety of effects, including netlist connectivity, circuit performance, and expansion fields. The former two exert an attractive force between nodes that depends upon netlist topology considerations or critical path analysis. For brevity these are referred to as "connectivity forces". Without the presence of expansion fields, the connectivity forces tend to draw together nodes into a highly clumped configuration that may exceed local slot resource supply. Spreading of nodes by the expansion fields then serves a twofold purpose: (a) provide solutions to slot assignment over some suitably chosen sub-discretization of a die, and (b) enhance routability, since localized clumping of nodes implies greater local demand for routing resources.

In a chip floorplan that is free of obstructions, very strong expansion fields result in a node distribution that is almost perfectly uniform. However this situation may not be desirable, since some amount of clumping may be beneficial. Once the node distribution reaches the point of routability, further increases to the expansion field strength may only worsen the routing problem by forcing nodes further apart than is optimal, seen by examining cutscores or circuit performance as a function of expansion field strength.

Further, the demand for routing resources may exceed supply only in very localized regions, while the bulk of the node distribution presents a tractable routing problem. The localized regions may occur due to netlist (topological) or floorplan effects. Increasing the expansion field strength to compensate for the "clumpiness" of the node distribution in selected regions affects the distribution as a whole, and in some usage scenarios may be suboptimal. In cases where the floorplan contains obstructions, the supply of routing resources can be a complex function of position on the die, and here a global approach can fail to have the desired effect entirely.

The illustrative but not limiting density-driven approaches presented here for addressing the problem of routing congestion in SDI can be categorized as follows:

1. Region Based
  a. By factor
  b. By function
2. Steiner Cuts Based
  a. Relative
  b. Absolute (i.e. supply vs. demand)

In the illustrative density enhancement embodiments, the density enhancement is inserted between the "fold" and "filtering" phases of node density computation.

Figure 27:
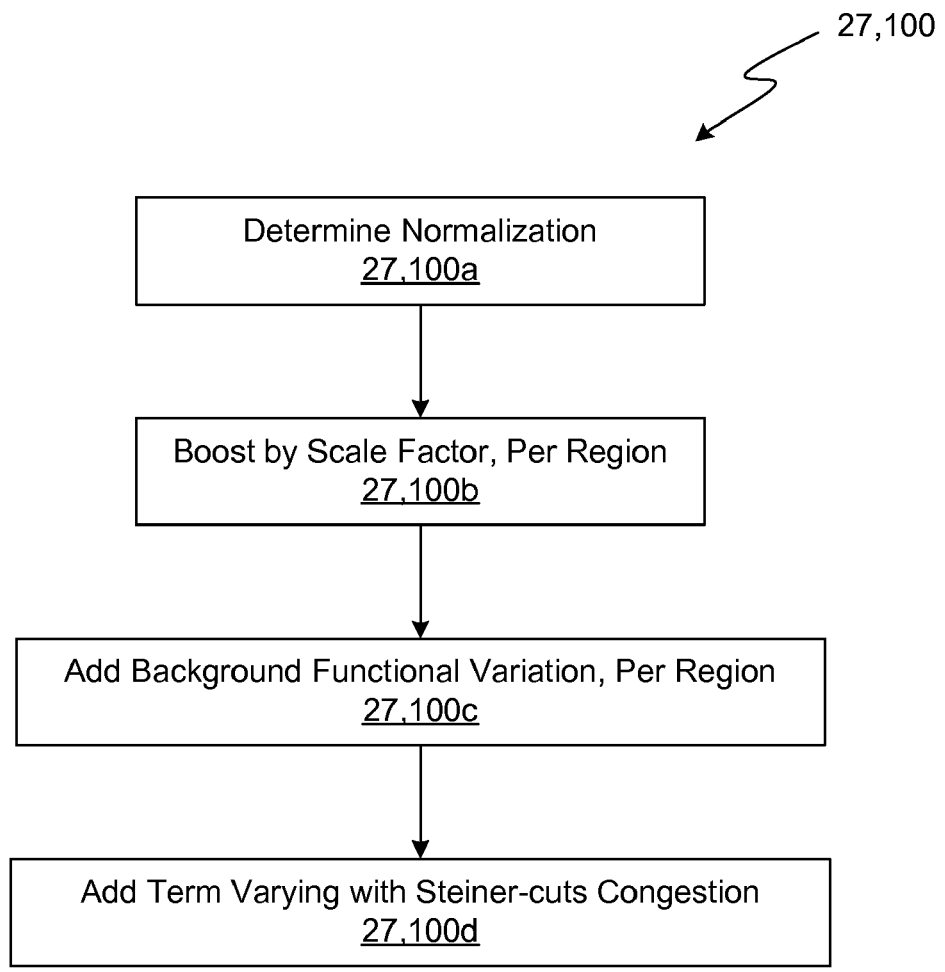
FIG. 27 illustrates a control flow in an illustrative embodiment, as used for density modification.

The flow 27,100 for density modification is illustrated in FIG. 27. Note effects introduced by procedures 27,100*b*, 27,100*c*, and 27,100*d* are completely independent of each other and can therefore be applied in any combination.

In procedure 27,100*a*, the normalization factor is typically taken as the average density, not counting that in excluded regions.

In procedure 27,100*b*, for each defined region that possesses a density scaling factor, the density is multiplied by the associated factor at each density field gridpoint contained within the region. Note this technique is essentially the same as increasing the effective mass for each node contained therein.

Given a statistically uniform node distribution to start with, the scale factor density enhancement tends to drive nodes out of the specified region, ultimately resulting in a node density on the order of (average density)/(scale factor) there, edge effects notwithstanding. Any number of such regions and scale factors can be defined. Regions may overlap if so desired.

In procedure 27,100c, for each defined region that possesses a density enhancement function, the associated spatial variation multiplied by the normalization factor is added to the existing density. The spatial variation is evaluated at each density field gridpoint contained within the region. In some embodiments an arbitrary functional variation is supported by expressing the function in Tcl (Tool Command Language) and using an embedded Tcl interpreter to return the result of the given expression at each gridpoint.

The functional variation enhancement may be well suited for the case where the node density becomes very rarefied, e.g. in small channels between obstructions. In rarefied density situations, the scale factor approach becomes less effective for pushing nodes out of the region, since there are fewer nodes to "push against". The functional variation serves essentially as a background density, only depending on the existing node density through the normalization factor (which is global). As in procedure 27,100b, there is no limit to the number of regions and functions that can be defined, and regions may overlap if desired.

In procedure 27,100d, a Steiner-cuts congestion density enhancement term is added. At this point in the flow, for this density enhancement embodiment, a congestion enhancement value at each gridpoint is available (described in detail below). Adding the congestion enhancement term (times a suitable normalization factor, e.g. the average density) for each gridpoint gives a final result.

Figure 28:
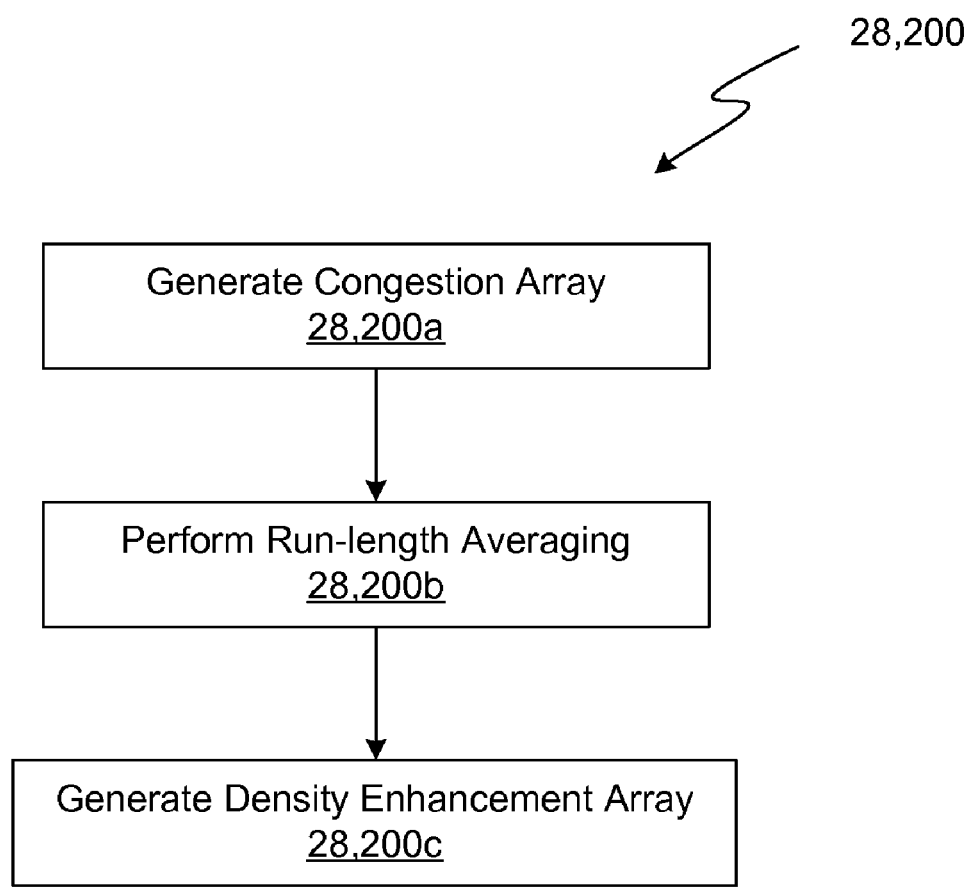
FIG. 28 illustrates a control flow of an illustrative embodiment, as used to determine the Steiner-cuts congestion term on the SDI grid.

The flow 28,200 used to determine the Steiner-cuts congestion term on the SDI grid in the density enhancement embodiment is given in FIG. 28.

Figure 29:
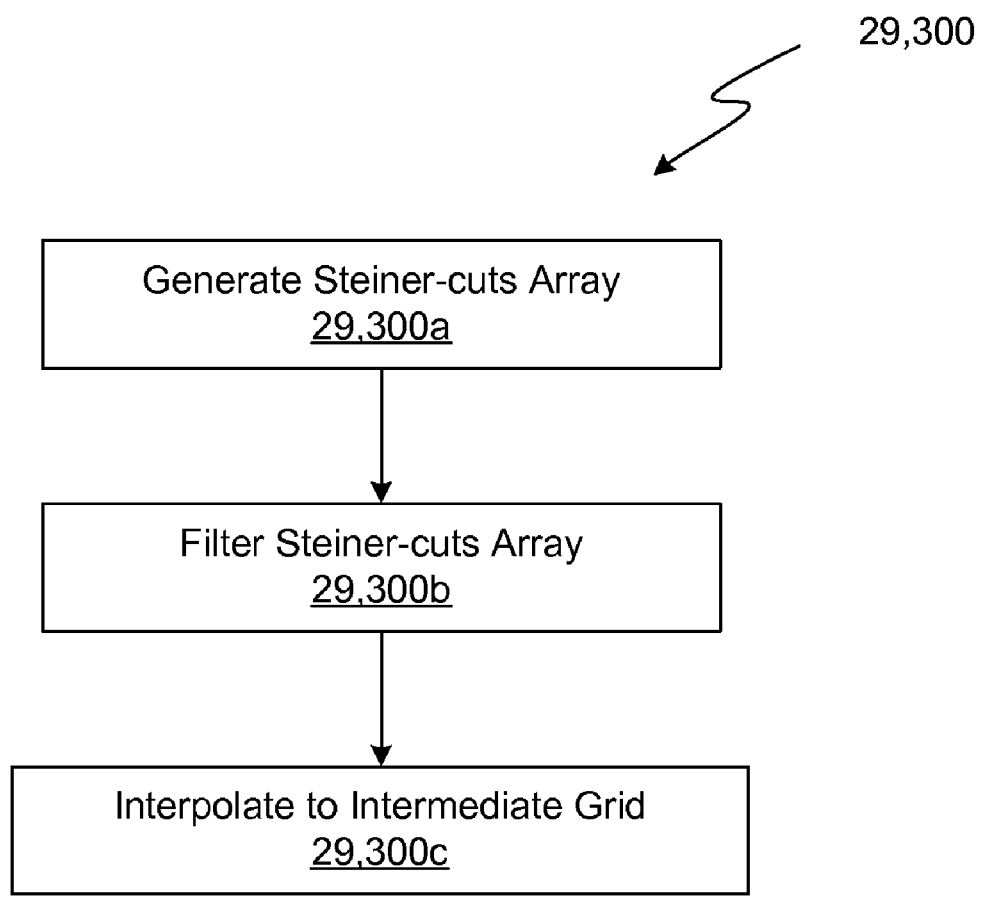
FIG. 29 illustrates procedures of an illustrative embodiment, showing creation of a congestion array.

In procedure 28,200a, a so-called "congestion array" is generated that is a measure of routing congestion output, taken from a Steiner cuts measurement. Since the calculation of routing congestion may be computationally expensive, the congestion array need only be calculated initially and at specified intervals as a run proceeds. An intermediate grid is used to assert the independence of the congestion array from the particular form of the routing congestion diagnostic, as well as from the SDI grid resolution. The procedures used to create the congestion array are illustrated in FIG. 29.

In procedure 28,200b, the congestion array is run-length averaged according to a specified relaxation factor. This helps prevent sudden "shock" to the system (which can cause unphysical fluctuations) every time the congestion array is recalculated, by phasing the change in gradually. The relaxation parameter is chosen to vary from zero (static; congestion array never changes) to unity (congestion array changes instantaneously).

Figure 30:
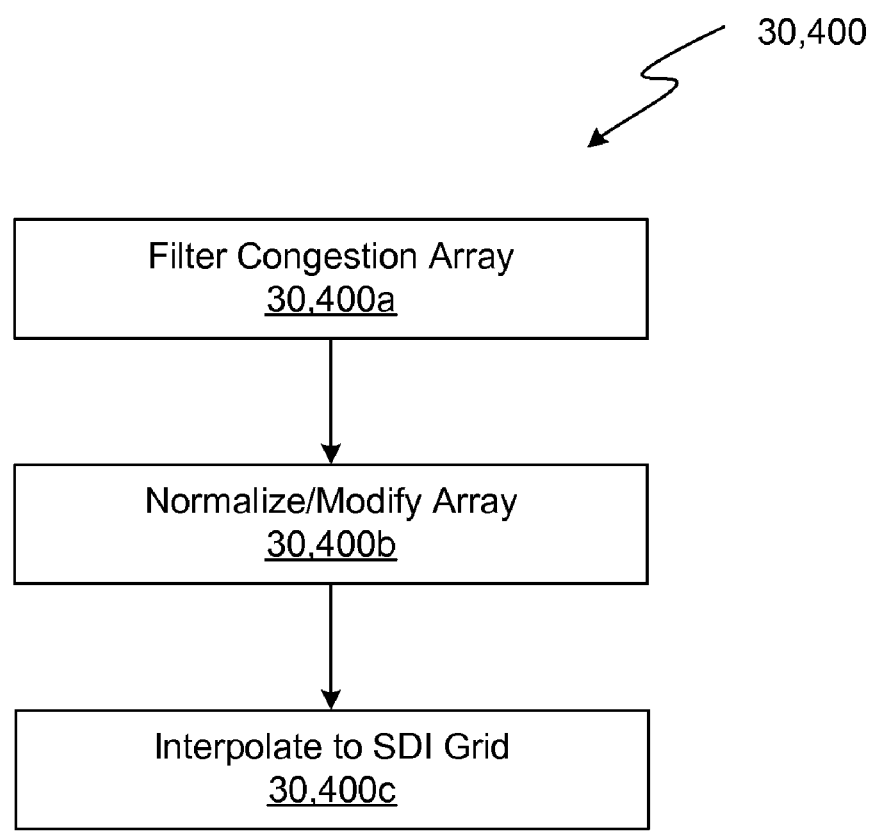
FIG. 30 illustrates procedures of an illustrative embodiment, showing calculation of a final congestion density enhancement array.

In procedure 28,200c, a final congestion density enhancement array is calculated. The calculation may be performed once each timestep, in response to configuration changes, or both. Further details are illustrated in FIG. 30.

In procedure 29,300a, the Steiner-cuts array is fetched from the generator. In some embodiments a timing kernel (TK) performs procedure 29,300a. The calculation may include an idealized buffer tree, at implementor or user discretion.

In procedure 29,300b, the Steiner-cuts array is subject to a filtering operation to increase smoothness, which helps improve accuracy of a subsequent interpolation procedure. In some embodiments a number of binomial digital filter passes are used.

In procedure 29,00c, the value at each gridpoint in the intermediate grid discretization is calculated using a linear spline approach.

In procedure 30,400a, the congestion array is smoothed using filtering similar procedure 29,300b, in part to improve the accuracy of the interpolation. But filtering is also considered the "final smoothing" phase of the field and is subject to the most user and/or programmatic control, to improve the quality of the final result. The smoothing is most effective when the scale lengths associated with the variation of the density enhancement are "semi-global", e.g. small compared to the die size, but large compared to motion of a node in a single timestep.

In procedure 30,400b, the congestion array is normalized as needed. First it is clipped at a pre-determined value of maximum congestion, to constrain resulting density gradients within reasonable limits. In relative spreading mode, a normalization of unity is imposed, thus inducing a density-driven outflow from congested areas without regard to actual routing supply.

In absolute spreading mode, the routing demand versus supply is compared to the maximum allowable relative demand (e.g. 80% capacity). Only at gridpoints where congestion exceeds the allowed limit does the enhancement field take on substantial values (while enforcing a reasonably smooth variation). In the case of a density-gradient model for calculating the expansion fields, the congestion density field that results is flat everywhere that routing supply satisfies demand, rising smoothly into elevated "mounds" at locations where the demand exceeds supply.

The congestion array is then modified according to desired strength of the density enhancement effect. Both multiplicative and power-law transformations may be applied. The strength of the enhancement may be increased over time to allow for the gradual movement of nodes out of congested areas.

In procedure 30,400c, the value of the congestion array at each SDI gridpoint is calculated using a linear spline approach.

Tunneling Congestion Relief Embodiments

In some SDI-based integrated circuit design flow embodiments "tunneling" is used to relieve congestion at boundaries. Tunneling governs transitions of nodes through one or more obstructed regions not available for node placement, i.e. xzones, of a chip (or portion thereof). In some embodiments the transition is according to a mathematical criterion. In some embodiments nodes are selected as tunneling candidates according to node attraction into one of the obstructed regions. In some embodiments the criterion is affected by node density. In some embodiments the criterion is affected by node interconnections (or connectivity). In some embodiments the criterion is affected by circuit performance (i.e. timing).

Tunneling enables further placement progress, according to selected metrics such as routability and circuit performance, while taking into account xzones. Tunneling has several aspects including candidate node selection, nodal move speculation, and node tunneling criteria (i.e. keep move/tunnel or reject).

In some embodiments tunneling is performed at the end of an SDI timestep. Any intervening sub-steps taken by the time integrator (e.g. part steps taken by a Runge-Kutta (RK) integrator) are not considered. During the course of a timestep (and any associated sub-steps) the nodes are allowed to drift into xzones in order to allow the time integrator to proceed at full speed, since in some usage scenarios a smooth trajectory in a numerical simulation enables more accurate integration, and thus may enable a longer timestep (given a predetermined accuracy target). At the end of one full timestep, only nodes that have been coerced into xzones are considered for tunneling speculation.

Figure 31:
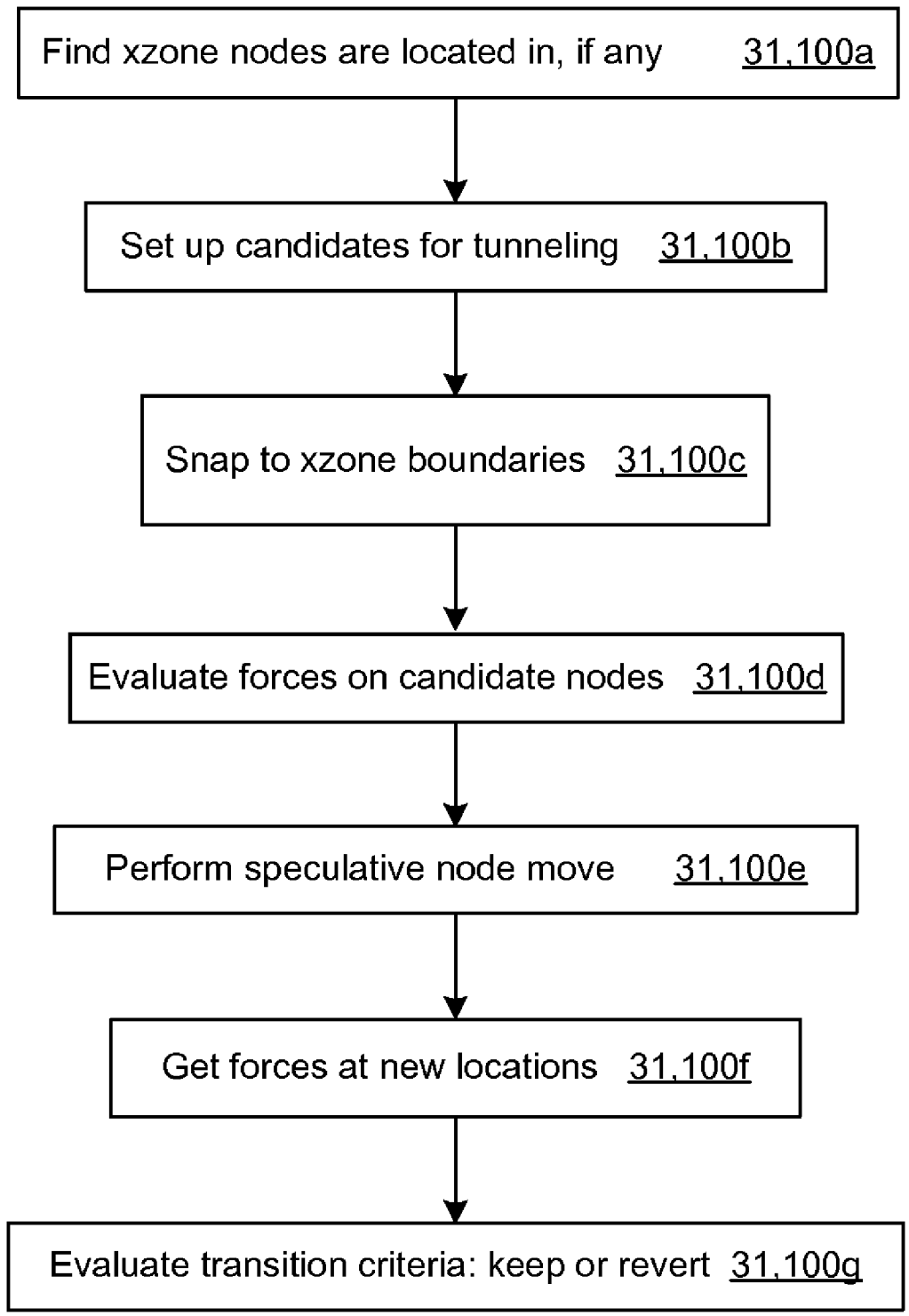
FIG. 31 illustrates an embodiment of a processing flow for node tunneling out of exclusion zones in an SDI-based integrated circuit design flow.

FIG. 31 illustrates an embodiment of a processing flow for node tunneling out of exclusion zones in an SDI-based integrated circuit design flow. In some implementations any combination of the illustrated elements are performed by software routines known collectively as a "node mover". In 31,100a nodes are selected as candidates for tunneling based on respective positions. Nodes that have moved into an xzone are included in a set of all transiting nodes. Each respective node will have arrived at the respective position (or point) due to (discounting inertial effects) the vector sum of all forces acting on the respective node. For example, some of the forces may be due to netlist connectivity (i.e. the respective node is drawn towards topologically close nodes) and some of the forces may be due to a local overabundance of nodes (density buildup). In some usage scenarios selecting nodes in xzones for tunneling consideration is an efficient selection criteria that discriminates nodes likely to benefit from a tunneling transition to another side of an xzone or multiple abutting xzones.

In 31,100b, having determined candidate nodes, per-node initialization is performed. In some usage scenarios total tunneling candidate nodes are a small fraction of total nodes, and for efficiency a secondary set of data structures is used to process the candidate nodes. A transiting node class contains a node id (that maps to an original node entry) and any ancillary data required for accurate tunneling speculation. Henceforth, the class of all node candidates for tunneling is referred to as "transiting nodes".

In 31,100c, all transiting nodes are snapped to the nearest xzone boundary. The snapped position is identical to the resulting node position were no tunneling to occur, and assures a baseline for proper field computation and comparison to the post-transit result.

In 31,100d, the forces on transiting nodes at the current positions (pre-speculation) are evaluated. See the discussion relating to FIG. 32 located elsewhere herein for further information.

In 31,100e, the position of the transiting node is restored to the positions before processing relating to 31,100c. The node mover then finds the intercept on the xzone boundary that results from application of the force vector components on the node. In some embodiments node inertia is also taken into account when determining the xzone boundary intercept. The node is speculatively moved to just past the intercept position, outside the original xzone. In the event that multiple abutting xzones exist and the node lands in yet another xzone, the mover is invoked again using the original trajectory to direct the move. The speculative movement procedure is continued as many times as necessary for the node to arrive in a region external to any xzone.

In 31,100f, the forces on transiting nodes at the new positions (post-speculation) are evaluated. See the discussion relating to FIG. 32 located elsewhere herein for further information.

In 31,100g, the transition criteria are evaluated and examined. If the transition is accepted, then the node associated with the transiting node acquires the new coordinates. Otherwise the coordinates as determined in 31,100c are retained. See the discussion relating to FIG. 33 located elsewhere herein for further information.

Figure 32:
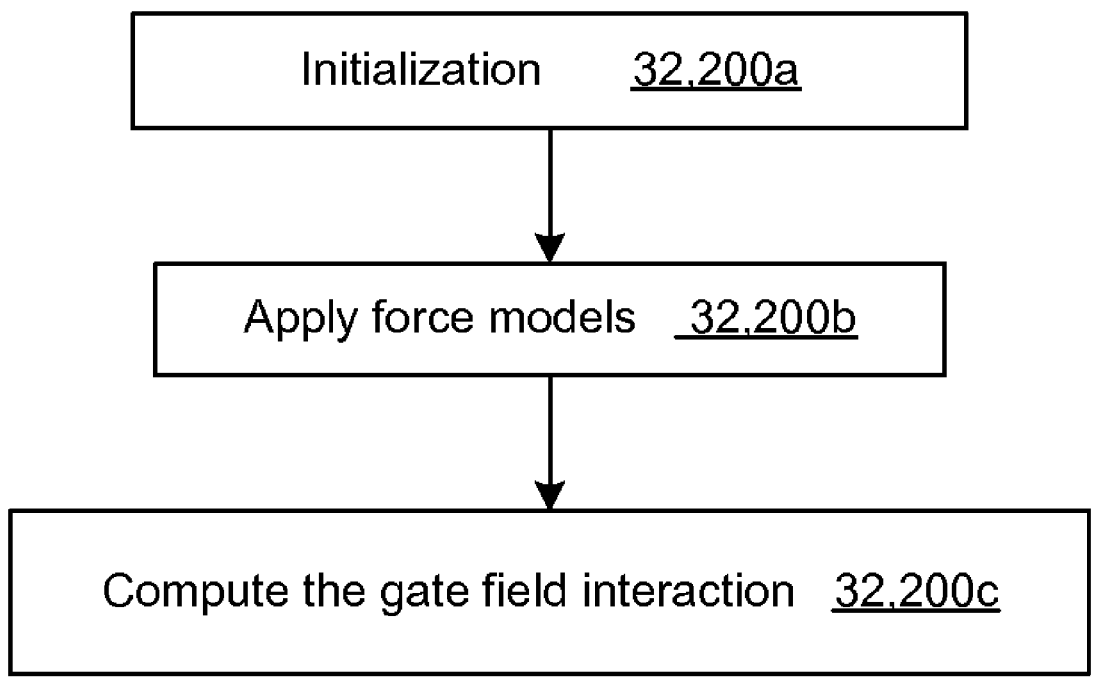
FIG. 32 illustrates an embodiment of SDI-related force calculations in a tunneling congestion relief context.

FIG. 32 illustrates an embodiment of SDI-related force calculations in a tunneling congestion relief context. In 32,200a, forces on the node are cleared and preparations are made for the field calculation.

In 32,200b, forces on each node due to all non-field interactions are summed, including all connectivity and timing based pin to pin forces, as well as any other nodal interaction forces present.

In 32,200c, gate field components are computed. The first time through (pre-speculation phase), a full field calculation is performed. The pre-speculation phase is with the nodes snapped to the nearest xzone boundary, so the result represents a result assuming no nodes transit. The second time through (post-speculation phase), the field calculation from the first phase is used, but applied to the speculative nodal coordinates. That is, it is assumed that the fields are not significantly changed on a global scale as a result of tunneling. In some usage scenarios, since only a small number of transitions are considered relative to the total number of nodes, the assumption serves as a reasonable approximation, and may be beneficial for computational efficiency since field computations for each individual speculation are avoided.

Figure 33:
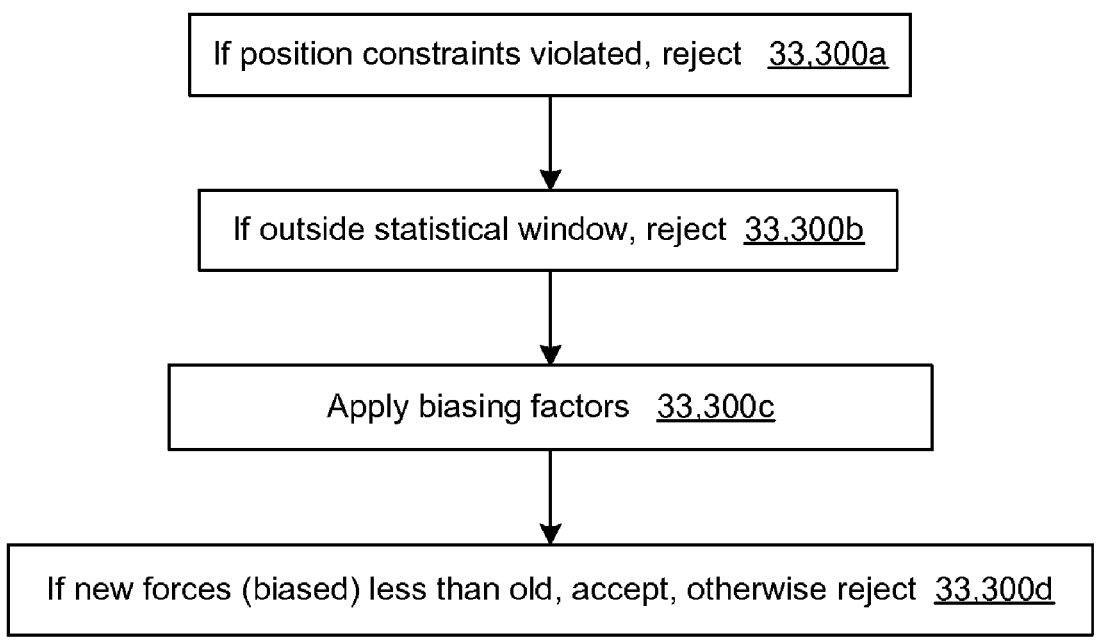
FIG. 33 illustrates an embodiment of evaluation of tunneling transition criteria.

FIG. 33 illustrates an embodiment of evaluation of tunneling transition criteria. In 33,300a, the speculative node coordinates are examined to see if there are violations of any node region constraints and if nodes fall into a legal logic area. If there is any violation, then the transition is rejected.

In 33,300b, a statistical window on how many transitions are considered is applied. In some implementations the window is small (such as 1%, 2%, 5%, or 10%) compared to unity but not so small that an inordinate number of passes through speculator routines are required to process all qualifying nodes. The windowing helps prevent sloshing, where many nodes tunnel from a high to a low density region at once, altering density so much that nodes tunnel back later. In other words, the statistical window helps to ensure that approximations made with respect to 32,200c (of FIG. 32) are valid.

In 33,300c, a variety of biasing factors are applied. In some implementations the factors are multiplied together. In some implementations one or more of the factors is less than unity. The factors include any combination of the following.

A default biasing factor.

A bias against multiple transitions in a row, to ensure longer relaxation time.

A distance based biasing, to make it more difficult to travel long distances. The distance based biasing may involve either a hard limit or a functional dependence on distance traveled (e.g. linear or quadratic).

A distance based biasing specific to timing critical nodes. Nodes on a critical path may have an unpredictable effect on timing due to tunneling, so the critical path nodes may be selectively more further constrained than other nodes.

In 33,300d, the magnitude of the forces on the node at the old and the new positions are computed. If the new force magnitude after biasing is less than the old force magnitude, then the transition is considered to be energetically favorable and therefore accepted. Otherwise the transition is rejected.

Clock Tree Synthesis (CTS) Embodiments

CTS is a process for creating a clock network in an Integrated Circuit (IC) physical design flow. CTS has general applicability to design flows having limited placement options for clock buffers, such as SAF-based design flows. Note that although CTS is described herein within a general context of an SDI-based flow, there are applications to other types of design flows using conventional EDA tools. In some usage scenarios a structured ASIC design has one or more clock signals that fan out to many (perhaps thousands) of register clock pins. A register clock pin may be a clock pin of a flip-flop, a latch, or clock pins of embedded memory and other IP blocks.

Clock nets produced by logic synthesis or derived from schematics act as placeholders for CTS-produced clock nets. Each of the logic synthesized clock nets drives a high drive strength buffer (an ideal clock). Each of the CTS-produced clock nets includes one or more levels of buffers, interconnect wires, and other gating logic such as clock_and, clock_or, clock_mux, and other similar clock manipulation elements. In some embodiments CTS is run post placement so that precise coordinates of clock pins driven by each clock net are known (such as portions of processing performed in conjunction with "Buffering Clock Tree Synthesis Timing Driven Buffering/Resizing" 821 of FIG. 8A).

In some implementations a CTS tool builds a clock network that strives to optimize characteristics of the clock network including skew and latency. Clock skew is the difference of signal arrival times at clock pins of two registers. The CTS tool optimizes a maximum clock skew of the circuit, i.e. the largest clock skew between any pair of registers that have timing paths (setup/hold) between them is minimized.

Clock latency is delay from a root of a clock tree to a clock input pin of a register. The CTS tool optimizes the maximum latency, i.e. the largest delay is minimized. In addition to skew and latency metrics, there are other considerations such as power and routing congestion addressed by the CTS tool. The CTS tool attempts to optimize (i.e. minimize) the buffers and wire resources used for clock distribution since the resources directly impact circuit routing congestion and dynamic power usage.

In some embodiments CTS is performed in a post detail placement phase to enable building optimized clock networks, based on locations of clock leaf pins. Gating logic enables power reduction by selectively turning on and off sub-trees of a clock tree. Clock selector logic (such as using a clock_mux) multiplexes multiple user clocks and test clocks. A clock tree may have several levels of clock selector logic gates and several levels of clock gating logic gates. In some usage scenarios clock gating circuitry is pre-designed by the user at a hardware description level and is then synthesized into gates by a synthesis tool. The CTS tool balances clock networks while taking into consideration delays of various gating logic, thus treating the gating logic transparently and automatically.

Figure 34A:
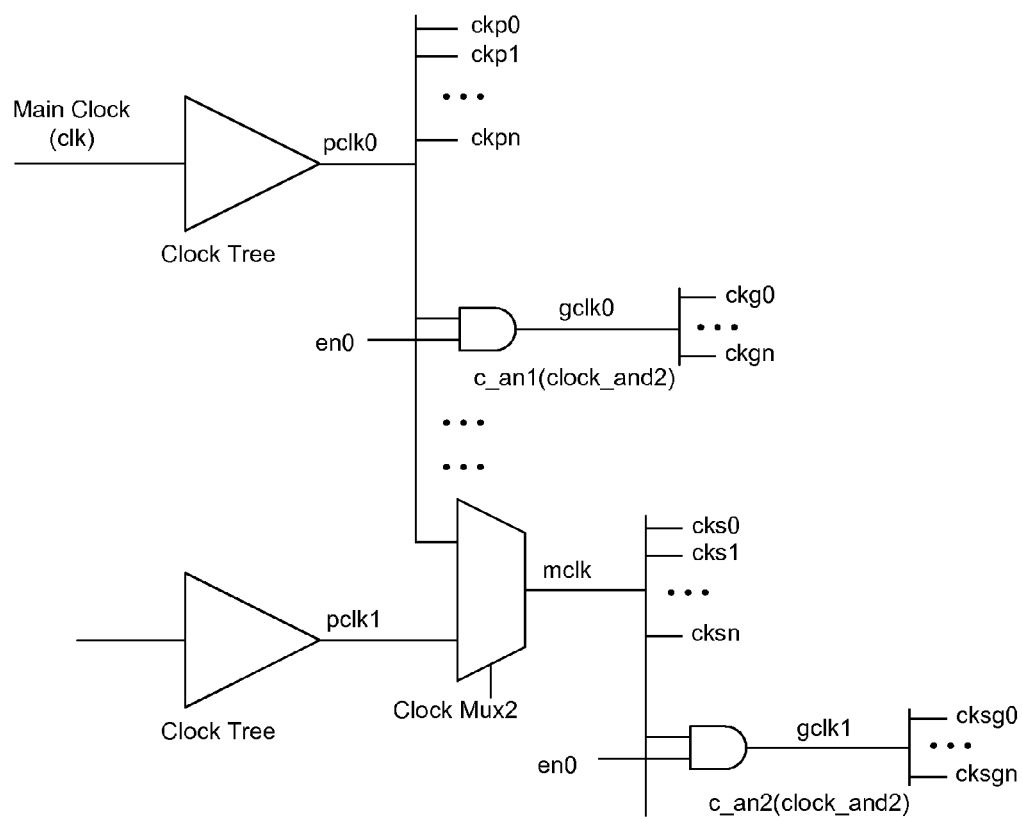
FIG. 34A illustrates an example clock tree suitable for input to a Clock Tree Synthesis (CTS) tool for Structured Array Fabric (SAF)-based design flows.

FIG. 34A illustrates an example clock tree suitable for input to a CTS tool for SAF-based design flows. Primary clock domains are illustrated as pclk0 and pclk1. Gated clock sub-domains are illustrated as gclk0 and gclk1. A clock selector based clock sub-domain is illustrated as mclk. Clocks pins of registers are illustrated as ckp0, ckp1, . . . ckpn; ckg0, . . . ckgn; cks0, cks1, cksn; and cksg0, . . . cksgn. Register clock pins ckg0, . . . ckgn and cksg0, . . . cksgn are associated with gated clocks. Register pins cks0, cks1, . . . cksn are associated with selected clocks. Register clock pins cksg0, . . . cksgn are associated with two levels of clock processing (select and gate functions).

Figure 34B:
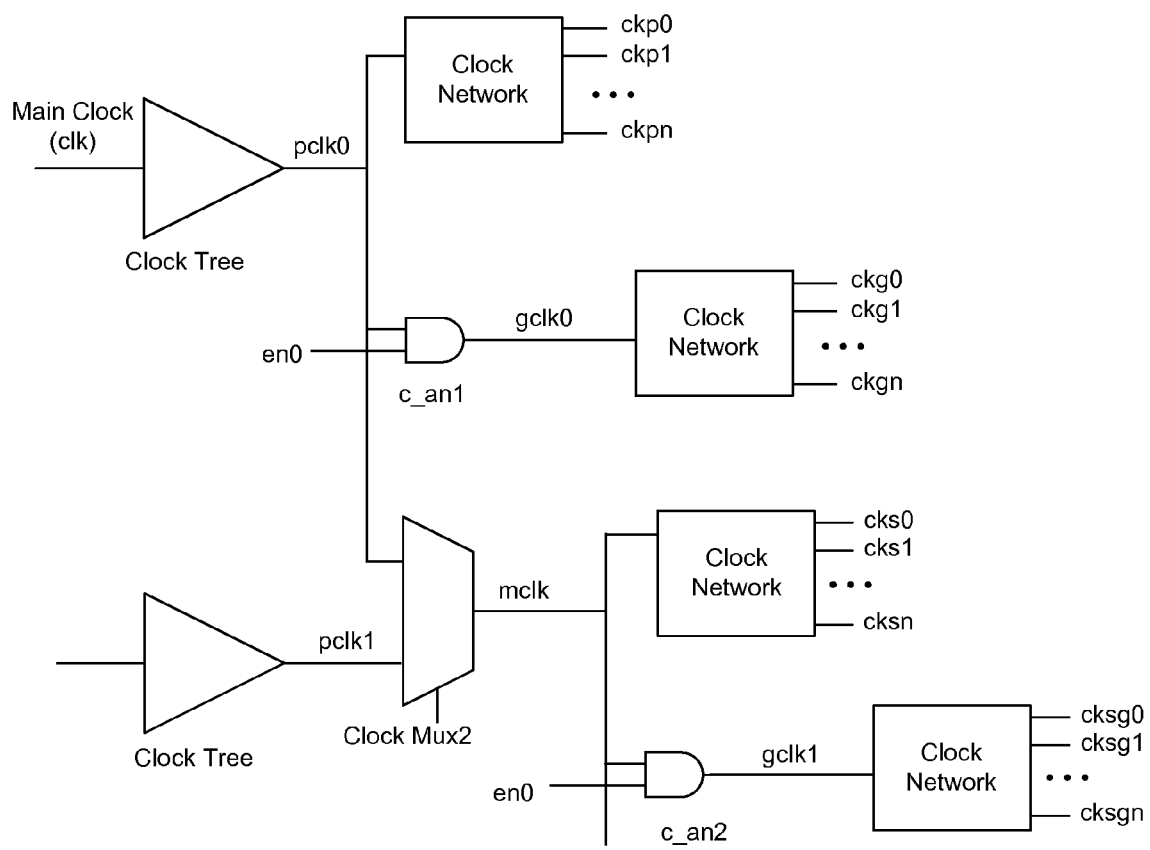
FIG. 34B illustrates an example clock tree output from the CTS tool operating on the input illustrated in FIG. 34A.

FIG. 34B illustrates an example clock tree output from the CTS tool operating on the input illustrated in FIG. 34A. In the illustrated output various Clock Networks produced by the CTS tool (according to the input illustrated by FIG. 34A) are shown driving the register clock pins.

Figure 34C:
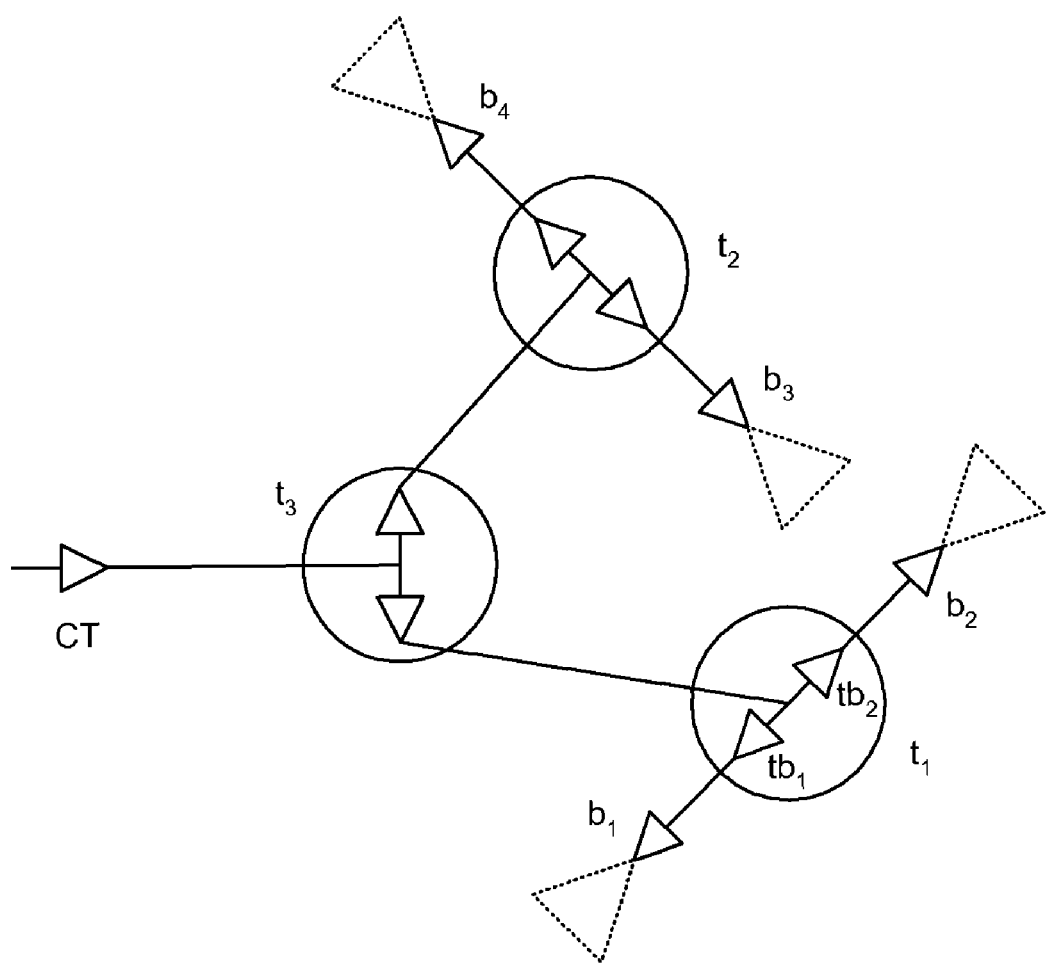
FIG. 34C illustrates an example clock tree network.

FIG. 34C illustrates an example clock tree network. Leaf buffers are illustrated as $b_1$, $b_2$, $b_3$, and $b_4$. Each of the buffers are shown driving (or fanning out to) a respective sea of clock pins as illustrated conceptually by the triangular element at each respective driver output. Terminals of the clock network are illustrated as $t_1$, $t_2$, and $t_3$. Selected terminal buffers are illustrated as $tb_1$ and $tb_2$. A clock root is illustrated as CT. The illustrated clock tree network is representative of some implementations of the Clock Networks of FIG. 34B. For example, consider the Clock Network of FIG. 34B driving register clock pins ckp0, ckp1, . . . ckpn. CT of FIG. 34C corresponds to the element driving pclk0. Leaf buffer $b_1$ drives ckp0, leaf buffer $b_2$ drives ckp1, and so forth.

Figure 35:
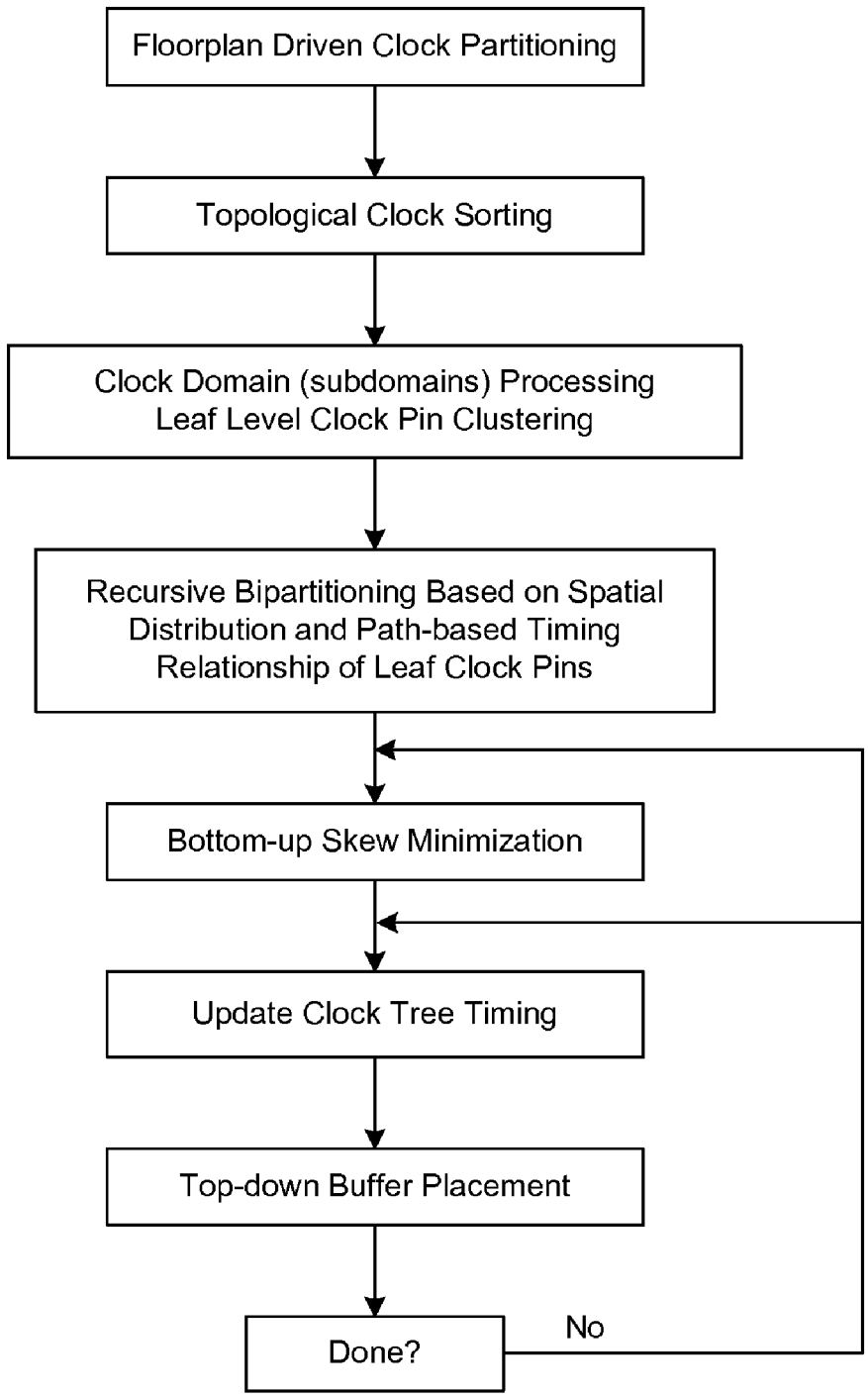
FIG. 35 illustrates an overview of an embodiment of a CTS flow.

FIG. 35 illustrates an overview of an embodiment of a CTS flow. According to various embodiments the CTS flow includes any combination of floorplan driven clock partitioning, topological clock sorting, top-down recursive bi-partitioning, clock domain (and sub-domain) processing, bottom-up skew minimization, and top-down buffer placement.

Floorplan driven clock partitioning (such as illustrated in FIG. 35) may be used when a die floorplan has extensive arrays of RAM and/or IP structures that lack suitable sites or slots for clock tree buffer elements. When the CTS tool builds a clock tree, buffer sites at intermediate points of each clock network are used to drive two sub-trees "underneath" the respective intermediate point. Having large rows (columns) of RAMs/IP blocks implies that there are extensive die regions that are either completely devoid of clock buffer sites or have the sites at sub-optimal locations. Therefore, CTS preprocesses the clock network and embeds Pseudo-clock Sub-Domains (PSDs) that are first balanced within each row (column). Subsequently, the clock sub-domains are deskewed across logic rows (columns). The first level PSDs can be deskewed by buffer resources within a row (column), thus alleviating the need to find sites over RAM and/or IP regions.

Figure 36A:
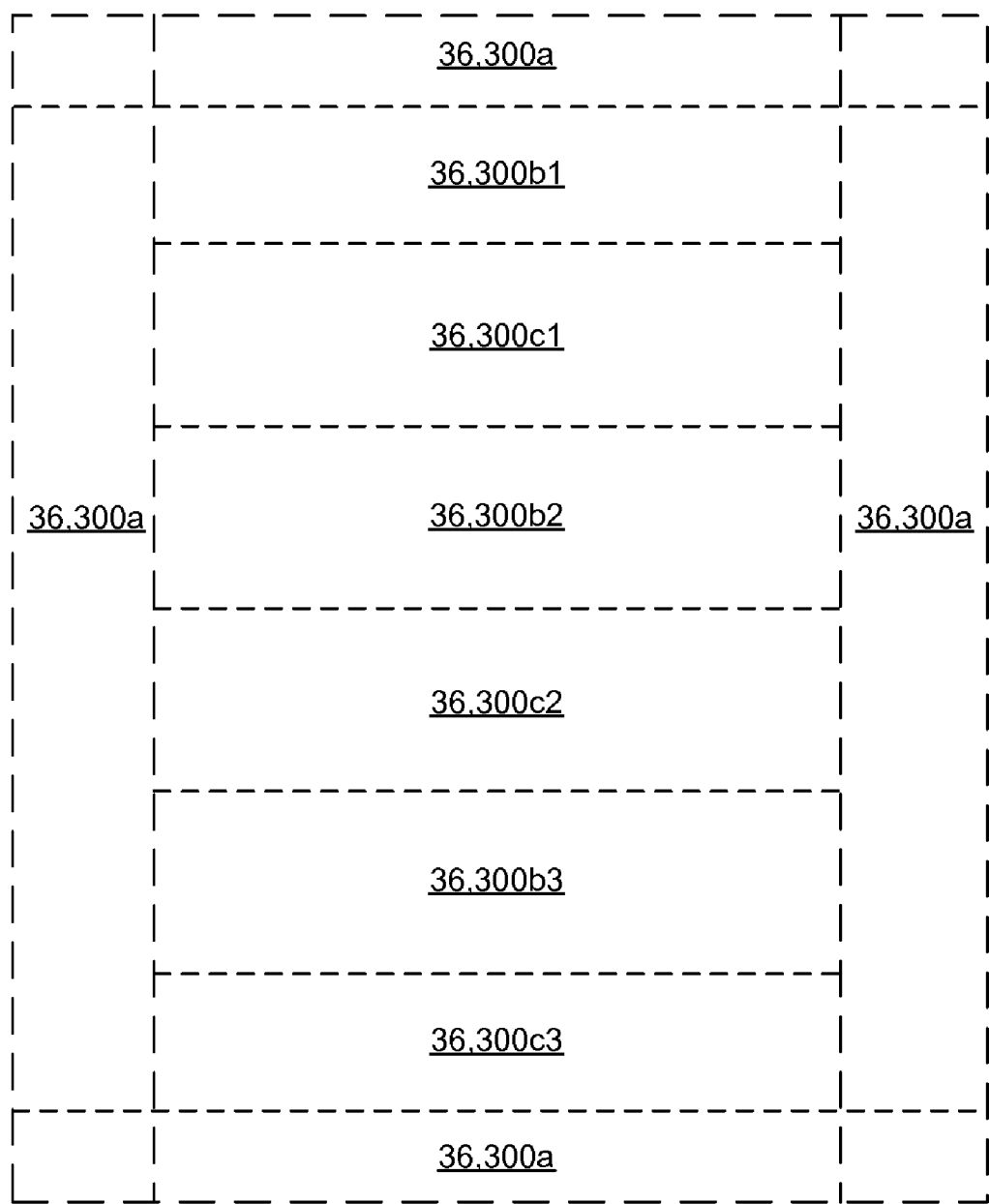
FIG. 36A illustrates an example die floorplan of a design having embedded Random Access Memory (RAM) or other Intellectual Property (IP) blocks.

FIG. 36A illustrates an example die floorplan of a design having embedded RAM or other IP blocks. Regions 36,300*a* represent an I/O ring. Regions 36,300*b*1, 36,300*b*2, and 36,300*b*3 represent rows of embedded RAMs. Regions 36,300*c*1, 36,300*c*2, and 36,300*c*3 represent rows of logic blocks. CTS clock preprocessing proceeds as follows. Within each PSD, all clock leaf pins in each contiguous logic region (such as each of regions 36,300*c*1, 36,300*c*2, and 36,300*c*3) are merged so the leaf pins fan out from a single Root Clock row (column) Buffer (RCB). The RCB is optimally placed at the centroid of the bounding-box encompassed by all the leaf clock pins within the respective logic region.

All RAM clock pins are then combined with logic clock pins by drawing a partitioning line through the middle of each RAM region. For example, if there are RAM clock pins in region 36,300*b*2, then each one is merged with clock pins of one of adjacent regions 36,300*c*1 or 36,300*c*2 depending on proximity of the respective RAM clock pin to the adjacent regions (i.e. the closest one of the regions is chosen).

Then each of the region PSDs are deskewed individually. In some usage scenarios the deskewing is by combining even and odd row (column) RCBs separately. In other words, every other row (column) is processed together. In situations where RAM (or IP) rows (columns) are alternated with logic block rows (columns), and the rows (columns) are of approximately the same size, processing even/odd rows (columns) separately simplifies equidistant placement of RCB pairs, since the center of each RCB pair will be in a logic block row (column). For example, RCBs associated with region 36,300*c*1 are processed with RCBs associated with region 36,300*c*3, and equidistant placement may be satisfied by region 36,300*c*2, a logic region. Note that the RCBs associated with a logic region may include RAM clock pins from adjacent RAM regions, such as region 36,300*c*1 RCBs include merge RAM clock pins from the upper half of region 36,300b2 and the lower half of region 36,300b1.

Subsequently, the even and odd RCBs are deskewed at the clock root. The aforementioned merging, partitioning, and RCB placement processing is performed for each primary clock. The leaf clock pins driven by gated-clocks and clock selectors cells are treated transparently during the processing. If a gated-clock or clock-selector logic drives leaf clock pins in multiple logic regions, then the gating logic is replicated in each of the respective regions the gated clock fans out to, thus enabling transparent merging of un-gated and gated-clock leaf pins.

Figure 36B:
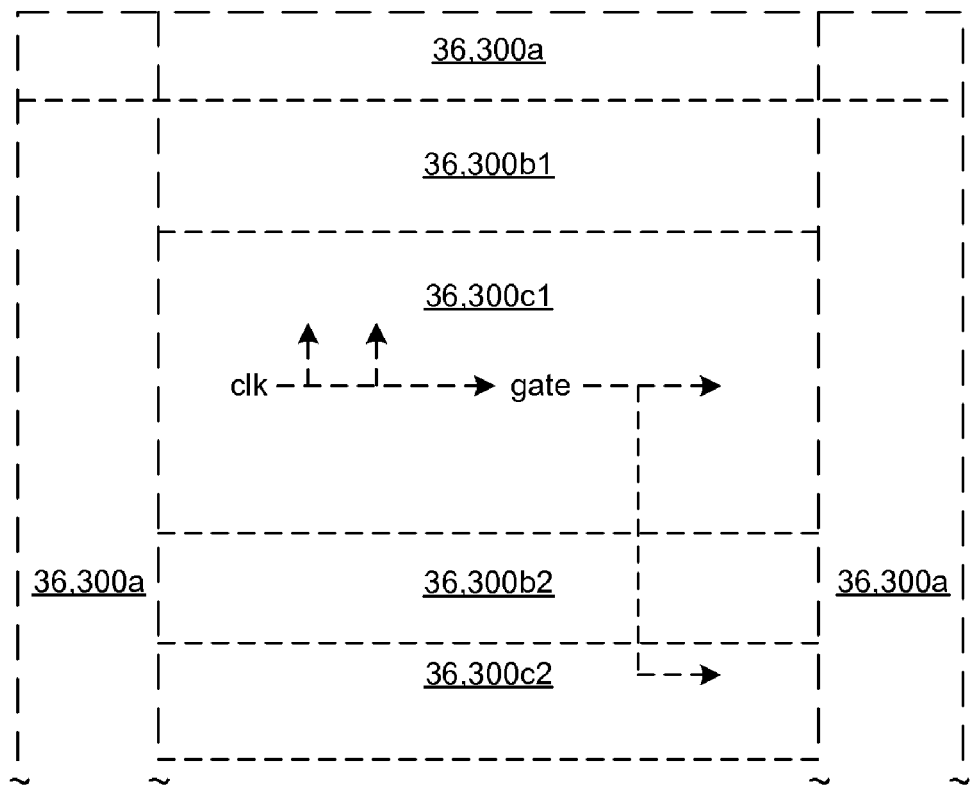
FIG. 36B illustrates a portion of a clock net in a context of a portion of FIG. 36A.

FIG. 36B illustrates a portion of a clock net in a context of a portion of FIG. 36A. Clock net "clk" feeds both un-gated and gated clock pins that span out to logic regions 36,300c1 and 36,300c2. The gated clock is replicated in region 36,300c2 so that the RCB in each region is enabled to independently drive both the un-gated and the gated branches of the clock trees. The replication technique reduces multi-level clock balancing across RAM regions and introduction of skew uncertainties.

Topological clock sorting, or domain ordering (such as illustrated in FIG. 35) is performed so that the CTS tool visits the clock domains in an order that facilitates deskewing of lower level sub-domains prior to higher level sub-domains. In some embodiments various clock sorting functions are performed by software routines implemented in a topological sorter.

In some usage scenarios a primary clock has several gated-clock and select-clock logic based sub-domains. As shown in FIG. 34A, main clock (clk) fans out to several leaf level clock pins after several levels of gating (gclk0, mclk, and gclk1).

The sub-domains gclk0, mclk, and gclk1 carry the same primary clock (clk), but are gated (controlled) by user logic to enable selectively turning off for one or more clock cycles. Clock distribution information of FIG. 34A is processed by the topological sorter to produce sub-domain ordering: gclk1→mclk→gclk0→pclk0→pclk1→clk. The ordering ensures that when the un-gated leaf level pins of clk nets are being deskewed with the gated-clock pin (gclk0), the gated clock pin has already been completely processed (expanded) and any associated clock network latency is determined.

Clock domains (and sub-domain) processing (such as illustrated in FIG. 35) includes processing the domains according to the topological domain ordering. A Clock Domain Processor (CDP) of the CTS tool first collects all clock pins to be deskewed. A user may mark pins to be excluded for deskewing and the CDP obeys the marking. The CDP forms two level clusters. For all the leaf clock pins that are pins of a leaf level register (such as flipflops, latches, and RAM blocks), recursive partitioning forms bottom-up clusters that may be driven by a leaf level clock buffer.

Clustering of leaf level clock pins (such as illustrated in FIG. 35) is performed via recursive partitioning of all the leaf level clock pins, and forms small well-formed clock pin clusters that may be driven by leaf level clock buffers, thus reducing complexity of leaf level clock buffer implementation. The partitioning uses recursive bipartitioning with an objective function that minimizes the diameter of the polygon formed by all pins in a partition.

As the diameter of the polygon computation has polynomial complexity, in some implementations a fast heuristic technique with linear complexity is used. The linear complexity technique computes an NSP of a bounding box of all leaf level pins in a partition. Clusters are also formed to increase relative "closeness" to other clusters having common setup and hold paths. Cluster closeness of two clusters is the number of clock buffers common to the clusters. In other words, tightly coupled leaf clock pins are grouped to share relatively many clock buffers, thus enabling more efficient skew reduction.

Figure 37A:
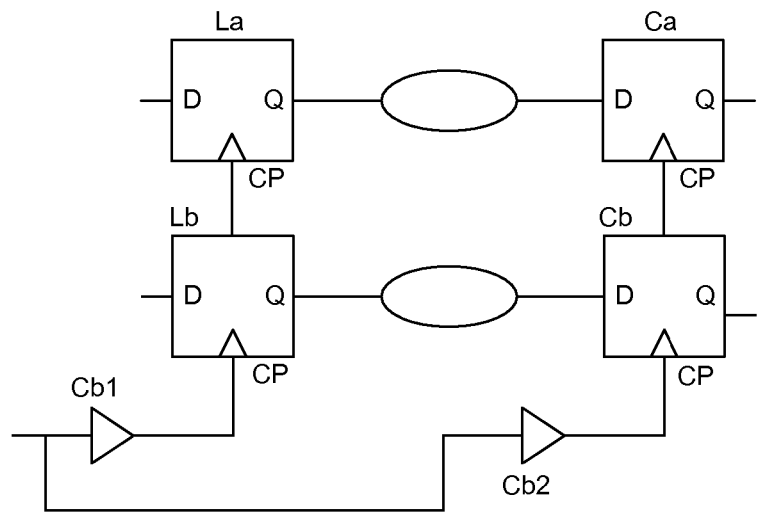
FIG. 37A illustrates an example of timing driven pin swapping.
Figure 37A:
Figure 37A:
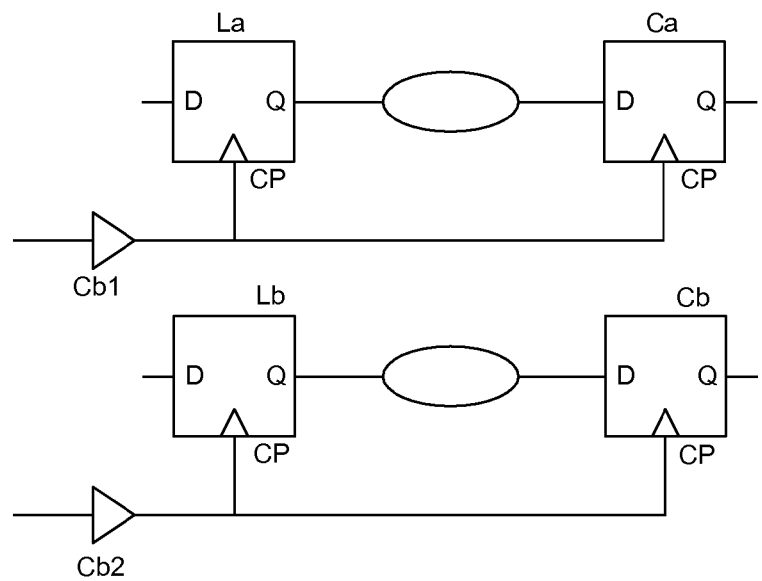

FIG. 37A illustrates an example of timing driven pin swapping. As illustrated, it is preferable to partition clusters as P1={La, Ca}, P2={Lb, Cb) instead of P1={La, Lb} and P2={Ca, Cb}. The former promotes sharing of clock buffers between launch and capture flip-flops thereby reducing the skew between launch and capture flip-flops since unshared clock buffers may be subject to separate process, voltage, and temperature variations and thus may introduce skew.

During recursive bipartitioning, each partition is scored based on timing relationships between each pin and every other pin of the partition. Cluster cost is a weighted sum of interconnect wiring cost and cluster-closeness cost. The interconnect wiring cost is determined from the NSP of the bounding box of all the pins constituting the cluster. For example, partition cost may be given by:

$$\text{Part\_cost} = 0.5 * cic * cic + 0.5 * ctc * ctc$$

where
cic: is cluster interconnect cost, given by
cic=(1−part interconnect_cost/best_interconnect_cost); and
ctc is cluster timing cost given by
ctc=(1−part_timing_cost/best_timing_cost).

Additionally, pairwise swapping of edge pins based on timing relationships of the pins within the cluster is performed. The swapping is directed to achieve maximal common launch and capture paths for a pair of clock pins that have either a setup path or a hold path in common.

Figure 37B:
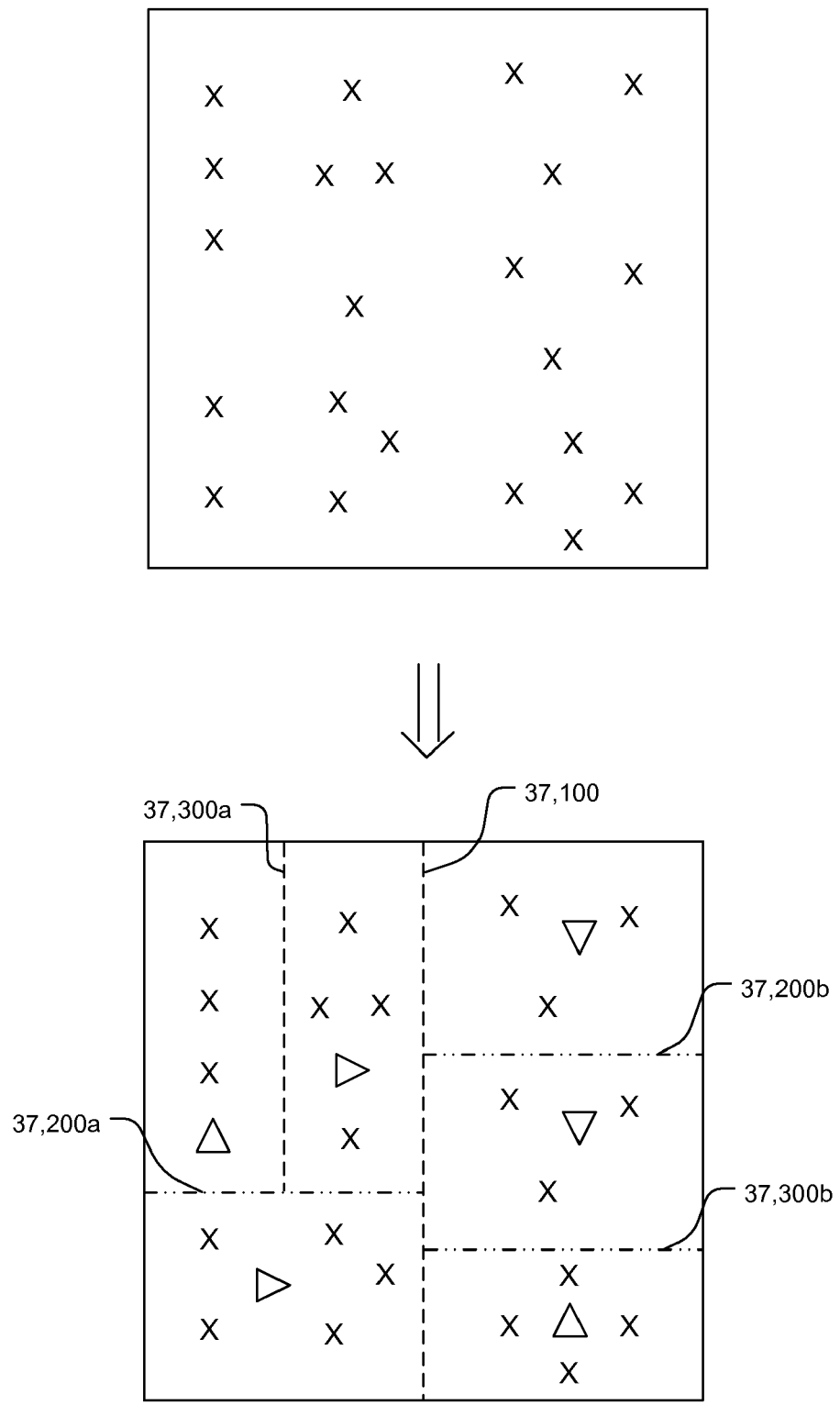
FIG. 37B illustrates an example of effects of clock tree partitioning.

FIG. 37B illustrates an example of effects of (top-down) clock tree partitioning. A random distribution of clock pins is illustrated in the upper portion of the figure. Results of clock tree partitioning and cluster formation are illustrated in the lower portion of the figure. The CDP performs top-down partitioning using leaf-level buffer input pins and any clock sub-domain clock pins. Clock sub-domain clock input pins include input pins of gated clock cells, clock selector cells, and derived clock pins of flip-flops. The clock sub-domains are processed top-down instead of being clustered with leaf level clock pins, thus enabling insertion delay of the clock sub-domain to be utilized to balance the sub-domains. As illustrated, results of a first recursive partitioning pass are shown as 37,100. Results of a pair of (independent) second recursive partitioning passes are shown as 37,200a and 37,200b. Results of a third recursive partitioning pass are shown as 37,300b. Note that although the recursive portioning results are illustrated as straight cut-lines splitting contiguous regions, various embodiments and starting conditions may result in cut-lines of any shape or form, such as zig-zags, curves, and so forth. Further note that the split regions may be non-contiguous; i.e. form one or more "islands" driven by a single leaf-level buffer.

Figure 38:
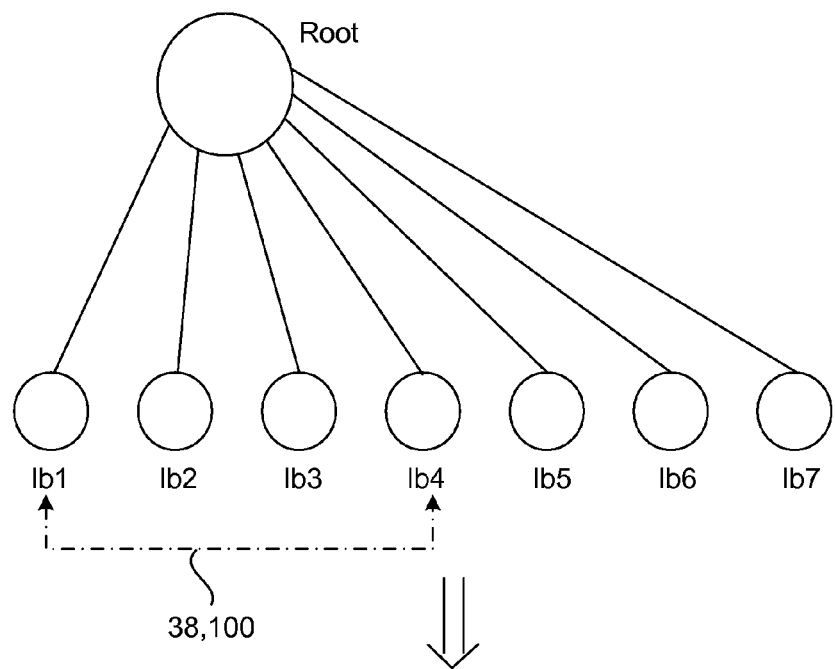
FIG. 38 illustrates an analysis according to an embodiment of clock domain and sub-domain partitioning.
Figure 38:
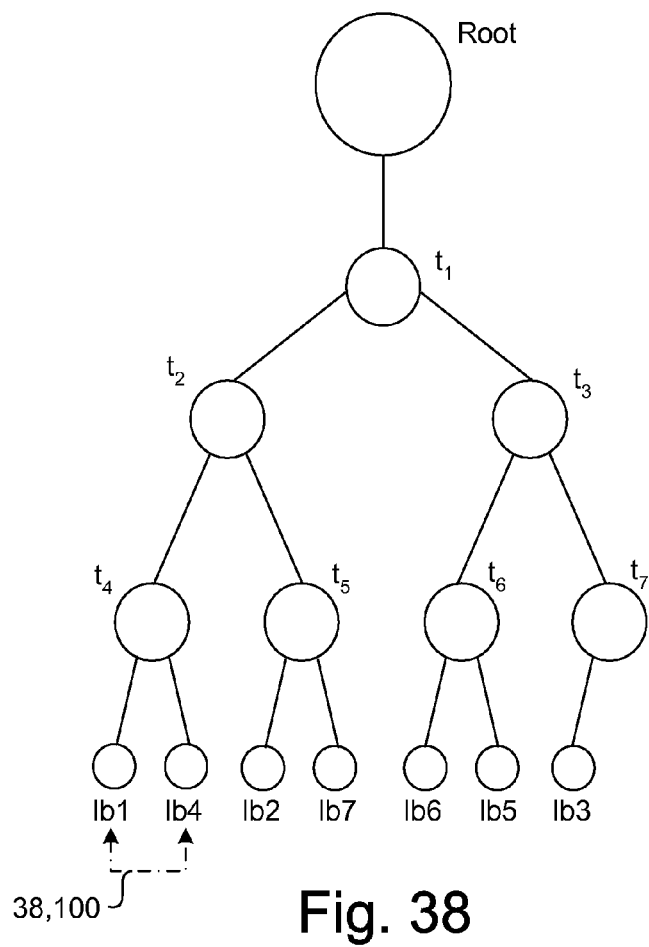
Figure 11:
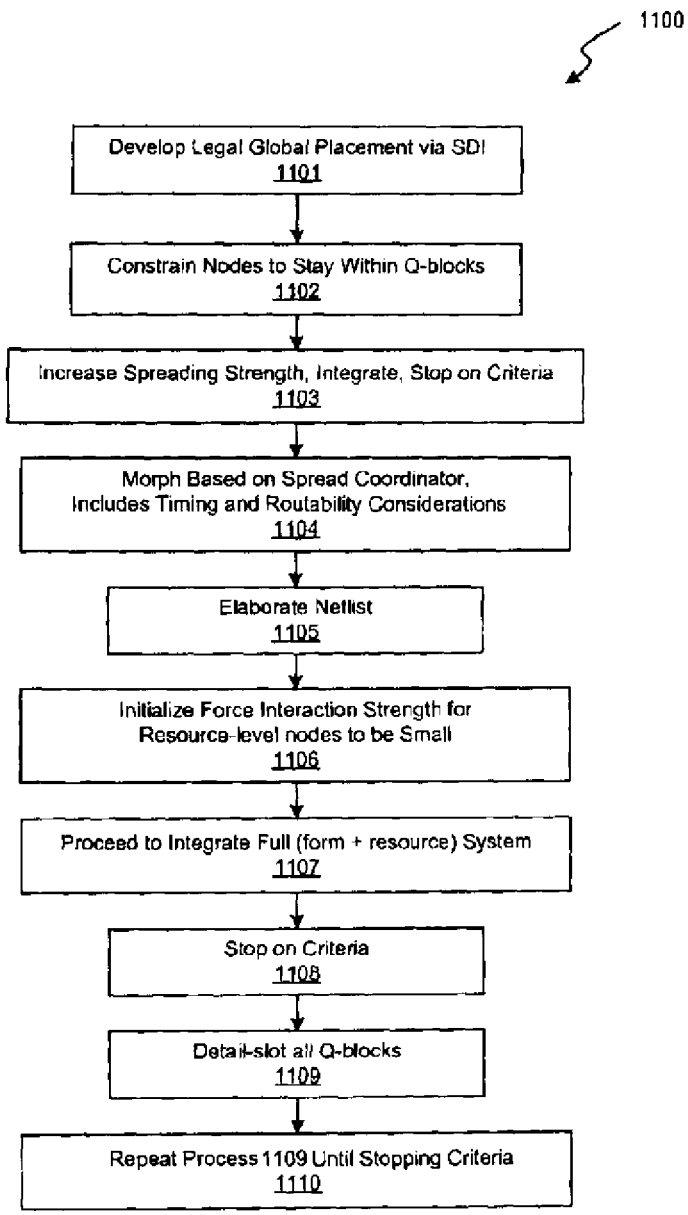
Figure 13:
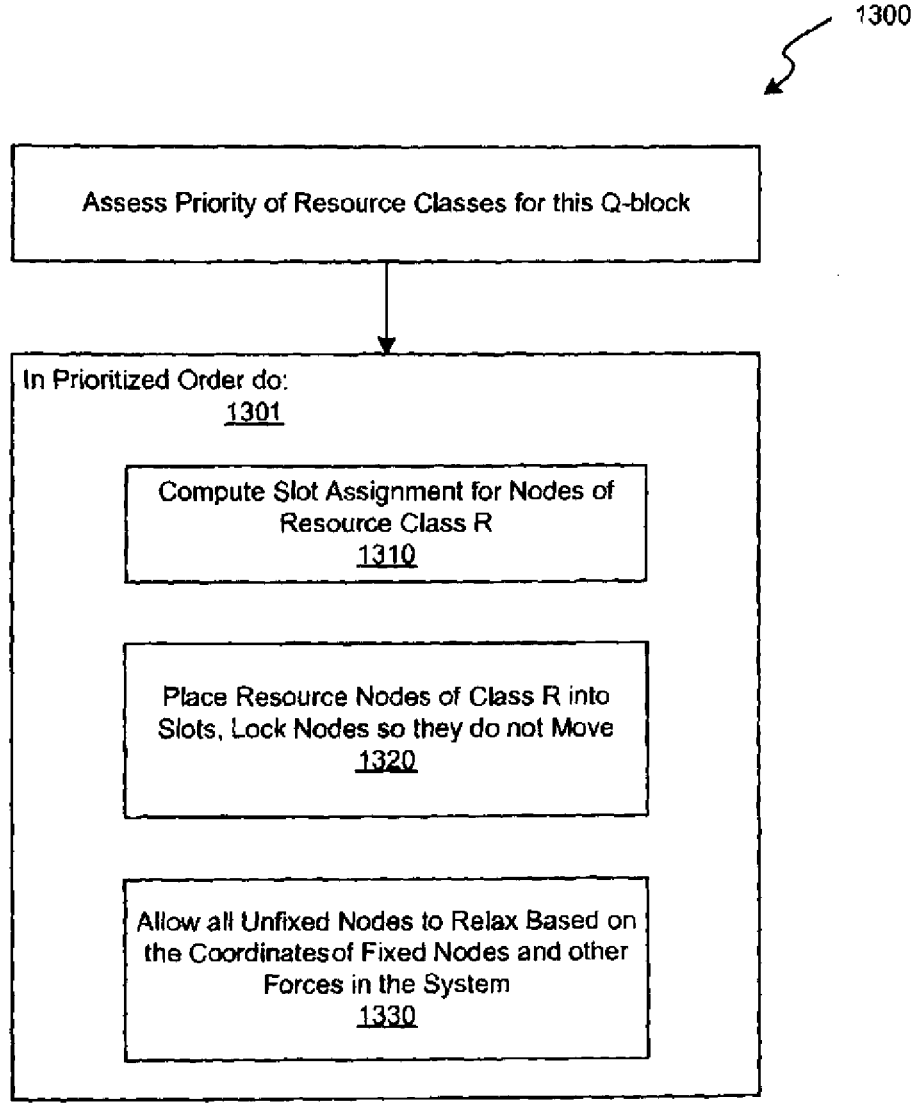

FIG. 38 illustrates an analysis according to an embodiment of clock domain and sub-domain partitioning. A clock "Root" is illustrated with relationships to leaf buffers lb1, lb2, lb3, lb4, lb5, lb6, and lb7. A tree of clock terminals is illustrated by $t_1$, $t_2$, $t_3$, $t_4$, $t_5$, $t_6$, and $t_7$. In some embodiments edges are added to represent timing relationships (such as setup and hold times) between leaf level buffers. One type of timing relationship between first and second buffers is when the first buffer drives a first storage element, the second buffer drives a second storage element, and the two storage elements are coupled via a path having a setup (or hold) timing constraint. An example setup (hold) timing relationship between a flipflop driven by lb1 and a flip-flop driven by lb4 is represented conceptually as dashed-line 38,100. As illustrated, skew is minimized between the two flip-flops by driving lb1 and lb4 via the same clock terminal ($t_4$).

The CDP creates distinct clock domains for the following types of clock nets:
- Primary clock nets;
- Clock nets driven by gated clock cells;
- Clock nets driven by clock selector cells;
- Pseudo clock domains (if floorplan driven clock partitioning has been performed); and
- Derived clock nets.

Timing relationships between the leaf level buffers are used to create optimum timing driven partitions. A scoring function for a partition is a function of interconnect cost and timing cost. To determine setup/hold timing relationships between leaf level buffers, an abstract graph is used as illustrated in the figure, having edges between two leaf level buffers if a setup/hold path exists between elements driven by the two leaf level buffers. The weight of the edge is the number of setup/hold paths between the two leaf level buffers.

As a result of top-down partitioning, the clock tree has two types of nodes, terminals and paths. A terminal represents a graph node that is processed by downstream modules for skew minimization. Each of the terminals has a pair of paths that represent the respective buffer path from the respective parent terminal to the respective pair of child terminals.

Clock domain edges are analyzed so that clock clusters recursively propagate the clock edge (e.g. a rising edge or a falling edge) used by the clock pin clusters at leaf level. Thus only one of rise time or fall time is propagated for all intervening levels of logic cells (including buffers and non-buffers).

During skew minimization (such as illustrated in FIG. 35) each internal terminal of a clock network is analyzed in a bottom-up visitation order and an ideal delay for each respective buffer pair is determined that will minimize the skew of the terminal. Skew minimization uses a successive approximation approach to determine types of buffer(s) and interconnect lengths associated with each of the buffers.

During a first pass skew optimization (or minimization), a default input transition time is used to compute delays of all clock buffers. For each terminal, respective locations of buffer pairs to be placed are determined that would minimize skew for an entire sub-tree. If the skew cannot be minimized by placing the buffer pair between two child terminals, then an amount of meandering interconnect/buffers to minimize the skew is determined.

An iterative skew improver portion of the CTS tool performs multi-pass skew computation and idealized delay allocation for each stage of a buffer tree. The skew improver performs a multi-pass optimization because skew minimization is done bottom-up but input transition is propagated top-down. Therefore during the first pass, a skew minimizer uses a default input transition for each buffer stage of a clock network and performs skew minimization at each level. Subsequently, a clock network timing update is performed that updates transition times at each level, top-down, using an estimated output load on each of the buffers of the network.

A second pass of skew minimization is performed that uses the propagated input transition time at each of the clock buffers. Subsequent passes are performed (such as 1, 2, 3, 4, or 5 iterations) seeking convergence of the skew minimizer.

Clock network timing is updated in accordance with buffer placement, delays of buffer gates, and interconnect delays. Since cell delays are functions of input transition time and phase, the clock network timing (arrival time and transition time) is relatively accurate to ensure that buffer cell delays computed at each of the terminals matches closely with post-routed-extracted delays.

Transition time at an output of a gate is a function of input transition time at the gate and effective output load (Ceff) driven by the gate. The proper phase of transition times is propagated down a clock network to accurately estimate transition times and cell delays at a next level of the clock network. In some usage scenarios (such as an SAF-based design flow) buffers may not be placed at ideal locations (i.e. there is no logic block in a proper buffer position). Thus clock buffer placement is performed iteratively. Whenever a buffer is placed at a somewhat non-ideal location, the effect of that buffer placement is propagated throughout the clock sub-tree.

A buffer placer module of the CTS tool inserts a pair of buffers at each terminal of a clock network. Unlike standard cell design flows where a buffer may be placed anywhere in a row of standard cell logic, structured ASICs are constrained in where buffer resources may be placed.

Buffer placement is performed recursively down the clock tree. At each terminal, the buffer placer evaluates a finite number of buffer pair sites for suitability as a buffer pair of the respective terminal. The buffer pairs are located by using a search window around an ideal buffer pair location.

The buffer placer uses a speculative scoring function to score each pair of buffers. Each buffer pair is scored on the basis of the objective function:

$$buf\_pair\_cost = 0.9*buf\_delay\_cost + 0.1*buf\_dist\_cost;$$

where $$buf\_delay\_cost = dd0*dd0 + dd1*dd1 + dd2*dd2;$$

where
- $dd0 = (1-est\_delay/ideal\_delay)$ for the respective parent terminal;
- $dd1 = (1-est\_delay/ideal\_delay)$ for the respective left terminal; and
- $dd2 = (1-est\_delay/ideal\_delay)$ for the respective right terminal.

Similarly, $$buf\_dist\_cost = dbb*dbb + msd1*msd1 + msd2*msd2;$$
and dbb=Manhattan distance between the pair of buffer.
Ideally the pair of buffers should be as close as possible to reduce any delay uncertainty between a parent buffer and respective buffer pairs. Using a dbb term penalizes any pair of buffers that are far apart.

msd1(2)=distance between left/right buffer and merging segment.

A merging segment is a line that goes between a pair of idealized buffer locations. The distance of the buffer location and the merge segment are measured. The idealized buffer locations for the downstream sub-tree are computed with the parent buffer being ideally placed on the merging segment. If actual placement of the buffer deviates too much from the idealized line segment then the estimates for the downstream terminal are no longer valid.

When two sub-trees have considerable differences in accumulated insertion delays then delay buffers are inserted to match insertion delay at a parent terminal. Differences in insertion delays may occur in some usage scenarios where one branch of the clock sub-tree is a (relatively large) gated-clock sub-domain and remaining branches are relatively smaller gated or un-gated clock-sub-domains.

Delay buffers are scored using an objective scoring function:

delay_buf_cost=0.70*dcost*dcost+0.2*ncost*ncost+ 0.1*pcost*pcost;

where
dcost=(1−(accum_delay+incr_delay)/ideal_delay);
ncost=(1−actual_length/ideal_length); and
pcost=(1−path remaining_length/path_ideal remaining_length).

Besides the delay cost (which has the highest weighting), delay_buf_cost uses two other metrics to evaluate a candidate delay buffer. Ncost factors in any deviation from ideal length of an interconnect for a respective path, and pcost factors in deviation of path length from a respective ideal path length.

If the skew minimizer determines that the path requires some amount of meandering interconnect to add extra delay at the buffer, then a dummy-load insertion technique is used to implement the incremental meandering wire resource. A dummy load inserter portion of the CTS tool searches for optimal dummy load sites (typically a low drive strength inverter) on an SAF-based chip and connects the buffer to the dummy load.

The CTS tool balances for max and min corners simultaneously as optimum skew for a max corner is not the optimum skew for min corner. In some usage scenarios skew at the max corner typically affects the setup timing paths whereas clock skew for the min corner affects the hold time paths. During deskewing monitored by the CTS tool, timing for both max and min corners (also known as mixed mode) is considered, and the CTS tool uses scoring functions (as described elsewhere herein) that uses a weighted sum of max and min scoring functions.

Post-routed-extracted parasitics are used to perform clock tree optimization. The clock optimization is used to achieve timing closure in designs having correlation issues with predicted clock skew and post-extracted clock skew. In some usage scenarios, the CTS tool achieves a high degree of correlation with post-extracted skew using several techniques as described elsewhere herein. The CTS tool performs several clock tree optimizations, such as replacement of a clock gating cell, replacement of terminal buffers, dummy load insertion, and swapping a CTS buffer for some other morphable element that may be implemented as a buffer.

CONCLUSION

Certain choices have been made in the description merely for convenience in preparing the text and drawings and unless there is an indication to the contrary the choices should not be construed per se as conveying additional information regarding structure or operation of the embodiments described. Examples of the choices include: the particular organization or assignment of the designations used for the figure numbering and the particular organization or assignment of the element identifiers (i.e., the callouts or numerical designators) used to identify and reference the features and elements of the embodiments.

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible, which are consistent with the description and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications (such as integration techniques and design flow technologies), are merely those of the described embodiments, are expected to track improvements and changes in implementation technology, and should not be construed as limitations.

Functionally equivalent techniques known in the art are employable instead of those described to implement various components, sub-systems, functions, operations, routines, and sub-routines. It is also understood that many functional aspects of embodiments are realizable selectively in either hardware (i.e., generally dedicated circuitry) or software (i.e., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design comprise insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:
1. A method, comprising:
    evolving over time, by a computing apparatus, a system of equations representative of motion of a first state of first locations of a plurality of nodes and a plurality of nets and approximating a continuous evolution of state variables over time, resulting, at least in part, from a plurality of forces on the nodes and the nets, to determine a second state of second locations of the nodes and the nets, wherein the nodes and the nets are representative of a circuit netlist of elements of an integrated circuit, wherein the plurality of forces include viscous damping, attractive, and spreading forces, and wherein the state variables describe at least a mass of each node;

modifying, by the computing apparatus after said evolving, magnitudes of one or more of the plurality of forces of at least one of the nodes, and the mass of at least one of the nodes based, at least in part, on a resource usage of the nodes and the nets, to adjust the second state to a third state of third locations; and modifying, by the computing apparatus, the third state to a fourth state of fourth locations based, at least in part, on a timing of the third state by:

replacing a first driver of at least one of the nets with a second driver, wherein the first driver and the second driver have different drive strengths; or inserting a buffer driving the at least one of the nets; or both.

2. The method of claim 1, further comprising sorting, by the computing apparatus, the plurality of the nets, prior to said modifying the third state to a fourth state, according to timing criticality.

3. The method of claim 1, wherein said modifying the third state to a fourth state is performed based, at least in part, on one or more of capacitance of at least one of the nets, fanout of at least one of the nets, timing criticality of at least one of the nets, maximum delay of at least one of the nets, or transition time of at least one of the nets.

4. The method of claim 1, wherein said modifying the third state to a fourth state comprises said replacing the first driver of the at least one of the nets with the second driver, and wherein the method further comprises, prior to said modifying the third state to a fourth state:

determining, by the computing apparatus, a plurality of replacement forms of the first driver;

attempting, by the computing apparatus, placement of at least some of the replacement forms to determine placeable ones of the replacement forms; and selecting, by the computing apparatus, the second driver from the placeable replacement forms.

5. The method of claim 4, further comprising sorting, by the computing apparatus, the placeable replacement forms based at least in part on respective timing scores of the placeable replacement forms.

6. The method of claim 5, wherein the respective timing scores of the placeable replacement forms are determined based at least in part on said attempting placement.

7. The method of claim 4, further comprising sorting, by the computing apparatus, prior to said attempting placement, the replacement forms based at least in part on respective timing scores of the replacement forms.

8. The method of claim 1, wherein said modifying the third state to a fourth state includes inserting a tree of buffers to drive at least one of the nets.

9. The method of claim 1, wherein said modifying the third state to a fourth state includes inserting a clock tree into the third state.

10. The method of claim 9, wherein said inserting a clock tree comprises inserting the clock tree based at least in part on a maximum clock skew of a network of clocks of the third state.

11. The method of claim 9, wherein said inserting a clock tree comprises inserting the clock tree based at least in part on a maximum latency of a network of clocks of the third state.

12. The method of claim 1, further comprising generating, by the computing apparatus, a placement of the elements of the integrated circuit in accordance with the determined fourth locations.

13. The method of claim 1, wherein the state variables further describe a position and a velocity of each node.

14. The method of claim 1, further comprising creating, by the computing apparatus, the first state of the nodes and the nets representative of the circuit netlist of elements of the integrated circuit.

15. A non-transitory computer-readable medium having stored thereon, computer-executable instructions configured to cause the computing apparatus, in response to execution of the instructions by the computing apparatus, to perform operations comprising:

evolving over time, by the computing apparatus, a system of equations representative of motion of a first state of first locations of a plurality of nodes and a plurality of nets and approximating a continuous evolution of state variables over time, resulting, at least in part, from a plurality of forces on the nodes and the nets, to determine a second state of second locations of the nodes and the nets, wherein the nodes and the nets are representative of a circuit netlist of elements of an integrated circuit, wherein the plurality of forces include viscous damping, attractive, and spreading forces, and wherein the state variables describe at least a mass of each node;

modifying, by the computing apparatus after said evolving, magnitudes of one or more of the plurality of forces of at least one of the nodes, and the mass of at least one of the nodes based, at least in part, on a resource usage of the nodes and the nets, to adjust the second state to a third state of third locations; and modifying, by the computing apparatus, the third state to a fourth state of fourth locations based, at least in part, on a timing of the third state by:

replacing a first driver of at least one of the nets with a second driver, wherein the first driver and the second driver have different drive strengths; or inserting a buffer driving the at least one of the nets; or both.

16. The non-transitory computer-readable medium of claim 15, wherein the computer-executable instructions, if executed by the computing apparatus, further cause the computing apparatus to perform an operation of sorting the plurality of the nets, prior to said modifying the third state to a fourth state, according to timing criticality.

17. The non-transitory computer-readable medium of claim 15, wherein said modifying the third state to a fourth state is performed based, at least in part, on one or more of capacitance of at least one of the nets, fanout of at least one of the nets, timing criticality of at least one of the nets, maximum delay of at least one of the nets, or transition time of at least one of the nets.

18. The non-transitory computer-readable medium of claim 15, wherein said modifying the third state to a fourth state comprises said replacing the first driver of the at least one of the nets with the second driver, and wherein the computer-executable instructions, if executed by a computing apparatus, further cause the computing apparatus to perform, prior to said modifying the third state to a fourth state, determining a plurality of replacement forms of the first driver;

attempting placement of at least some of the replacement forms to determine placeable ones of the replacement forms; and selecting the second driver from the placeable replacement forms.

19. A system, comprising:

a processor; and a non-transitory computer-readable medium coupled to the processor by way of a bus, the non-transitory computer-readable medium having stored thereon, computer-executable instructions that enable the system, in response to execution of the instructions, to:

evolve over time a system of equations representative of motion of a first state of first locations of a plurality of nodes and a plurality of nets and approximating a continuous evolution of state variables over time, resulting, at least in part, from a plurality of forces on the nodes and the nets, to determine a second state of second locations of the nodes and the nets, wherein the nodes and the nets are representative of a circuit netlist of elements of an integrated circuit, wherein the plurality of forces include viscous damping, attractive, and spreading forces, and wherein the state variables describe at least a mass of each node; and modifying, by the computing apparatus after said evolving, magnitudes of one or more of the plurality of forces of at least one of the nodes, and the mass of at least one of the nodes based, at least in part, on a resource usage of the nodes and the nets, to adjust the second state to a third state of third locations; and modify the third state to a fourth state of fourth locations based, at least in part, on a timing of the third state by:

replacing a first driver of at least one of the nets with a second driver, wherein the first driver and the second driver have different drive strengths; or inserting a buffer driving the at least one of the nets; or both.

20. The system of claim 19, wherein the computer-executable instructions enable the system to modify the third state to the fourth state by replacing the first driver of the at least one of the nets with the second driver, and wherein the computer-executable instructions further enable the system, in response to execution of the instructions by the system, to:

determine a plurality of replacement forms of the first driver;

attempt placement of at least some of the replacement forms to determine placeable ones of the replacement forms; and select the second driver from the placeable replacement forms.

21. The system of claim 19, wherein the computer-executable instructions further enable the system, in response to execution of the instructions by the system, to modify the third state to the fourth state based at least in part on the timing of the third state by inserting a tree of buffers to drive the at least one of the nets.

22. The system of claim 19, wherein the computer-executable instructions further enable the system, in response to execution of the instructions by the system, to modify the third state to the fourth state based at least in part on the timing of the third state by inserting a clock tree into the third state, wherein the clock tree comprises one or more levels of clock selector logic gates.

23. The system of claim 19, wherein the computer-executable instructions further enable the system, in response to execution of the instructions by the system, to modify the third state to the fourth state based at least in part on the timing of the third state by inserting a clock tree into the third state, wherein the clock tree comprises one or more levels of clock gating logic gates.

* * * * *

UNITED STATES PATENT AND TRADEMARK OFFICE
CERTIFICATE OF CORRECTION

| | |
|---|---|
| PATENT NO. | : 8,332,793 B2 |
| APPLICATION NO. | : 12/301456 |
| DATED | : December 11, 2012 |
| INVENTOR(S) | : Bose |

It is certified that error appears in the above-identified patent and that said Letters Patent is hereby corrected as shown below:

On Title Page 2, item (56), under "OTHER PUBLICATIONS", in Column 2, Line 4, delete "Lebrun." and insert -- LeBrun. --, therefor.

On Title Page 2, item (56), under "OTHER PUBLICATIONS", in Column 2, Line 45, delete "PCT/U506/25294" and insert -- PCT/US06/25294 --, therefor.

In the Drawings

In Fig. 11, Sheet 21 of 54, in Box "1104", in Line 2, delete "Routeability" and insert -- Routability --, therefor. (attached)

In Fig. 11, Sheet 21 of 54, in Box "1110", in Line 1, delete "9" and insert -- 1109 --, therefor. (attached)

In Fig. 13, Sheet 23 of 54, below "In Prioritized Order do:", insert -- 1301 --. (attached)

In Fig. 13, Sheet 23 of 54, in Box "1330", in Line 2, delete "Corrdinates" and insert -- Coordinates --, therefor. (attached)

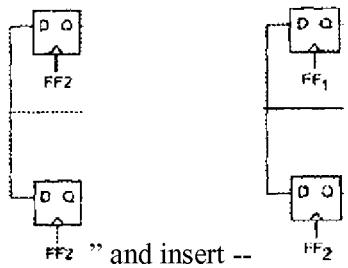

In Fig. 26, Sheet 38 of 54, delete " FF2 " and insert -- FF2 --, therefor.

Signed and Sealed this
Twenty-fourth Day of September, 2013

Teresa Stanek Rea
*Deputy Director of the United States Patent and Trademark Office*

In Fig. 26, Sheet 38 of 54, delete "  " and insert -- --, therefor.

In the Specification

In Column 2, Line 58, delete "RST" and insert -- SRT --, therefor.

In Column 6, Line 1, delete "paritally" and insert -- partially --, therefor.

In Column 10, Line 24, delete "(MRST)" and insert -- (MRSTs) --, therefor.

In Column 14, Line 39, delete "of" and insert -- of: --, therefor.

In Column 33, Line 62, delete "fooprint" and insert -- footprint --, therefor.

In Column 41, Line 56, delete ""Detailed Placement"" and insert -- "(SDI) Detailed Placement" --, therefor.

In Column 47, Line 18, delete "(MRST)" and insert -- (MRSTs) --, therefor.

In Column 50, Line 22, delete "RST" and insert -- SRT --, therefor.

In Column 53, Line 56, delete "101B," and insert -- 1001B, --, therefor.

In Column 62, Lines 20-21, delete "over subscribed" and insert -- oversubscribed --, therefor.

In Column 62, Line 58, delete "Techniques" and insert -- Techniques: --, therefor.

In Column 62, Line 67, delete "function" and insert -- function. --, therefor.

In Column 64, Line 5, delete " $0*x\_0 + 0*x\_1 + 0*x\_2 + 3*x\_3 + 2*x\_4 + \ldots <= 100$ " and insert -- $0*x\_0 + 0*x\_1 + 0*x\_2 + 3*x\_3 + 2*x\_4 + \ldots <= 100$ --, therefor.

In Column 65, Line 7, delete "Techniques" and insert -- Techniques: --, therefor.

In Column 68, Line 45, delete "SDF(L2)=dcoff*exp(11/10-1);" and insert -- SDF(L2)=d coeff*exp(11/10-1); --, therefor.

In Column 73, Line 35, delete "c0" and insert -- $C_0$ --, therefor.

In Column 73, Line 38, delete "b1'" and insert -- $b_1$' --, therefor.

In Column 78, Line 47, delete "demand)" and insert -- demand). --, therefor.

In Column 79, Line 10, delete "Tcl" and insert -- TCL --, therefor.

In Column 79, Line 11, delete "embedded Tcl" and insert -- embedded TCL --, therefor.

In Column 79, Line 15, delete "rareified" and insert -- rarefied --, therefor.

In Column 80, Line 1, delete "29,00c," and insert -- 29,300c, --, therefor.

In Column 89, Lines 9-10,
delete "pcost=(1-path remaining_length/path_ideal remaining_length)." and
insert -- pcost=(1-path_remaining_length/path_ideal remaining_length). --, therefor.

In the Claims

In Column 93, Line 20, in Claim 19, delete "node; and" and insert -- node; --, therefor.